US008673538B2

(12) United States Patent
Inasaki et al.

(10) Patent No.: US 8,673,538 B2

(45) Date of Patent: Mar. 18, 2014

(54) ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE COMPOSITION

(75) Inventors: Takeshi Inasaki, Haibara-gun (JP); Tomotaka Tsuchimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/558,497

(22) Filed: Jul. 26, 2012

(65) Prior Publication Data

US 2013/0029255 A1 Jan. 31, 2013

(30) Foreign Application Priority Data

Jul. 28, 2011 (JP) ................................. 2011-166034
Jun. 27, 2012 (JP) ................................. 2012-144555

(51) Int. Cl.

| | |
|---|---|
| ***G03F 7/00*** | (2006.01) |
| ***G03F 7/004*** | (2006.01) |
| ***G03F 7/028*** | (2006.01) |
| ***G03F 7/20*** | (2006.01) |
| ***G06F 1/00*** | (2006.01) |

(52) U.S. Cl.

USPC ............ 430/270.1; 430/5; 430/942; 430/945; 430/966; 430/913

(58) Field of Classification Search

USPC ........................... 430/270.1, 5, 945, 942, 966

See application file for complete search history.

(56) References Cited

U.S. PATENT DOCUMENTS

| | | | | |
|---|---|---|---|---|
| 6,042,997 | A | 3/2000 | Barclay et al. | |
| 7,569,326 | B2 * | 8/2009 | Ohsawa et al. | 430/270.1 |
| 7,893,293 | B2 | 2/2011 | Akita et al. | |
| 8,048,610 | B2 * | 11/2011 | Ohsawa et al. | 430/270.1 |
| 8,057,985 | B2 * | 11/2011 | Ohashi et al. | 430/270.1 |
| 2004/0091817 | A1 | 5/2004 | Komatsu et al. | |
| 2007/0105042 | A1 | 5/2007 | Takeda et al. | |
| 2010/0248149 | A1 * | 9/2010 | Tsuchimura et al. | 430/296 |
| 2010/0288794 | A1 * | 11/2010 | Chapin | 222/377 |
| 2011/0165512 | A1 * | 7/2011 | Utsumi et al. | 430/270.1 |
| 2012/0142410 | A1 * | 6/2012 | Olive et al. | 463/25 |
| 2012/0171617 | A1 * | 7/2012 | Bae et al. | 430/285.1 |
| 2012/0202141 | A1 | 8/2012 | Inasaki et al. | |
| 2012/0202153 | A1 * | 8/2012 | Hatakeyama | 430/283.1 |
| 2012/0214091 | A1 * | 8/2012 | Tsuchimura et al. | 430/5 |
| 2012/0301817 | A1 * | 11/2012 | Inasaki et al. | 430/5 |
| 2013/0004888 | A1 * | 1/2013 | Inasaki et al. | 430/5 |

FOREIGN PATENT DOCUMENTS

| | | | |
|---|---|---|---|
| JP | 03282550 | A | 12/1991 |
| JP | 10115928 | A * | 5/1998 |
| JP | 2000-171977 | A | 6/2000 |
| JP | 2000241975 | A | 9/2000 |
| JP | 2004-158287 | A | 6/2004 |
| JP | 2005-157401 | A | 6/2005 |
| JP | 2005232396 | A | 9/2005 |
| JP | 2007132998 | A | 5/2007 |
| JP | 2008089871 | A | 4/2008 |
| JP | 2008-162101 | A | 7/2008 |
| JP | 2009003242 | A | 1/2009 |
| JP | 2010250290 | A | 11/2010 |
| JP | 2010286646 | A | 12/2010 |
| JP | 2012163725 | A | 8/2012 |
| JP | 2013011738 | A | 1/2013 |

OTHER PUBLICATIONS

Notice of Submission of Opinion, mailed Sep. 3, 2013, issued in Korean Application No. 10-2012-0079274, 8 pages in English and Korean.

* cited by examiner

*Primary Examiner* — Amanda C. Walke

(74) *Attorney, Agent, or Firm* — Sughrue Mion, PLLC

(57) ABSTRACT

Provided is an actinic ray-sensitive or radiation-sensitive resin composition containing a compound (A) which contains at least one phenolic hydroxyl group and at least one group where a hydrogen atom in a phenolic hydroxyl group is substituted by a group represented by the following General Formula (1)

(1)

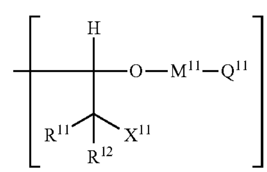

(in the formula, each of $R^{11}$ and $R^{12}$ independently represents a hydrogen atom, an alkyl group, a cycloalkyl group, an aryl group, or an aralkyl group; $X^{11}$ represents an aryl group; $M^{11}$ represents a single bond or a divalent linking group; and $Q^{11}$ represents an alkyl group, a cycloalkyl group or an aryl group, wherein the number of carbon atoms which are included in the group represented by $-M^{11}-Q^{11}$ is 3 or more, and at least two of $R^{11}$, $R^{12}$, $Q^{11}$, and $X^{11}$ may form a ring by bonding to each other).

18 Claims, No Drawings

ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE COMPOSITION

BACKGROUND OF THE INVENTION

1. Field of the Invention

The present invention relates to an actinic ray-sensitive or radiation-sensitive resin composition, and an actinic ray-sensitive or radiation-sensitive film and a pattern forming method using the composition. Particularly, the present invention relates to an actinic ray-sensitive or radiation-sensitive resin composition that is suitably used for a production process of VLSIs and high-capacity microchips, a fabrication process of molds for nanoimprint, an ultramicrolithography process applicable for a production process of high-density information recording media, and other photofabrication processes, and relates to an actinic ray-sensitive or radiation-sensitive film and a pattern forming method using the composition. More specifically, the present invention relates to an actinic ray-sensitive or radiation-sensitive resin composition that is suitably usable for microfabrication of semiconductor devices using an electron beam, X-rays, or EUV light, and relates to an actinic ray-sensitive or radiation-sensitive film and a pattern forming method using the composition.

2. Description of the Related Art

In the microfabrication using a resist composition, ultramicro patterns are required to be formed since integrated circuits are increasingly highly integrated. In accompaniment with this, a trend of wavelength shortening in the exposure wavelength from g-rays and i-rays to KrF lasers (for example, JP2000-171977A) and ArF lasers can be seen, and furthermore, in recent years, the development of lithography technology which uses an electron beam, X-rays, or EUV light instead of excimer laser light is progressing.

In electron beam (EB) lithography, it is known that the influence of electron scattering, that is, the influence of forward scattering in a resist film is diminished by increasing an accelerating voltage of an EB. Consequently, in recent years, the accelerating voltage of the EB has tended to increase. However, if the accelerating voltage of the EB is increased, while the influence of forward scattering is diminished, the influence of the scattering of electrons reflected in a resist substrate, that is, the influence of backward scattering is increased. The influence of backward scattering is particularly great when an independent line pattern having a large exposure area is formed. Accordingly, for example, if the accelerating voltage of the EB is increased, resolution of the independent line pattern is likely to deteriorate.

Particularly, in a case of forming patterns in photomask blanks used for semiconductor exposure, the lower layer of a resist film includes a light-shielding film that contains heavy atoms such as chromium, molybdenum, and tantalum. In this case, the influence of backward scattering caused by reflection from the lower layer of a resist is more marked compared to a case of coating a resist onto a silicon wafer. Consequently, when the independent line pattern is formed on the photomask blanks, there is a possibility that the pattern will be easily influenced particularly by the backward scattering and that the resolution will deteriorate.

Generally, a chemical amplification type positive resist is a photosensitive composition that contains a compound (photoacid generator) generating a strong acid by being irradiated with light and a compound that is turned into an alkali-soluble substance due to the decomposition of a hydrophobic acid labile group caused by the catalytic action of the generated acid. In some cases, this photosensitive composition further contains a basic compound to inhibit a dark reaction in an unexposed portion. Due to this basic compound, the acid generated by the influence of scattered electrons is deactivated by a neutralization reaction, whereby film reduction in an unexposed portion can be inhibited. However, if an acetal group having low activation energy of an acid degradation reaction is used as an acid labile group, the degradation reaction of the acid labile group competes with the neutralization reaction between the generated acid and the basic compound. Accordingly, the film reduction of the unexposed portion cannot be completely inhibited, and particularly, the resolution of the independent line pattern deteriorates.

As a method of improving the resolution of the independent line pattern, the use of a resin containing a group that adjusts the solubility of the resin has been examined (for example, see JP2005-157401A). However, this is not fundamental means for solving the above problems and cannot sufficiently satisfy the resolution of the independent line pattern.

Microfabrication using a resist composition is not only directly used for producing integrated circuits but also has been applied for producing a so-called imprinting mold structure in recent years (for example, see JP2004-158287A, JP2008-162101A, and "Science and New Technology in Nanoimprint", edited by Yoshihiko Hirai, Frontier Publishing (published in June 2006). Accordingly, particularly, even when independent patterns are formed using X-rays, soft X-rays, or an electron beam as an exposure light source, it is important to satisfy high sensitivity, high resolution, and roughness characteristics at the same time, and this is a problem needing to be solved.

SUMMARY OF THE INVENTION

An object of the present invention is to provide an actinic ray-sensitive or radiation-sensitive resin composition that can form independent line patterns with high resolution and excellent shapes and shows other excellent resist performances including roughness characteristics and post exposure bake sensitivity (PEBS), and to provide an actinic ray-sensitive or radiation-sensitive film and a pattern forming method using the composition.

An embodiment of the present invention is as follows.

[1] An actinic ray-sensitive or radiation-sensitive resin composition containing a compound (A) which contains at least one phenolic hydroxyl group and at least one group where a hydrogen atom in a phenolic hydroxyl group is substituted by a group represented by the following General Formula (1).

(1)

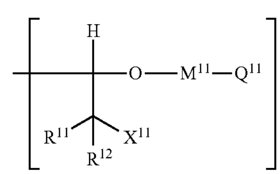

In the formula, each of $R^{11}$ and $R^{12}$ independently represents a hydrogen atom, an alkyl group, a cycloalkyl group, an aryl group, or an aralkyl group;

$X^{11}$ represents an aryl group;

$M^{11}$ represents a single bond or a divalent linking group; and $Q^{11}$ represents an alkyl group, a cycloalkyl group or an aryl group.

Here, the number of carbon atoms which are included in the group represented by $-M^{11}-Q^{11}$ is 3 or more.

In addition, at least two of $R^{11}$, $R^{12}$, $Q^{11}$, and $X^{11}$ may form a ring by bonding to each other.

[2] The composition according to [1], wherein the compound (A) is a polymer compound containing a repeating unit represented by the following General Formula (2).

(2)

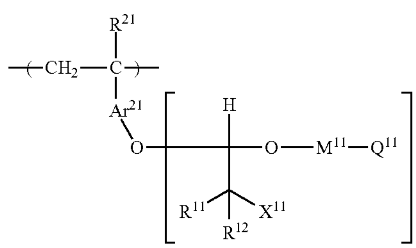

In the formula, $R^{21}$ represents a hydrogen atom or a methyl group;

$Ar^{21}$ represents an arylene group;

each of $R^{11}$ and $R^{12}$ independently represents a hydrogen atom, an alkyl group, a cycloalkyl group, an aryl group, or an aralkyl group;

$X^{11}$ represents an aryl group;

$M^{11}$ represents a single bond or a divalent linking group; and $Q^{11}$ represents an alkyl group, a cycloalkyl group or an aryl group.

Here, the number of carbon atoms which are included in the group represented by $-M^{11}-Q^{11}$ is 3 or more.

In addition, at least two of $R^{11}$, $R^{12}$, $Q^{11}$, and $X^{11}$ may form a ring by bonding to each other.

[3] The composition according to [1] or [2], wherein the group represented by $-M^{11}-Q^{11}$ has at least one ring structure.

[4] The composition according to any one of [1] to [3], wherein the group represented by $-M^{11}-Q^{11}$ is a cycloalkyl group, an alkyl group substituted by a cycloalkyl group, an aralkyl group, or an aryloxyalkyl group.

[5] The composition according to [1] or [2], wherein $M^{11}$ is a single bond, $Q^{11}$ is an alkyl group or a cycloalkyl group, and, the carbon atom of $Q^{11}$ which is directly connected to the oxygen atom in —(O-$M^{11}$-$Q^{11}$) is a secondary carbon or tertiary carbon.

[6] The composition according to any one of [2] to [5], wherein $Ar^{21}$ is a phenylene group.

[7] The composition according to any one of [2] to [6], wherein the compound (A) contains a repeating unit represented by the following General Formula (5).

(5)

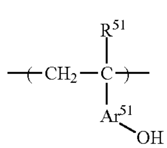

In the formula, $R^{51}$ represents a hydrogen atom or a methyl group; and $Ar^{51}$ represents an arylene group.

[8] The composition according to any one of [2] to [7], wherein the compound (A) further contains a non-degradable repeating unit represented by the following General Formula (3).

(3)

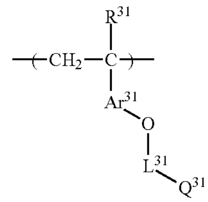

In the formula, $R^{31}$ represents a hydrogen atom or a methyl group;

$Ar^{31}$ represents an arylene group;

$L^{31}$ represents a single bond or a divalent linking group; and $Q^{31}$ represents a cycloalkyl group or an aryl group.

[9] The composition according to any one of [2] to [8], wherein a compound (A) further contains a repeating unit represented by the following General Formula (4).

(4)

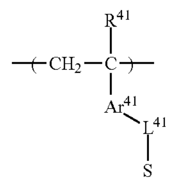

In the formula, $R^{41}$ represents a hydrogen atom or a methyl group;

$Ar^{41}$ represents an arylene group;

$L^{41}$ represents a single bond or a divalent linking group; and

S represents a structural moiety that generates an acid on a side chain by being degraded by actinic ray irradiation or radiation irradiation.

[10] The composition according to any one of [1] to [9] further containing a compound (B) which generates an acid due to irradiation of actinic rays or radiation.

[11] The composition according to [10], wherein the volume of the acid which is generated from the compound (B) is 200 Å$^3$ or more.

[12] The composition according to any one of [1] to [11] which is exposed using an electron beam, X-rays, or EUV light.

[13] An actinic ray-sensitive or radiation-sensitive film which is formed using the composition according to any one of [1] to [12].

[14] The actinic ray-sensitive or radiation-sensitive film according to [13], wherein the film thickness of the actinic ray-sensitive or radiation-sensitive film is 100 nm or less.

[15] Mask blanks, wherein the actinic ray-sensitive or radiation-sensitive film according to [13] or [14] is formed.

[16] A semiconductor manufacturing mask which is obtained by exposing and developing the mask blanks according to [15].

[17] A pattern forming method including exposing the film according to [13] or [14] and developing the exposed film.

[18] A pattern forming method including exposing the mask blanks according to [15], and developing the exposed mask blanks.

[19] The method according to [17] or [18], wherein the exposing is performed using an electron beam, X-rays, or EUV light.

According to the present invention, an actinic ray-sensitive or radiation-sensitive resin composition that can form independent line patterns with high resolution and excellent shapes and shows excellent resist performances including roughness characteristics, and an actinic ray-sensitive or radiation-sensitive film and a pattern forming method using the composition can be provided.

DESCRIPTION OF THE PREFERRED EMBODIMENTS

Hereinbelow, embodiments of the present invention will be described in detail.

Here, in the denotation of groups (atomic groups) in the specification, denotation where substituted or unsubstituted is not specified includes not only a group (atomic group) which does not have a substituent but also a group (atomic group) which has a substituent. For example, an "alkyl group" includes not only an alkyl group (unsubstituted alkyl group) not having a substituent but also an alkyl group (substituted alkyl group) having a substituent.

In the present invention, the term "actinic rays" or "radiation" refers to, for example, a bright line spectrum of a mercury lamp, far-ultraviolet rays represented by an excimer laser, extreme ultraviolet rays (EUV light), X-rays, an electron beam and the like. In addition, the "light" in the present invention refers to the actinic rays or the radiation. The term "exposure" in this specification includes not only the exposure performed using a mercury lamp, far-ultraviolet rays represented by an excimer laser, X-rays, EUV light, and the like, but also drawing performed using particle beams such as an electron beam and an ion beam, unless otherwise specified.

The actinic ray-sensitive or radiation-sensitive resin composition according to the present invention is, for example, a positive composition, and typically is a positive resist composition. The constitution of this composition will be described below.

[1] Compound (A)

The composition of the present invention contains a compound (A) which includes at least one phenolic hydroxyl group and at least one group where a hydrogen atoms in a phenolic hydroxyl group is substituted by a group (referred to below as an "acid labile group") represented by the following General Formula (1). The "acid labile group" refers to a group eliminated when a chemical bond is broken by the action of an acid. In addition, the "phenolic hydroxyl group" refers to a hydroxyl group directly binding to an aromatic ring.

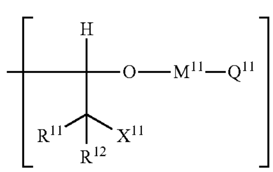

(1)

In the formula, each of $R^{11}$ and $R^{12}$ independently represents a hydrogen atom, an alkyl group, a cycloalkyl group, an aryl group, or an aralkyl group;

$X^{11}$ represents an aryl group;

$M^{11}$ represents a single bond or a divalent linking group; and $Q^{11}$ represents an alkyl group, a cycloalkyl group or an aryl group.

Here, the number of carbon atoms which are included in the group represented by $-Q^{11}$ is 3 or more.

In addition, at least two of $R^{11}$, $R^{12}$, $Q^{11}$, and $X^{11}$ may form a ring by bonding to each other.

The General Formula (1) will be described in more detail.

As described above, each of $R^{11}$ and $R^{12}$ independently represents a hydrogen atom, an alkyl group, a cycloalkyl group, an aryl group, or an aralkyl group.

In an embodiment, the alkyl group preferably has 20 or less carbon atoms, and more preferably has 8 or less carbon atoms. Examples of the alkyl group include a methyl group, an ethyl group, a propyl group, an isopropyl group, an n-butyl group, a sec-butyl group, a t-butyl group, a hexyl group, a 2-ethylhexyl group, an octyl group, and a dodecyl group. Among these, a methyl group, an ethyl group, a propyl group, an isopropyl group, and a t-butyl group are particularly preferable.

The cycloalkyl group may be monocyclic or polycyclic. The cycloalkyl group preferably has 3 to 10 carbon atoms. Examples of the cycloalkyl group include, for example, a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, and a 2-norbornyl group. Among these, a cyclopentyl group and a cyclohexyl group are preferable.

The aryl group may contain a hetero atom; alternatively, the aryl group may also contain a structure (for example, a biphenyl group or a terphenyl group) in which a plurality of aromatic rings are connected to each other via a single bond. The aryl group preferably has 4 to 20 carbon atoms, and more preferably has 6 to 14 carbon atoms. Examples of the aryl group include a phenyl group, a naphthyl group, an anthranyl group, a biphenyl group, a terphenyl group, a pyrrolyl group, a pyridyl group, a pyrimidyl group, a furanyl group, and a thienyl group. Among these, a phenyl group, a naphthyl group, and a biphenyl group are particularly preferable.

The aralkyl group preferably has 6 to 20 carbon atoms, and more preferably has 7 to 12 carbon atoms. Examples of the aralkyl group include a benzyl group, a phenethyl group, a naphthylmethyl group, and a naphthylethyl group.

The alkyl group, the cycloalkyl group, the aryl group, and the aralkyl group may further have a substituent. Examples of the substituent that the alkyl group may further have include a cycloalkyl group, an aryl group, an amino group, an amide group, a ureide group, a urethane group, a hydroxyl group, a carboxy group, a halogen atom, an alkoxy group, a thioether group, an acyl group, an acyloxy group, an alkoxycarbonyl group, a cyano group, and a nitro group.

Examples of the substituent that the cycloalkyl group may further have include an alkyl group and the respective groups described above as specific examples of the substituent that the alkyl group may further have.

The substituent that the alkyl group and the cycloalkyl group may further have preferably has 8 or less carbon atoms.

Examples of the substituent that the aryl group and the aralkyl group may further have include a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

$R^{11}$ and $R^{12}$ are preferably a hydrogen atom, an alkyl group, a cycloalkyl group, or an aralkyl group and are particularly preferably a hydrogen atom.

$X^{11}$ represents an aryl group as described above. The aryl group may contain a hetero atom, and in a case of a heteroaryl group, the atom in $X^{11}$ which is directly bonded to the carbon atom in the General Formula (1) which is bonded to $X^{11}$ is a carbon atom.

The aryl group represented by $X^{11}$ also includes a structure where a plurality of aromatic rings are connected to each other via a single bond (for example, a biphenyl group or a terphenyl group). The number of carbon atoms in the aryl group is preferably 4 to 20 and is more preferably 6 to 14. Examples of the aryl group include a phenyl group, a naphthyl group, an anthranyl group, a biphenyl group, a terphenyl group, and the like. Among these, a phenyl group, a naphthyl group, and a biphenyl group are particularly preferable.

The heteroaryl group preferably has 2 to 20 carbon atoms and more preferably has 4 to 14 carbon atoms. Specifically, examples include a pyrrolyl group, an imidazolyl group, a pyrazolyl group, a carbazolyl group, a pyridyl group, a pyrimidyl group, a furanyl group, a thienyl group, an indolyl group, a thiazolyl group, an oxazolyl group, a quinolyl group, an isoquinolyl group, an acridinyl group and the like.

The aryl group may have a substituent. Examples of the substituent which is possible include a nitro group, a halogen atom such as fluorine atom, a carboxyl group, a hydroxyl group, an amino group, a cyano group, an alkyl group (preferably having 1 to 15 carbon atoms), an alkoxy group (preferably having 1 to 15 carbon atoms), an alkylthio group (preferably having 1 to 6 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Below, specific examples of the group represented by —$CR^{11}R^{12}X^{11}$ are shown, but the present invention is not limited thereto.

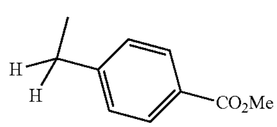
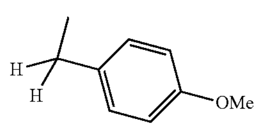
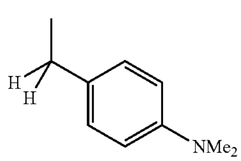
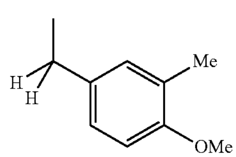
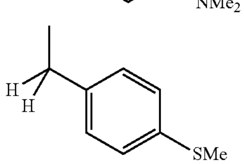
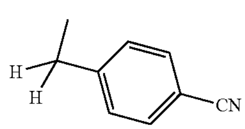

-continued

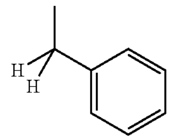
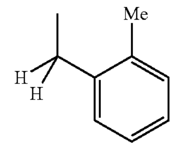
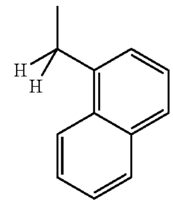
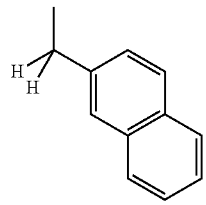
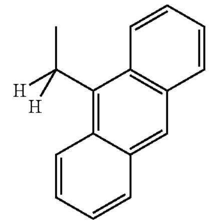
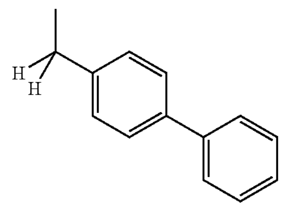
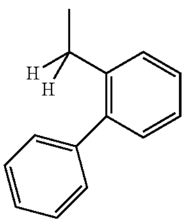
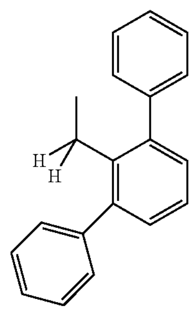
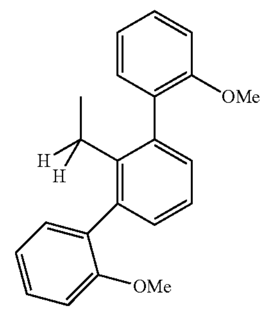
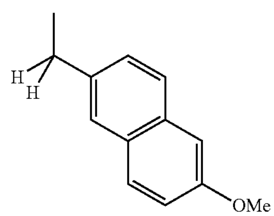
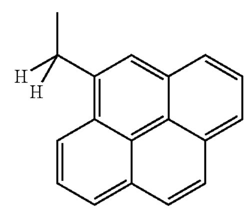
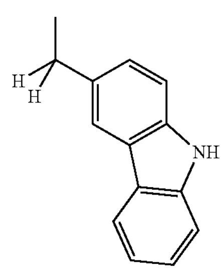
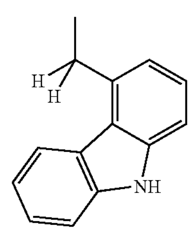
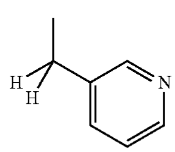
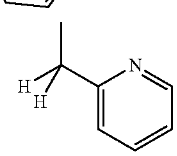
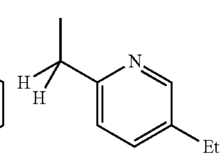

9
-continued
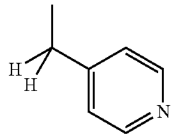
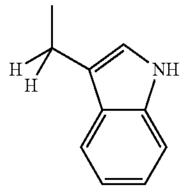
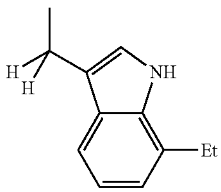
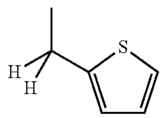
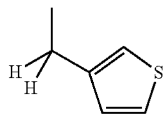
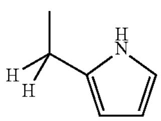
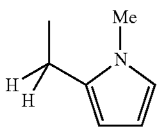
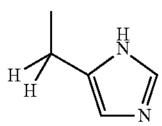
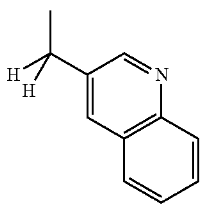
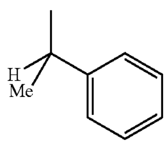
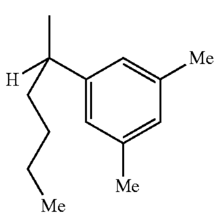
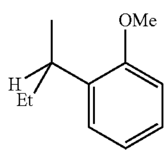
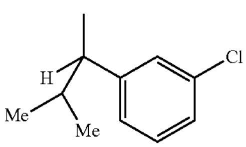
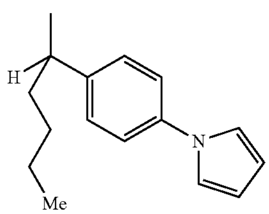
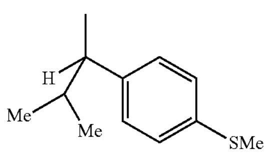
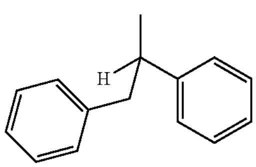
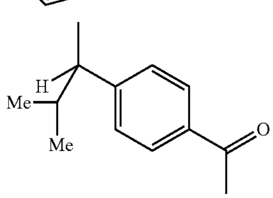
10
-continued
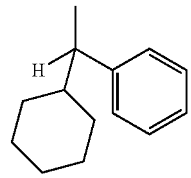
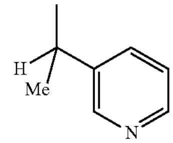
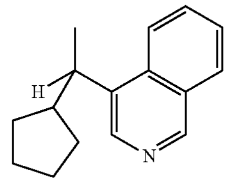
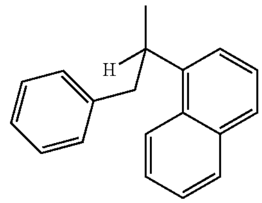
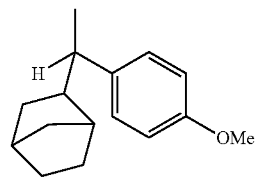
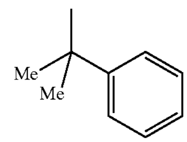
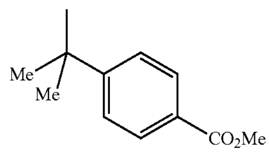
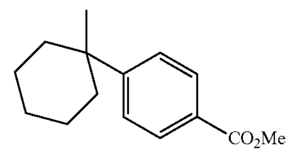
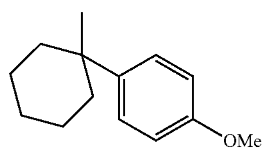
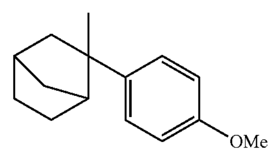
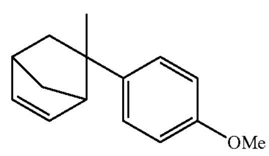
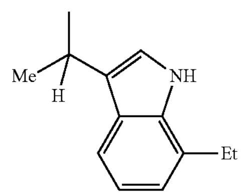
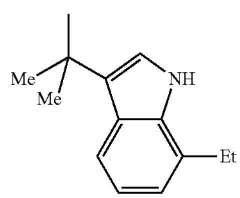
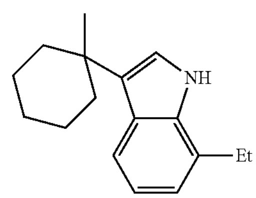
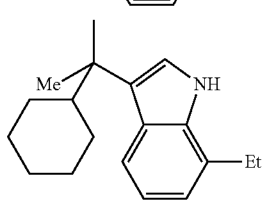
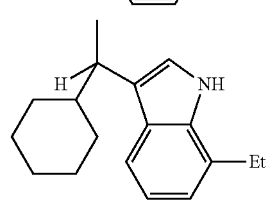
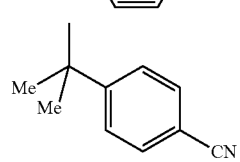
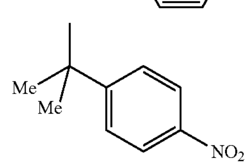

-continued

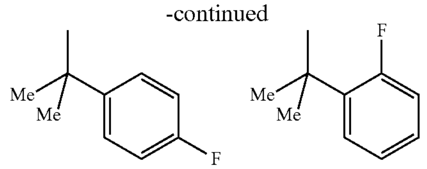

The divalent linking group represented by $M^{11}$ is, for example, an alkylene group (preferably an alkylene group having 1 to 8 carbon atoms, for example, a methylene group, an ethylene group, a propylene group, a butylene group, a hexylene group, or an octylene group), a cycloalkylene group (preferably a cycloalkylene group having 3 to 15 carbon atoms, for example, a cyclopentylene group or a cyclohexylene group), —S—, —O—, —CO—, —CS—, —$SO_2$—, —$N(R_0)$—, or a combination of two or more of the same. The divalent linking group preferably has 20 or less carbon atoms in total. Herein, $R_0$ is a hydrogen atom or an alkyl group (for example, an alkyl group having 1 to 8 carbon atoms, specifically a methyl group, an ethyl group, a propyl group, an n-butyl group, a sec-butyl group, a hexyl group, an octyl group, and the like).

$M^{11}$ is preferably a single bond, an alkylene group, or a divalent linking group including a combination of an alkylene group with at least one of —O—, —CO—, —CS—, and —$N(R_0)$—, and more preferably a single bond, an alkylene group, or a divalent linking group including a combination of an alkylene group with —O—. Herein, $R_0$ has the same definition as $R_0$ described above.

$M^{11}$ may further have a substituent, and the substituent that $M^{11}$ may further have is the same as the above-described substituent that the alkyl group represented by $R^{11}$ may have.

The alkyl group represented by $Q^{11}$ is the same as, for example, the above-described alkyl group represented by $R^{11}$.

The cycloalkyl group represented by $Q^{11}$ may be monocyclic or polycyclic. The cycloalkyl group preferably has 3 to 10 carbon atoms. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[$6.2.1.1^{3,6}.0^{2,7}$] dodecyl group, an 8-tricyclo[$5.2.1.0^{2,6}$]decyl group, and a 2-bicyclo[2.2.1]heptyl group. Among these, a cyclopentyl group, a cyclohexyl group, a 2-adamantyl group, an 8-tricyclo[$5.2.1.0^{2,6}$]decyl group, and a 2-bicyclo[2.2.1]heptyl group are preferable.

Examples of the aryl group represented by $Q^{11}$ include the above-described aryl groups represented by $R^{11}$. The aryl group preferably has 3 to 18 carbon atoms.

The cycloalkyl group and the aryl group represented by $Q^{11}$ may have a substituent, and examples thereof include an alkyl group, a cycloalkyl group, a cyano group, a halogen atom, a hydroxyl group, an alkoxy group, a carboxyl group, and an alkoxycarbonyl group.

The group represented by -$M^{11}$-$Q^{11}$ contains 3 or more carbon atoms. This is preferable in optimally maintaining deprotection reactivity and in optimally maintaining PEBS. More preferably, the carbon atoms which are included are 3 or more and 20 or less.

In addition, in an embodiment, in the group represented by -$M^{11}$-$Q^{11}$, at least one ring structure is preferable in increasing the resistance to dry etching. The ring structure may be monocyclic or polycyclic and may be any hydrocarbon ring which is aromatic or non-aromatic. Examples of the group which has at least one ring structure include a cycloalkyl group, an alkyl group substituted by a cycloalkyl group, an aralkyl group, an aryloxyalkyl group, and the like. Specifically, examples include a cyclopentyl group, a cyclohexyl group, a cyclohexyl ethyl group, a 2-adamantyl group, an 8-tricyclo[$5.2.1.0^{2,6}$]decyl group, a 2-bicyclo[2.2.1]heptyl group, a benzyl group, a 2-phenethyl group, a 2-phenoxyethyl group, and the like.

In addition, in another embodiment, in the group represented by -$M^{11}$-$Q^{11}$, $M^{11}$ is a single bond, $Q^{11}$ is an alkyl group or a cycloalkyl group, and, the carbon atom of $Q^{11}$ which is directly connected to the oxygen atom in —(O-$M^{11}$-$Q^{11}$) is a secondary carbon or tertiary carbon, and this is preferable in increasing the glass transition temperature of the compound A. Specifically, in a case where the carbon atom is a secondary carbon, examples include an isopropyl group, an isobutyl group, an isopentyl group, a 2-ethylhexyl group, a cyclopentyl group, a cyclohexyl group, a 2-adamantyl group, a 8-tricyclo[$5.2.1.0^{2,6}$]decyl group, a 2-bicyclo[2.2.1]heptyl group, and the like, and in a case where the carbon atom is a tertiary carbon, examples include a tert-butyl group, a tert-amyl group, a 3-methyl-3-pentyl group, a trityl group, a 1-adamantyl group, or the like.

The carbon atom being a secondary carbon is more preferable in increasing the temporal stability of the compound A.

Specific examples of the group represented by -$M^{11}$-$Q^{11}$ will be described below, but the present invention is not limited thereto.

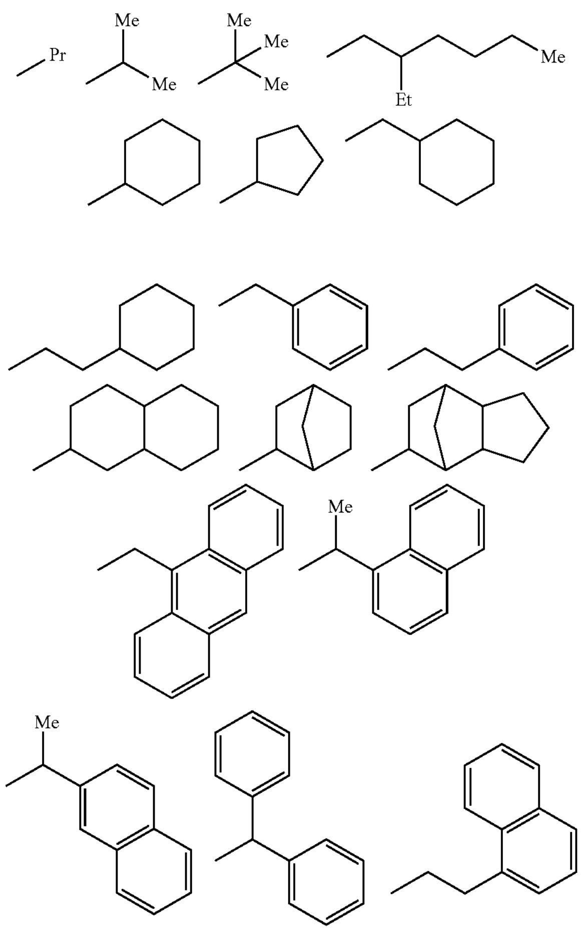

-continued
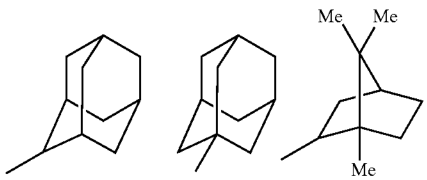
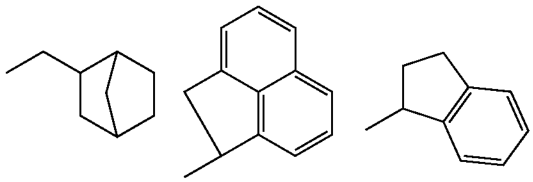
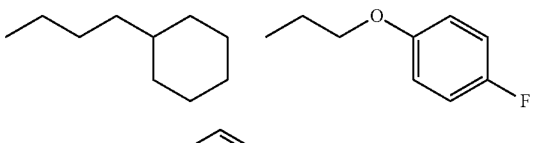
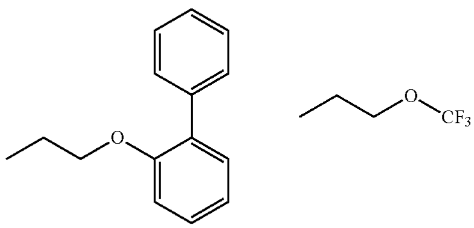
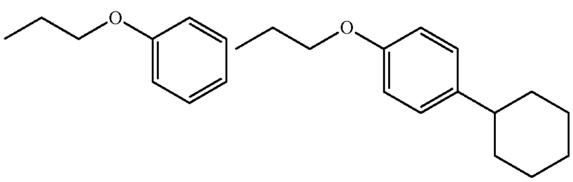
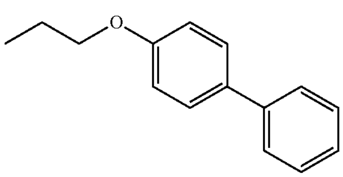
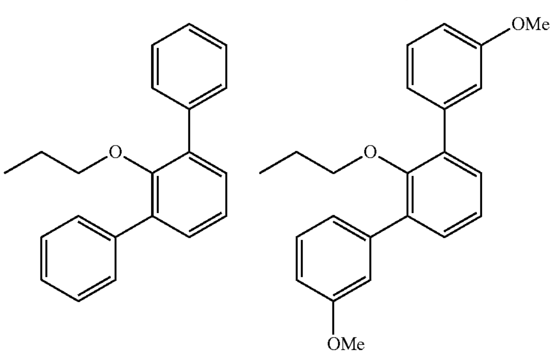
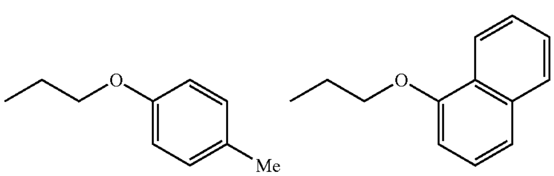
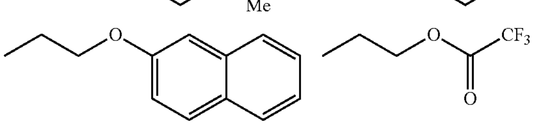
-continued
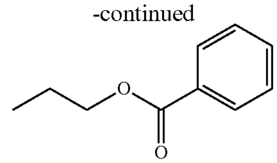
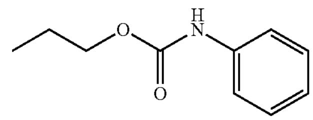
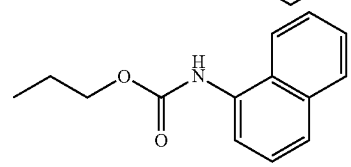
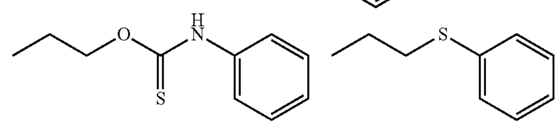
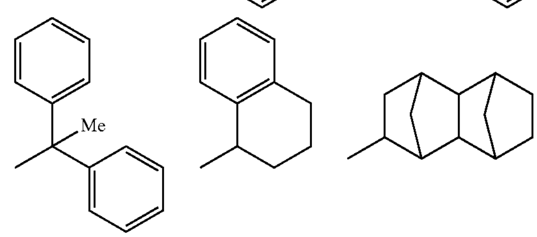
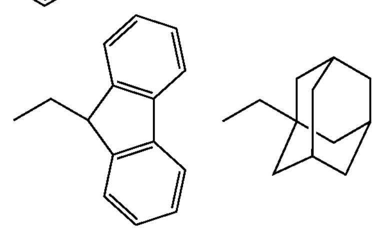
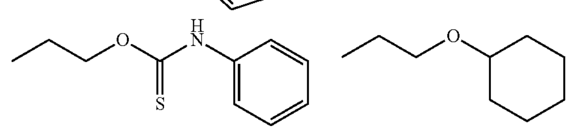
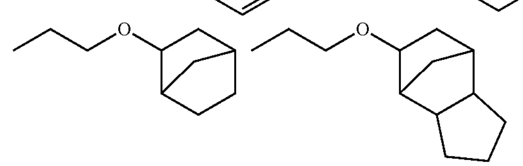
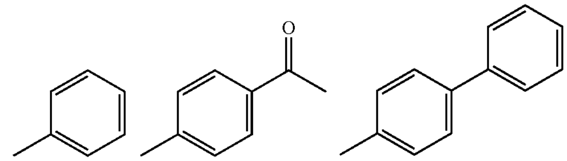
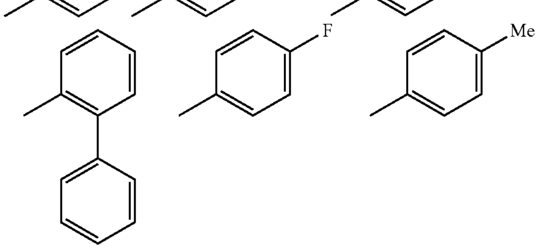
Specific examples of the acid labile group represented by the General Formula (1) include a group which is a combination of the above-mentioned specific examples of the group represented by —$CR^{11}R^{12}X^{11}$ and the specific examples of the group represented by -$M^{11}$-$Q^{11}$ but is not limited thereto.
Preferable examples of the acid labile group represented by General Formula (1) will be described below.
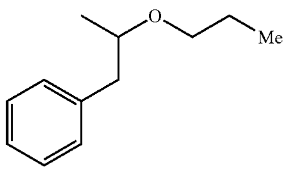
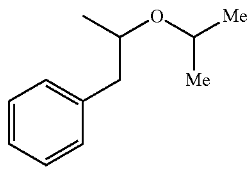
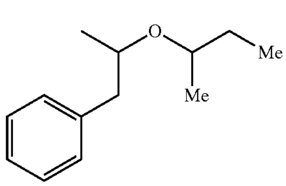
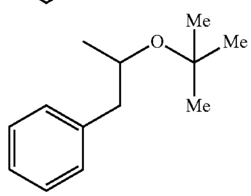
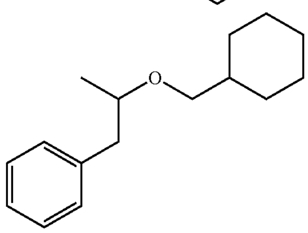
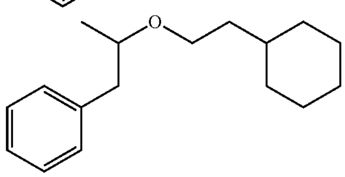
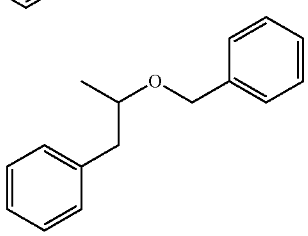
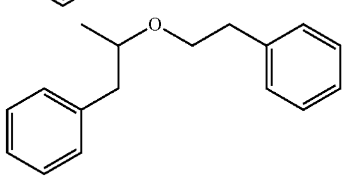
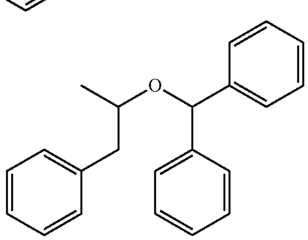
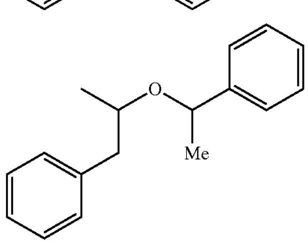
-continued
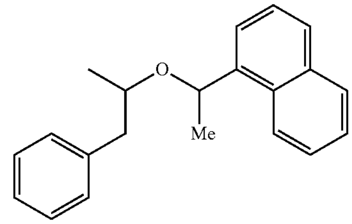
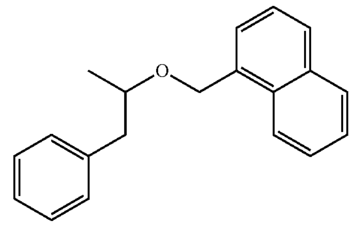
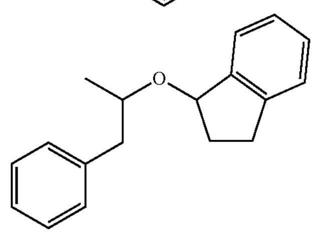
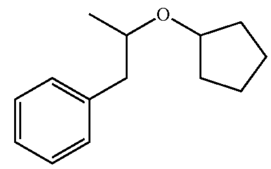
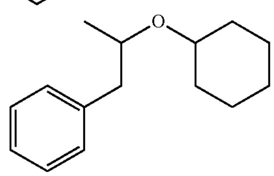
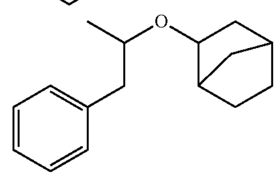
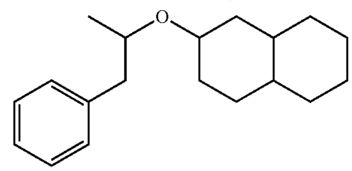
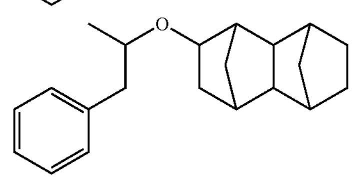
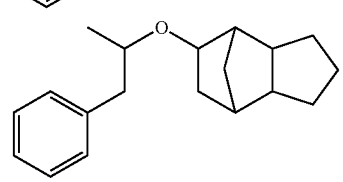
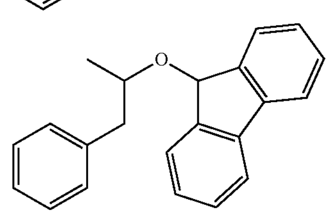
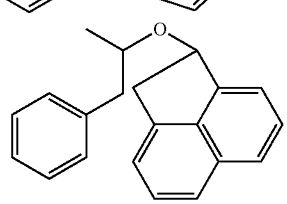

-continued
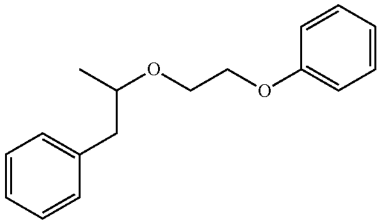
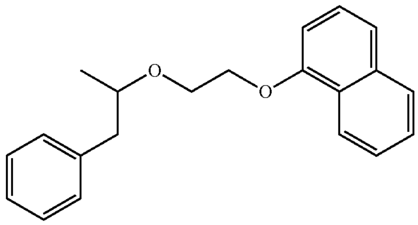
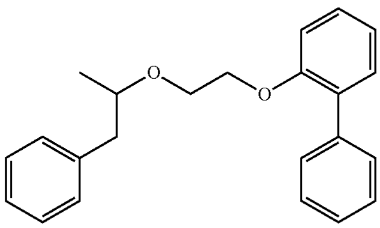
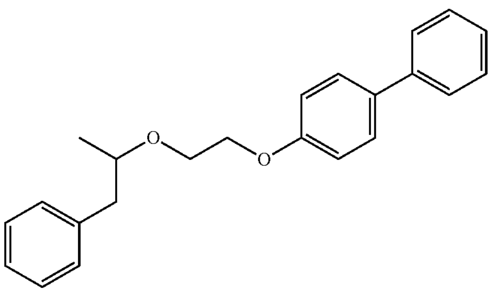
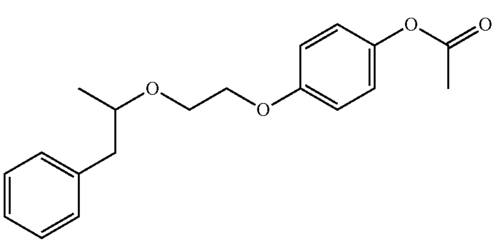
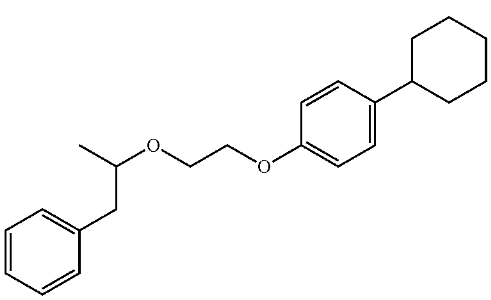
-continued
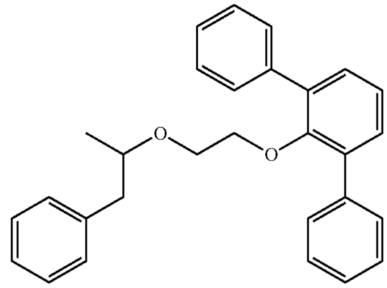
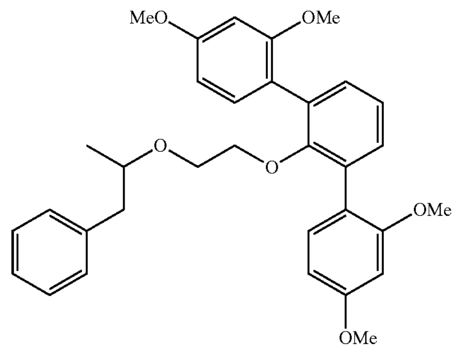
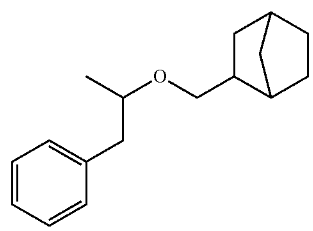
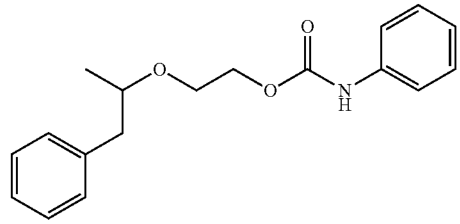
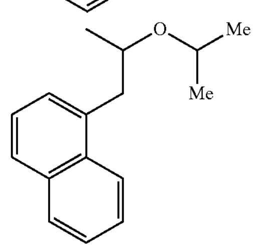
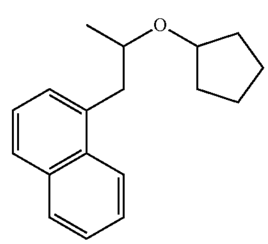
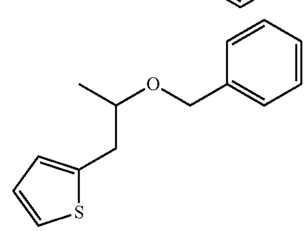

-continued
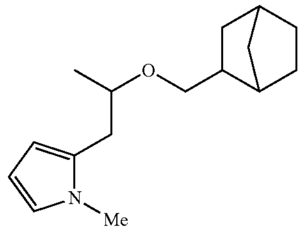
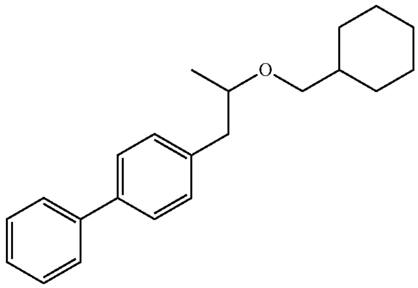
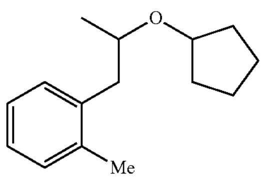
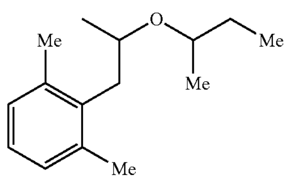
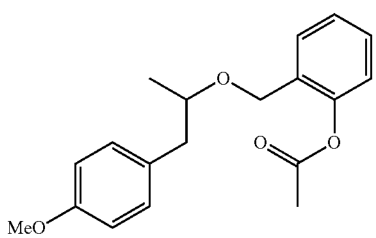
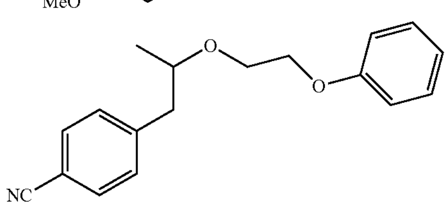
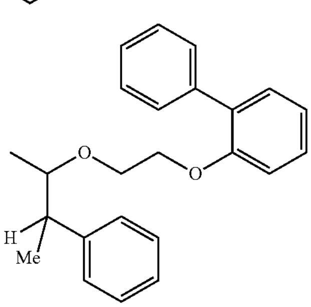
-continued
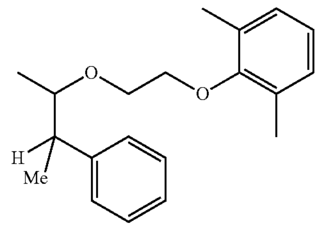
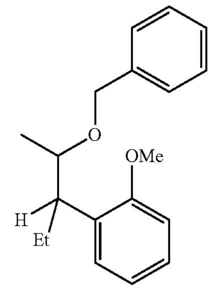
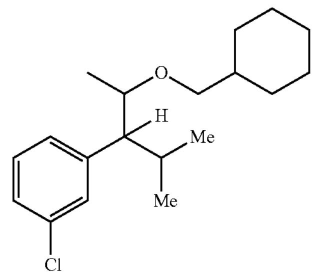
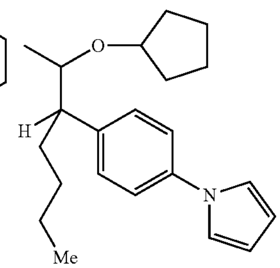
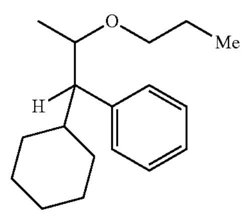
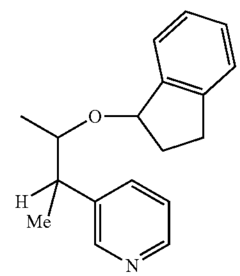
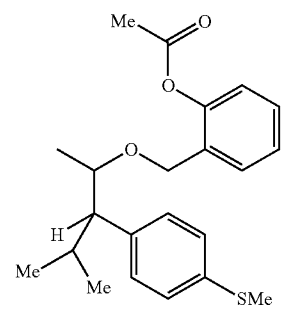
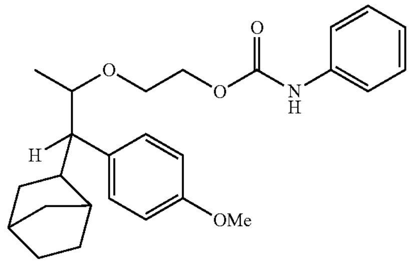
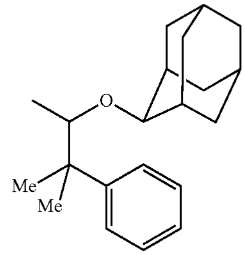
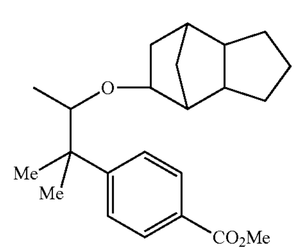

-continued
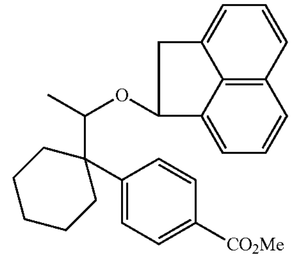
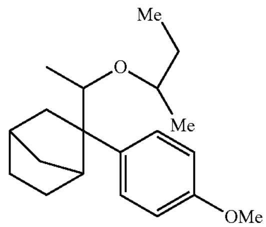
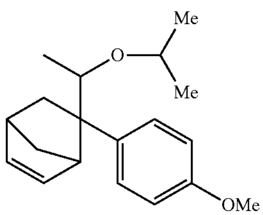
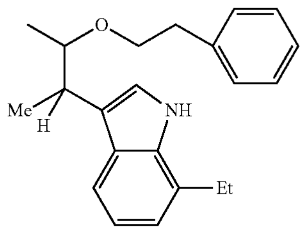
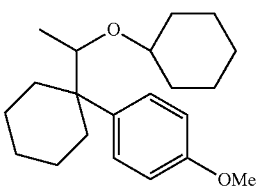
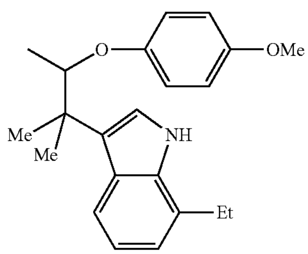
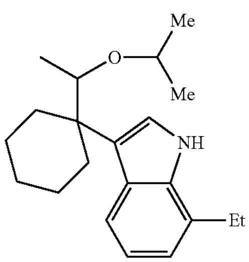
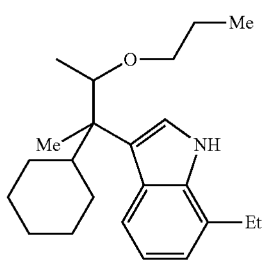
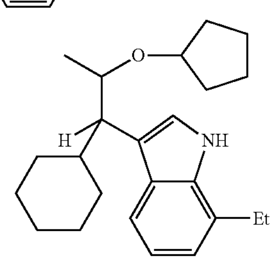
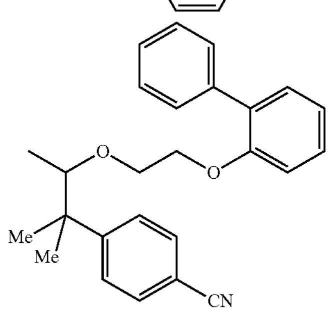
-continued
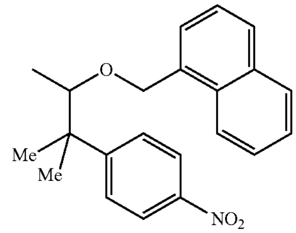
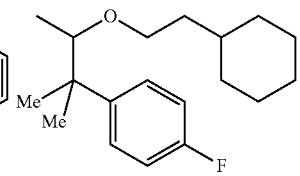
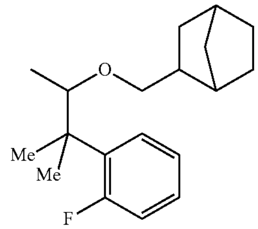
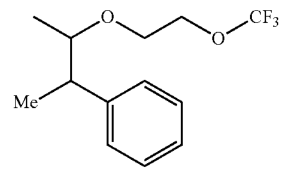
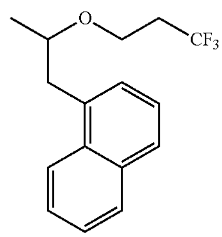
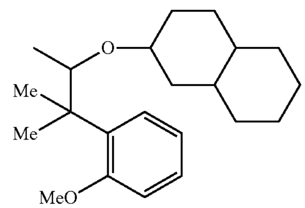
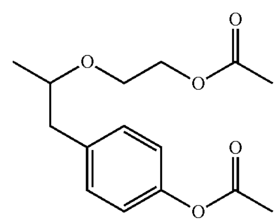
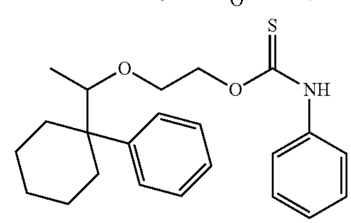
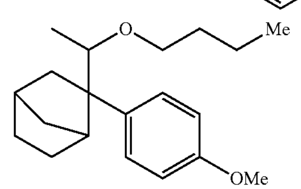
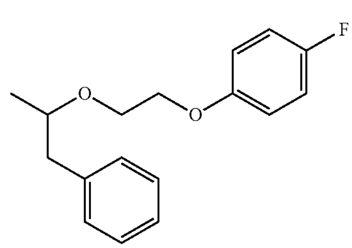
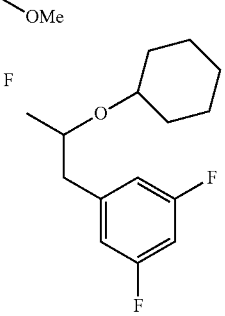

-continued

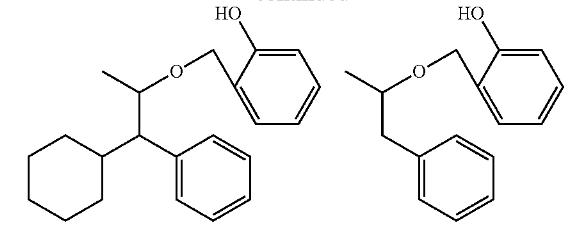

In the acid labile group represented by the General Formula (1), since the carbocation intermediate which is generated in the process of decomposition due to the action of an acid is unstabilized due to the aryl group compared to a typical acid labile group where, for example, all of $R^{11}$, $R^{12}$, and $X^{11}$ are substituted by hydrogen atoms, it is estimated that the activation energy of the acid decomposition reaction is higher.

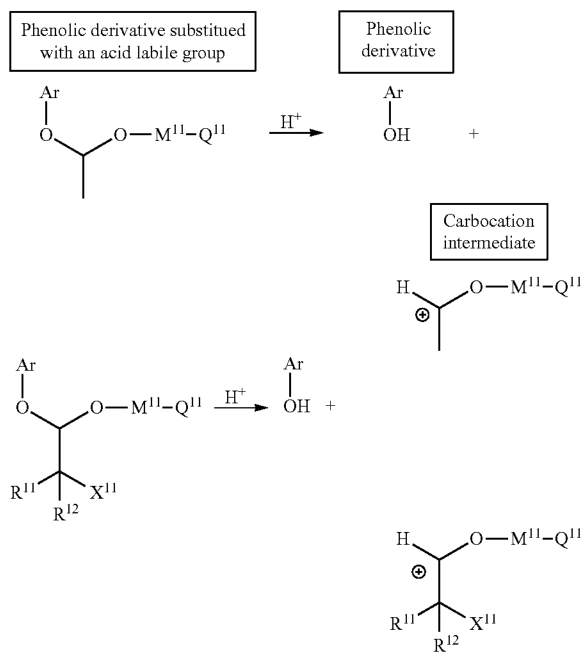

Since $X^{11}$ is an electron withdrawing group, the carbocation intermediate is more unstable If the activation energy is increased, the degradation reaction of the acid labile group caused at a temperature around room temperature is inhibited. Accordingly, the neutralization reaction of the generated acid in a resist film does not compete with the degradation reaction of the acid labile group, whereby the resolution and the roughness characteristics are improved.

In the compound (A) of the present invention, the amount substituted with the acid labile group represented by General Formula (1) preferably ranges from 1 mol % to 60 mol %, more preferably ranges from 2 mol % to 40 mol %, and particularly preferably ranges from 2 mol % to 30 mol %, based on the total phenolic hydroxyl groups.

In an embodiment, the compound (A) may be a polymer compound containing a repeating unit that contains a phenolic hydroxyl group and a repeating unit that contains a group in which a hydrogen atom of a phenolic hydroxyl group has been substituted with the acid labile group represented by General Formula (1). In another embodiment, the compound (A) may be a low-molecular weight compound in which hydrogen atoms of a portion of phenolic hydroxyl groups in a parent compound having a plurality of phenolic hydroxyl groups have been substituted with the acid labile group represented by General Formula (1).

First, a case where the compound (A) is a polymer compound will be described.

As described above, in an embodiment, the compound (A) may be a polymer compound containing a repeating unit that contains a phenolic hydroxyl group and a repeating unit that contains a group in which a hydrogen atom of a phenolic hydroxyl group has been substituted with the acid labile group represented by General Formula (1).

Examples of the repeating unit that contains a phenolic hydroxyl group include repeating units represented by the following General Formula (5) or (6), and among these, the repeating unit represented by General Formula (5) is more preferable.

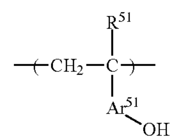

(5)

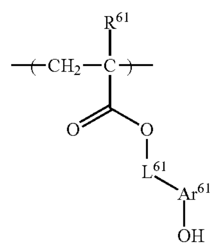

(6)

In General Formulae (5) and (6), each of $R^{51}$ and $R^{61}$ independently represents a hydrogen atom or a methyl group, and each of $Ar^{51}$ and $Ar^{61}$ independently represents an arylene group. $L^{61}$ represents a single bond or an alkylene group.

$R^{51}$ is more preferably a hydrogen atom, and $R^{61}$ is more preferably a methyl group.

The arylene group represented by $Ar^{51}$ and $Ar^{61}$ may have a substituent. The arylene group is preferably an arylene group having 6 to 18 carbon atoms that may have a substituent, even more preferably a phenylene group or a naphthylene group that may have a substituent, and most preferably a phenylene group that may have a substituent. Examples of the substituent that these groups may have include an alkyl group, a halogen atom, a hydroxyl group, an alkoxy group, a carboxyl group, and an alkoxycarbonyl group.

As described above, $L^{61}$ represents a single bond or an alkylene group. The alkylene group preferably has 1 to 8 carbon atoms, and more preferably has 1 to 4 carbon atoms. Examples of the alkylene group include a methylene group, an ethylene group, a propylene group, a butylene group, a hexylene group, and an octylene group, and among these, a methylene group and an ethylene group are particularly preferable.

Specific examples of the repeating unit represented by General Formula (5) will be described, but the present invention is not limited thereto.

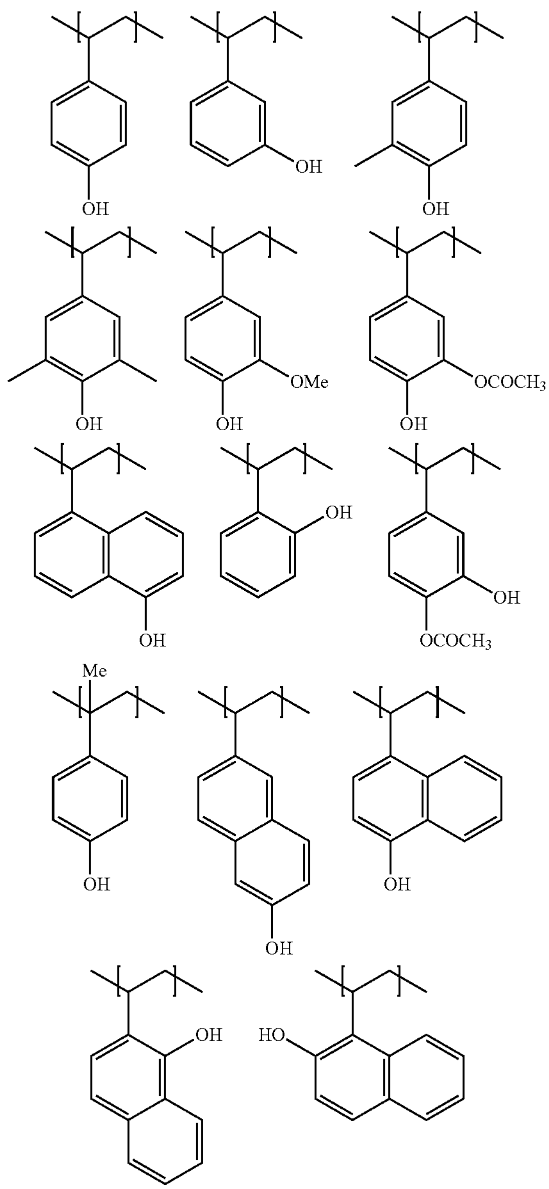

Specific examples of the repeating unit represented by General Formula (6) will be described, but the present invention is not limited thereto.

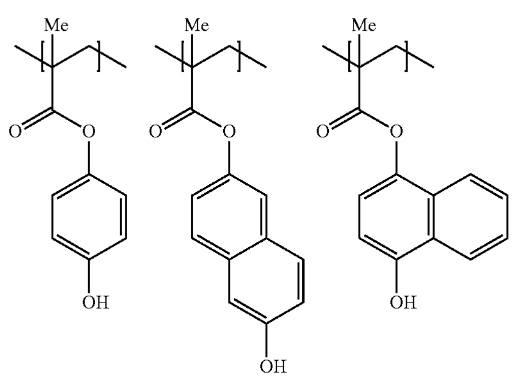

-continued

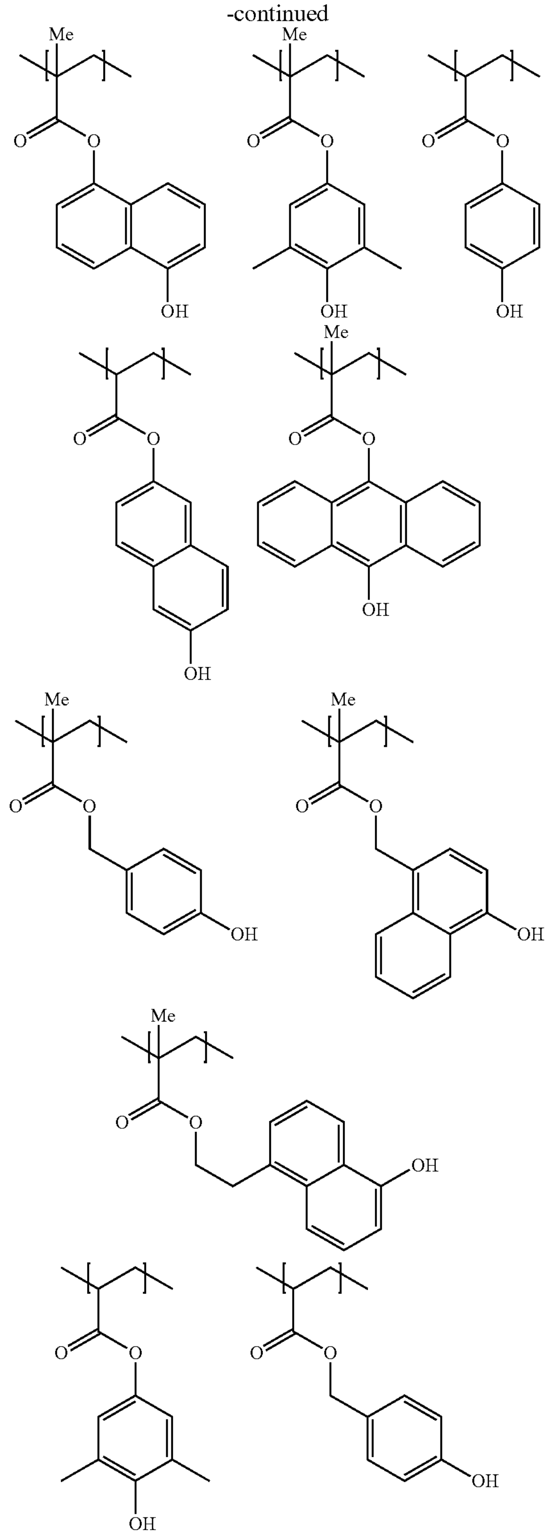

Examples of the repeating unit having a group in which a hydrogen atom of a phenolic hydroxyl group has been substituted with the acid labile group represented by General Formula (1) include repeating units represented by the following General Formula (2) or (7), and among these, the repeating unit represented by General Formula (2) is more preferable.

(2)

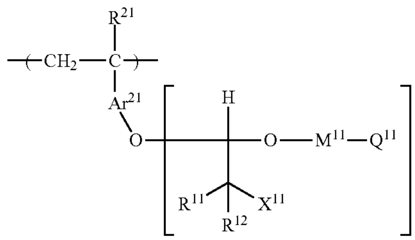

(7)

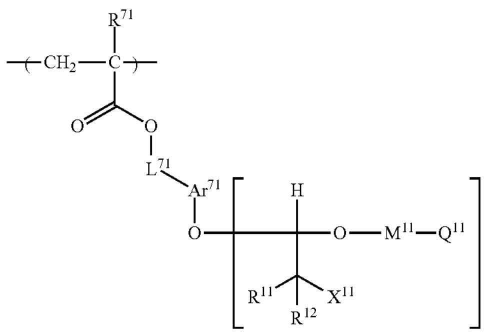

In General Formulae (2) and (7), each of $R^{21}$ and $R^{71}$ independently represents a hydrogen atom or a methyl group;

each of $Ar^{21}$ and $Ar^{71}$ independently represents an arylene group; and $L^{71}$ represents a single bond or an alkylene group;

each of $R^{11}$ and $R^{12}$ independently represents a hydrogen atom, an alkyl group, a cycloalkyl group, an aryl group, or an aralkyl group;

$X^{11}$ represents an aryl group;

$M^{11}$ represents a single bond or a divalent linking group; and $Q^{11}$ represents an alkyl group, a cycloalkyl group or an aryl group.

Here, the number of carbon atoms which are included in the group represented by $-M^{11}-Q^{11}$ is 3 or more.

In addition, at least two of $R^{11}$, $R^{12}$, $Q^{11}$, and $X^{11}$ may form a ring by bonding to each other.

$R^{21}$ is more preferably a hydrogen atom, and $R^{71}$ is more preferably a methyl group The arylene group represented by $Ar^{21}$ and $Ar^{71}$ may have a substituent, and specific examples thereof include the same groups as $Ar^{51}$ and $Ar^{61}$ in the General Formulae (5) and (6). $^{71}$ include the same groups as $L^{51}$ and $L^{61}$ in the General Formula (6).

$R^{11}$, $R^{12}$, $X^{11}$, $M^{11}$, and $Q^{11}$ are the same respective groups in the General Formula (1) described above.

Specific examples of the repeating unit represented by General Formulae (2) and (7) include groups in which a hydrogen atom of the phenolic hydroxyl group in the specific examples of the repeating units represented by General Formulae (5) and (6) described above has been substituted with the specific examples of the acid labile group represented by General Formula (1) described above.

The compound (A) of the present invention may further contain a non-degradable repeating unit represented by the following General Formula (3).

(3)

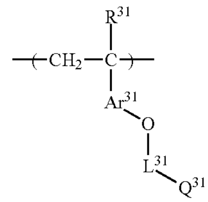

In General Formula (3), $R^{11}$ represents a hydrogen atom or a methyl group;

$Ar^{31}$ represents an arylene group;

$L^{31}$ represents a single bond or a divalent linking group; and $Q^{31}$ represents a cycloalkyl group or an aryl group.

Herein, "non-degradable" means that a chemical bond is not broken by the action of an acid generated by exposure, an alkaline developer, and the like.

As described above, $R^{31}$ represents a hydrogen atom or a methyl group, and more preferably represents a hydrogen atom. As described above, $Ar^{31}$ represents an arylene group, and specific examples and a preferable range thereof are the same as the specific examples and the preferable range of $Ar^{21}$ in the General Formula (2).

Examples of the divalent linking group represented by $L^{31}$ include an alkylene group, an alkenylene group, —O—, —CO—, —$NR^{32}$—, —S—, —CS—, and a combination of the same. Herein, $R^{32}$ represents a hydrogen atom, an alkyl group, a cycloalkyl group, an aryl group, or an aralkyl group. The divalent linking group represented by $L^{31}$ preferably has 1 to 15 carbon atoms in total, and more preferably has 1 to 10 carbon atoms in total.

The above alkylene group preferably has 1 to 8 carbon atoms, and more preferably has 1 to 4 carbon atoms. Examples of the alkylene group include a methylene group, an ethylene group, a propylene group, a butylene group, a hexylene group, and an octylene group.

The above alkenylene group preferably has 2 to 8 carbon atoms, and more preferably has 2 to 4 carbon atoms.

Specific examples and preferable ranges of the alkyl group, the cycloalkyl group, the aryl group, and the aralkyl group represented by $R^{32}$ are the same as the specific examples and the preferable ranges of the alkyl group, the cycloalkyl group, the aryl group, and the aralkyl group represented by $R^{11}$ in the General Formula (1).

The group represented by $L^{31}$ is preferably a carbonyl group, a methylene group, *—CO—$NR^{32}$—, *—CO—$(CH_2)_n$—O—, *—CO—$(CH_2)_n$—O—CO—, *—$(CH_2)_n$—COO—, *—$(CH_2)_n$—$CONR^{32}$—, or *—CO—$(CH_2)_n$—$NR^{32}$—, particularly preferably a carbonyl group, a methylene group, *—CO—$NR^{32}$—, *—$CH_2$—COO—, *—CO—$CH_2$—O—, *—CO—$CH_2$—O—CO—, *—$CH_2$—$CONR^{32}$—, or *—CO—$CH_2$—$NR^{32}$—, and most preferably a carbonyl group, a methylene group, *—CO—$NR^{32}$—, or *—$CH_2$—COO—. Herein, the n represents an integer from 1 to 10, and * represents a linking moiety of a main chain, that is, a moiety linked to an O atom in the formula.

As described above, $Q^{31}$ represents a cycloalkyl group or an aryl group, and specific examples and a preferable range thereof are the same as the specific examples and the preferable range of $Q^{11}$ in the General Formula (1).

-continued
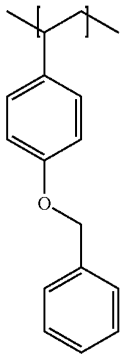
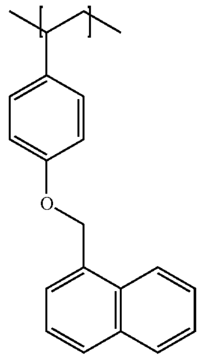
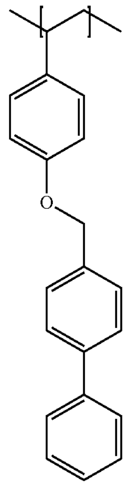
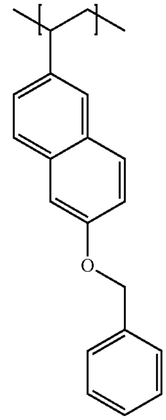
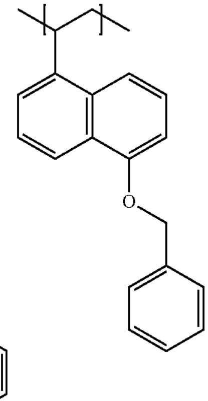
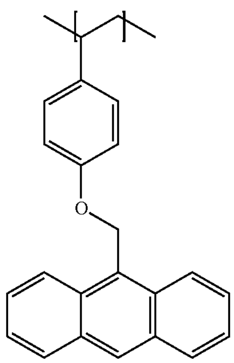
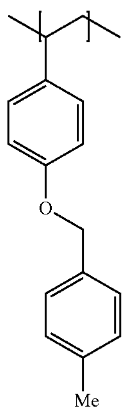
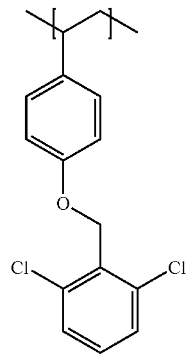
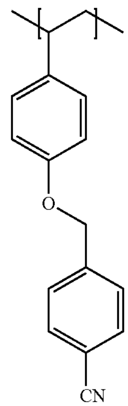
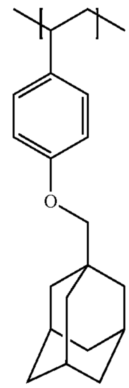
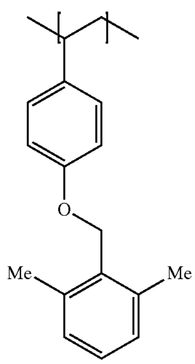
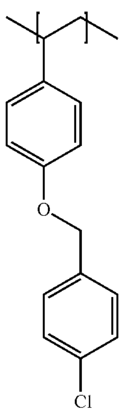
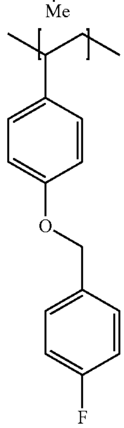
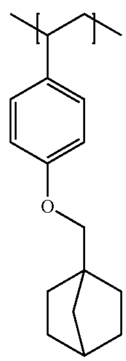
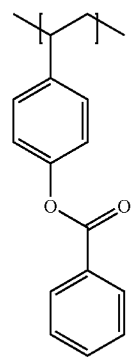
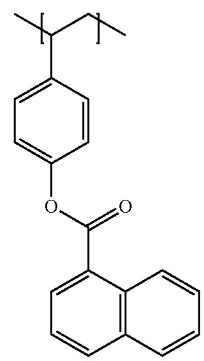
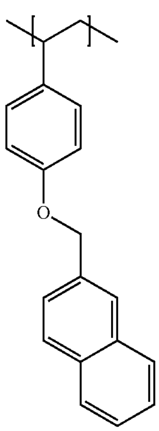
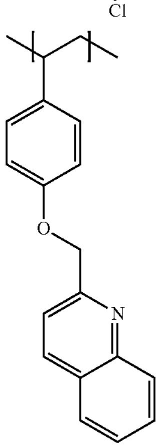
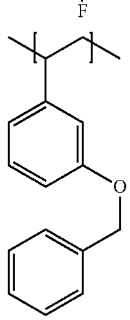
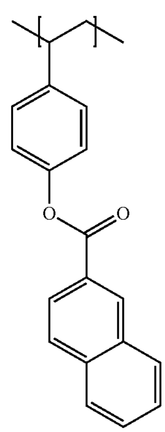
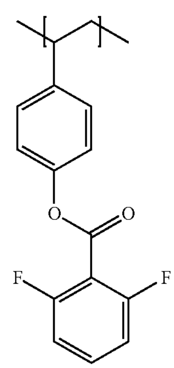
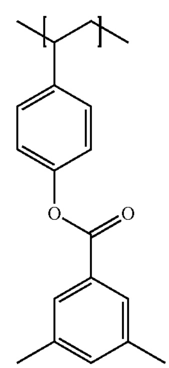

-continued

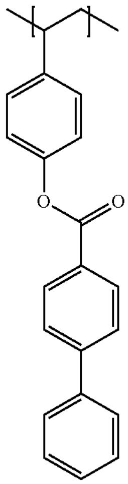
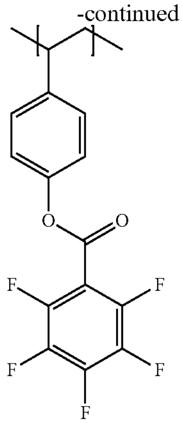
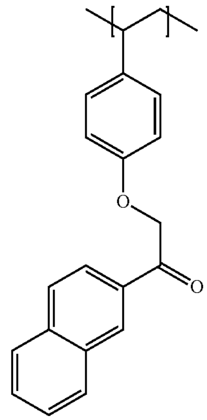
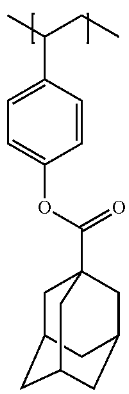
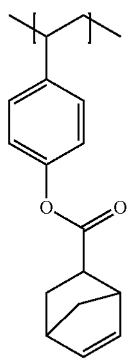
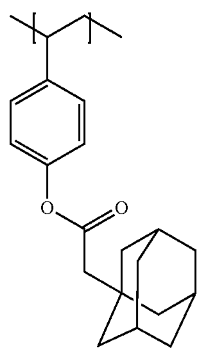
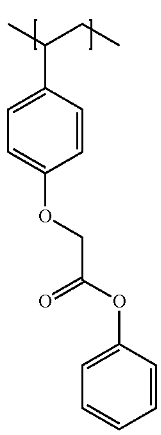
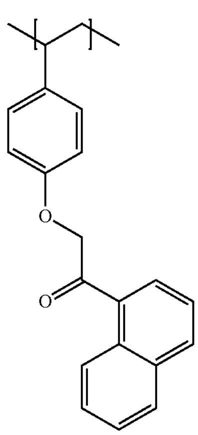
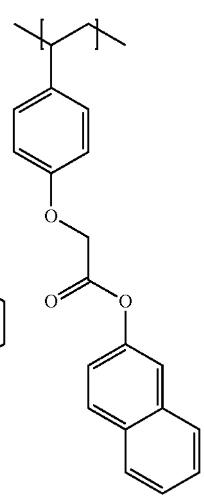

-continued

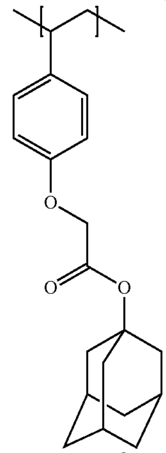
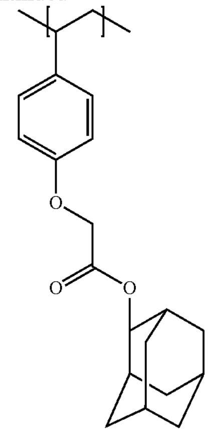
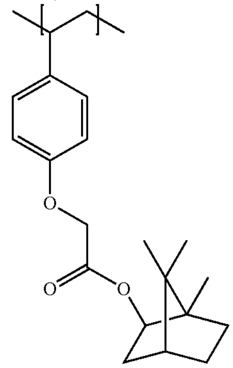

When the mother nucleus is a polymer compound, the content of the repeating units represented by General Formula (3) in the compound (A) of the present invention preferably ranges from 1 mol % to 30 mol %, more preferably ranges from 2 mol % to 20 mol %, and particularly preferably ranges from 2 mol % to 10 mol %, based on the total repeating units of the compound (A).

The compound (A) of the present invention may further contain a repeating unit represented by the following General Formula (4).

(4)

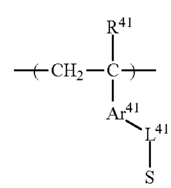

$R^{41}$ represents a hydrogen atom or a methyl group; $Ar^{41}$ represents an arylene group; $L^{41}$ represents a single bond or a divalent linking group; and S represents a structural moiety that generates an acid on a side chain by being degraded by actinic ray irradiation or radiation irradiation.

As described above, $R^{41}$ represents a hydrogen atom or a methyl group, and more preferably represents a hydrogen atom. As described above, $Ar^{41}$ represents an arylene group, and specific examples and a preferable range thereof are the same as the specific examples and the preferable range of $Ar^{21}$ in the General Formula (2).

$L^{41}$ represents a single bond or a divalent linking group. When $L^{41}$ is a divalent linking group, examples thereof include an alkylene group, a cycloalkylene group, an arylene group, —O—, —$SO_2$—, —CO—, —N(R)—, —S—, —CS—, and a combination of two or more kinds of the same, and these groups preferably have 20 or less carbon atoms in total. Herein, R represents an aryl group, an alkyl group, or a cycloalkyl group.

When the compound (A) contains the repeating unit represented by General Formula (4), for example, at least one of resolution, roughness characteristics, and EL (Exposure Latitude) is further improved.

Preferable examples of the alkylene group represented by $L^{41}$ include a methylene group, an ethylene group, a propylene group, a butylene group, a hexylene group, an octylene group, a dodecanylene group, and the like having 1 to 12 carbon atoms.

Preferable examples of the cycloalkylene group represented by $L^{41}$ include a cyclopentylene group, a cyclohexylene group, and the like having 5 to 8 carbon atoms.

Preferable examples of the arylene group represented by $L^{41}$ include a phenylene group, a naphthylene group, and the like having 6 to 14 carbon atoms.

This alkylene group, cycloalkylene group, and arylene group may further have a substituent. Examples of the substituent include an alkyl group, a cycloalkyl group, an aryl group, an amino group, an amide group, a ureide group, a urethane group, a hydroxy group, a carboxy group, a halogen atom, an alkoxy group, a thioether group, an acyl group, an acyloxy group, an alkoxycarbonyl group, a cyano group, and a nitro group.

S represents a structural moiety that generates an acid on a side chain by being degraded with actinic ray irradiation or radiation irradiation. S is preferably a structural moiety that generates an acid anion on a side chain of the compound (A) by being degraded with actinic ray irradiation or radiation irradiation. More preferably, S is, for example, a structural moiety of a photoinitiator of cationic photopolymerization, a photoinitiator of radical photopolymerization, a photodecolorant of dyes, a photodiscoloring agent, or a known compound that is used for a micro resist or the like and generates an acid due to light. The structural moiety is more preferably an ionic structural moiety.

S is more preferably an ionic structural moiety that contains a sulfonium salt or an iodonium salt. More specifically, S is preferably a group represented by the following General Formula (PZI) or (PZII).

(PZI)

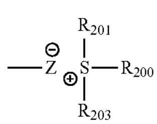

(PZII)

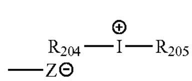

In the General Formula (PZI), each of $R_{201}$ to $R_{203}$ independently represents an organic group; and the organic group represented by $R_{201}$ to $R_{203}$ generally has 1 to 30 carbon atoms, and preferably has 1 to 20 carbon atoms.

Two of $R_{201}$ to $R_{203}$ may form a ring structure by binding to each other, and an oxygen atom, a sulfur atom, an ester bond, an amide bond, or a carbonyl group may be included in the ring. Examples of the group that two of $R_{201}$ to $R_{203}$ form by binding to each other include an alkylene group (for example, a butylene group or a pentylene group). It is preferable to use the repeating unit in which a ring, structure is formed by two of $R_{201}$ to $R_{203}$ binding to each other since it is expected that the exposing machine can be prevented from being contaminated with degradation products during exposure.

$Z^-$ represents an acid anion generated by the degradation caused by actinic ray irradiation or radiation irradiation, and is preferably a non-nucleophilic anion. Examples of the non-nucleophilic anion include a sulfonic acid anion, a carboxylic acid anion, a sulfonylimide anion, a bis(alkylsulfonyl)imide anion, a tris(alkylsulfonyl)methyl anion, and the like.

The non-nucleophilic anion is an anion with a very low ability for causing a nucleophilic reaction, which is an anion that can inhibit temporal degradation caused by an intramolecular nucleophilic reaction. Due to this property, the temporal stability of the resin is improved, and the temporal stability of the composition is also improved.

Examples of the organic group represented by $R_{201}$ to $R_{203}$ include an aryl group, an alkyl group, a cycloalkyl group, a cycloalkenyl group, an indolyl group, and the like. Herein, in the cycloalkyl group and the cycloalkenyl group, at least one of the carbon atoms forming a ring may be a carbonyl carbon. $R_{201}$ to $R_{203}$ is an aryl group, and more preferably, all three are aryl groups.

The aryl group in $R_{201}$, $R_{202}$ and $R_{203}$ is preferably a phenyl group or a naphthyl group, and more preferably a phenyl group.

Preferable examples of the alkyl group, the cycloalkyl group, and the cycloalkenyl group in $R_{201}$, $R_{202}$ and $R_{203}$ include a linear or branched alkyl group (for example, a methyl group, an ethyl group, a propyl group, a butyl group, or a pentyl group) having 1 to 10 carbon atoms, a cycloalkyl group (for example, a cyclopentyl group, a cyclohexyl group, or a norbornyl group) having 3 to 10 carbon atoms, and a cycloalkenyl group (for example, a pentadienyl group or a cyclohexenyl group) having 3 to 10 carbon atoms.

The organic groups represented by $R_{201}$, $R_{202}$ and $R_{203}$, such as an aryl group, an alkyl group, a cycloalkyl group, a cycloalkenyl group, and an indolyl group may further have a substituent. Examples of the substituent include a nitro group, a halogen atom such as a fluorine atom, a carboxy group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an arylthio group (preferably having 6 to 14 carbon atoms), a hydroxyalkyl group (preferably having 1 to 15 carbon atoms), an alkylcarbonyl group (preferably having 2 to 15 carbon atoms), a cycloalkylcarbonyl group (preferably having 4 to 15 carbon atoms), an arylcarbonyl group (preferably having 7 to 14 carbon atoms), a cycloalkenyloxy group (preferably having 3 to 15 carbon atoms), a cycloalkenylalkyl group (preferably having 4 to 20 carbon atoms), and the like, but the present invention is not limited thereto.

In the cycloalkyl group and the cycloalkenyl group as the substituent that the respective groups of $R_{201}$, $R_{202}$ and $R_{203}$ may have, at least one of carbon atoms forming a ring may be a carbonyl carbon.

The substituent that the respective groups of $R_{201}$, $R_{202}$ and $R_{203}$ may have may further have a substituent. Examples of substituents that the substituent may further have include the same ones as the above-described examples of the substituent that the respective groups of $R_{201}$, $R_{202}$ and $R_{203}$ may have, and among the examples, an alkyl group and a cycloalkyl group are preferable.

When at least one of $R_{201}$ to $R_{203}$ is not an aryl group, examples of preferable structures include cationic structures of compounds exemplified as Formulae (I-1) to (1-70) in Paragraphs 0046 and 0047 of JP2004-233661A, Paragraphs 0040 to 0046 of JP2003-35948A, and compounds exemplified as Formulae (I-1) to (1-70) in US2003/0224288A, compounds exemplified as Formulae (IA-1) to (IA-54) and Formulae (IB-1) to (IB-24) in US2003/0077540A, and the like.

In the General Formula (PZII), each of $R_{204}$ and $R_{205}$ independently represents an aryl group, an alkyl group, or a cycloalkyl group. This aryl group, alkyl group, and cycloalkyl group are the same as the aryl group described as the aryl group, the alkyl group, and the cycloalkyl group of $R_{201}$ to $R_{203}$ in the compound (PZI).

The aryl group represented by $R_{204}$ and $R_{205}$ may be an aryl group having a heterocyclic structure that contains an oxygen atom, a nitrogen atom, a sulfur atom, or the like. Examples of the aryl group having a heterocyclic structure include a pyrrole residue (a group formed when pyrrole loses one hydrogen atom), a furan residue (a group formed when furan loses one hydrogen atom), a thiophene residue (a group formed when thiophene loses one hydrogen atom), an indole residue (a group formed when indole loses one hydrogen atom), a benzofuran residue (a group formed when benzofuran loses one hydrogen atom), a benzothiophene residue (a group formed when benzothiophene loses one hydrogen atom), and the like.

The aryl group, the alkyl group, and the cycloalkyl group represented by $R_{204}$ and $R_{205}$ may have a substituent. Examples of the substituent include the substituents that the aryl group, the alkyl group, and the cycloalkyl group represented by $R_{201}$ to $R_{203}$ in the compound (PZI) may have.

$Z^-$ represents an acid anion that is generated by degradation caused by actinic ray irradiation or radiation irradiation. $Z^-$ is preferably a non-nucleophilic anion, and examples thereof are the same as described for $Z^-$ in General Formula (PZI).

Specific preferable examples of S will be described below, but the present invention is not particularly limited thereto. In addition, the symbol * represents a direct link to $L^{41}$.

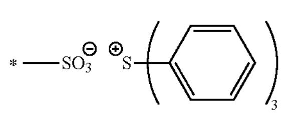

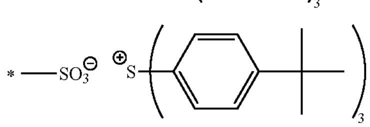

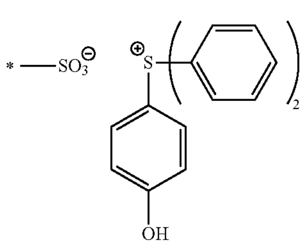

-continued

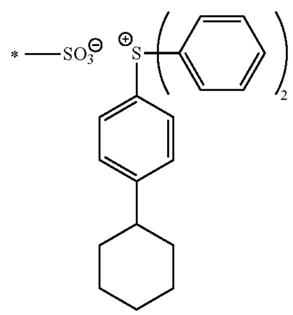

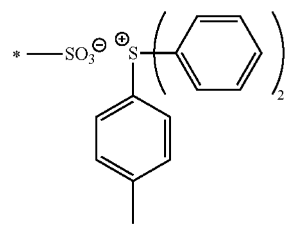

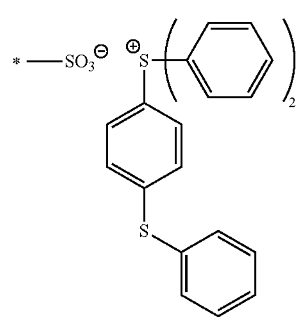

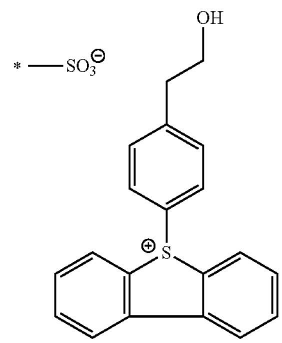

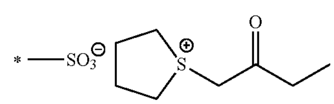

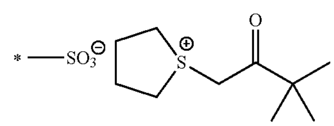

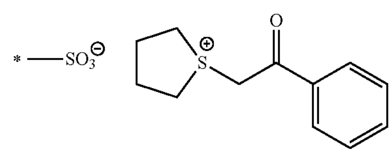

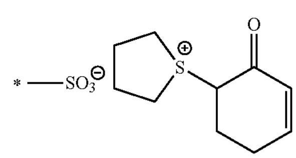

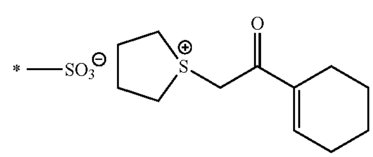

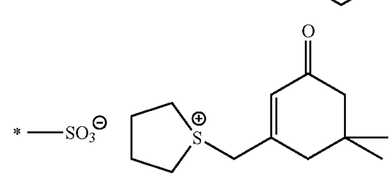

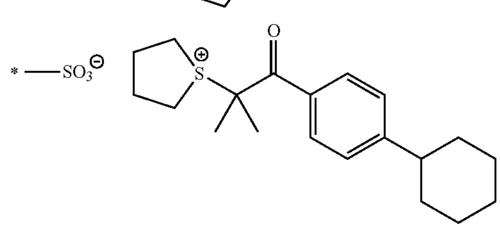

-continued
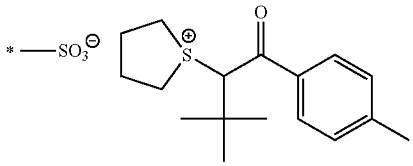
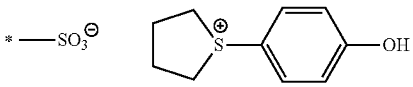
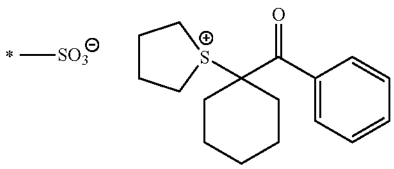
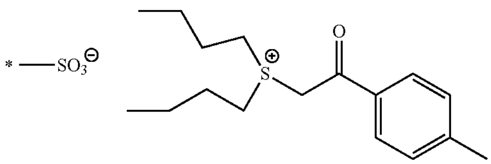
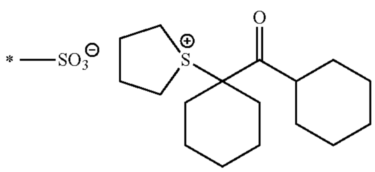
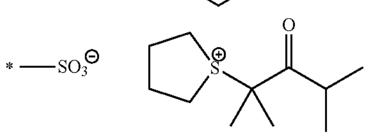
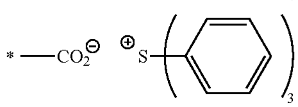
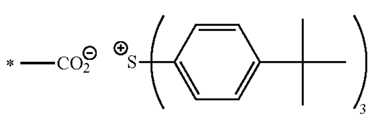
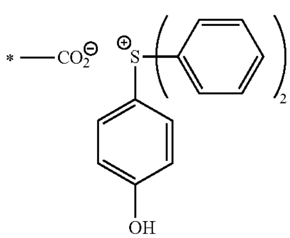
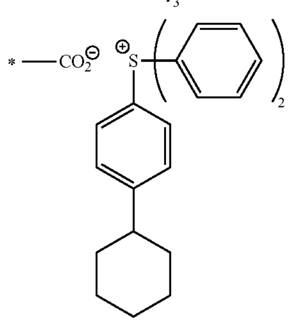
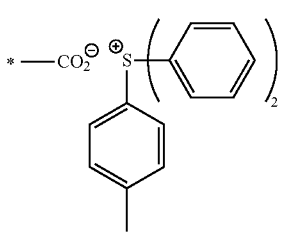
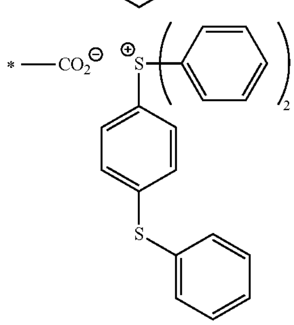
-continued
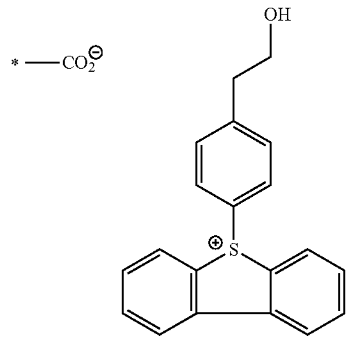
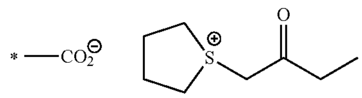
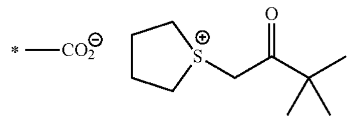
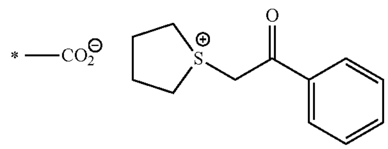
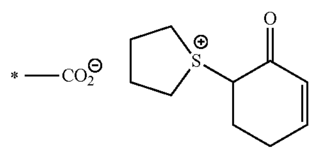
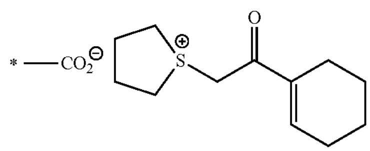
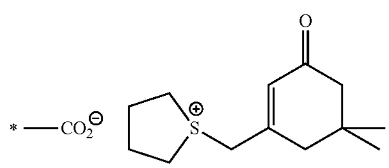
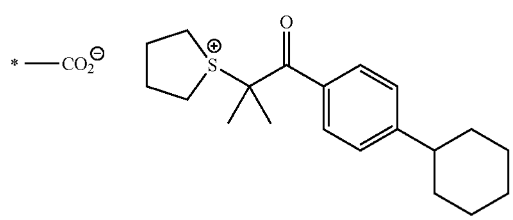
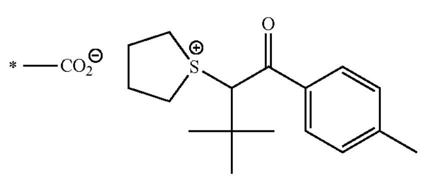
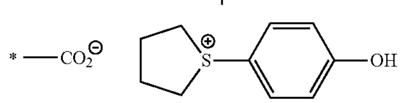

-continued
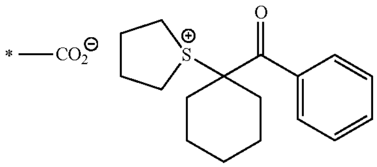
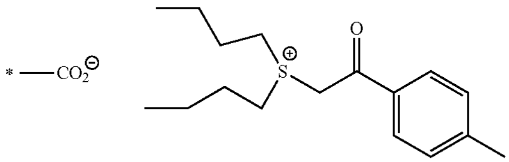
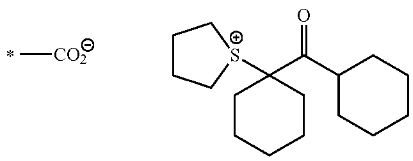
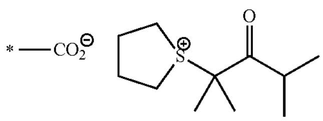
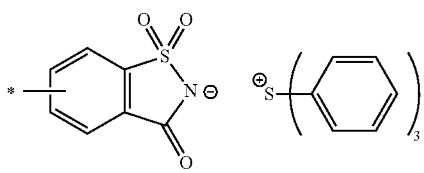
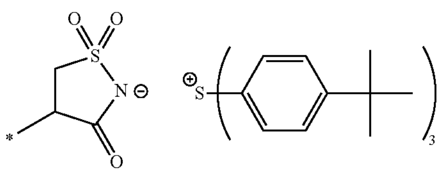
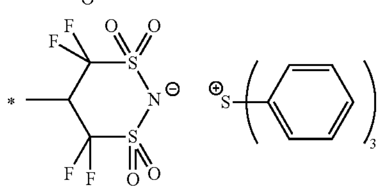
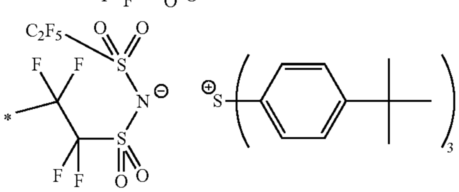
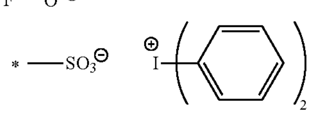
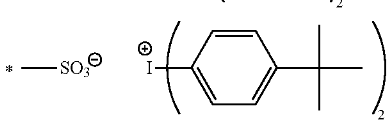
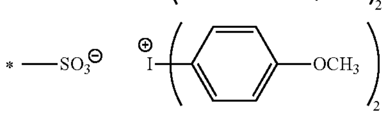
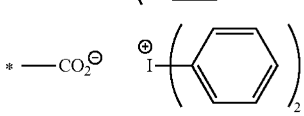
-continued
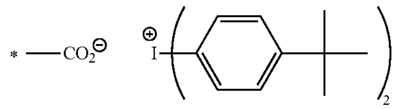
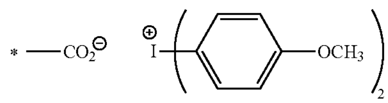
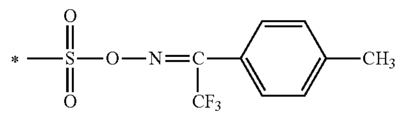
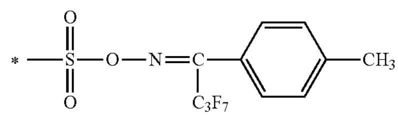
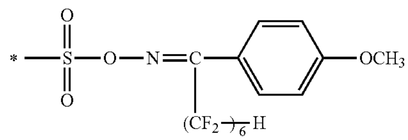
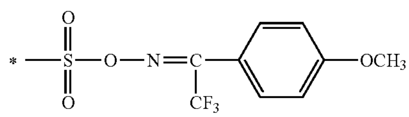
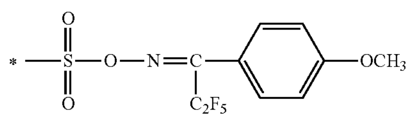
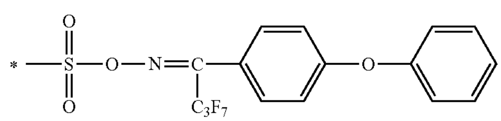
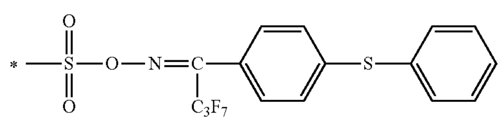
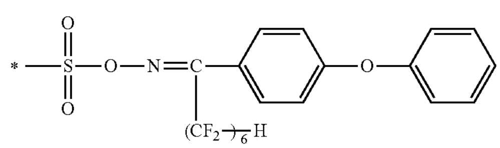
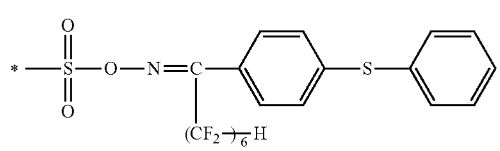
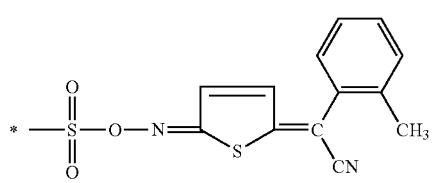
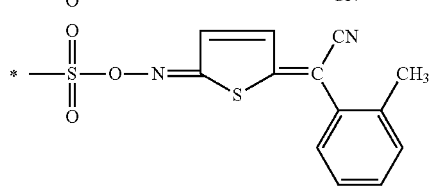

-continued

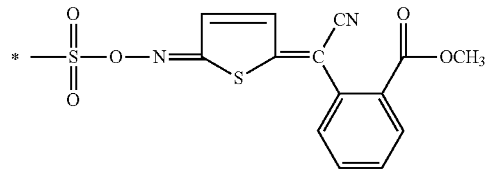

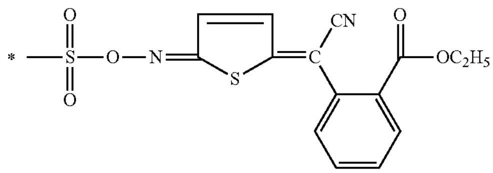

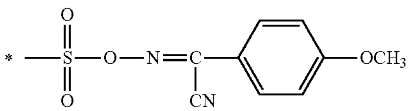

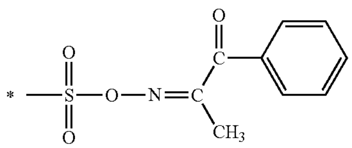

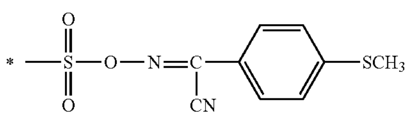

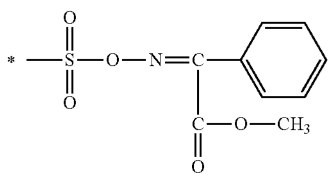

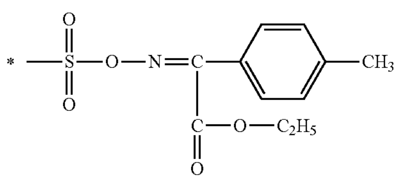

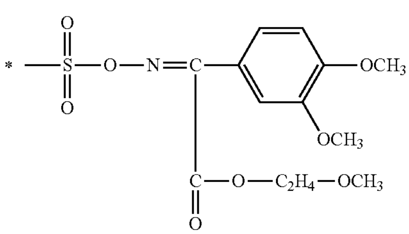

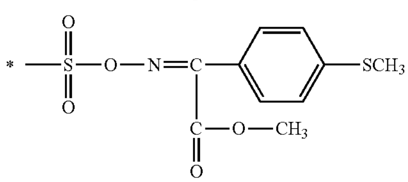

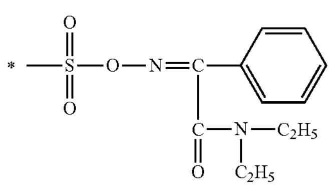

-continued

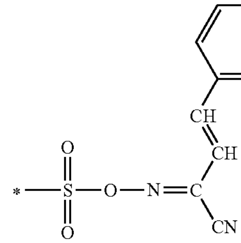

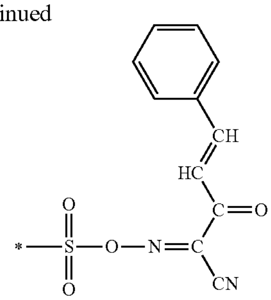

The moiety corresponding to ($-L^{41}$-S) of the repeating unit represented by General Formula (4) is more preferably represented by the following General Formula (6).

(6)

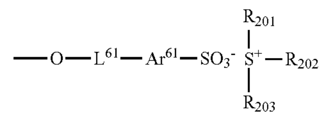

In the formula, $L^{61}$ represents a divalent organic group, and $Ar^{61}$ represents an arylene group.

Examples of the divalent organic group represented by $L^{61}$ include an alkylene group, a cycloalkylene group, —O—, —$SO_2$—, —CO—, —N(R)—, —S—, —CS—, and a combination of the same. Herein, R has the same definition as R in $L^{41}$ of Formula (4). The divalent organic group represented by $L^{61}$ preferably has 1 to 15 carbon atoms in total, and more preferably has 1 to 10 carbon atoms in total.

The alkylene group and the cycloalkylene group represented by $L^{61}$ are the same as the alkylene group and the cycloalkylene group represented by $L^{41}$ of Formula (4), and the preferable examples are also the same.

$L^{61}$ is preferably a carbonyl group, a methylene group, *—CO—$(CH_2)_n$—O—, *—CO—$(CH_2)_n$—O—CO—, *—$(CH_2)_n$—COO—, *—$(CH_2)_n$—CONR—, or *—CO—$(CH_2)_n$—NR—, and particularly preferably a carbonyl group, *—$CH_2$—COO—, *—CO—$CH_2$—O—, *—CO—$CH_2$—O—CO—, *—$CH_2$—CONR—, or *—CO—$CH_2$—NR—. Here, n represents an integer of 1 to 10. n is preferably an integer of 1 to 6, is more preferably an integer of 1 to 3, and most preferably is 1. In addition, * represents a linking moiety of a main chain, that is, a moiety linked to an O atom in the formula.

$Ar^{61}$ represents an arylene group and may have a substituent. Examples of a substituent which $Ar^{61}$ may have include an alkyl group (preferably having 1 to 8 carbon atoms and more preferably having 1 to 4 carbon atoms), an alkoxy group (preferably having 1 to 8 carbon atoms and more preferably having 1 to 4 carbon atoms), and a halogen atom (preferably a fluorine atom, a chlorine atom, a bromine atom, or an iodine atom and more preferably a fluorine atom). An aromatic ring of $Ar^{61}$ may be an aromatic hydrocarbon ring (for example, a benzene ring or a naphthalene ring) or an aromatic heterocycle (for example, a quinoline ring). The aromatic ring preferably has 6 to 18 carbon atoms, and more preferably has 6 to 12 carbon atoms.

$Ar^{61}$ is preferably an unsubstituted arylene group or an arylene group substituted with an alkyl group or a fluorine atom, and more preferably a phenylene group or a naphthylene group.

A method of synthesizing a monomer corresponding to the repeating unit represented by General Formula (4) is not particularly limited. In a case of an onium structure, examples of the method include a method that synthesizes the monomer by exchanging an acid anion having a polymerizable unsaturated bond corresponding to the repeating unit and a halide of a known onium salt.

More specifically, a metal ion salt (for example, a sodium ion, a potassium ion, or the like) or an ammonium salt (ammonium, triethylammonium salt, or the like) of an acid having a polymerizable unsaturated bond corresponding to the repeating unit and an onium salt having a halogen ion (a chloride ion, a bromide ion, an iodide ion, or the like) are stirred in the presence of water or methanol to cause an anion exchange reaction, followed by liquid separation and washing by using an organic solvent such as dichloromethane, chloroform, ethyl acetate, methyl isobutyl ketone, or tetrahydroxyfuran and water, whereby a target monomer corresponding to the repeating unit represented by General Formula (4) can be synthesized.

In addition, the acid anion and the onium salt are stirred in the presence of an organic solvent that can be separated from water, such as dichloromethane, chloroform, ethyl acetate, methyl isobutyl ketone, or tetrahydroxyfuran, and water to cause an anion exchange reaction, followed by liquid separation and washing by using water, whereby the monomer can be synthesized.

The repeating unit represented by General Formula (4) can also be synthesized by introducing an acid anion moiety to a side chain through a polymer reaction and introducing an onium salt through salt exchange.

Specific examples of the repeating unit represented by General Formula (4) will be shown below, but the present invention is not limited thereto.

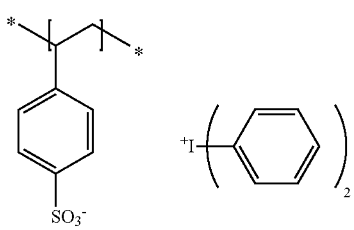

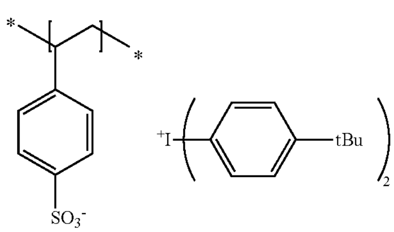

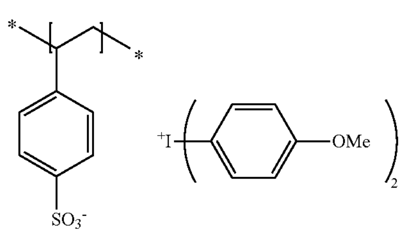

-continued

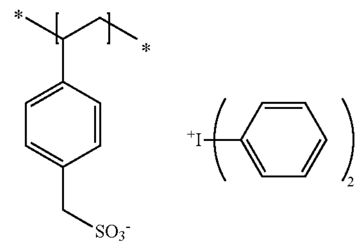

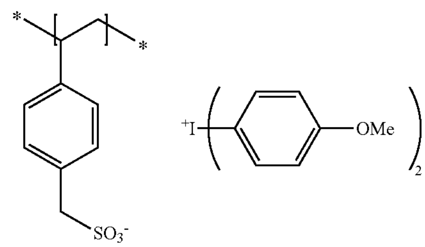

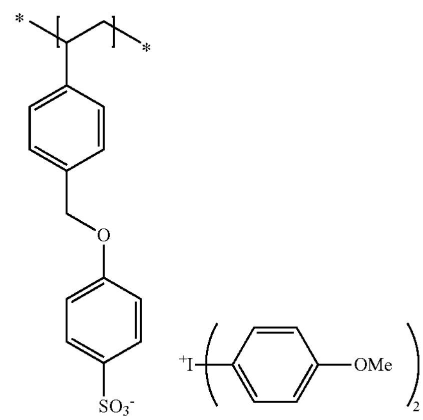

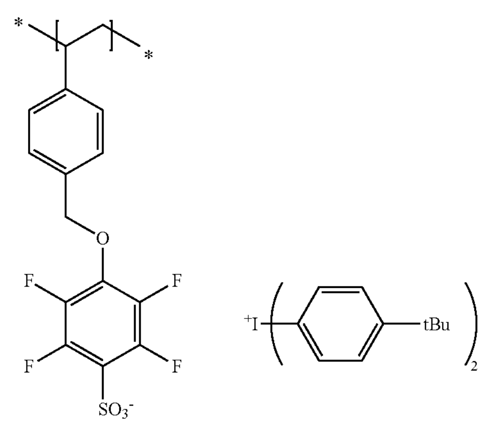

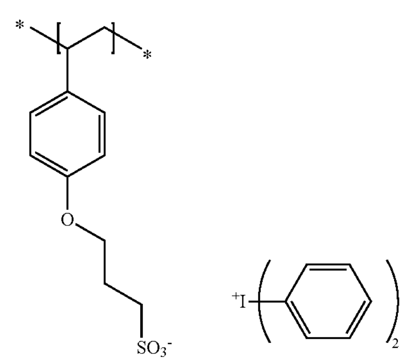

-continued
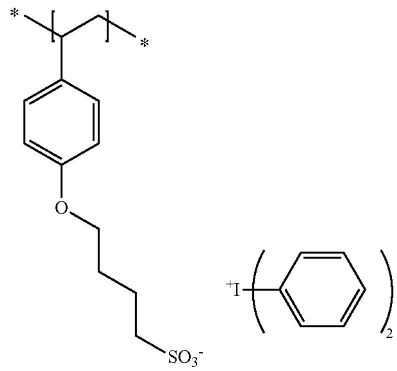
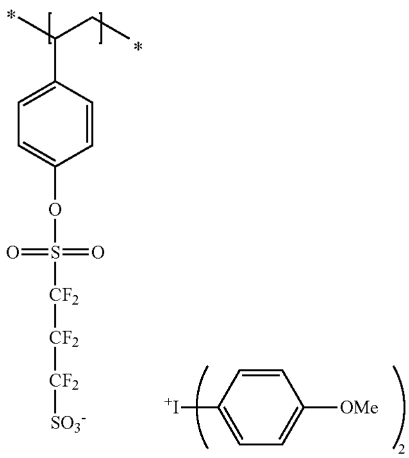
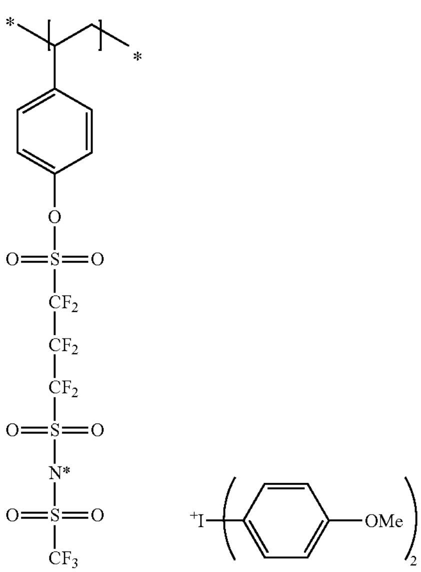
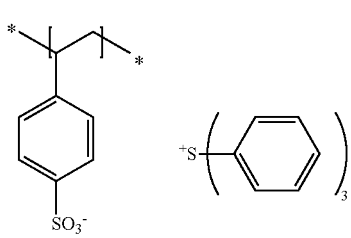
-continued
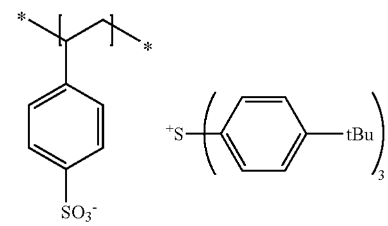
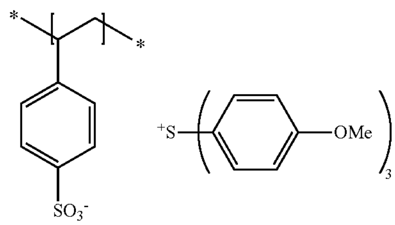
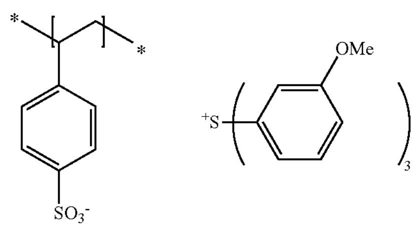
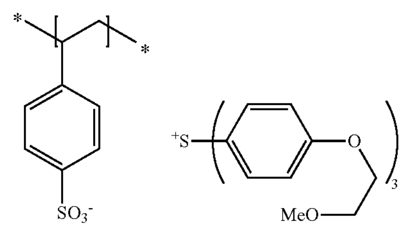
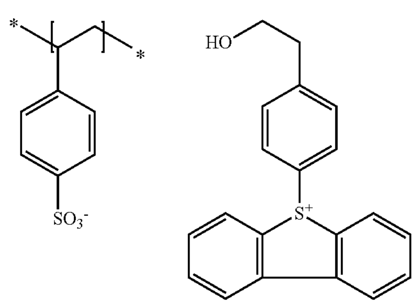
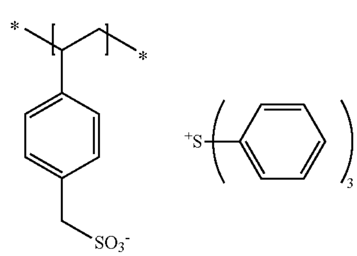
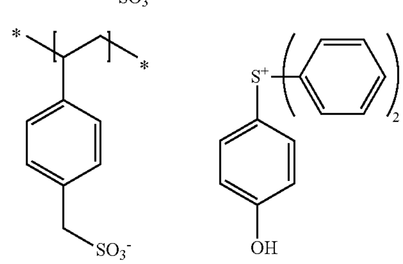

-continued
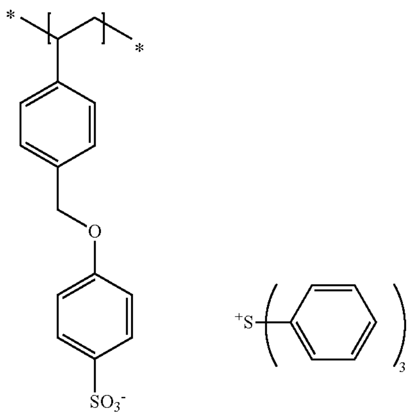
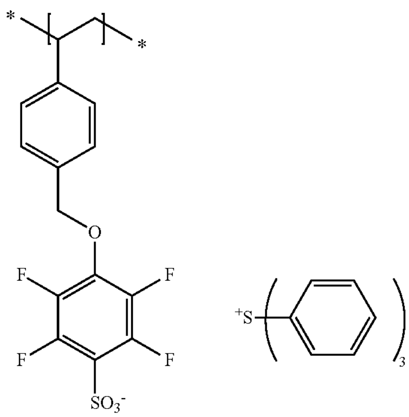
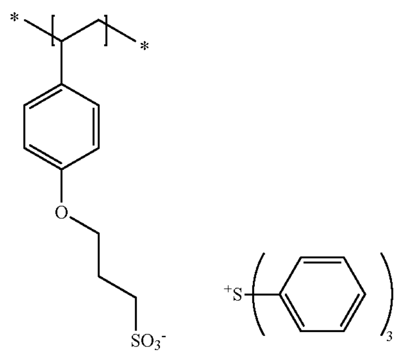
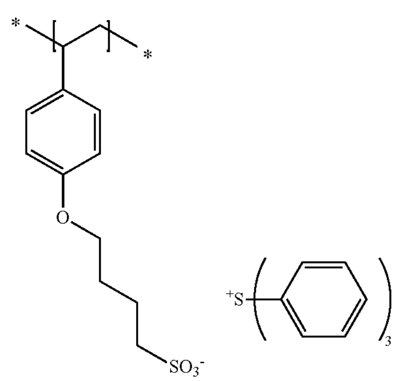
-continued
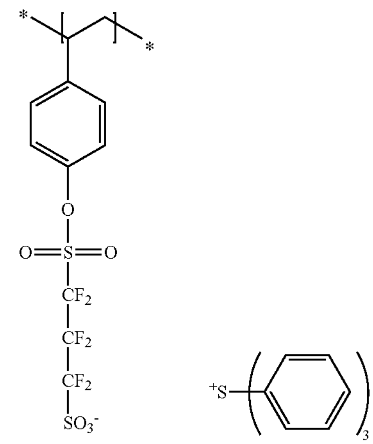
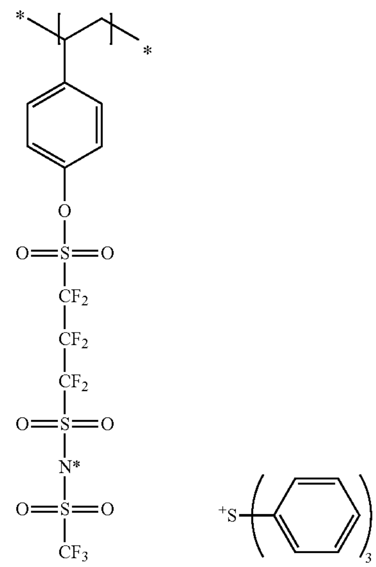
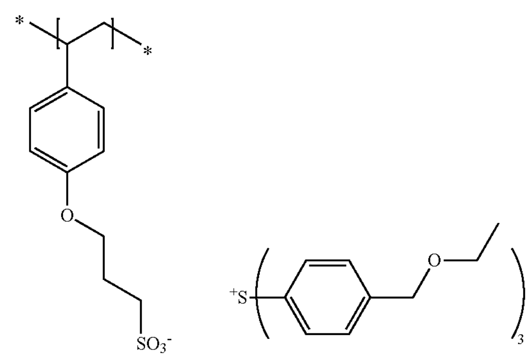
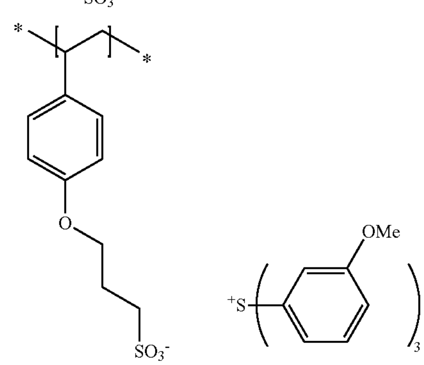

-continued
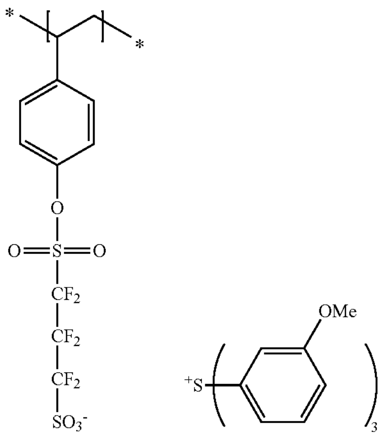
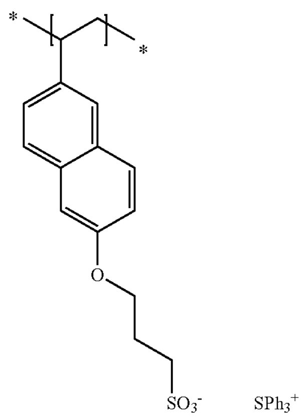
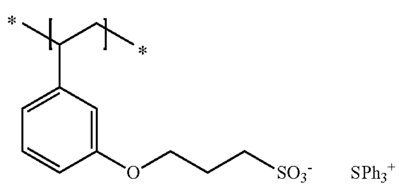
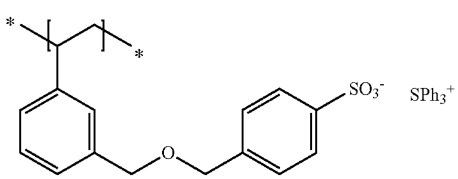
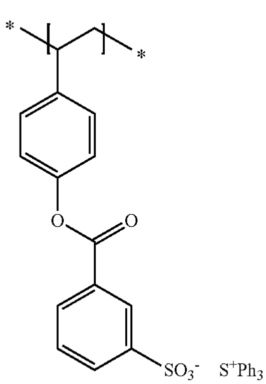
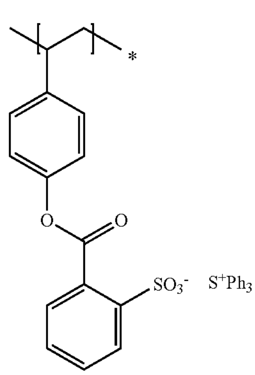
-continued
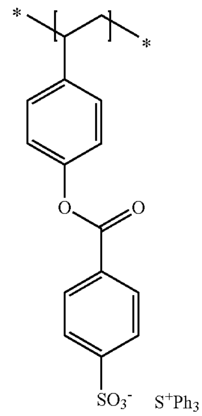
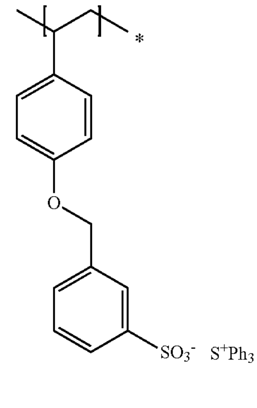
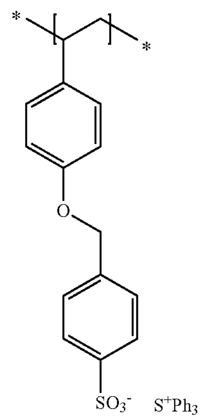
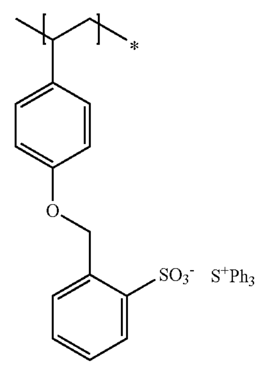
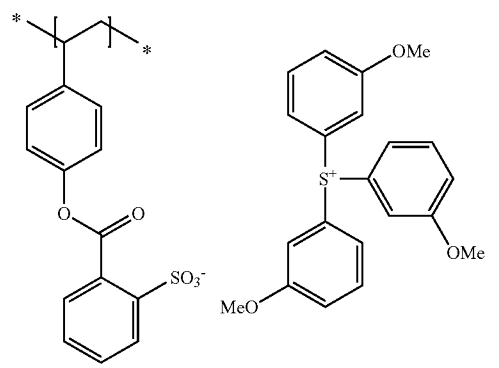
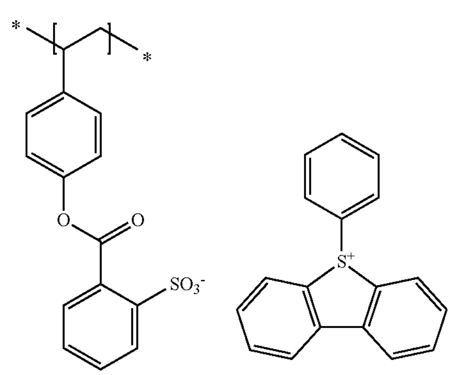

-continued
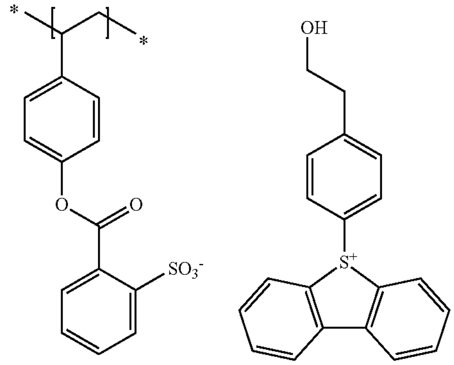
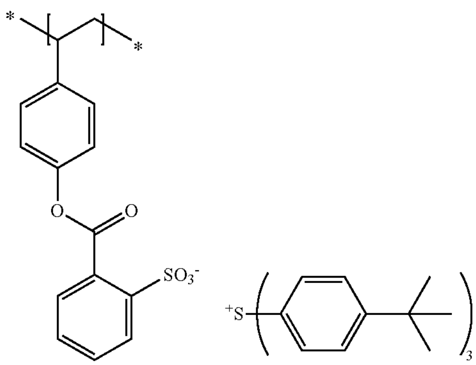
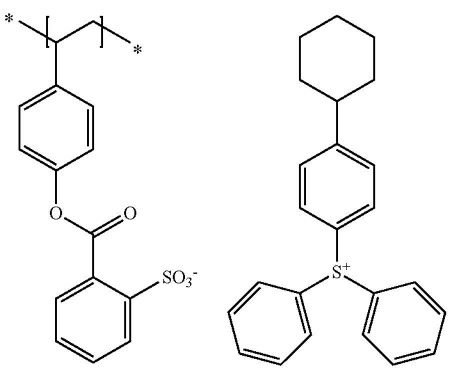
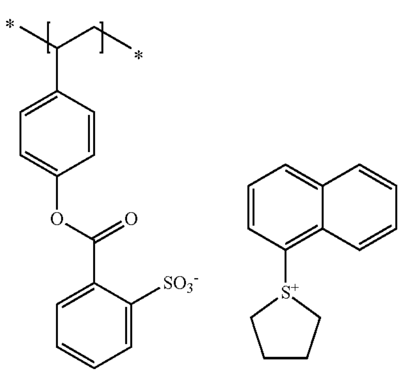
-continued
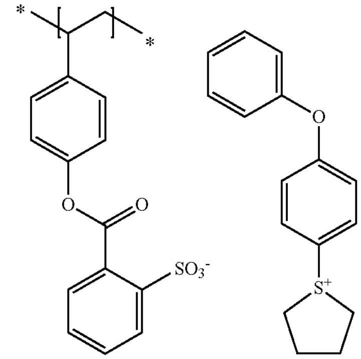
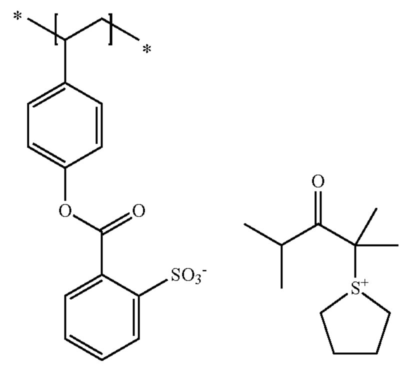
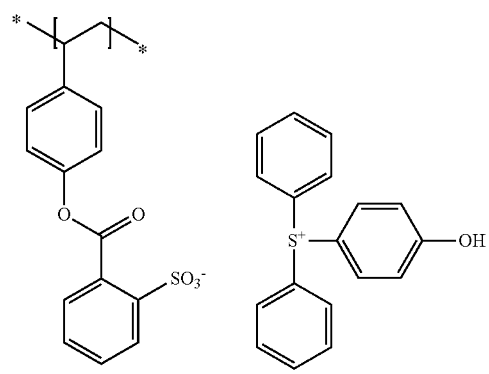
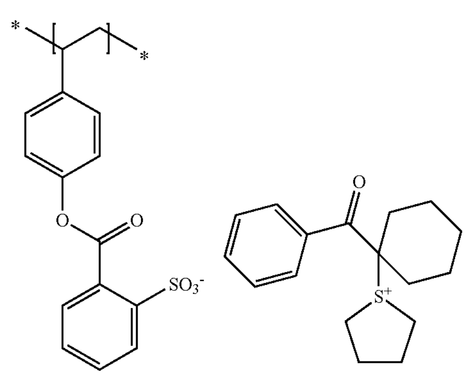

-continued
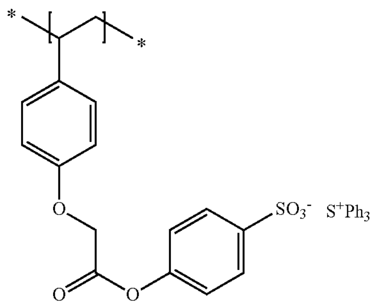
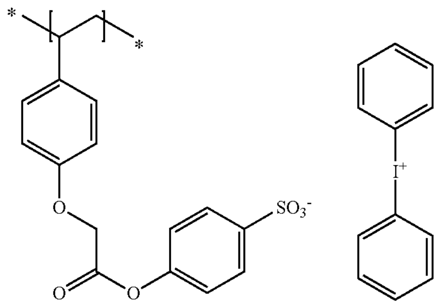
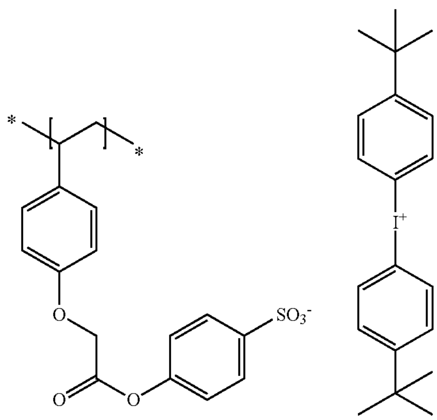
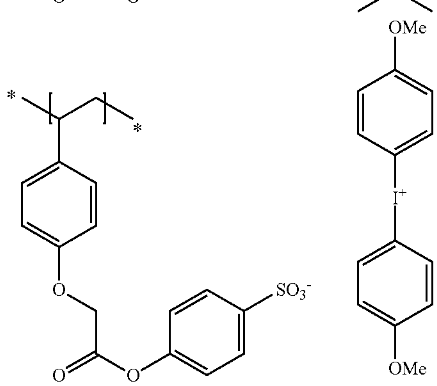
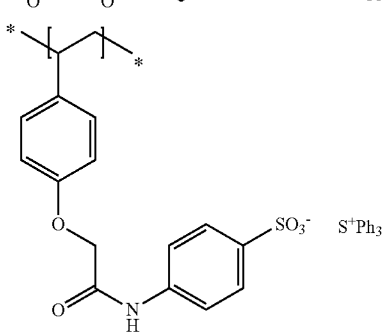
-continued
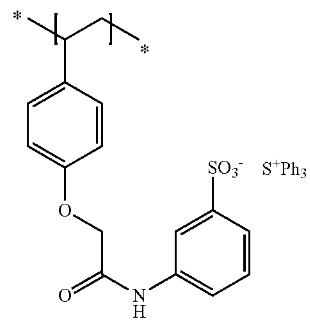
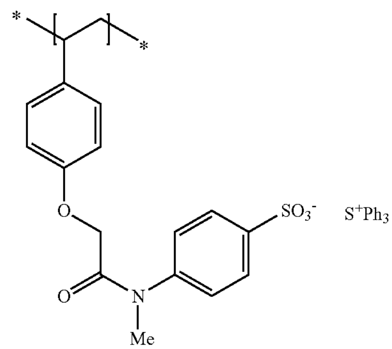
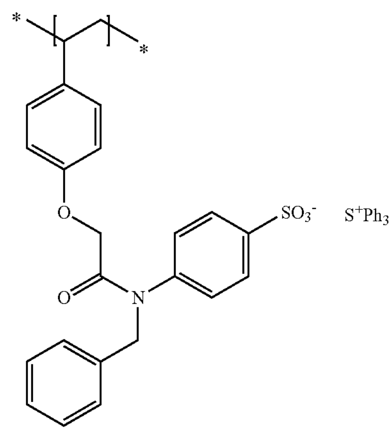
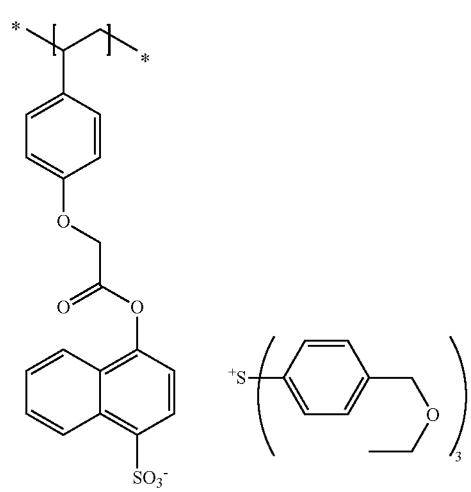

-continued
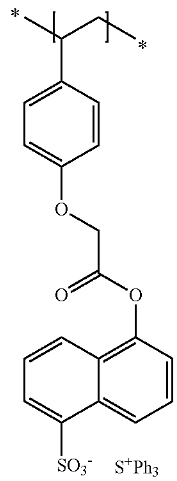
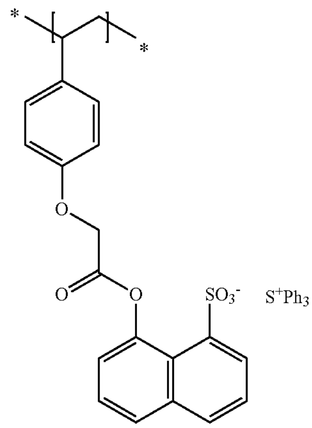
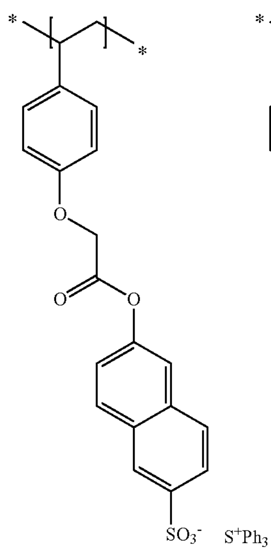
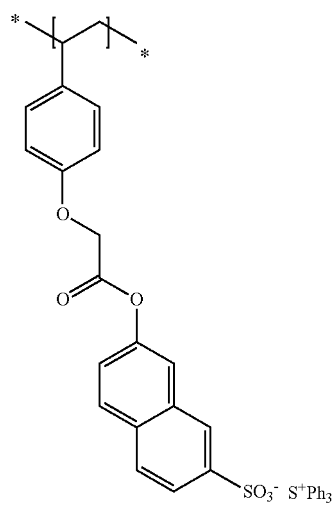
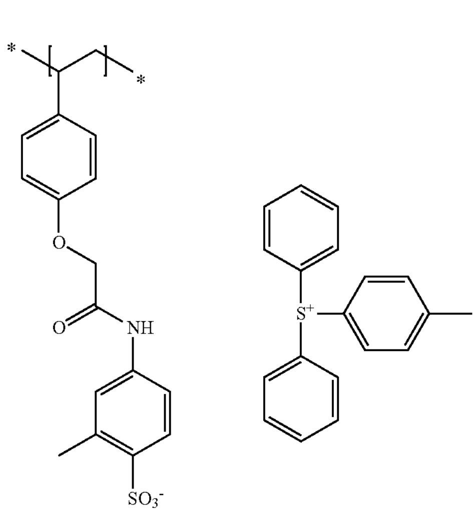
-continued
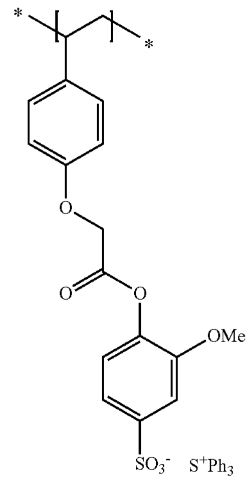
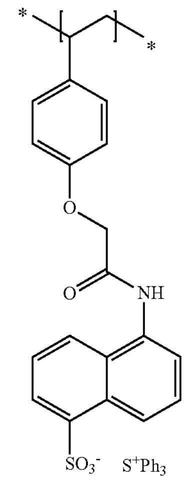
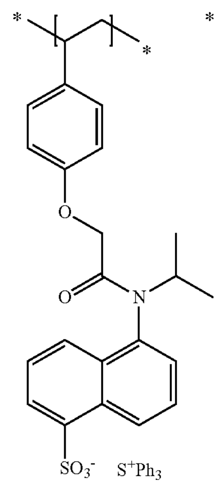
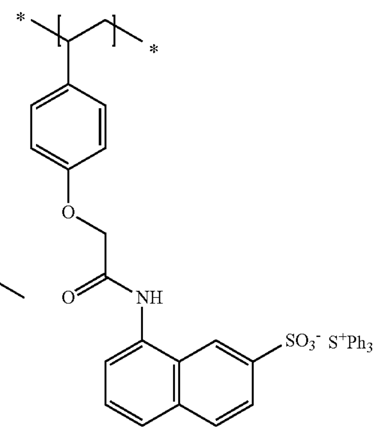
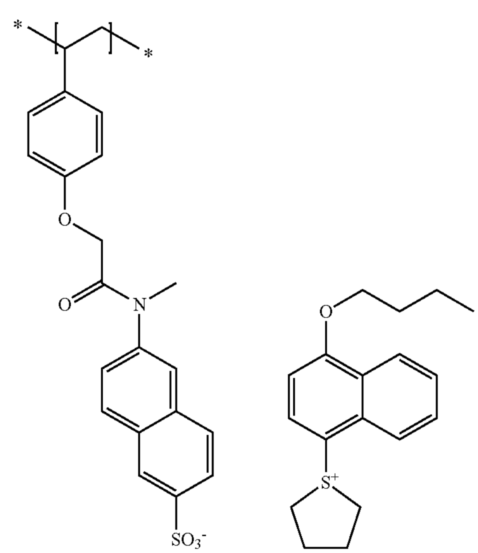

-continued
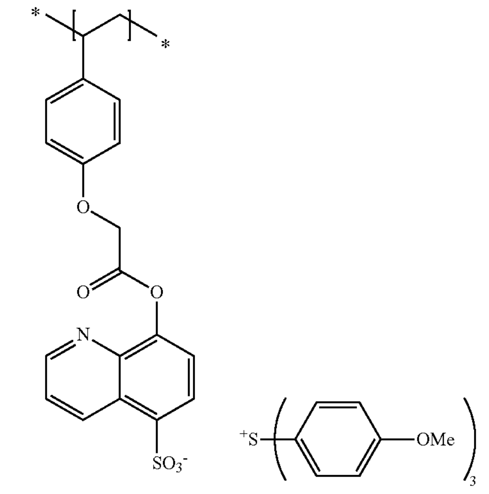
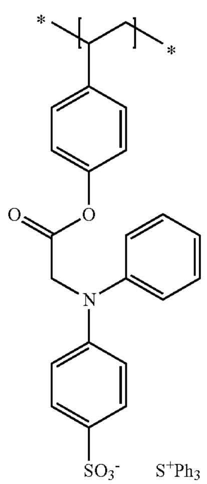
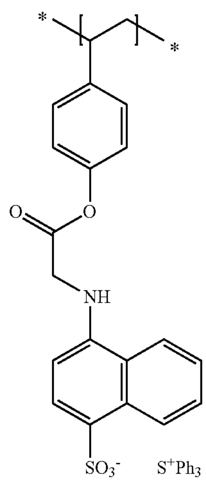
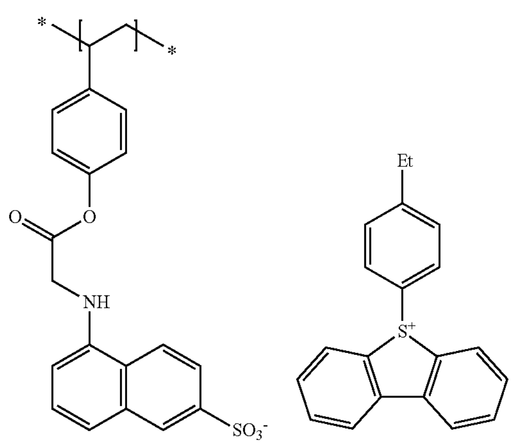
-continued
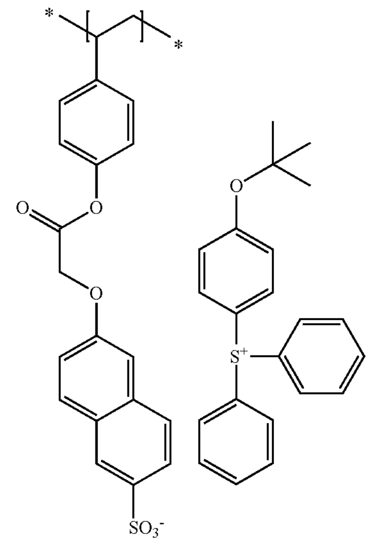
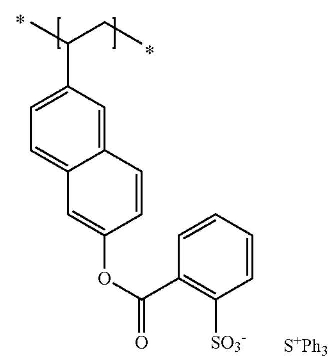
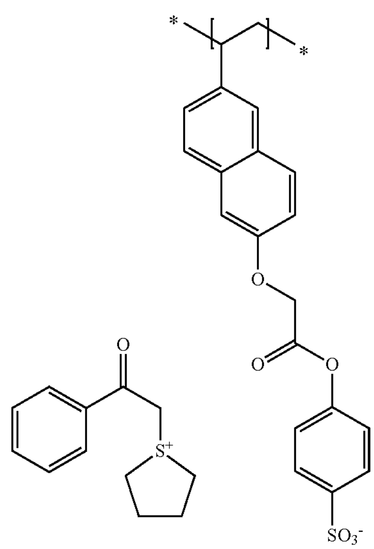

-continued
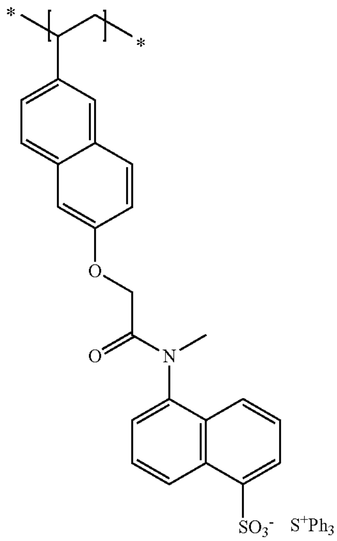
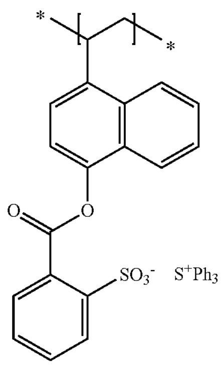
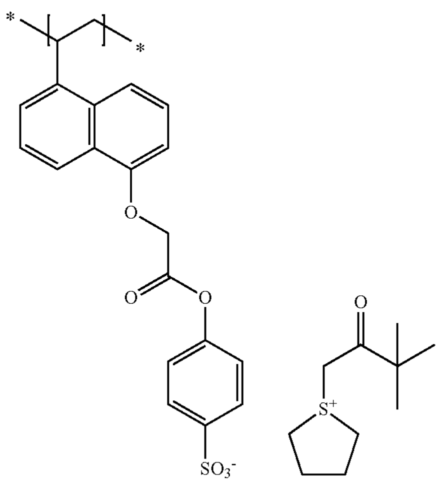
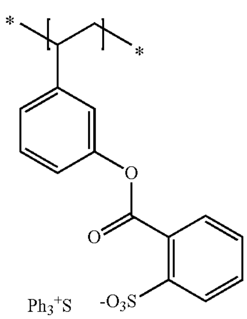
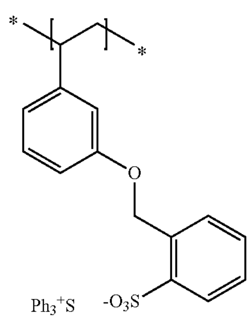
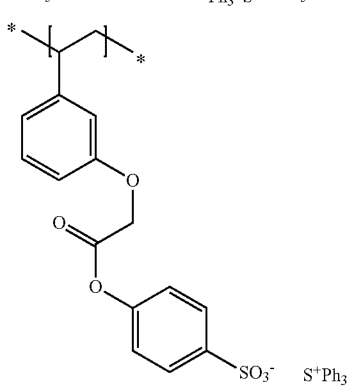
-continued
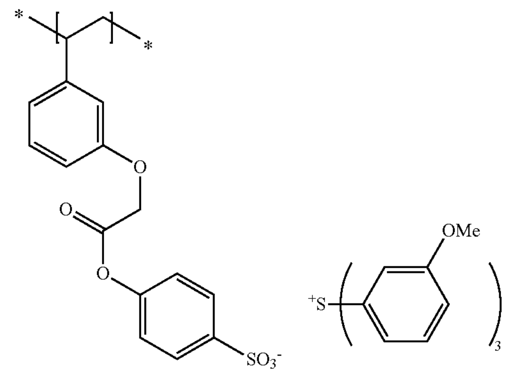
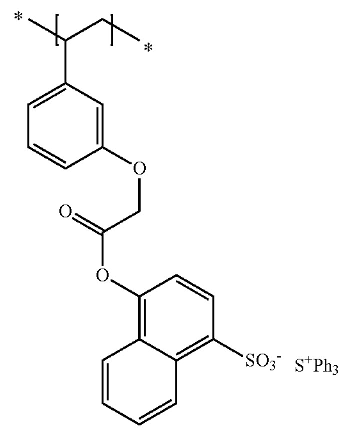
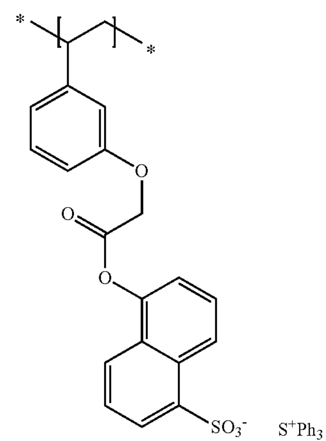
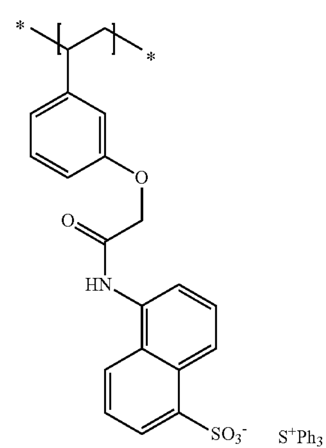

-continued
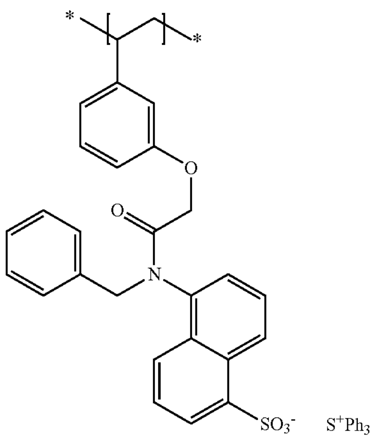
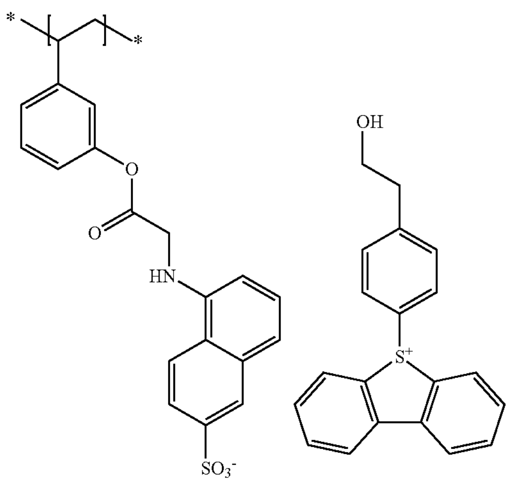
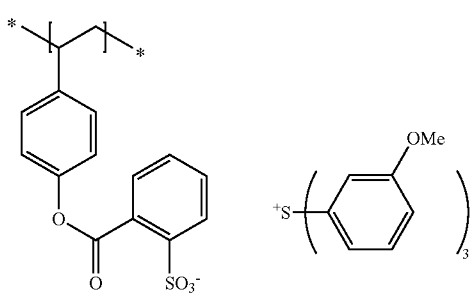
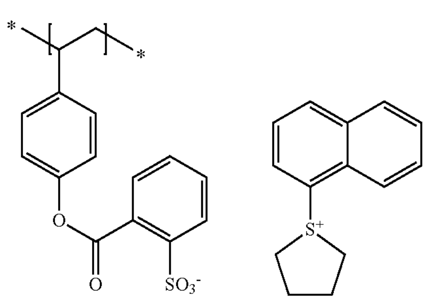
-continued
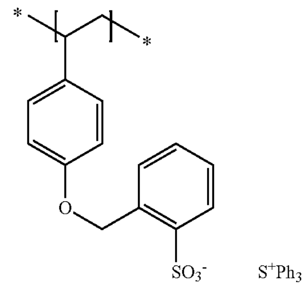
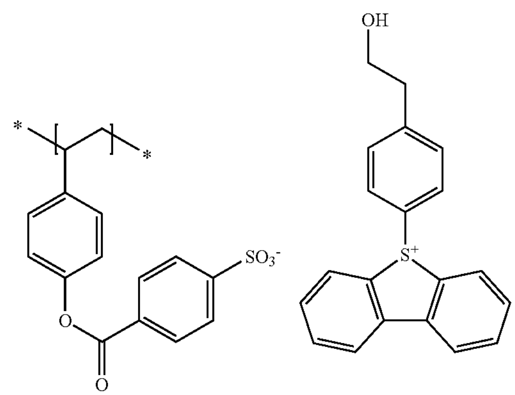
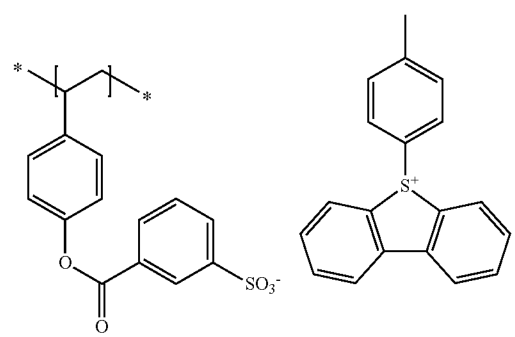
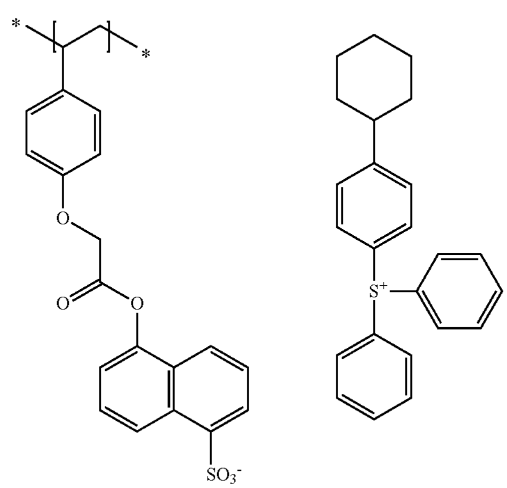

-continued
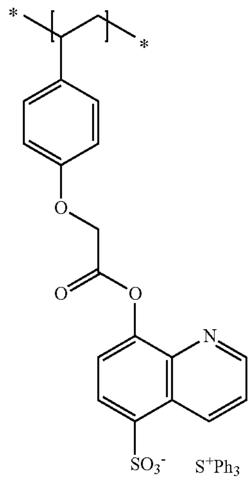
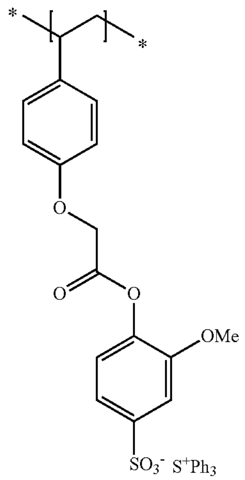
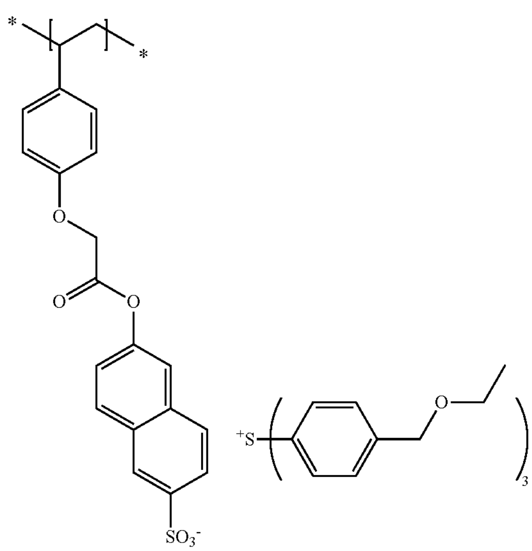
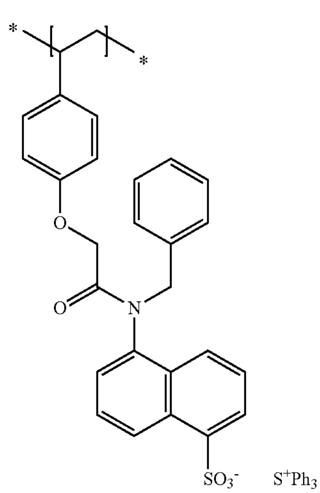
-continued
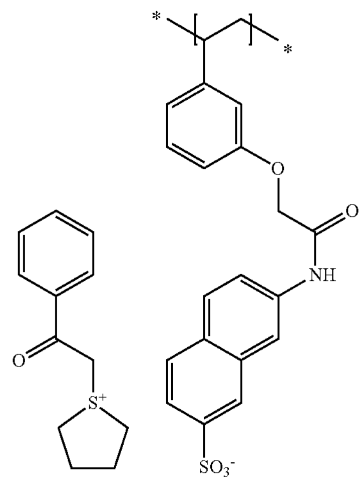
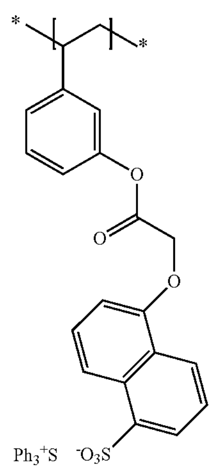
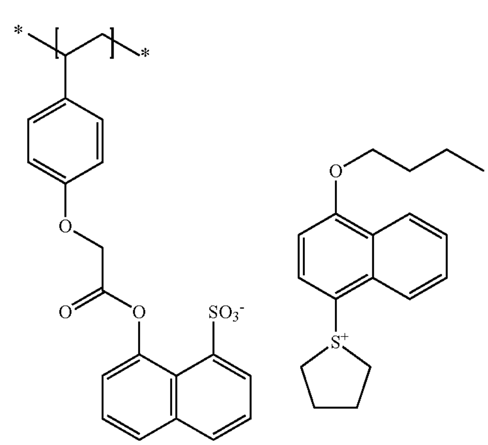

-continued
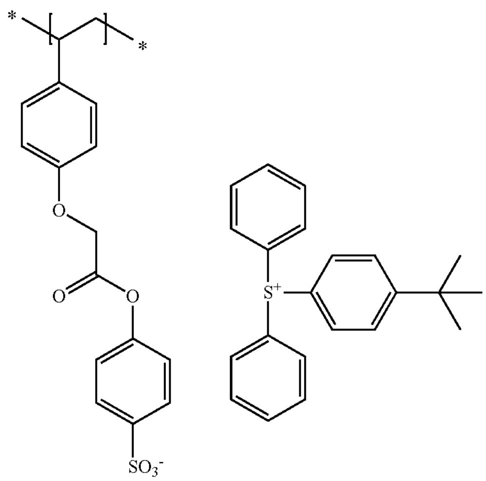
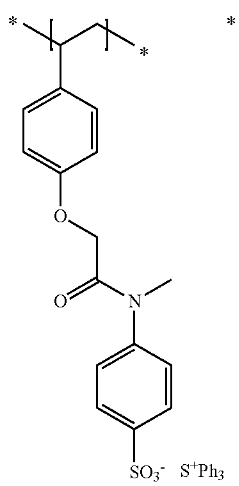
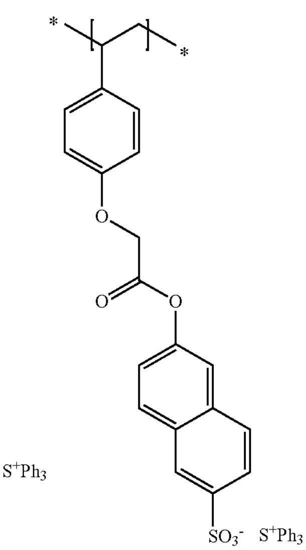
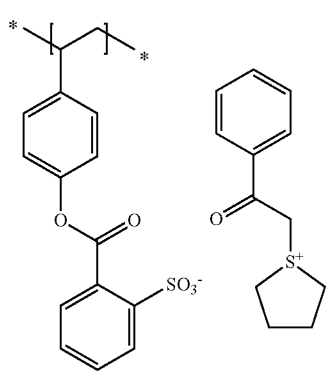
-continued
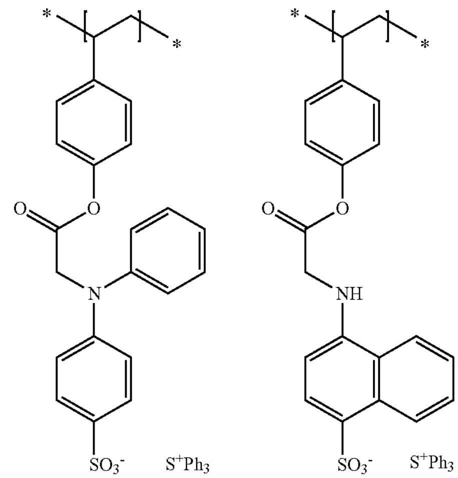
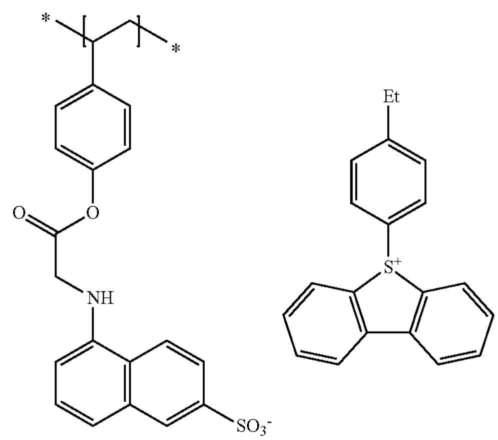
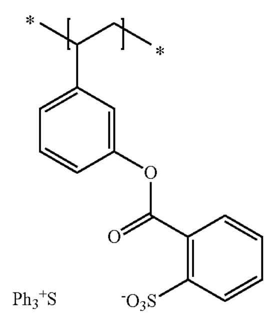
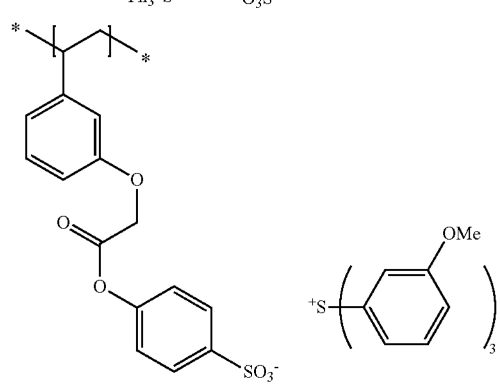

-continued
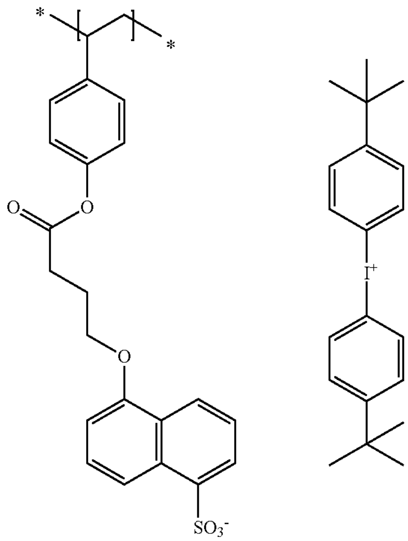
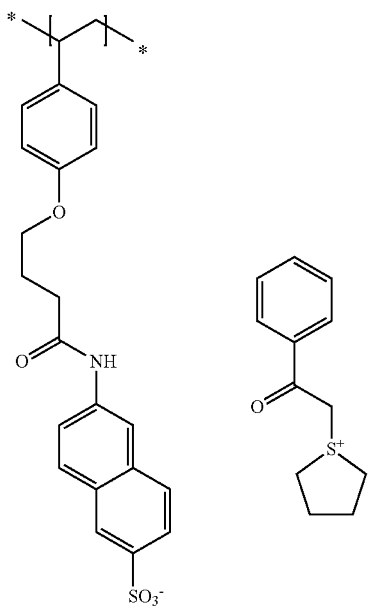
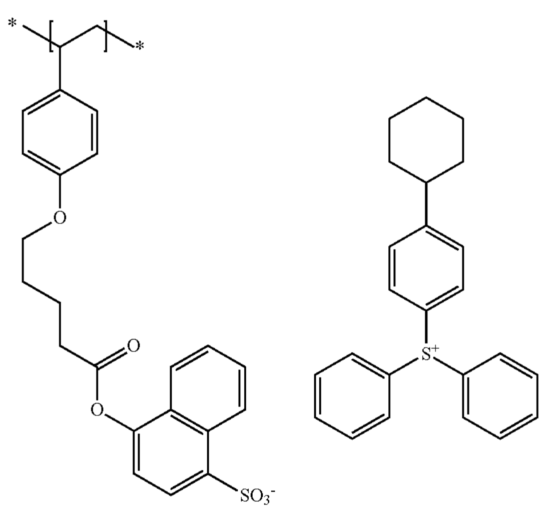
-continued
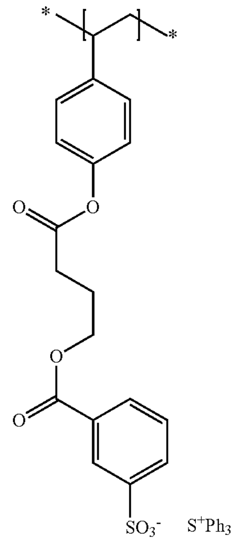
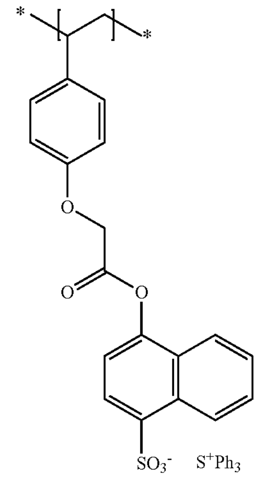
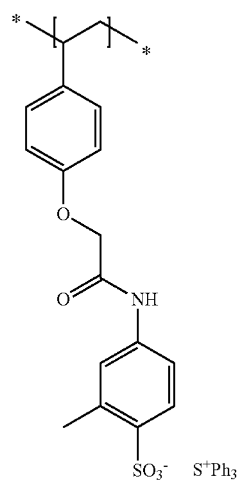
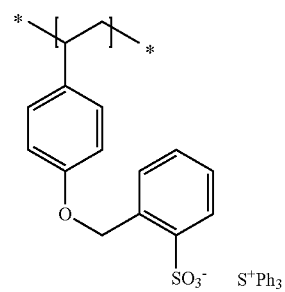
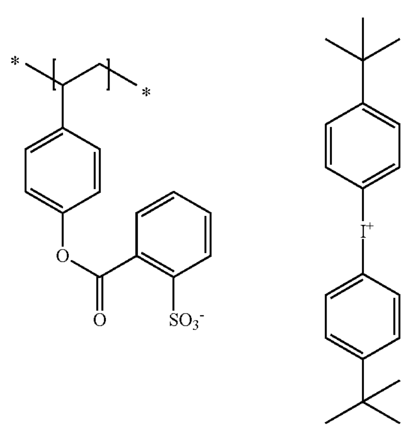

-continued

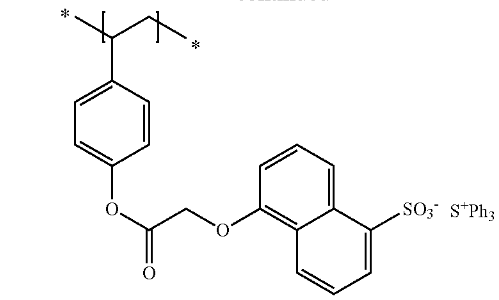

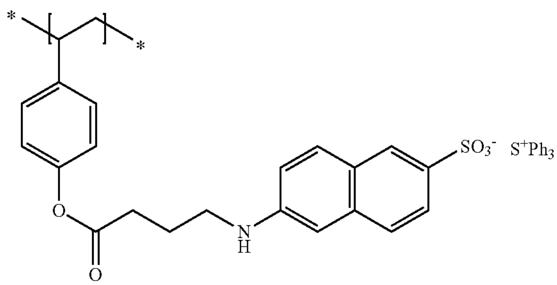

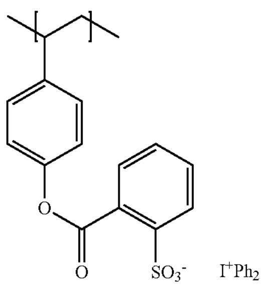

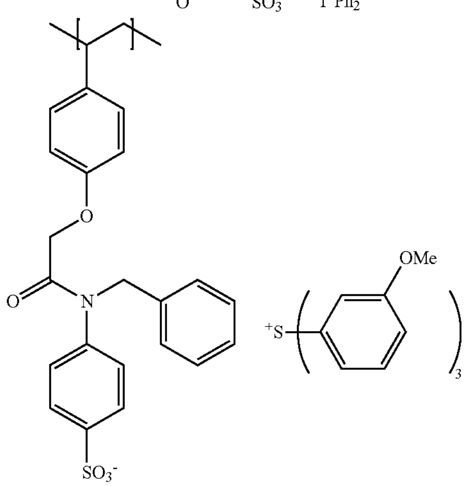

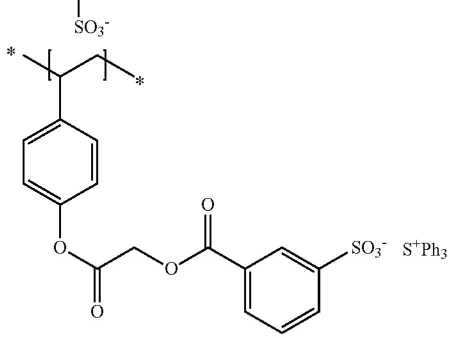

When the mother nucleus is a polymer compound, the content of the repeating units represented by General Formula (4) in the compound (A) of the present invention preferably ranges from 1 mol % to 30 mol %, more preferably ranges from 2 mol % to 15 mol %, and particularly preferably ranges from 2 mol % to 10 mol %, based on the total repeating units of the compound (A).

When the mother nucleus is a polymer compound, the compound (A) used in the present invention preferably further contains a repeating unit described below as another repeating unit.

For example, the compound (A) may further contain a repeating unit having a group of which a dissolution rate in an alkaline developer is increased due to the degradation of the group caused by the action of the alkaline developer. Examples of such a group include a group having a lactone structure, a group having a phenyl ester structure, and the like. As the repeating unit having a group of which a dissolution rate in an alkaline developer is increased due to the degradation of the group caused by the action of the alkaline developer, a repeating unit represented by the following General Formula (AII) is more preferable.

(AII)

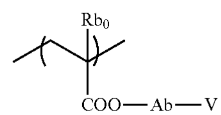

In General Formula (AII), V represents a group of which a dissolution rate in an alkaline developer is increased due to the degradation of the group caused by the action of the alkaline developer, $Rb_0$ represents a hydrogen atom or a methyl group, and Ab represents a single bond or a divalent organic group.

V is a group degraded by the action of an alkaline developer and is a group having an ester bond, and among such groups, a group having a lactone structure is more preferable. As the group having a lactone structure, any group can be used as long as the group has a lactone structure, but the group preferably has a 5- to 7-membered ring lactone structure. It is preferable that another ring structure be condensed with the 5- to 7-membered lactone structure while forming a bicyclo structure or a spiro structure.

Ab is preferably a single bond or a divalent linking group represented by -AZ—$CO_2$— (AZ is an alkylene group or an aliphatic ring group). AZ is preferably a methylene group, an ethylene group, a cyclohexylene group, an adamantylene group, or a norbornylene group.

Specific examples thereof are shown below. In the formulae, Rx represents H or $CH_3$.

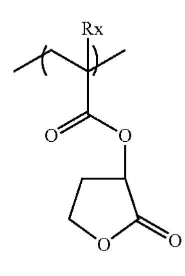

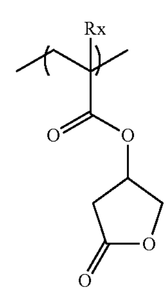

-continued
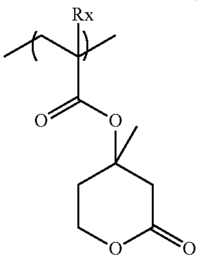
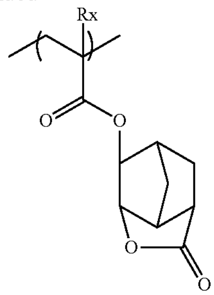
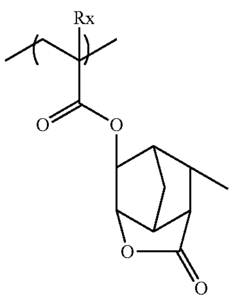
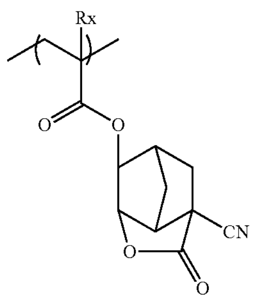
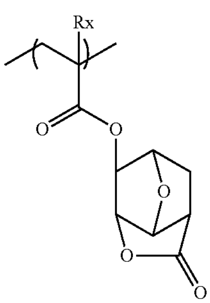
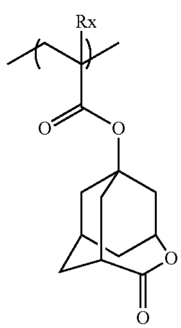
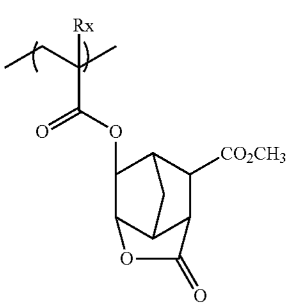
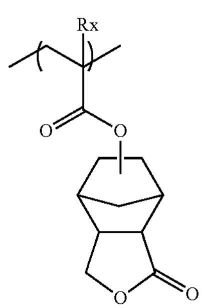
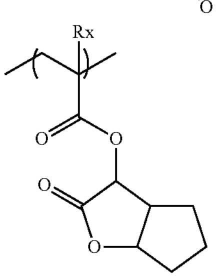
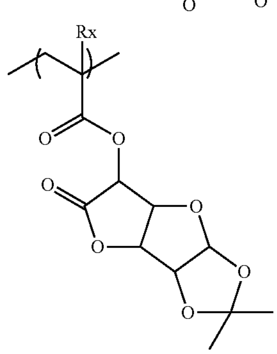
-continued
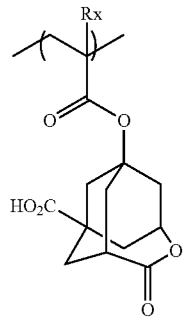
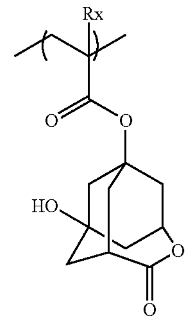
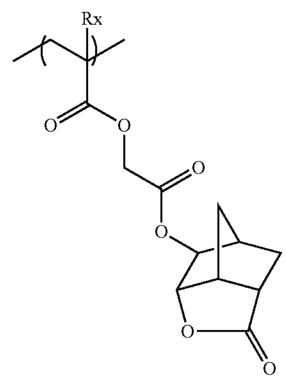
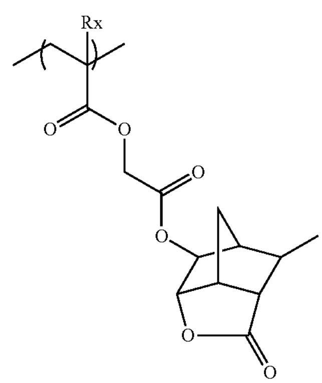
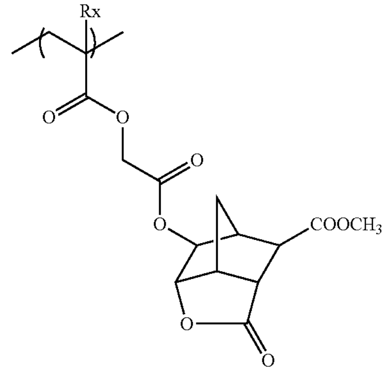

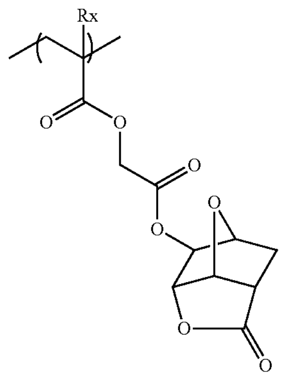
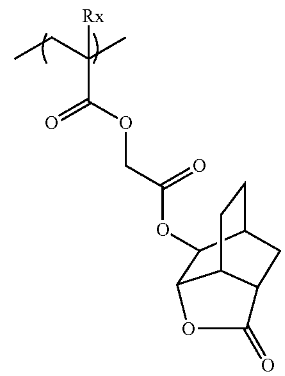
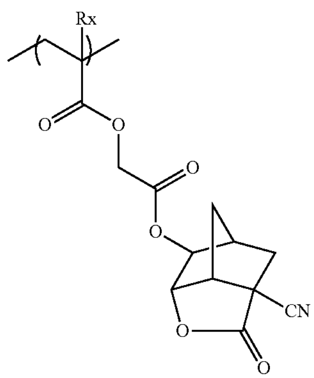
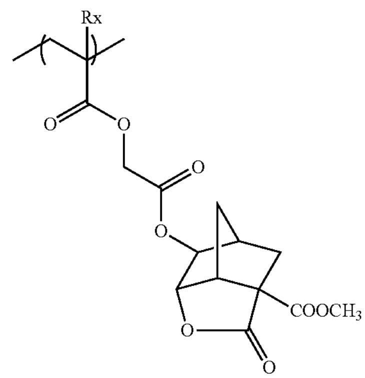
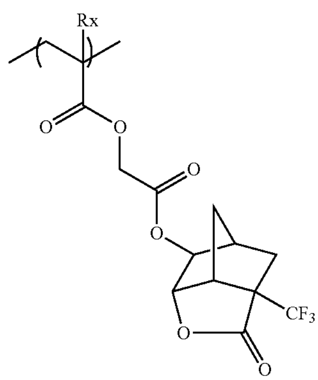
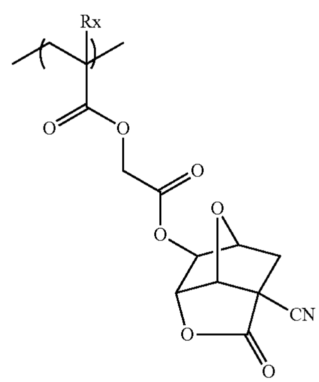
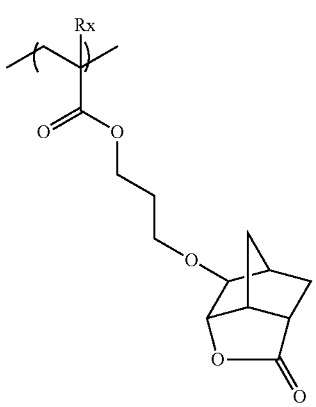
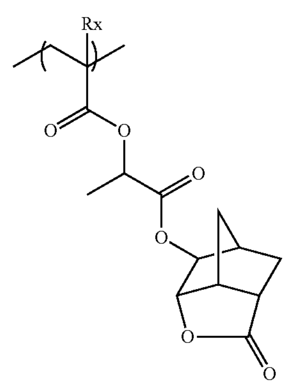

-continued

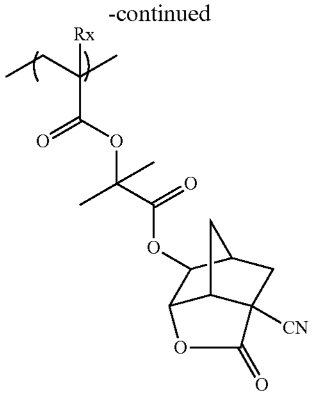

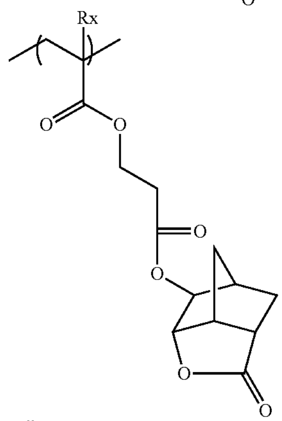

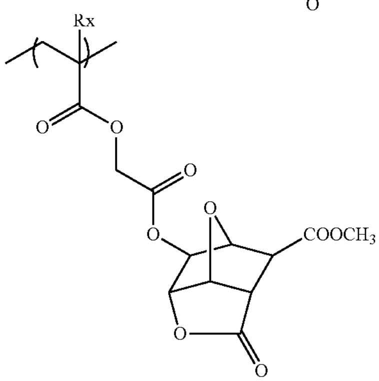

The compound (A) may or may not contain a repeating unit having a group of which a dissolution rate in an alkaline developer is increased due to the degradation of the group caused by the action of the alkaline developer. When compound (A) contains the repeating unit, the content of the repeating units having such a group preferably ranges from 10 mol % to 60 mol %, more preferably ranges from 15 mol % to 50 mol %, and even more preferably ranges from 15 mol % to 40 mol %, based on the total repeating units in the compound (A).

Examples of the polymerizable monomer for forming a repeating unit other than the above repeating unit in the compound (A) of the present invention include styrene, alkyl-substituted styrene, alkoxy-substituted styrene, O-alkylated styrene, O-acylated styrene, hydrogenated hydroxystyrene, maleic anhydride, an acrylic acid derivative (acrylic acid, acrylic acid ester, or the like), a methacrylic acid derivative (methacrylic acid, methacrylic acid ester, or the like), N-substituted maleimide, acrylonitrile, methacrylonitrile, vinyl naphthalene, vinyl anthracene, acenaphthylene, indene which may have a substituent, and the like. As substituted styrene, 4-(1-naphthylmethoxy)styrene, 4-benzyloxy styrene, 4-(4-chlorobenzyloxy)styrene, 3-(1-naphthylmethoxy)styrene, 3-benzyloxystyrene, 3-(4-chlorobenzyloxy)styrene, and the like are preferable.

The compound (A) may or may not contain these repeating units. When the compound (A) contains these repeating units, the content of these repeating units in the compound (A) generally ranges from 1 mol % to 20 mol %, and preferably ranges from 2 mol % to 10 mol %, based on the total repeating units constituting the compound (A).

When the mother nucleus is a polymer compound, the compound (A) of the present invention can be synthesized by, for example, polymerizing an unsaturated monomer corresponding to the respective repeating units through radical polymerization, cationic polymerization, or anionic polymerization. In addition, an unsaturated monomer corresponding to a precursor of the respective repeating units may be used to polymerize a polymer, and then the synthesized polymer may be modified with a low-molecular weight compound so as to be converted into the desired repeating unit, whereby the compound (A) can be synthesized. In any case, it is preferable to use living polymerization such as living anionic polymerization since the molecular weight distribution of the obtained polymer compound becomes uniform.

The weight average molecular weight of the compound (A) which is used in the present invention is preferably 1000 to 200000, is more preferably 2000 to 50000, and even preferably 2000 to 15000. The preferable dispersity (molecular weight distribution) (Mw/Mn) of the compound (A) is 1.0 or more and 1.7 or less and is more preferably 1.0 or more and 1.3 or less. The weight average molecular weight and the dispersity of the compound (A) are defined as values that are measured by GPC and expressed in terms of polystyrene. In the present specifications, the weight average molecular weight (Mw) and the numerical average molecular weight (Mn) of the compound (A) are able to be obtained using, for example, an HLC-8120 (manufactured by Tosoh Corporation), using a TSK gel Multipore HXL-M (7.8 mm ID×30.0 cm manufactured by Tosoh Corporation) as a column and using THF (tetrahydrofuran) as an eluent.

Specific examples of the compound (A) used in the present invention will be shown below, but the present invention is not limited thereto.

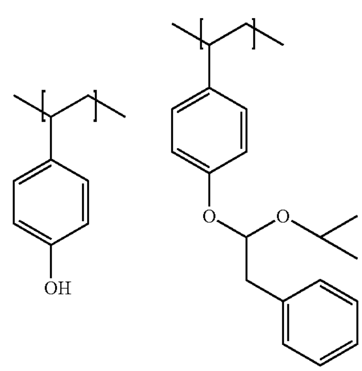

-continued
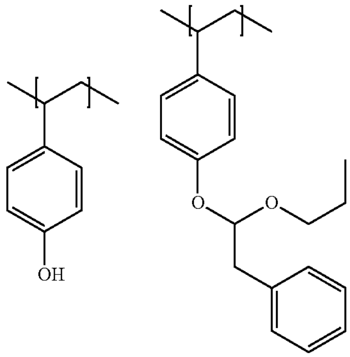
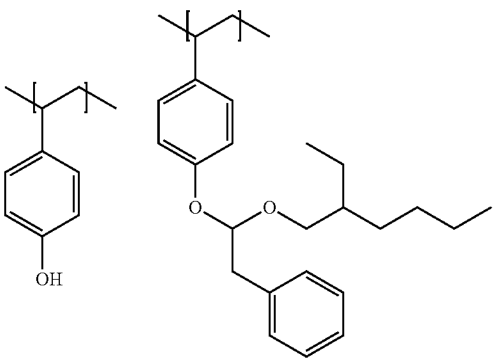
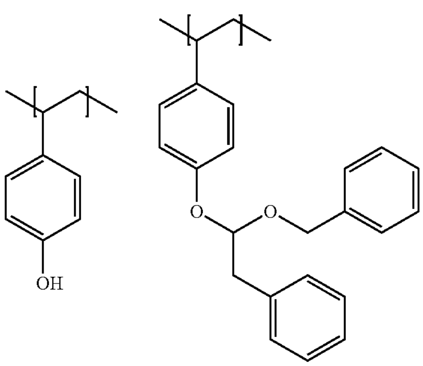
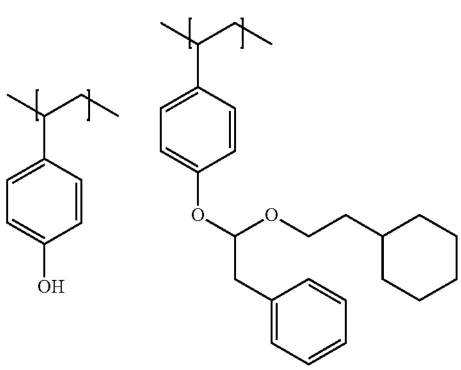
-continued
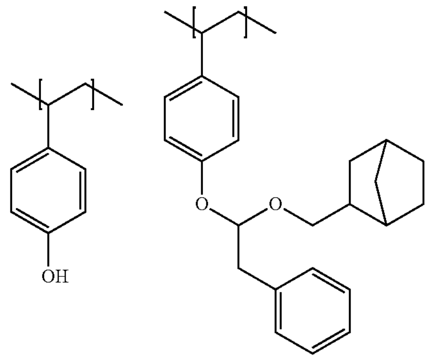
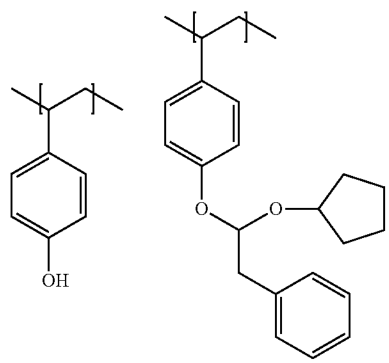
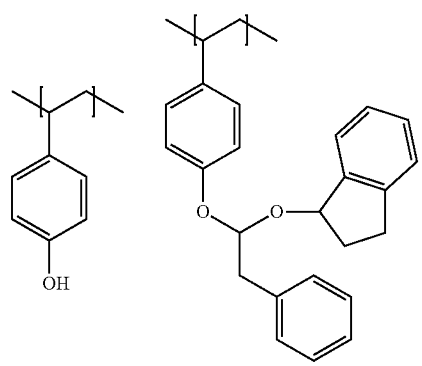
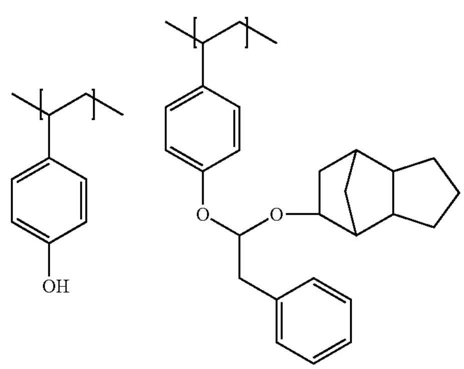

-continued
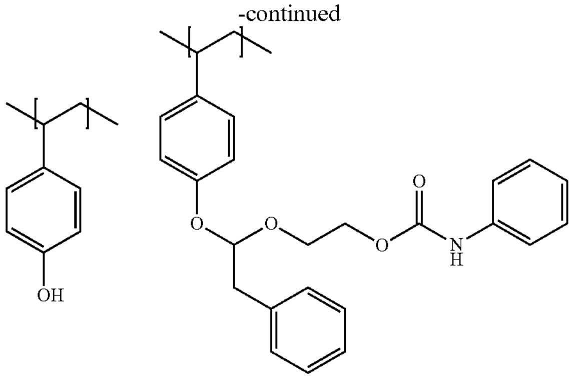
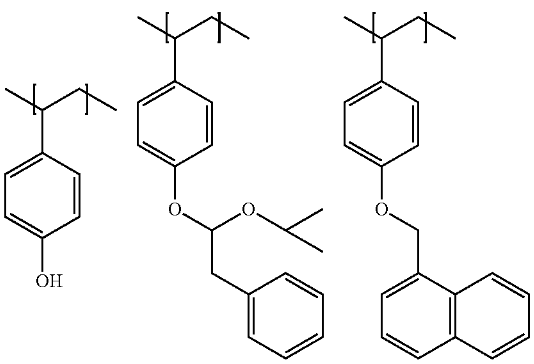
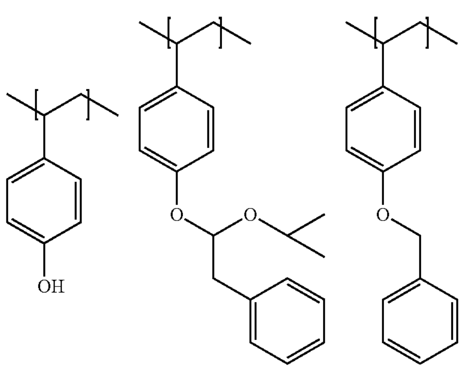
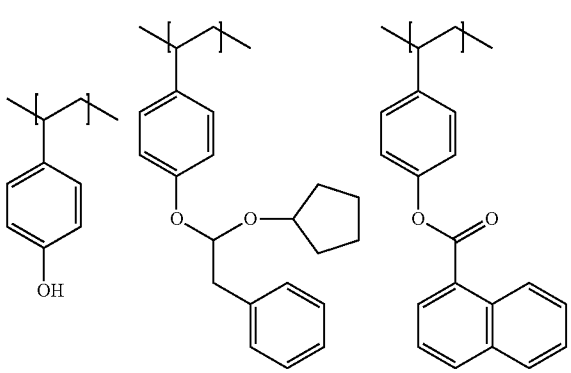
-continued
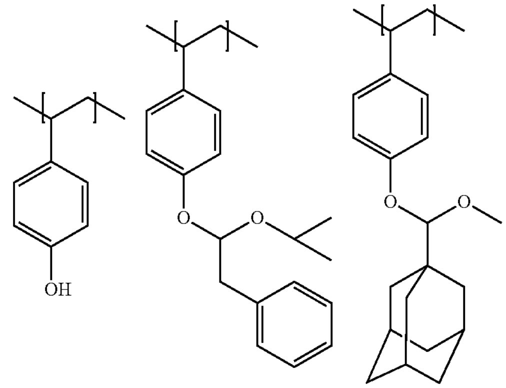
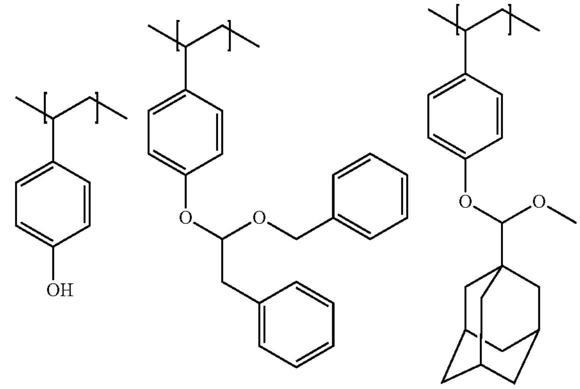
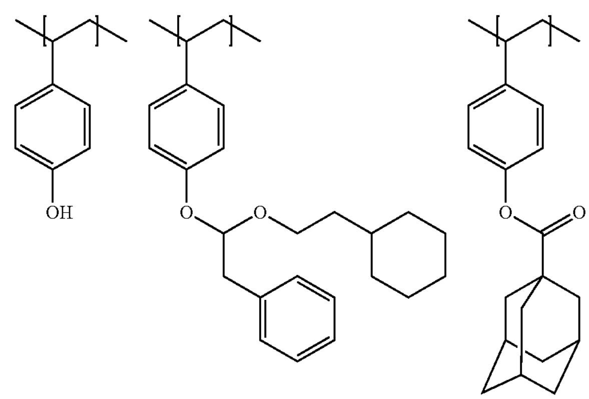
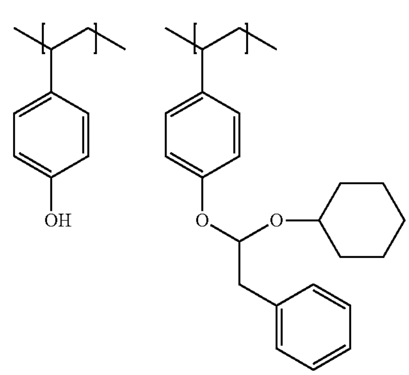

-continued
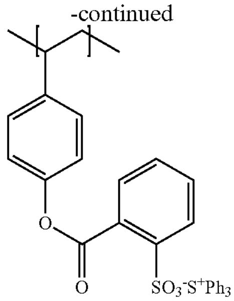
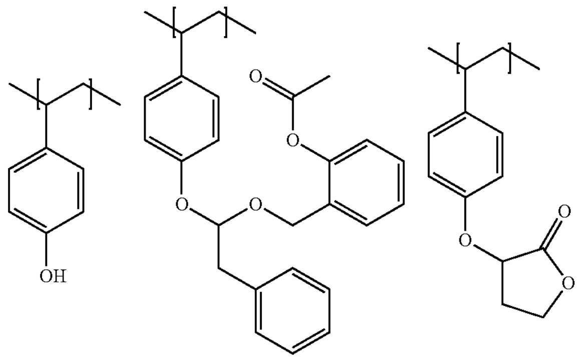
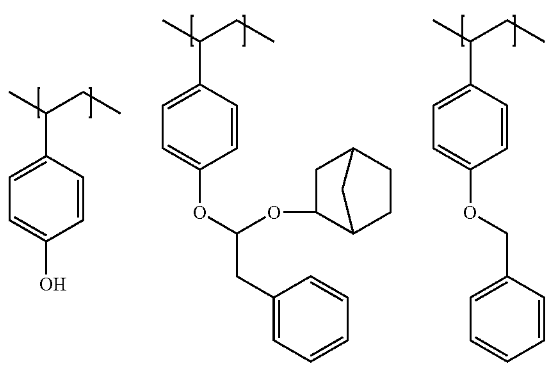
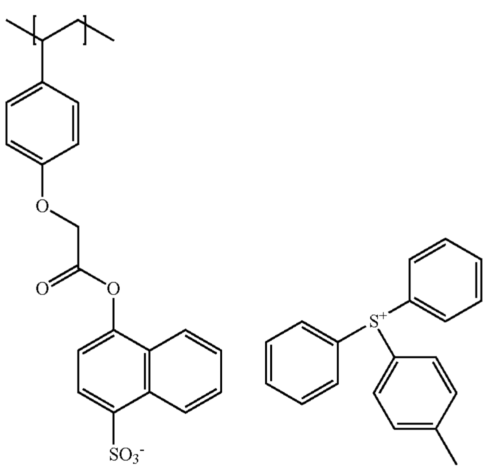
-continued
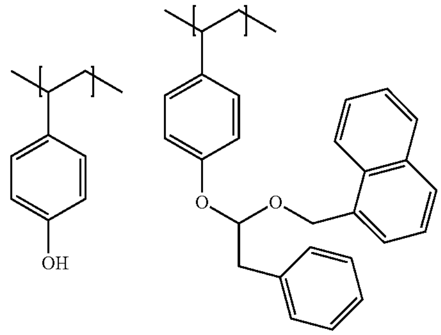
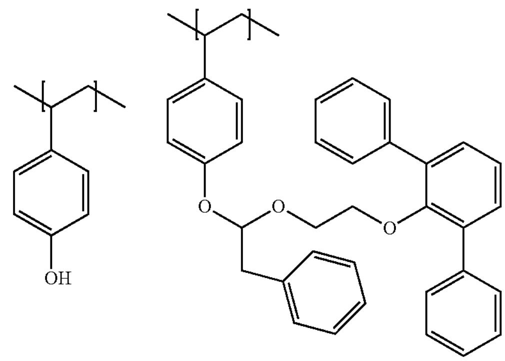
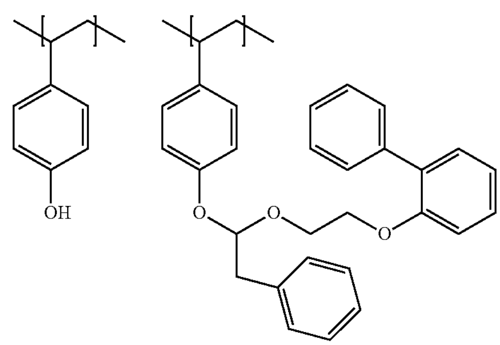
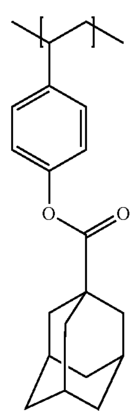

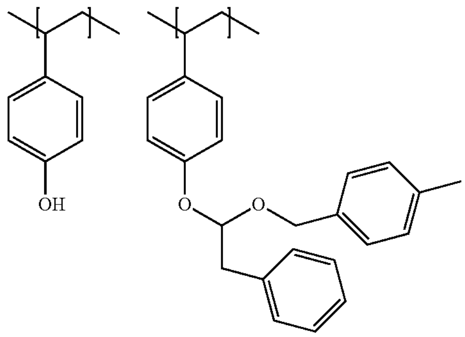
OH
O
O
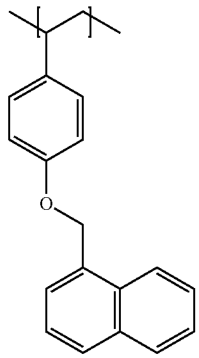
O
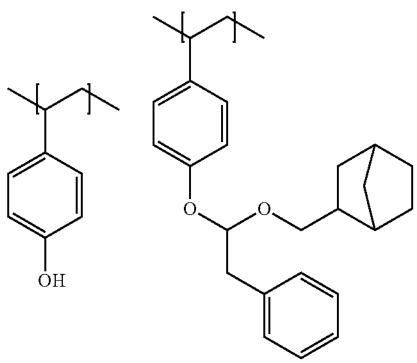
OH
O
O
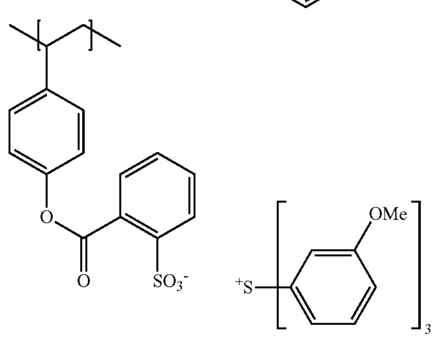
O
O
$SO_3^-$
$^+S$
OMe
3
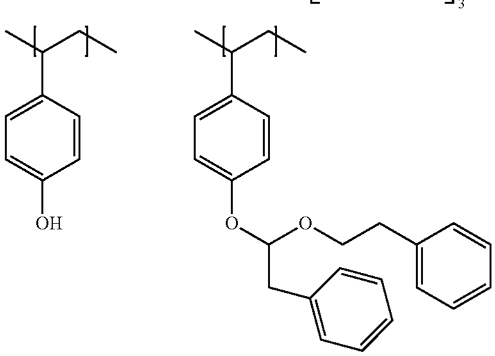
OH
O
O
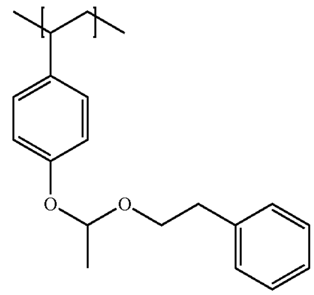
O
O
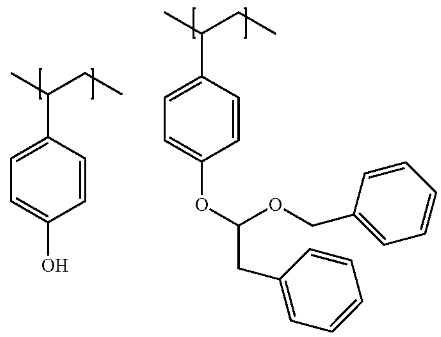
OH
O
O
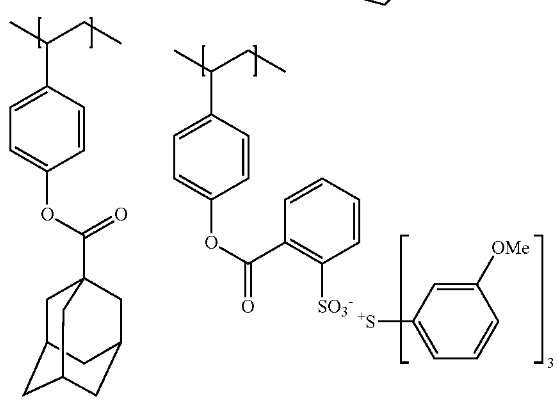
O
O
O
O
$SO_3^-$
$^+S$
OMe
3
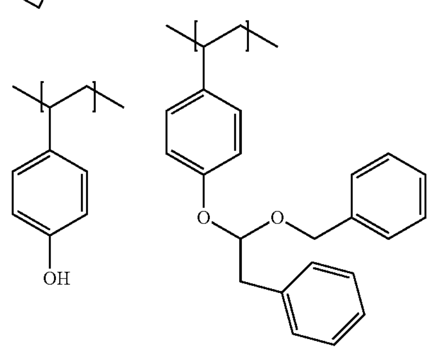
OH
O
O
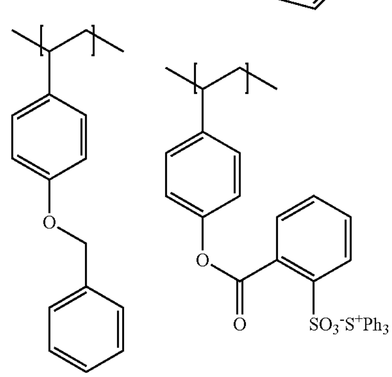
O
O
O
$SO_3^-S^+Ph_3$ -continued
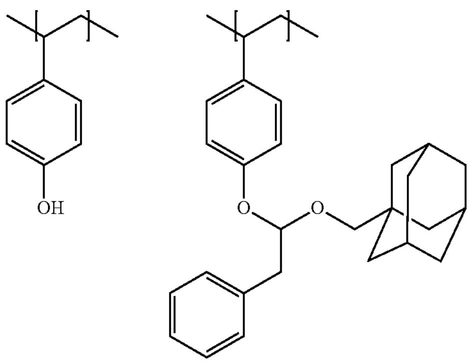
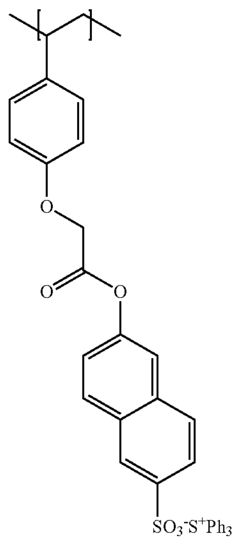
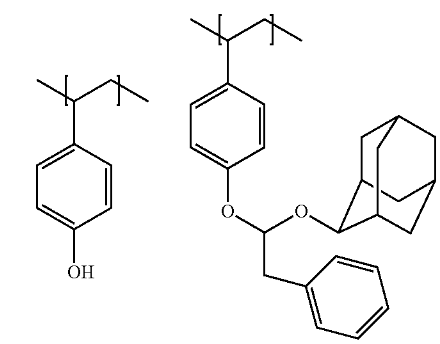
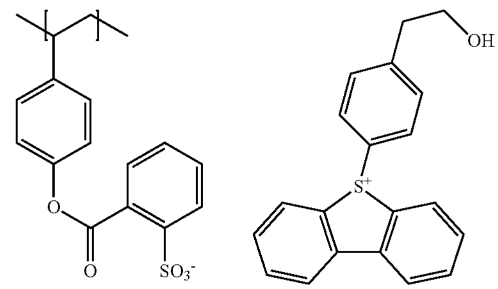
-continued
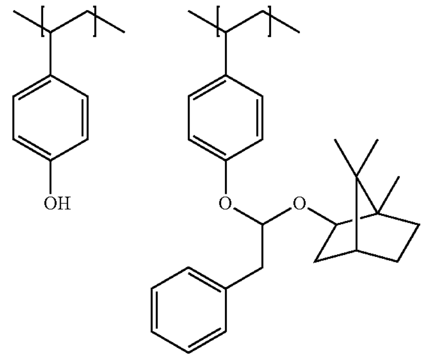
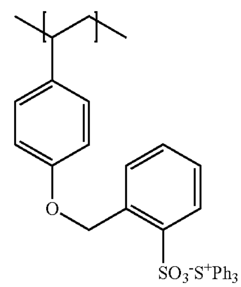
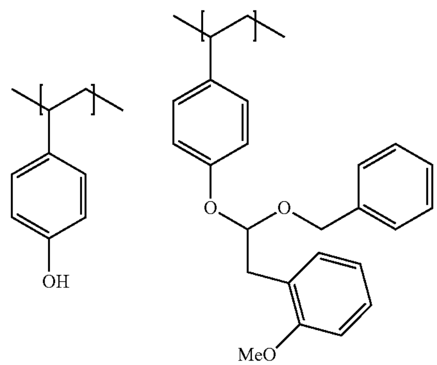
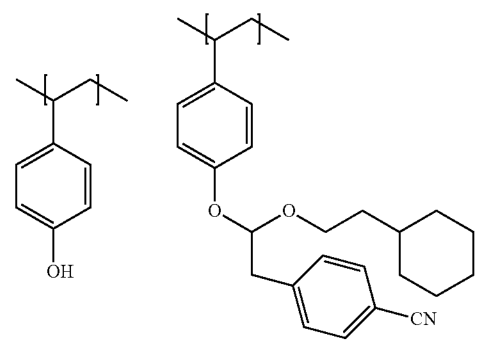
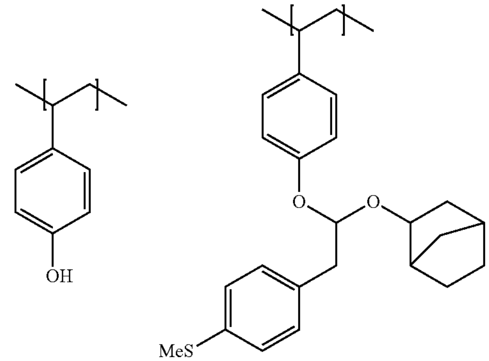

-continued
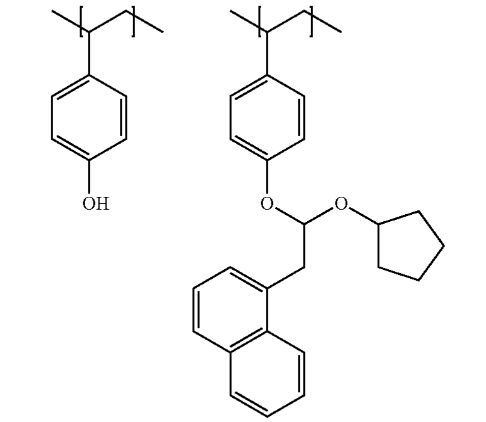
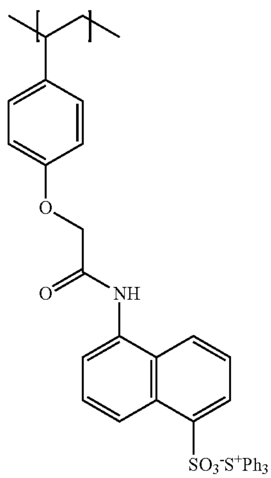
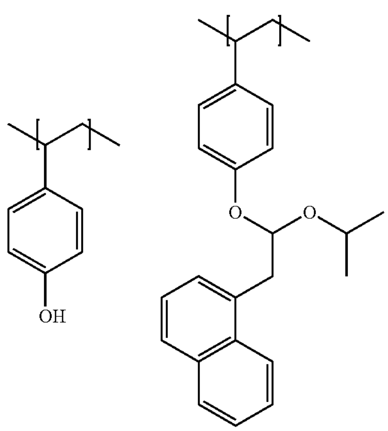
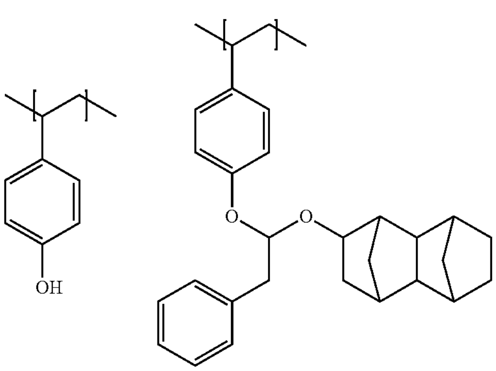
-continued
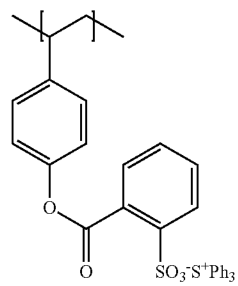
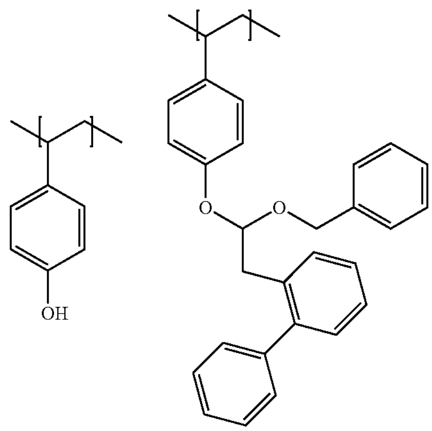
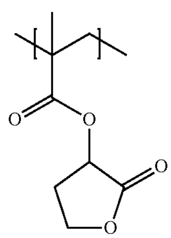
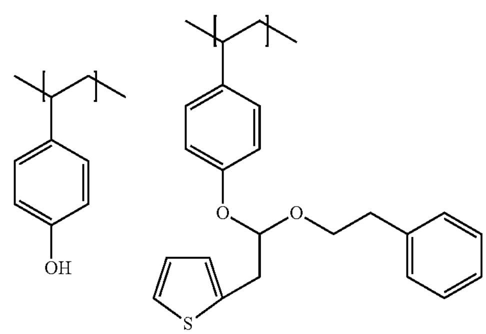
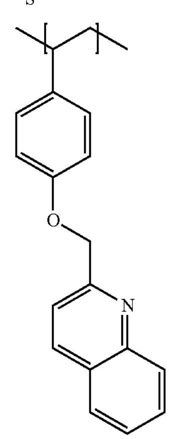

-continued
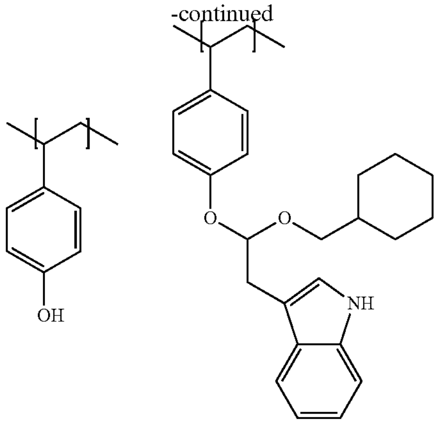
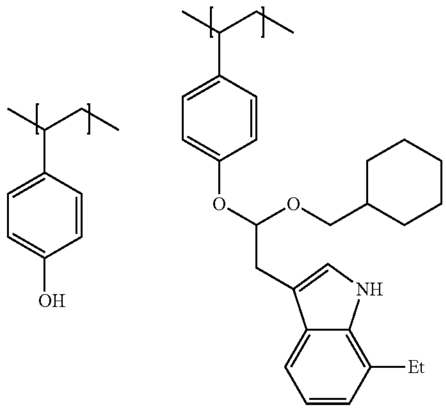
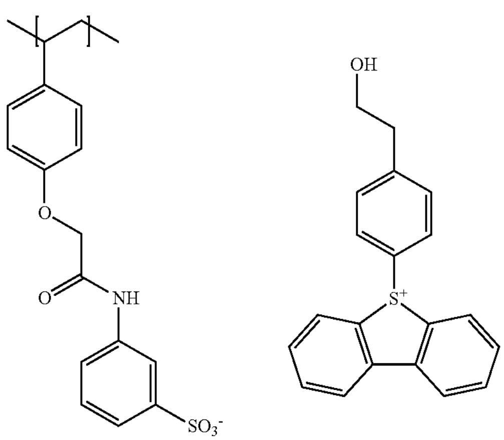
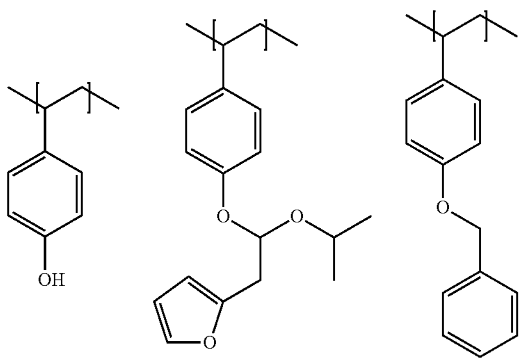
-continued
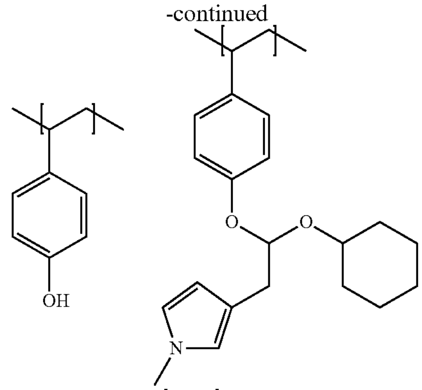
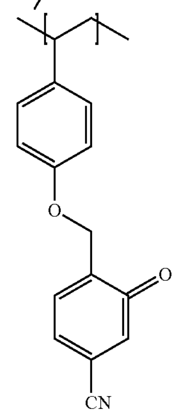
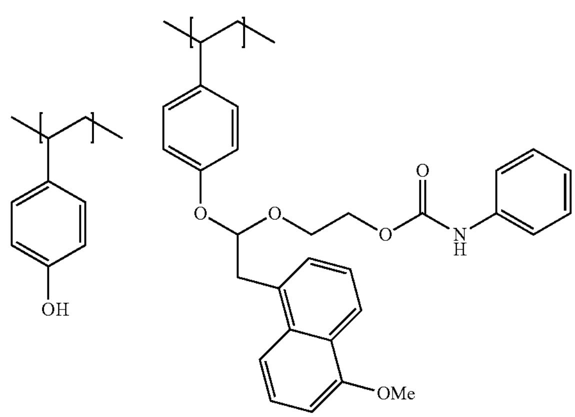
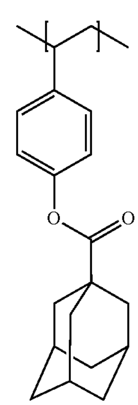

-continued
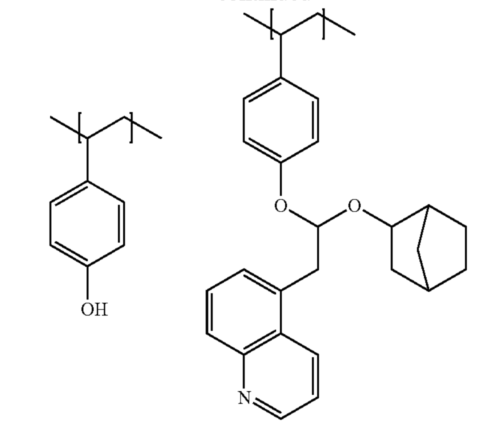
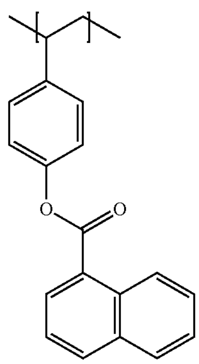
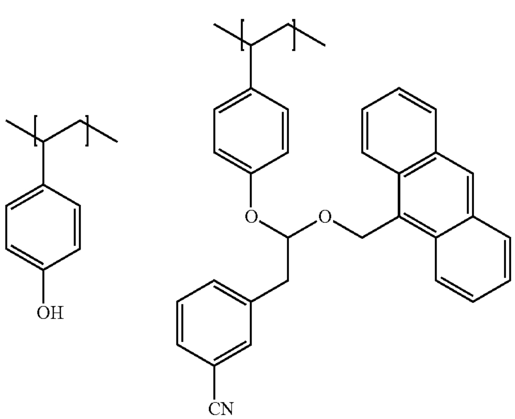
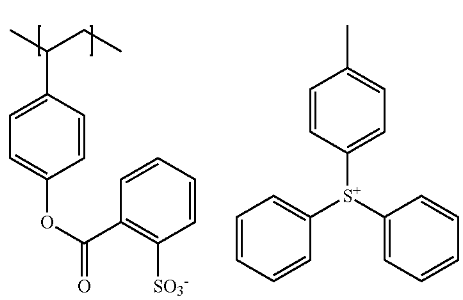
-continued
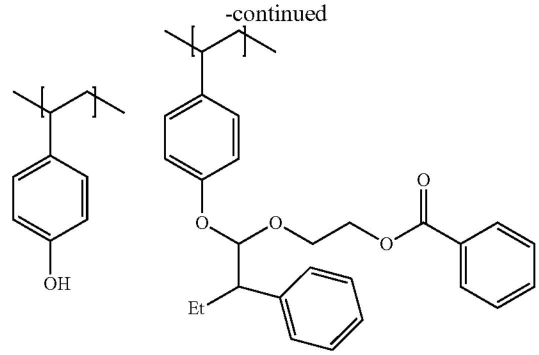
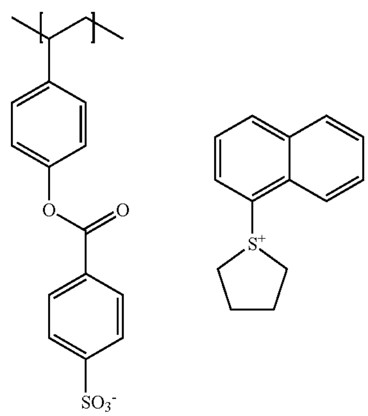
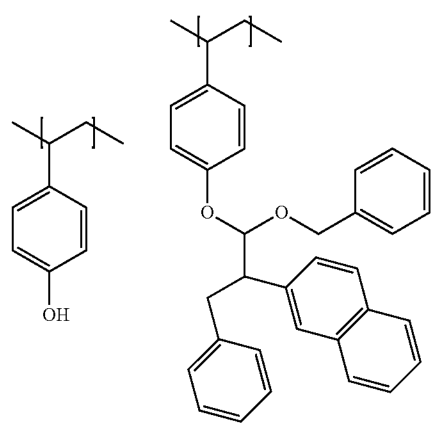
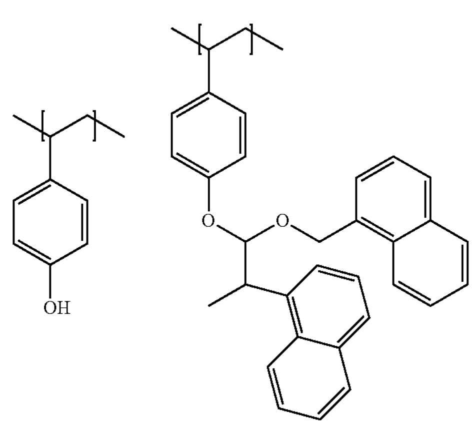

-continued
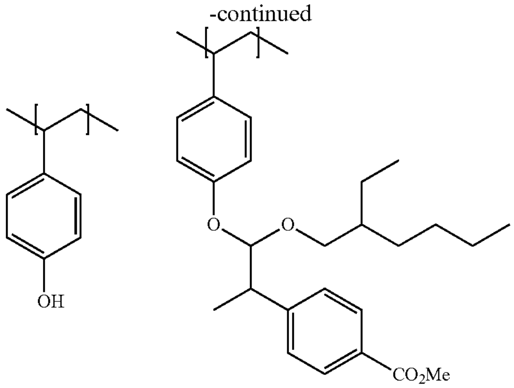
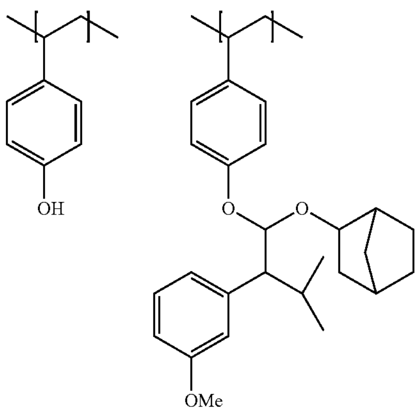
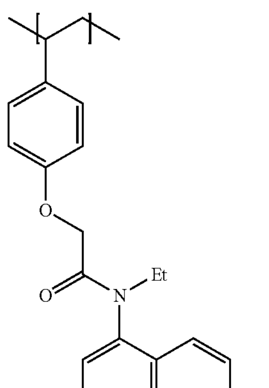
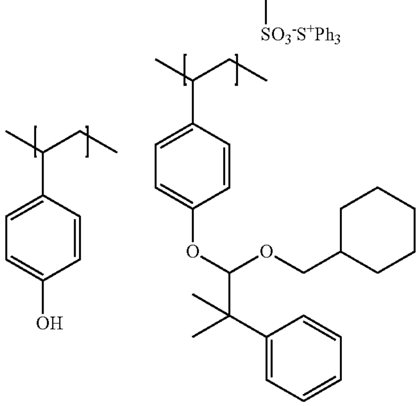
-continued
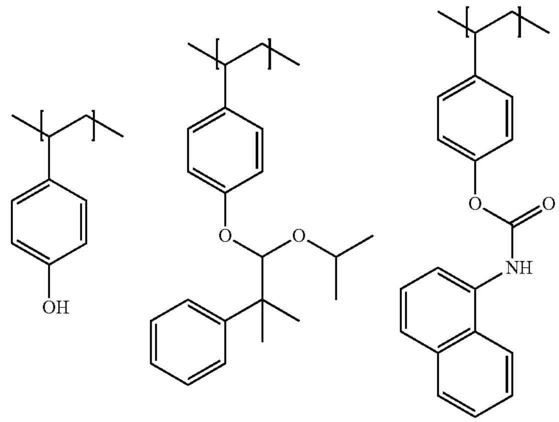
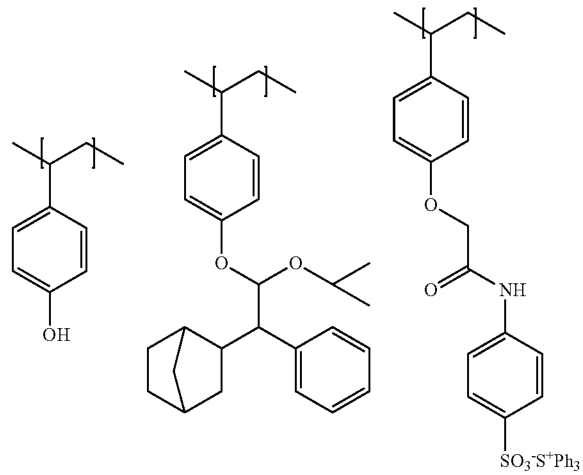
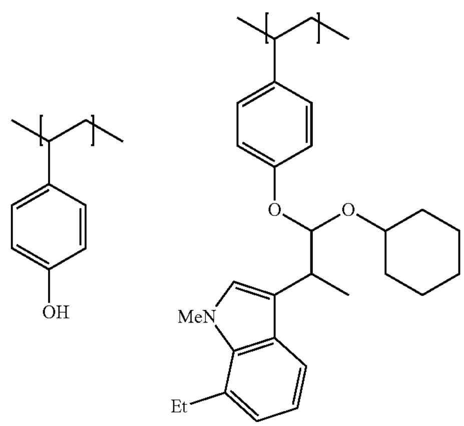
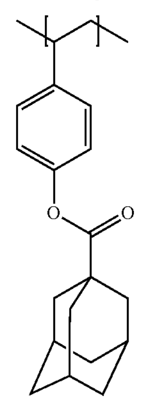

-continued
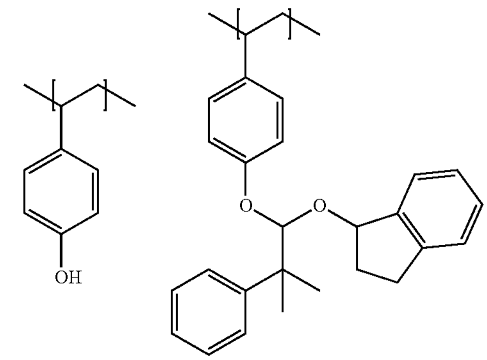
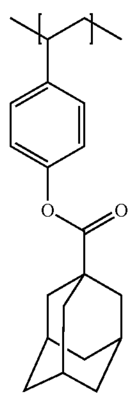
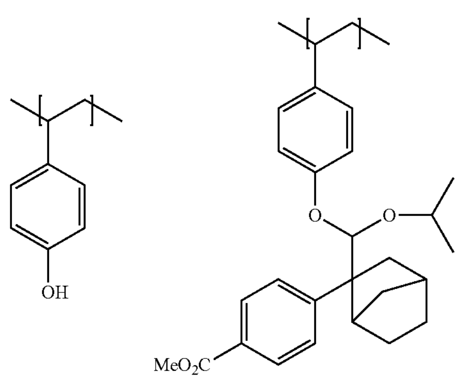
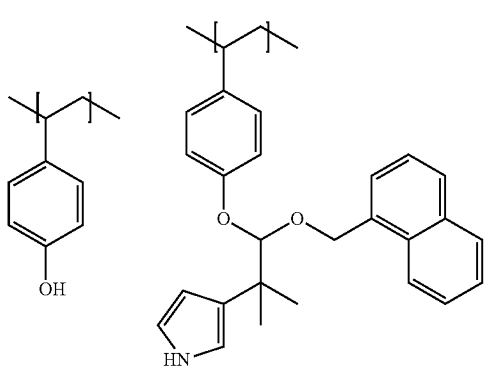
-continued
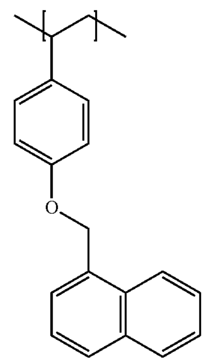
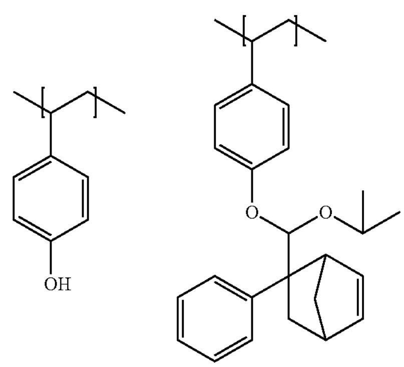
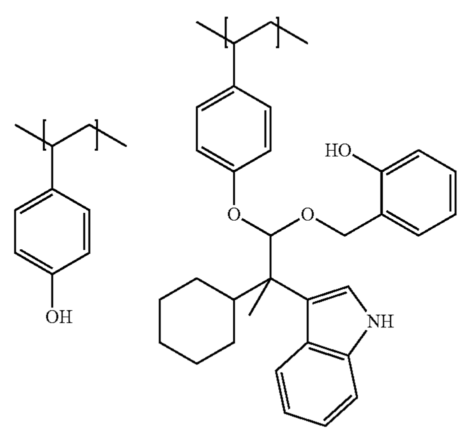
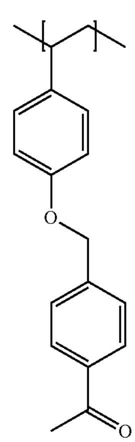

-continued
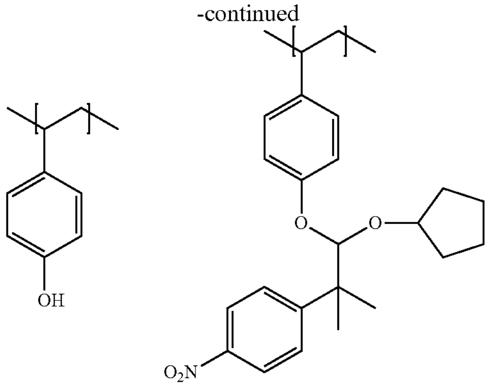
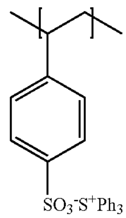
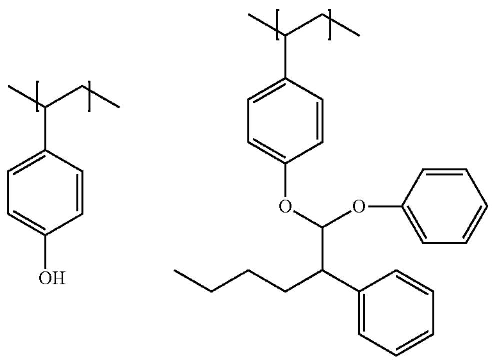
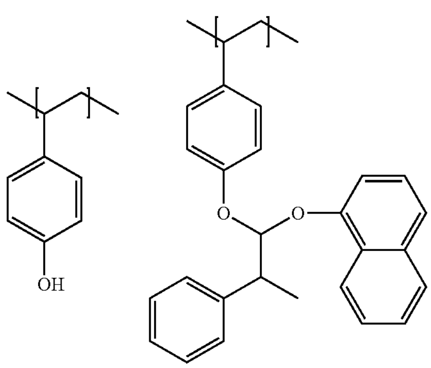
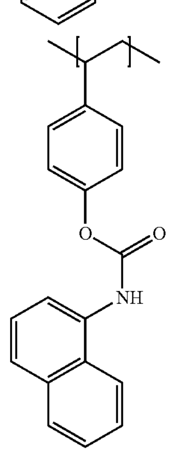
-continued
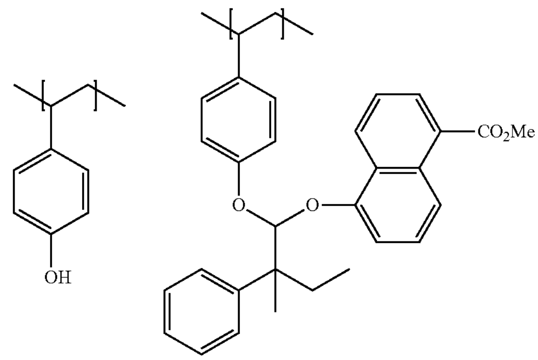
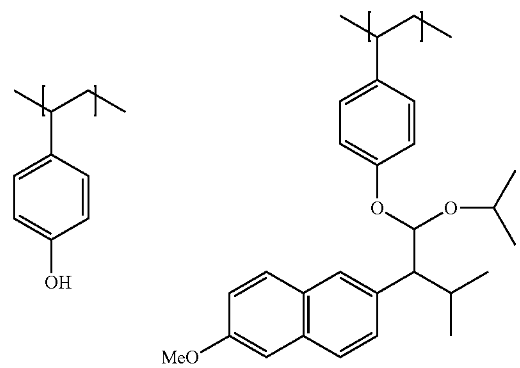
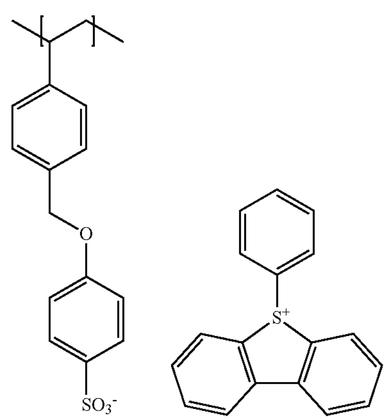
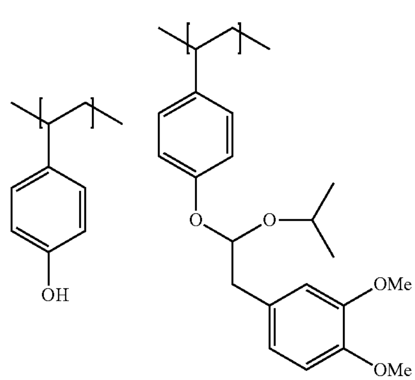

-continued
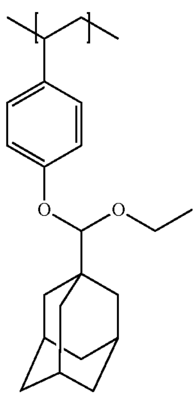
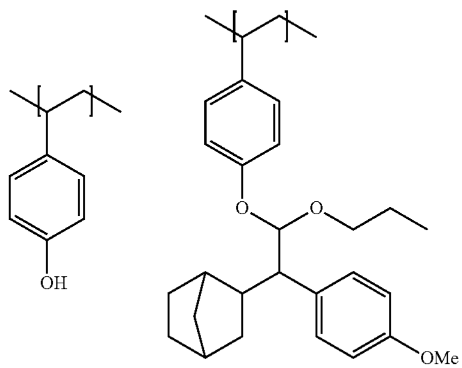
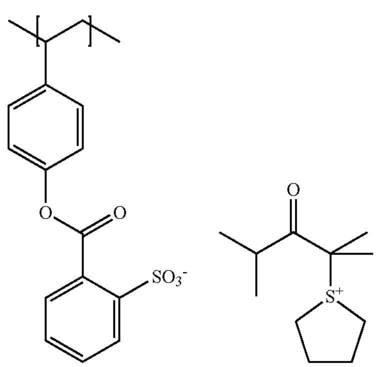
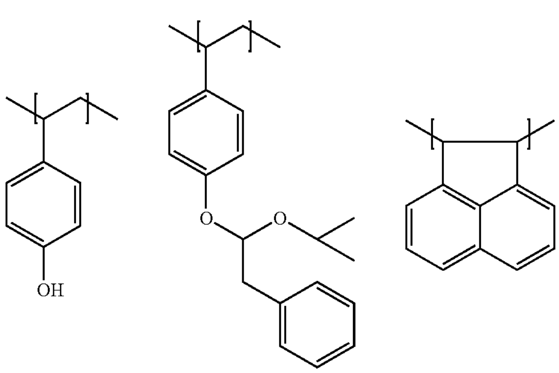
-continued
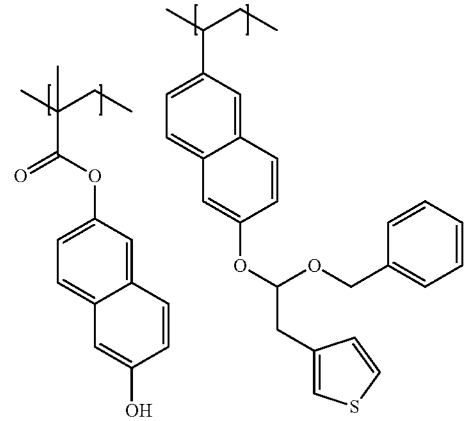
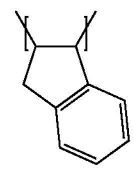
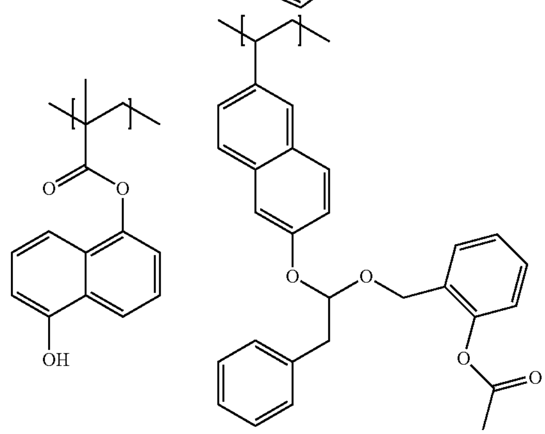
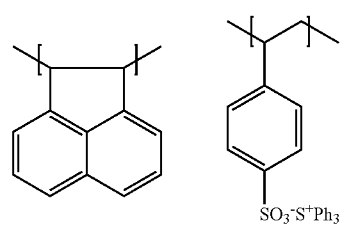
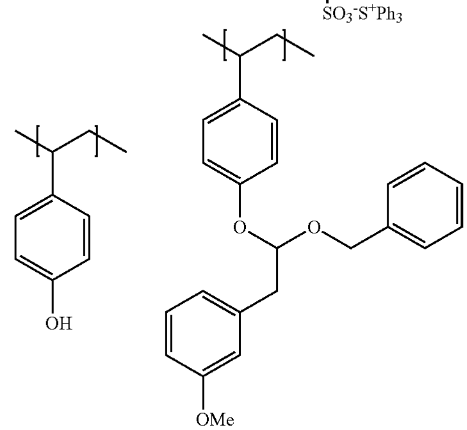

-continued
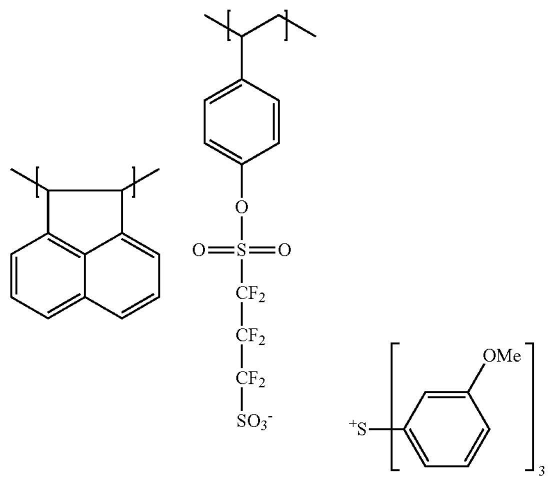
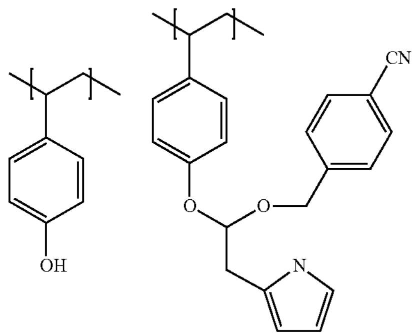
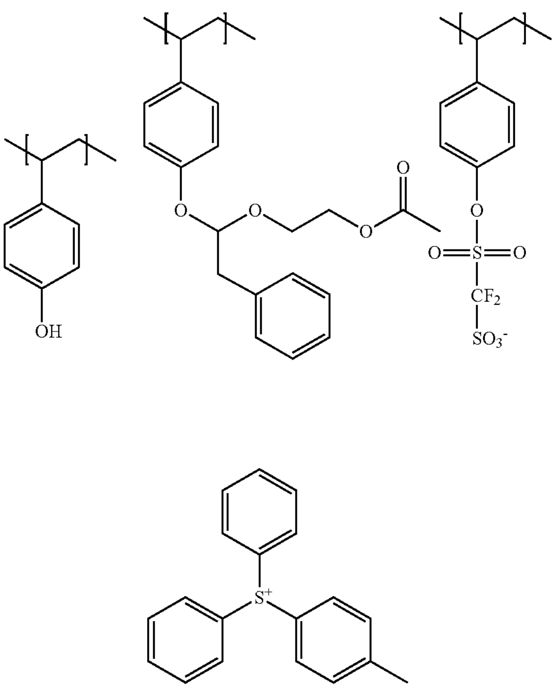
-continued
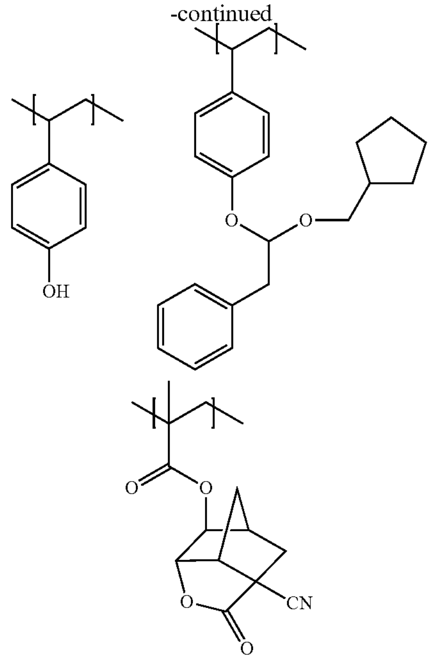
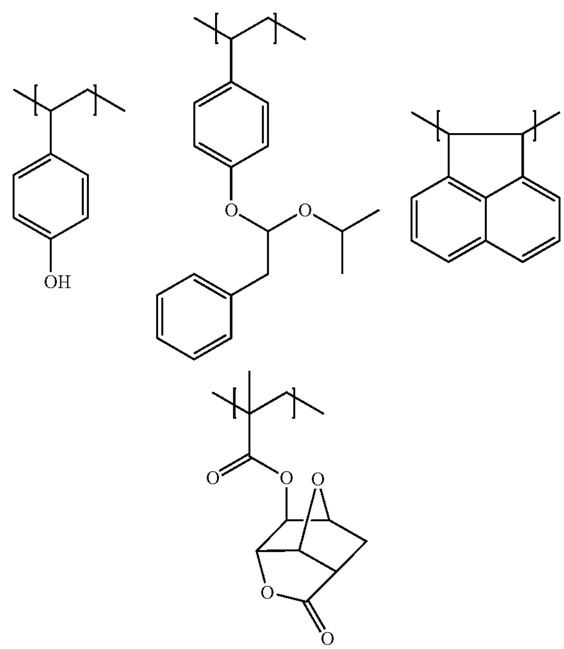
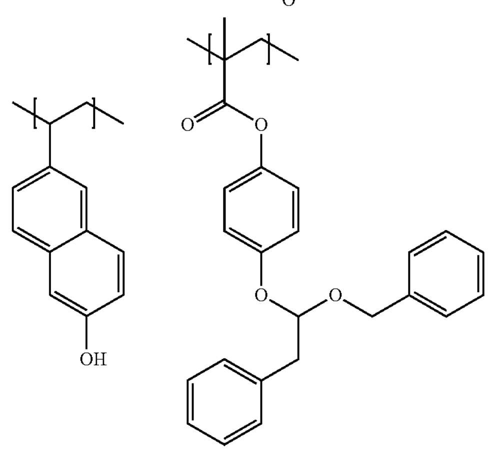

-continued
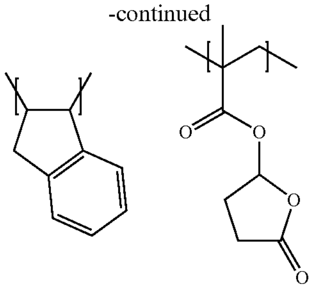
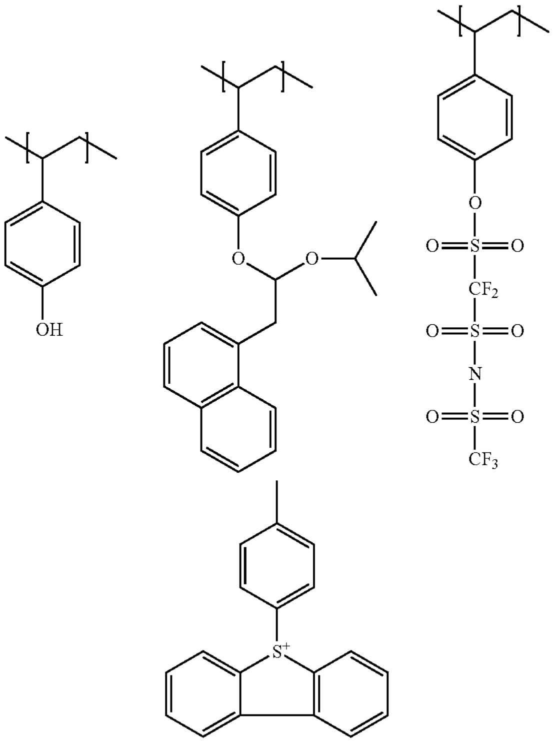
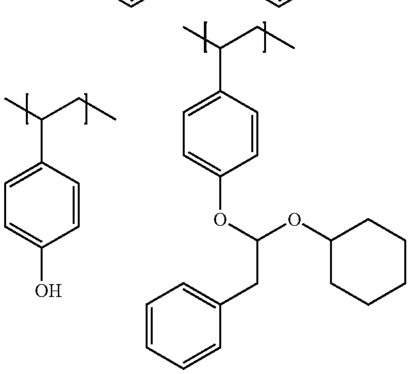
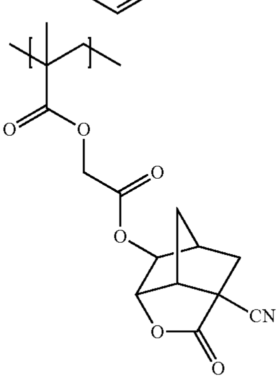
-continued
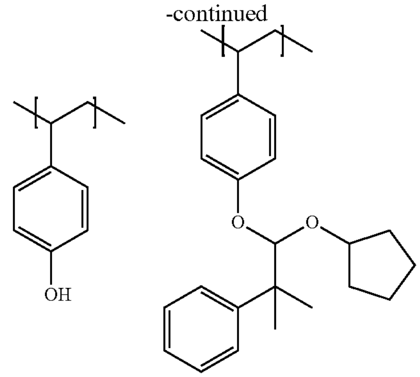
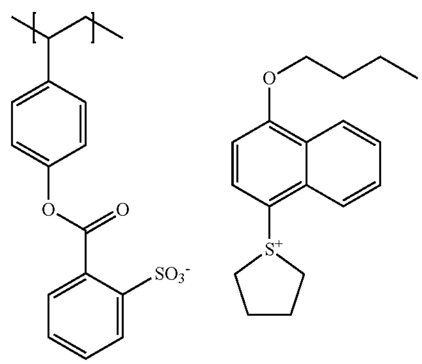
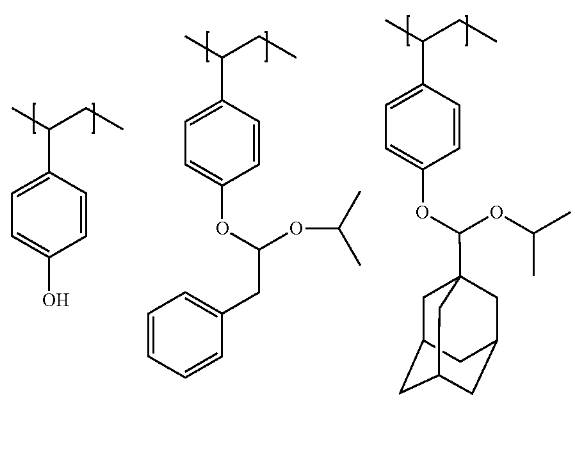
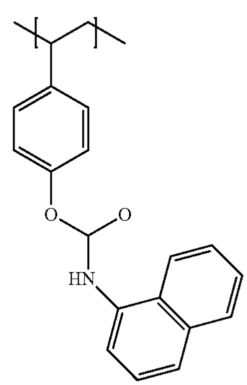

-continued
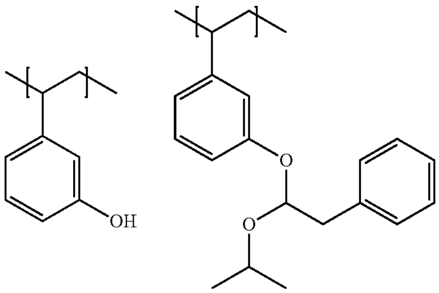
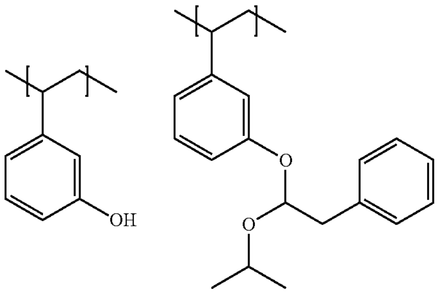
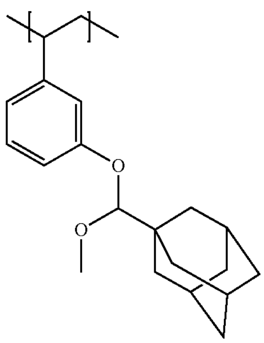
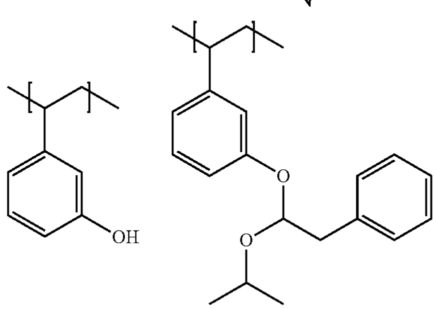
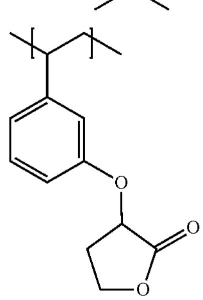
-continued
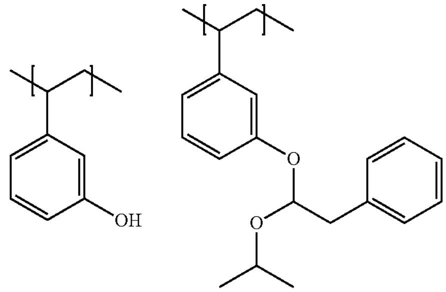
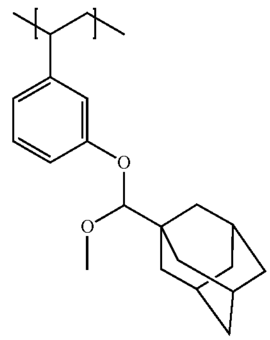
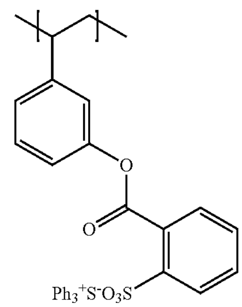
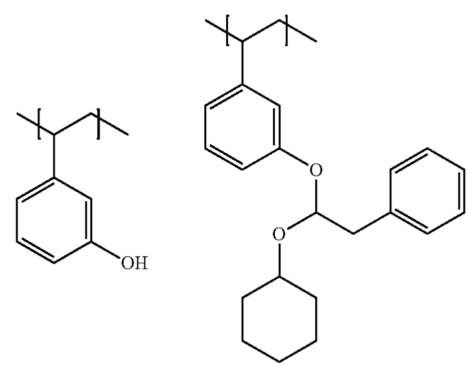
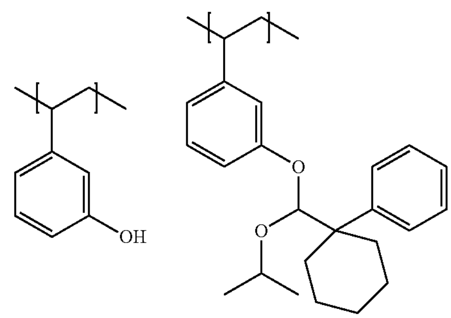
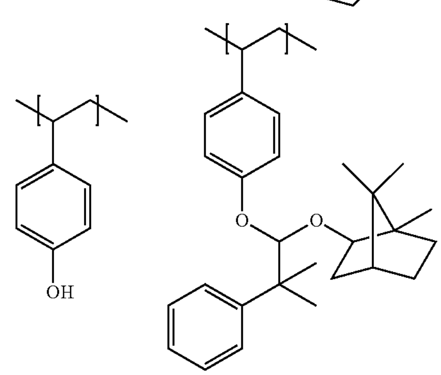

-continued
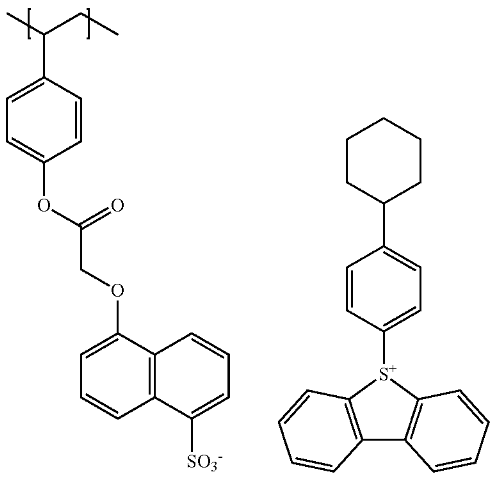
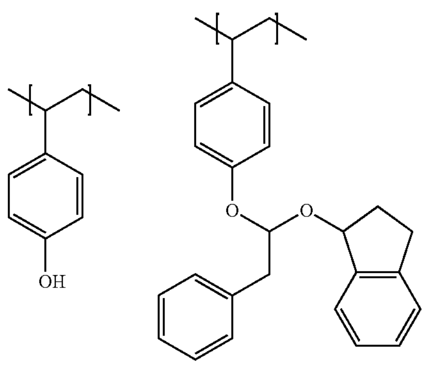
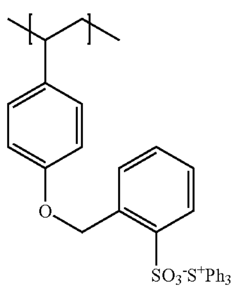
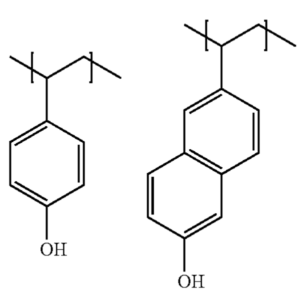
-continued
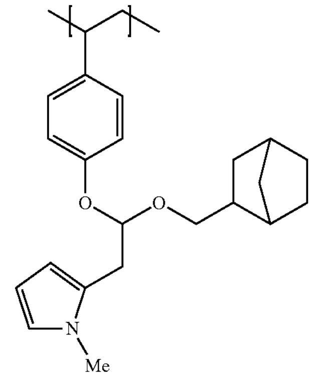
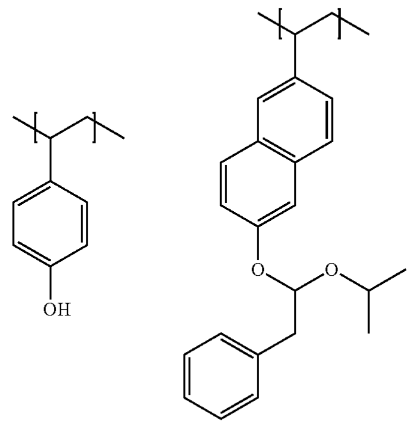
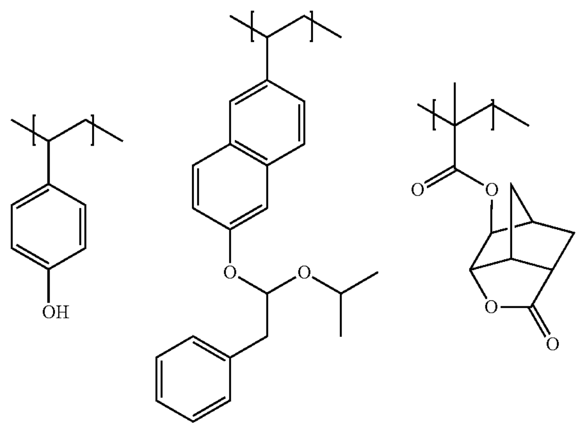
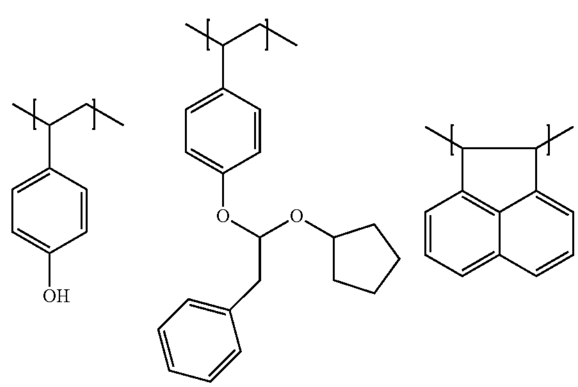

-continued
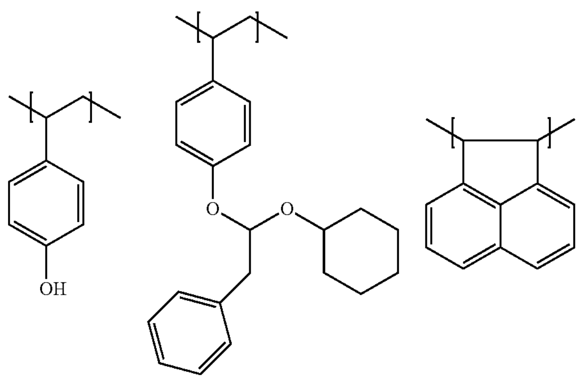
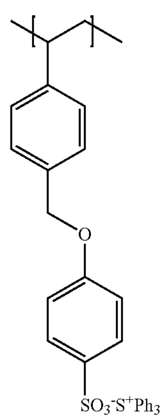
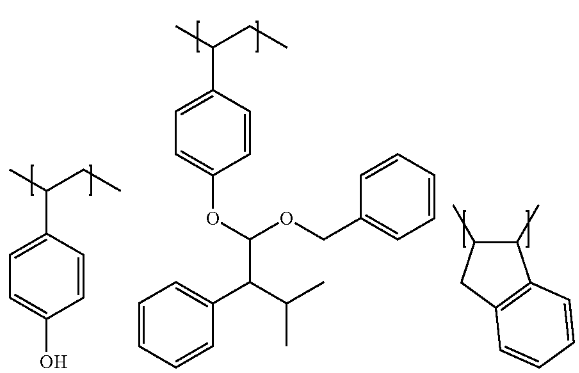
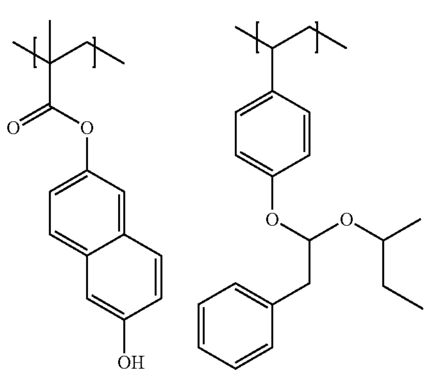
-continued
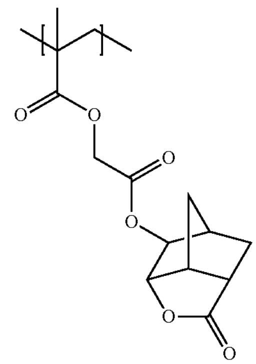
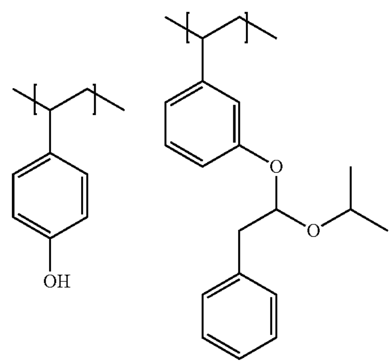
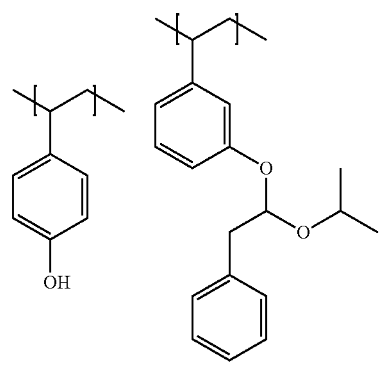
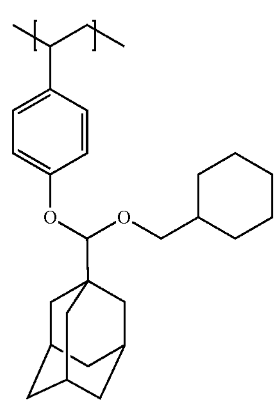

-continued

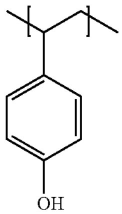

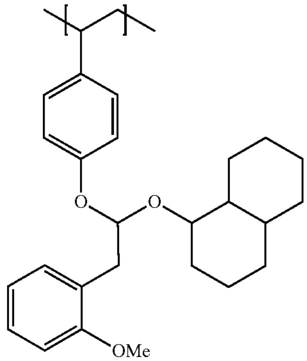

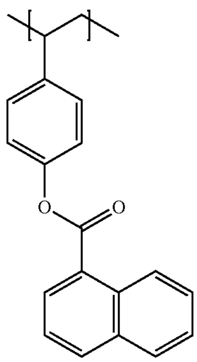

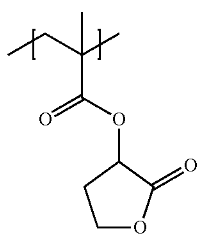

Next, a case where the compound (A) is a low-molecular weight compound will be described.

As described above, the compound (A) may be a low-molecular weight compound in which a hydrogen atom of a portion of phenolic hydroxyl groups in a parent compound having a plurality of phenolic hydroxyl groups has been substituted with an acid labile group represented by General Formula (1). Herein, the "low-molecular weight compound" refers to, for example, a compound containing less than 10 repeating units derived from a polymerizable monomer, and the molecular weight of the compound is, for example, 3000 or less, preferably from 300 to 2000, and more preferably from 500 to 1500.

In an embodiment, the low-molecular weight compound (A) has a structure represented by the following General Formula (T-I) or (T-II).

(T-I)

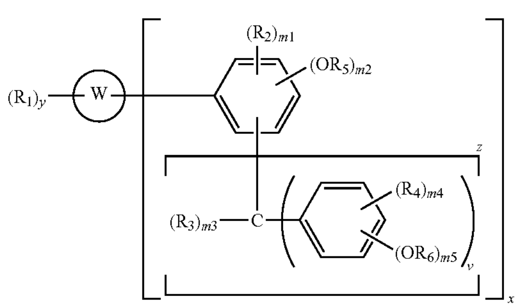

-continued (T-II)

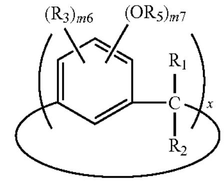

In General Formulae (T-I) and (T-II), each of $R_1$, $R_2$, $R_3$, and $R_4$ independently represents a hydrogen atom, an alkyl group, or a cycloalkyl group, a plurality of $R_1$s may form a ring by binding to each other, a plurality of $R_2$s may form a ring by binding to each other, a plurality of $R_3$s may form a ring by binding to each other, a plurality of $R_4$s may form a ring by binding to each other, and the plurality of $R_1$, $R_2$, $R_3$, and $R_4$ may be the same as or different from each other;

each of $R_5$ and $R_6$ independently represents a hydrogen atom or an organic group and the plurality of $R_5$ and $R_6$ may be the same as or different from each other, and in addition, at least one out of the plurality of $R_5$ and $R_6$ is a group represented by the General Formula (1);

W represents a single bond, an alkylene group, an arylene group, or a group which arbitrarily combines these;

x represents a positive integer;

y represents an integer of 0 or more, and when W is a single bond, y is 0;

z represents an integer of 0 or more;

v represents an integer of 0 or more;

m1, m3, m4, and m6 represent positive integers;

m2, m5, and m7 represent integers of 0 or more; $m1+m2+z=5$, $m3+v=3$, $m4+m5=5$, and $m2+m5\geq 2$, and in addition, $m6+m7=4$.

Here, the compound (A) represented by the General Formula (T-I) is preferably a compound represented by any of the General Formulae (T-III) to (T-V).

A phenolic hydroxyl group of a compound to be a mother nucleus (parent compound) such as a polyvalent phenol compound is allowed to react with a protection reaction agent so as to protect the phenolic hydroxyl group of the parent compound with the group represented by General Formula (1), whereby the compound (A) can be synthesized. The protection reaction agent herein refers to a compound used for causing a reaction for introducing a protecting group. Here, the proportion of the phenolic hydroxyl group, which is protected by the acid decomposable group with regard to the total number of phenolic hydroxyl groups included in the parent compound, is referred to as the protection rate.

Specific examples of the parent compound of the compound (A) represented by General Formula (T-I) will be shown below, but the present invention is not limited thereto.

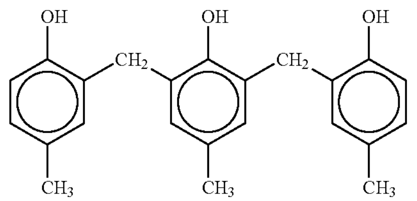
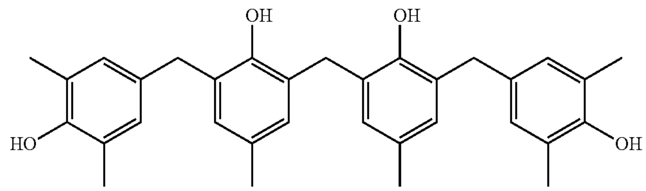
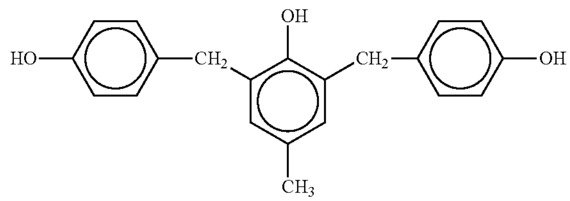
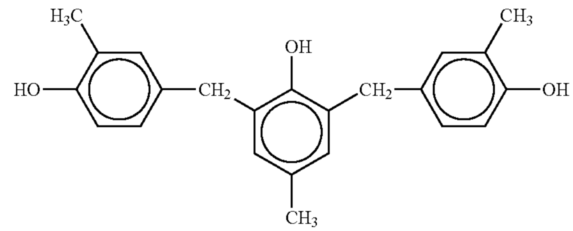
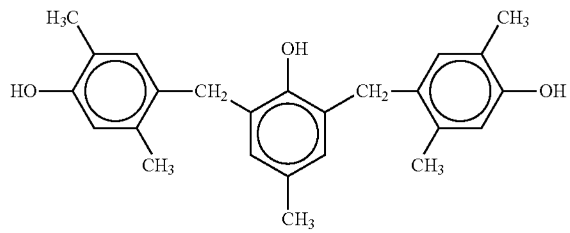
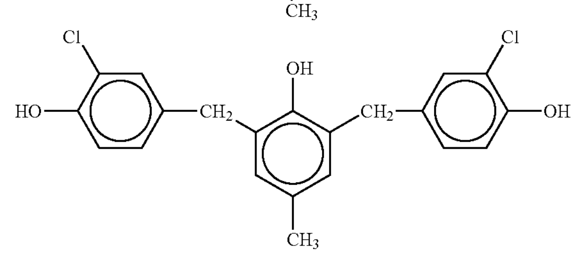
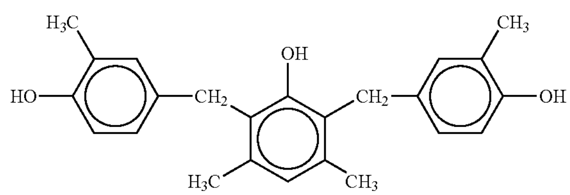
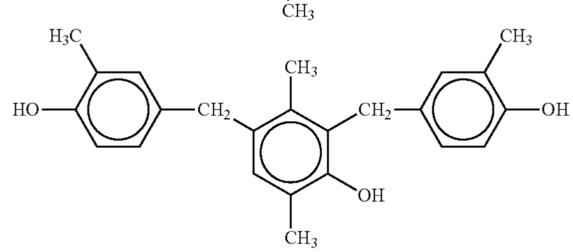
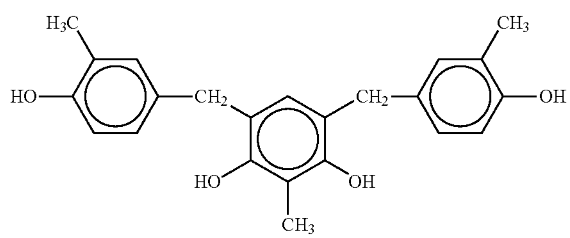
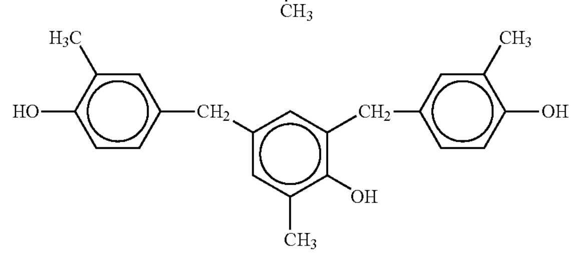
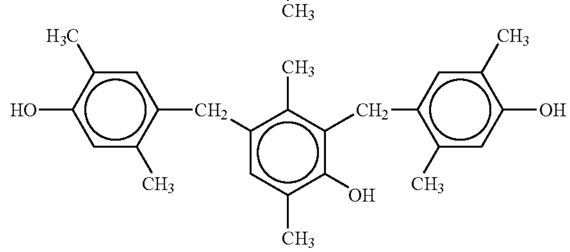
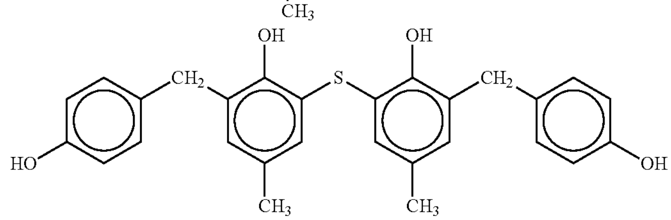
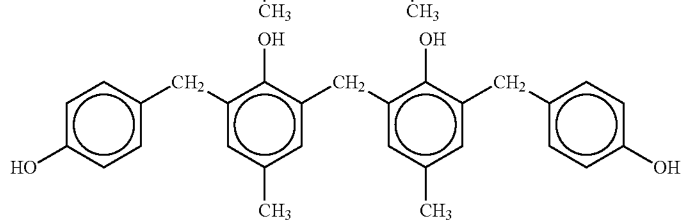

-continued
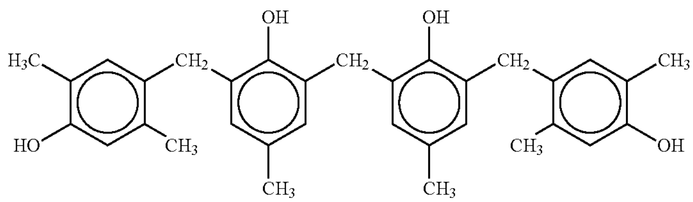
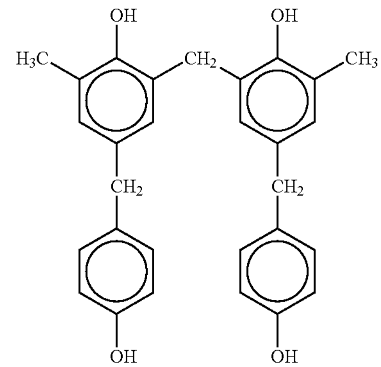
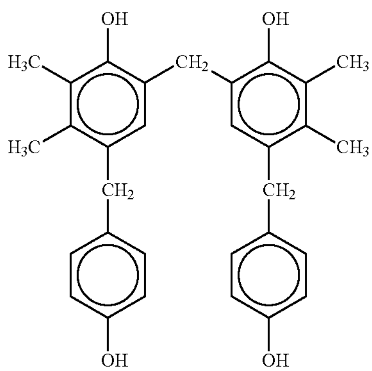
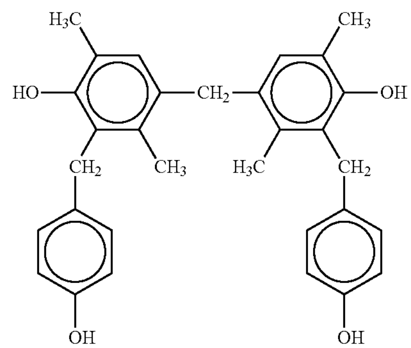
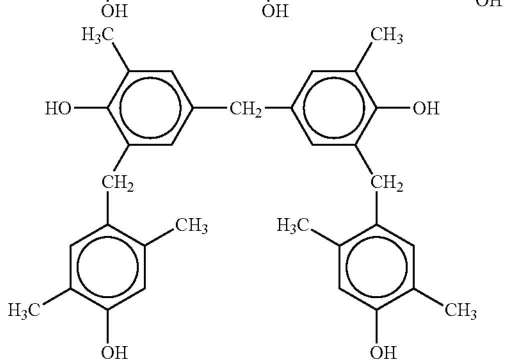
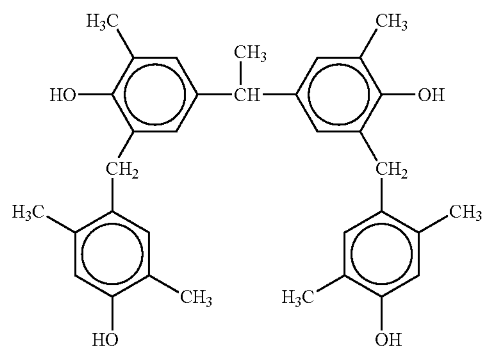
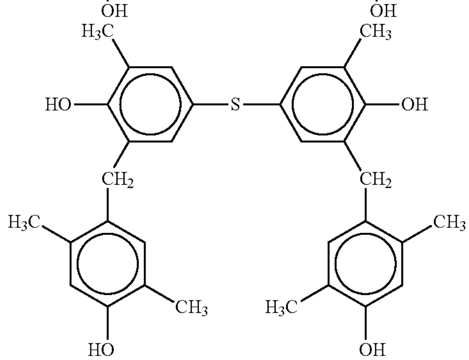
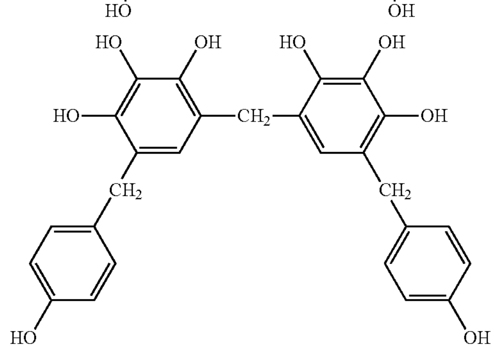
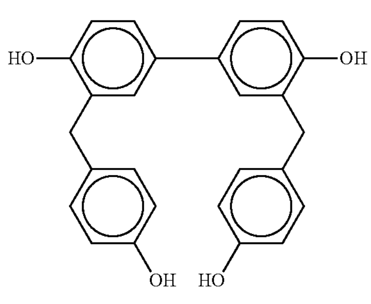
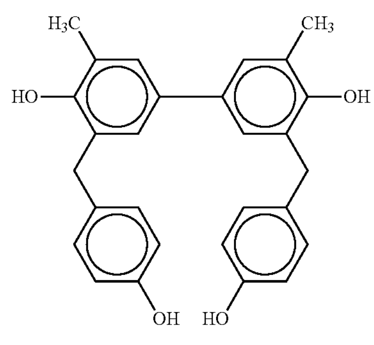

-continued
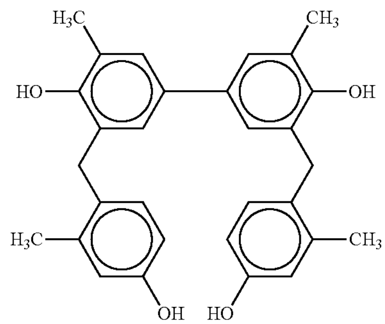
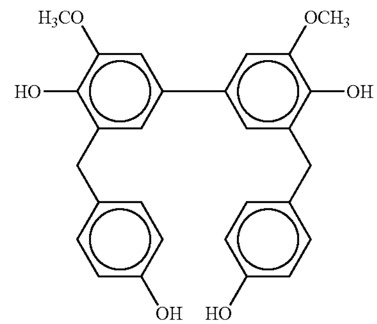
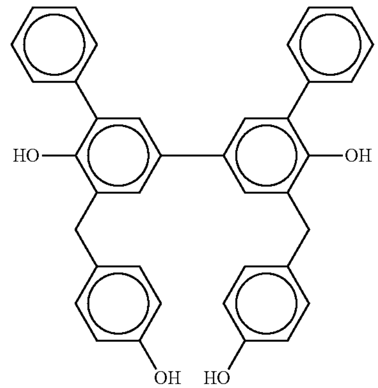
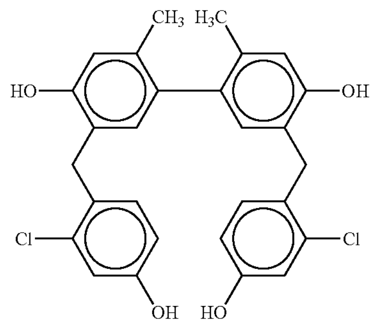
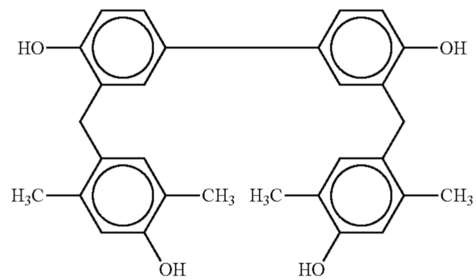
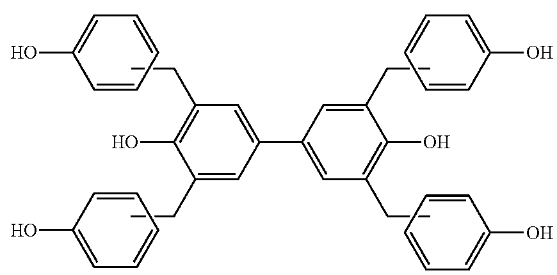
Mixture of ortho-substituent/para-substituent
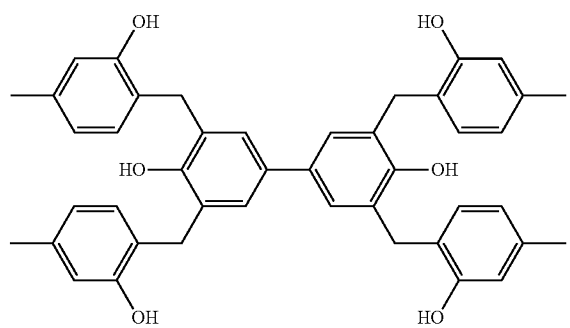
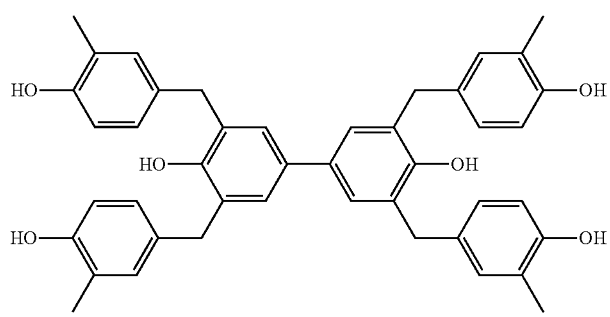
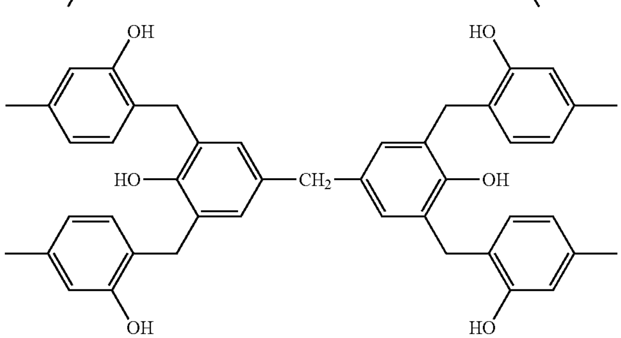

-continued
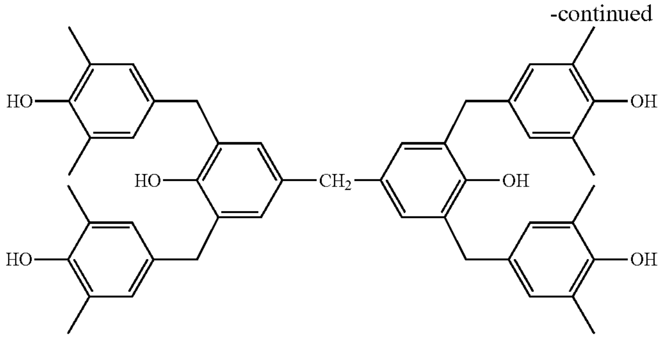
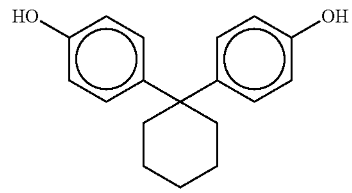
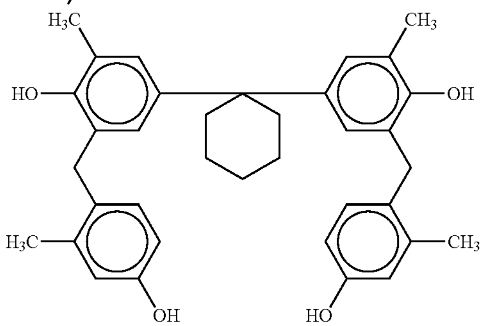
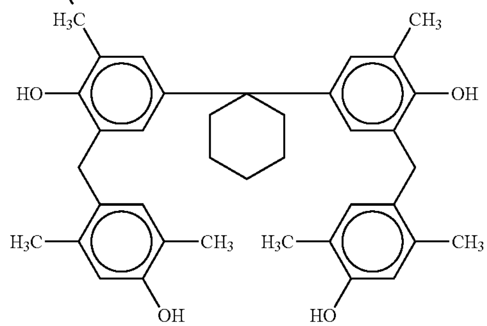
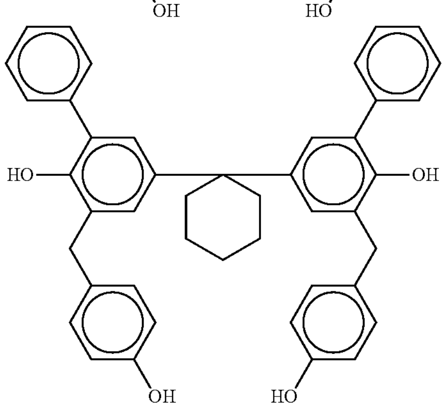
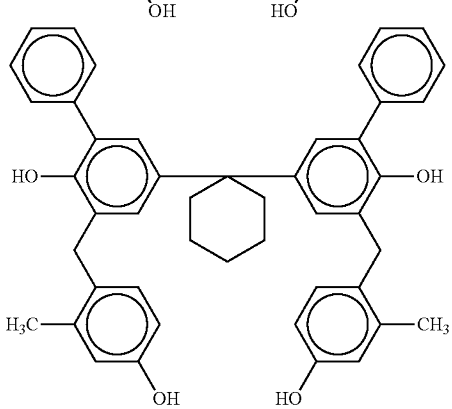
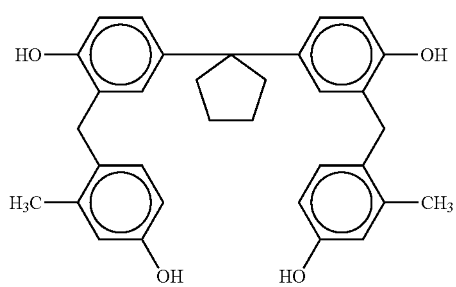
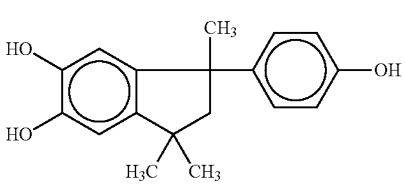
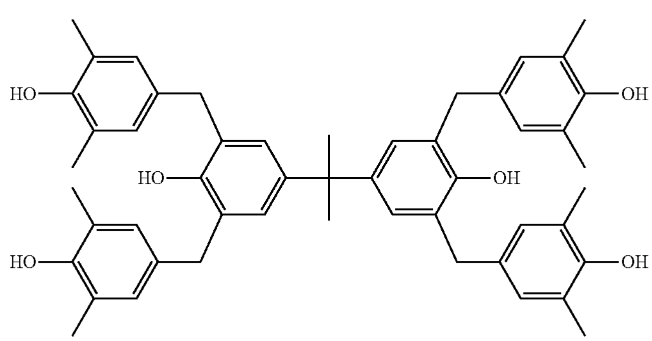

-continued
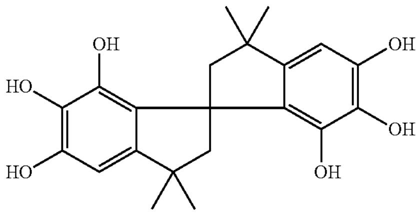
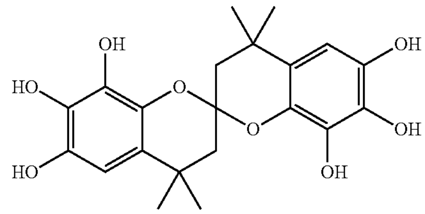
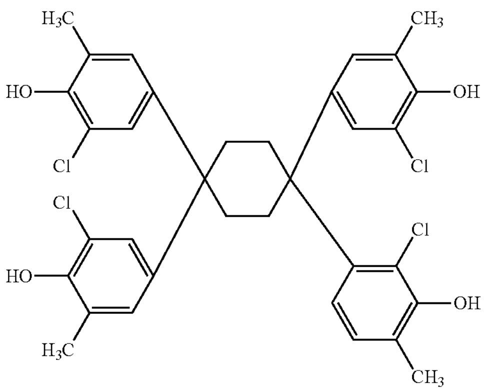
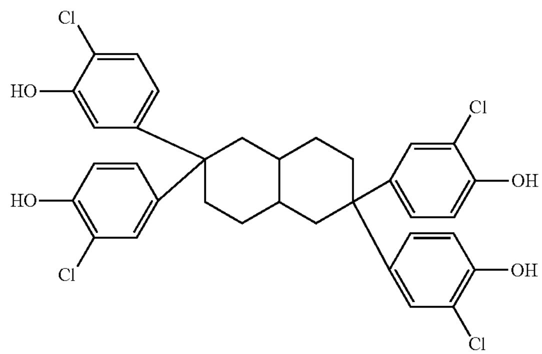
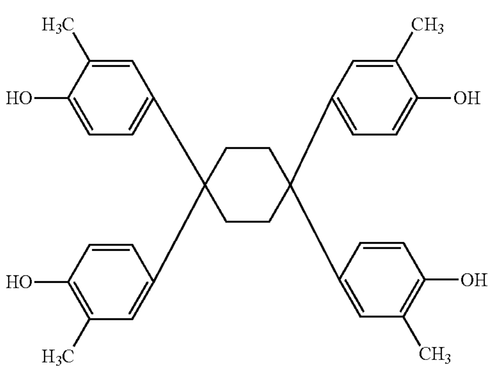
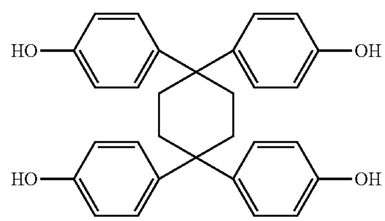
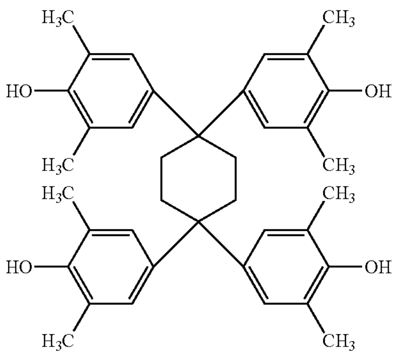
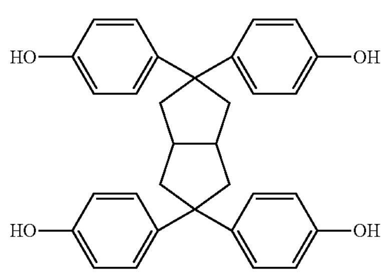

-continued
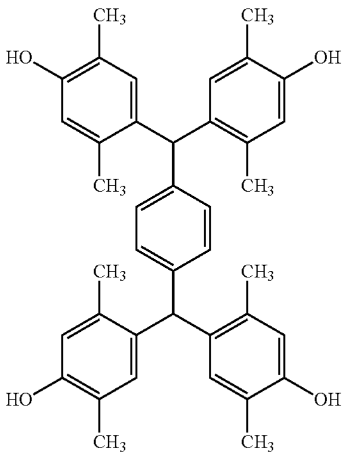
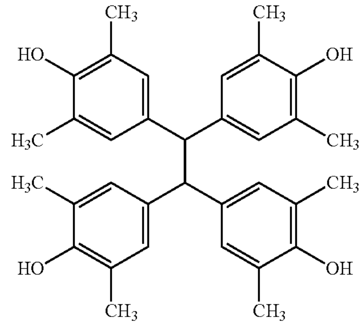
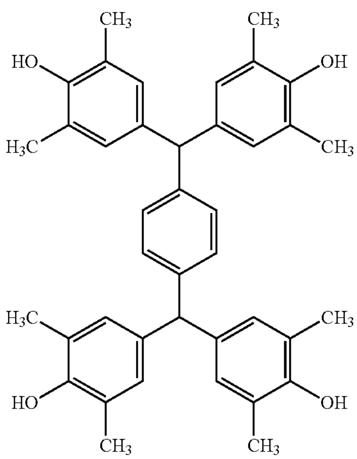
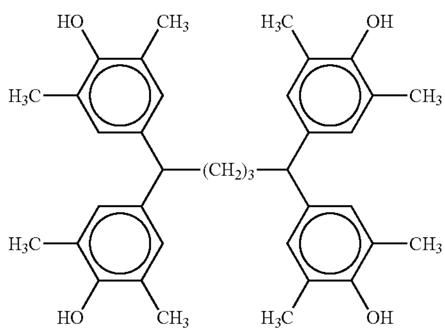
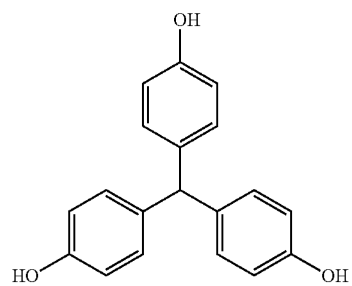
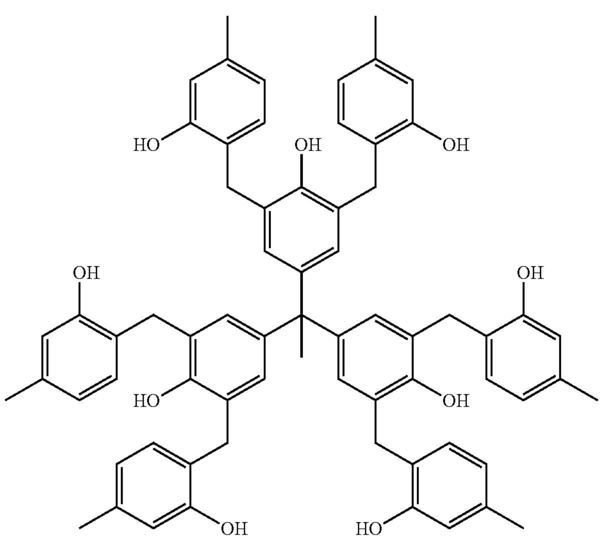

-continued
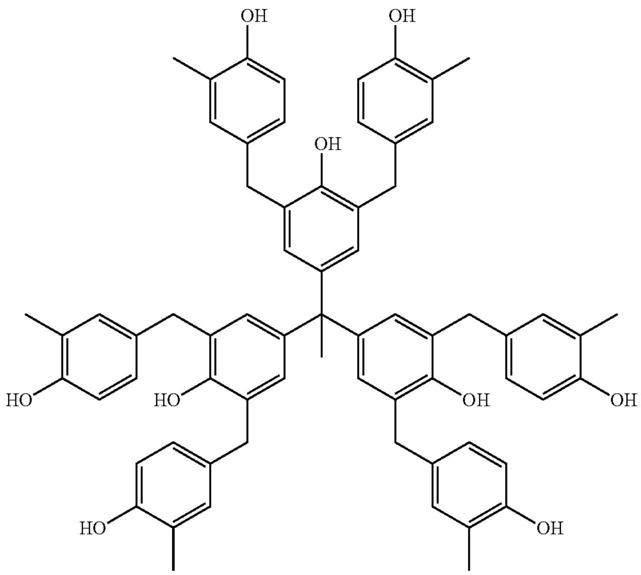
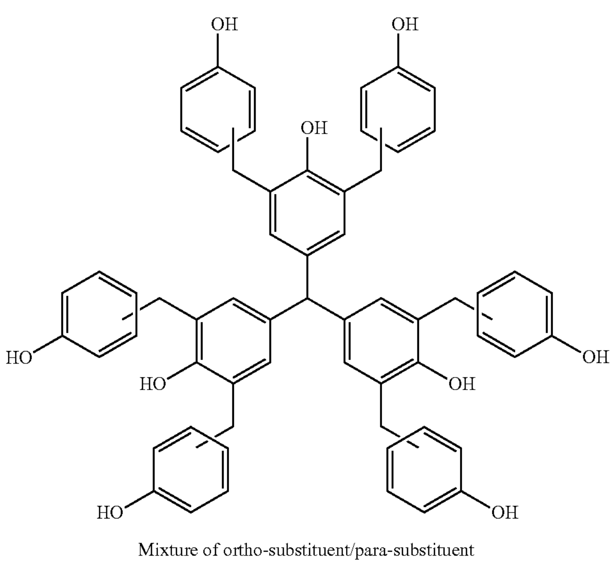
Mixture of ortho-substituent/para-substituent
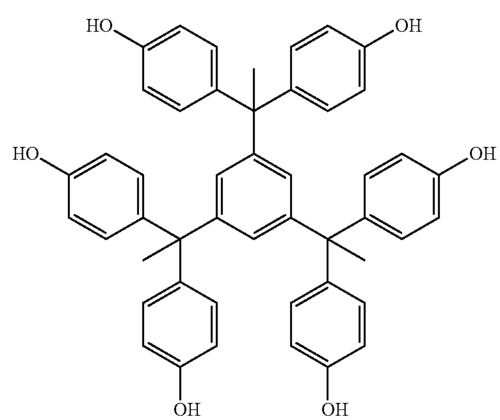

-continued
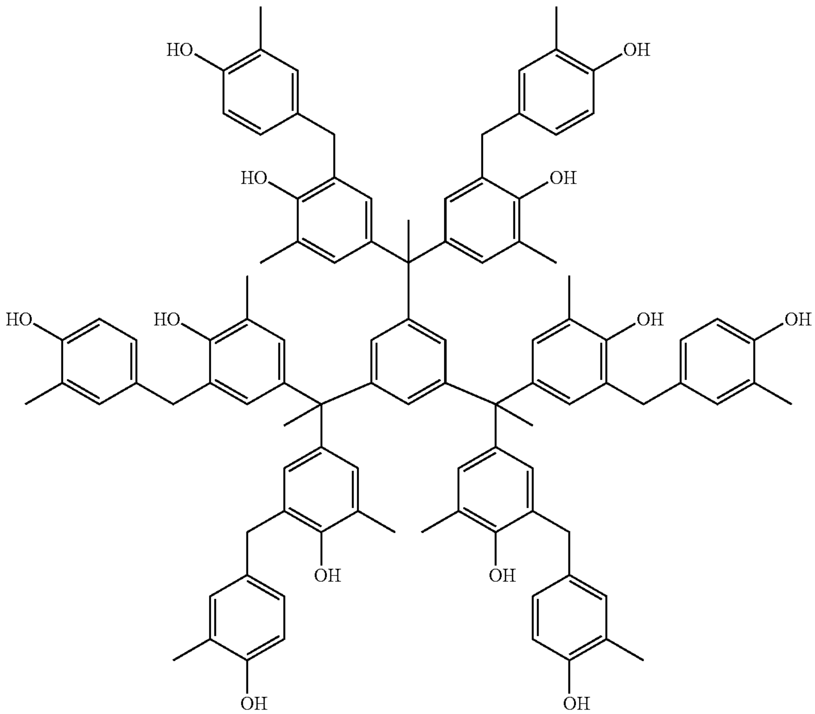
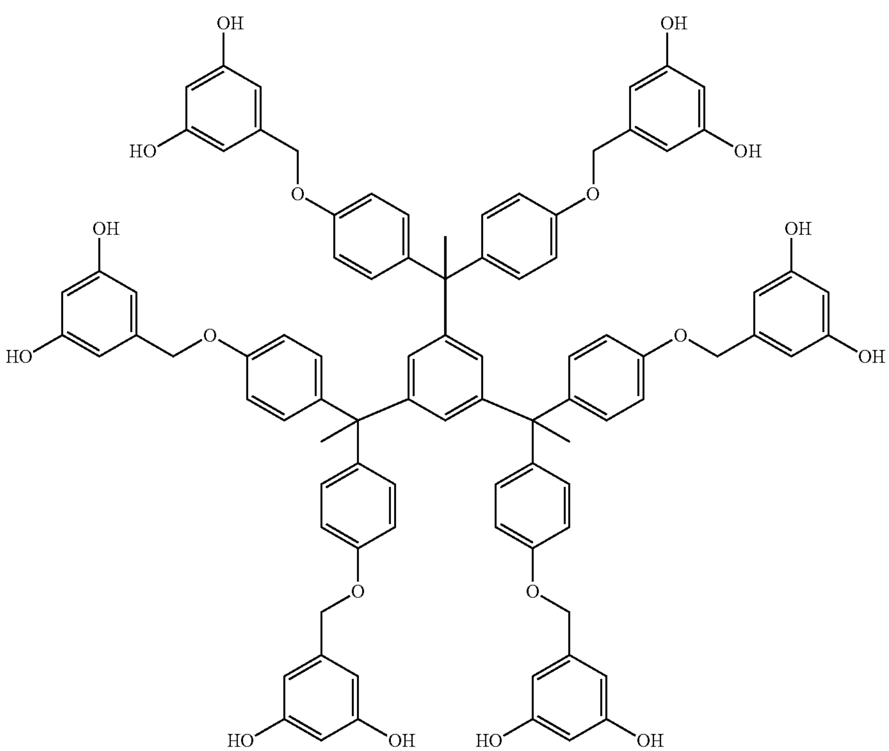
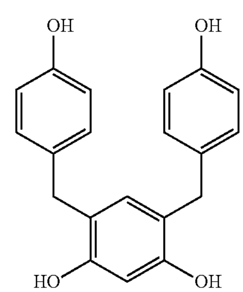

-continued
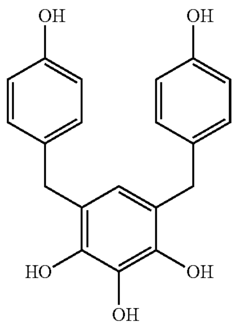
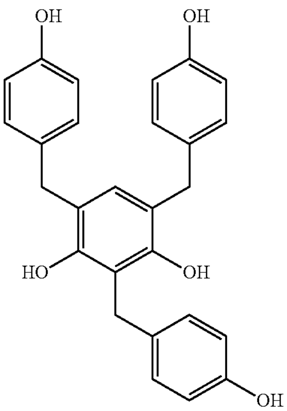
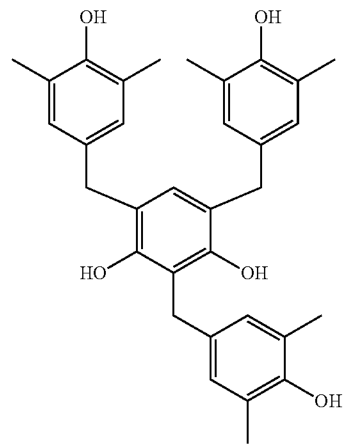
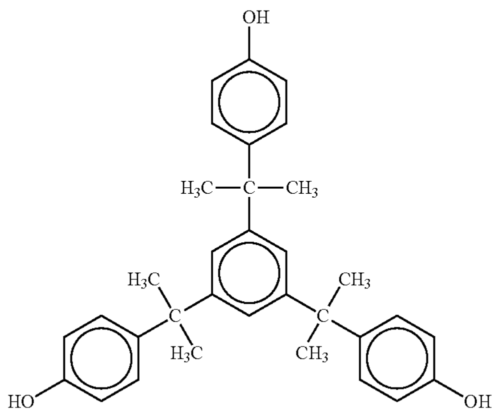
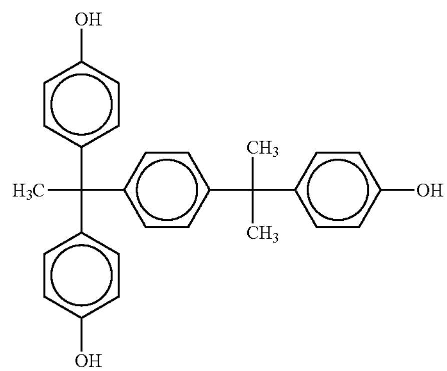
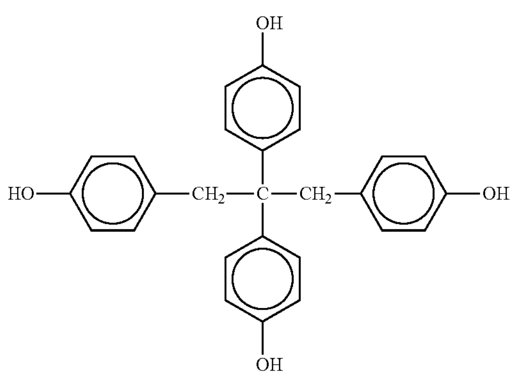
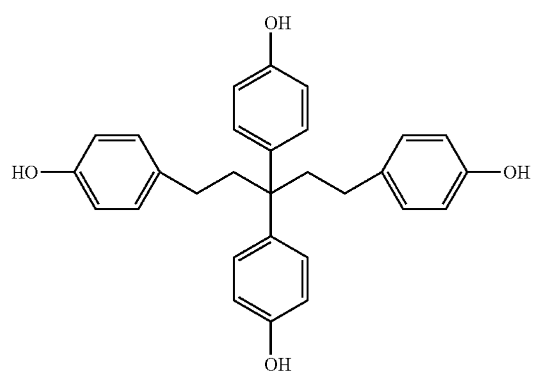
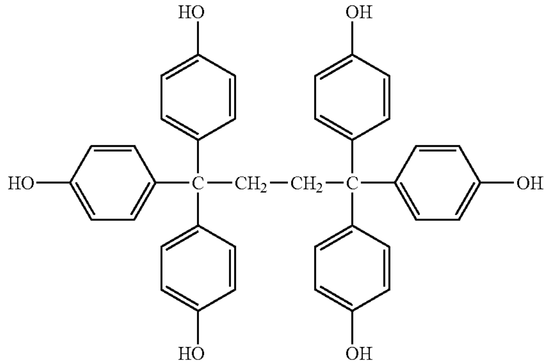
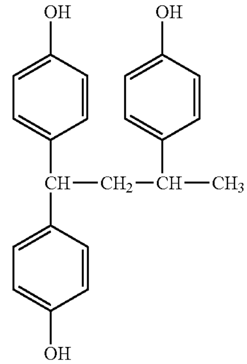

-continued
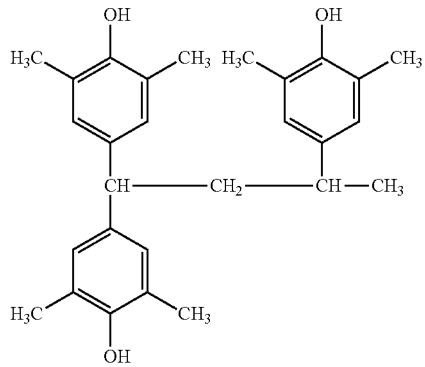
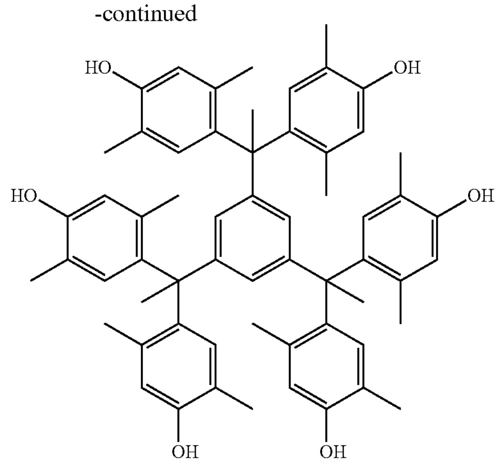
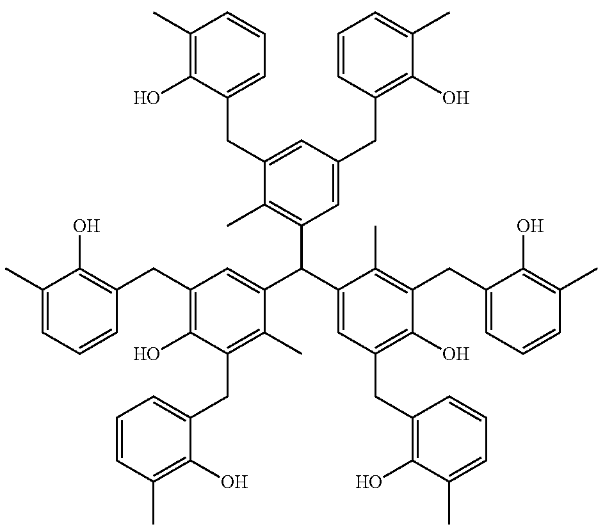
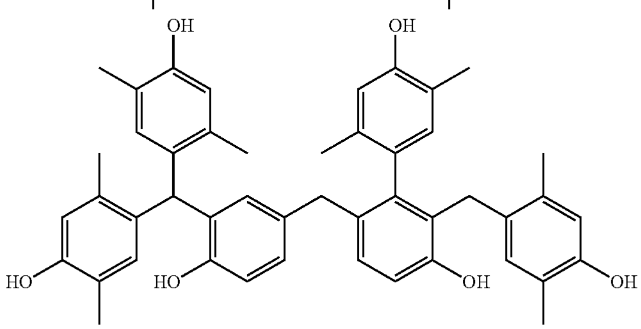
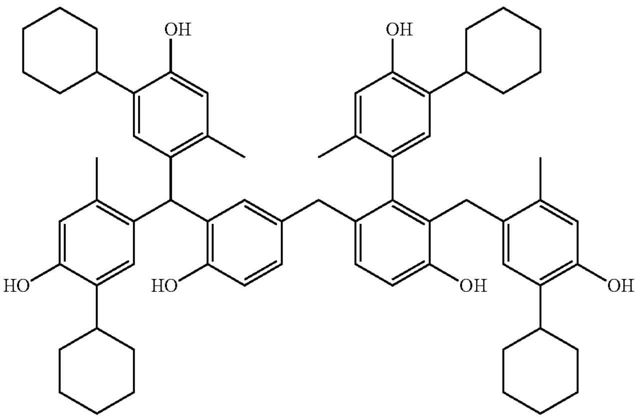

Next, specific examples of the parent compound of the compound (A) represented by General Formula (T-II) will be shown, but the present invention is not limited thereto.

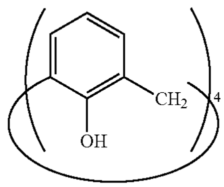

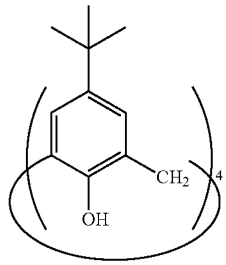

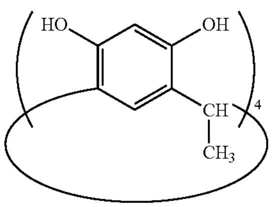

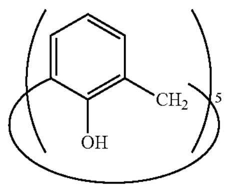

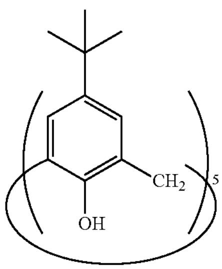

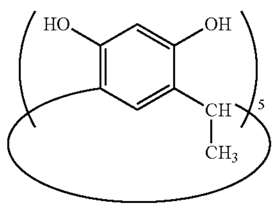

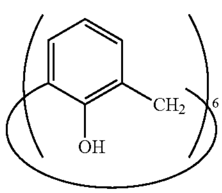

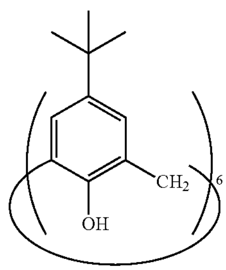

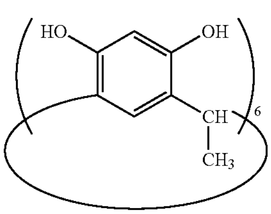

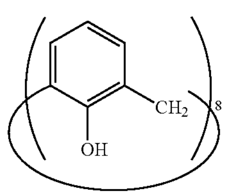

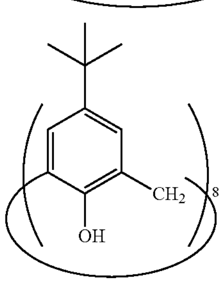

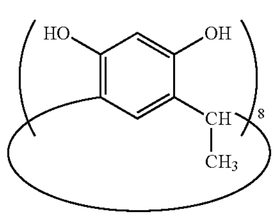

-continued

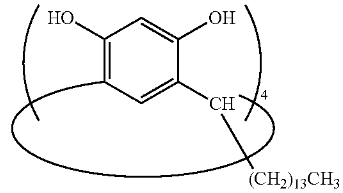

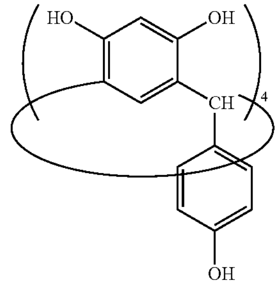

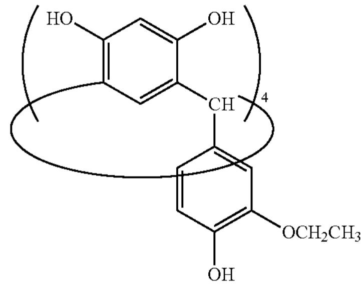

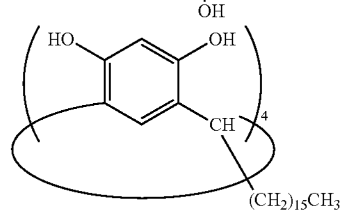

[2] Compound (B) Which Generates Acid Due to Irradiation of Actinic Rays or Radiation The composition according to the present invention may contain a compound which generates an acid due to the irradiation of actinic rays or radiation (referred to below as "photoacid generator" and the like).

As the photoacid generator, for example, it is possible to appropriately select and use a photo-initiator for cationic photopolymerization, a photo-initiator for radical photopolymerization, a photodecolorant of dyes, a photodiscoloring agent, or a known compound which uses a micro resist, or the like and generates an acid due to irradiation of actinic rays or radiation, or a mixture thereof. Examples thereof include a sulfonium salt, an iodonium salts, bis(alkylsulfonyl diazomethane), and the like.

As a preferable example of the photoacid generator, examples include the compounds according to the General Formulae (ZI), (ZII), and (ZIII).

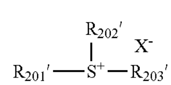

(ZI)

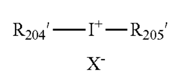

(ZII)

-continued (ZIII)

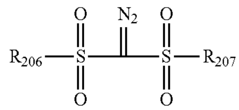

In the general formula (ZI) above, $R_{201}'$, $R_{202}'$, and $R_{203}'$ each independently represents an organic group, and the number of carbon atoms of the organic group of $R_{201}'$ $R_{202}'$ and $R_{203}'$ is typically 1 to 30 and is preferably 1 to 20

In addition, a ring structure may be formed by bonding two out of $R_{201}'$ to $R_{203}'$ via a single bond or a linking group. Examples of a linking group in this case include an ether bond, a thioether bond, an ester bond, an amide bond, a carbonyl group, a methylene group, and an ethylene group. Examples of the group which is formed by the bonding of two out of $R_{201}'$ to $R_{203}'$ include an alkylene group such as a butylene group or a pentylene group. Specific examples of $R_{201}'$, $R_{202}'$, and $R_{203}'$ include a group which corresponds to the compounds (ZI-1), (ZI-2), and (ZI-3) described later.

$X^-$ represents a non-nucleophilic anion. Examples of $X^-$ preferably include a sulfonate anion, a bis(alkylsulfonyl)amide anion, a tris(alkylsulfonyl)methide anion, $BF_4^-$, $PF6^-$ and $SbF6^-$. $X^-$ is preferably an organic anion which contains a carbon atom. Examples of the organic anion preferably include an organic anion shown in AN1 to AN3 below.

AN1

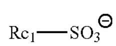

AN2

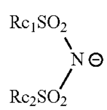

AN3

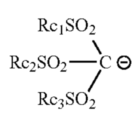

In the General Formulae AN1 to AN3, each of $Rc_1$ to $Rc_3$ independently represents an organic group. Examples of the organic group include an organic group having 1 to 30 carbon atoms and is preferably an alkyl group, an aryl group, or a group where a plurality of such groups are connected through a single bond or a linking group. Here, examples of the linking group include —O—, —$CO_2$—, —S—, —$SO_3$— and —$SO_2N(Rd_1)$-. Here, $Rd_1$ represents a hydrogen atom or an alkyl group and may form a ring with an alkyl group or an aryl group by bonding.

The organic group of $Rc_1$ to $Rc_3$ may be an alkyl group substituted by a fluorine atom or a fluoroalkyl group at the 1-position, or a phenyl group substituted by a fluorine atom or a fluoroalkyl group. Due to containing a fluorine atom or a fluoroalkyl group, it is possible to increase the acidity of the acid which is generated due to irradiation with light. Due to this, it is possible to improve the sensitivity of the actinic ray-sensitive or radiation-sensitive resin composition. Here, $Rc_1$ to $Rc_3$ may form a ring by bonding with another alkyl group, aryl group, or the like.

In addition, examples of a preferable $X^-$ include a sulfonate anion represented by the General Formulae (SA1) or (SA2) below.

(SA1)

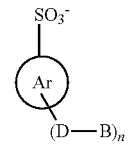

In the formula (SA1),

Ar represents an aryl group, and may further contain a substituent other than a sulfonate anion or a group represented by -(D-B).

n is an integer of 0 or more. n is preferably 1 to 4, more preferably 2 or 3, and most preferably 3.

D represents a single bond or a divalent linking group. Examples of the divalent linking group can include an ether group, a thioether group, a carbonyl group, a sulfoxide group, a sulfone group, a sulfonic ester group, an ester group, a group which is a combination of two or more thereof, or the like.

B represents a hydrocarbon group.

(SA2)

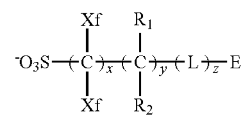

Each of $R_1$ and $R_2$ independently represents a hydrogen atom, a fluorine atom, or an alkyl group. In a case where two or more of $R_1$ or $R_2$ are contained, each $R_1$ or $R_2$ may be the same as or different from each other.

L represents a divalent linking group. In a case where two or more Ls are contained, the Ls may be the same as or different from each other.

E represents an organic group with a ring structure.

x represents an integer of 1 to 20, y represents an integer of 0 to 10, and z represents an integer of 0 to 10.

First, the sulfonate anion represented by the General Formula (SA1) will be described in detail.

In the General Formula (SA1), Ar is preferably an aromatic ring having 6 to 30 carbon atoms. Specific examples of Ar include a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, a phenazine ring or the like. Among these, from the point of view of obtaining both improvement in roughness and higher sensitivity, a benzene ring, a naphthalene ring or an anthracene ring are preferable, and a benzene ring is more preferable.

In a case where Ar further contains a substituent other than the sulfonate anion and the -(D-B) group, examples of the substituent include a halogen atom such as a fluorine atom, a chlorine atom, a bromine atom or an iodine atom, a hydroxy group, a carboxy group, a sulfonate group, and the like.

the General Formula (SA1), D is preferably a single bond, an ether group, or an ester group. D is more preferably a single bond.

In the General Formula (SA1), for example, B is preferably an alkyl group, an alkenyl group, an alkynyl group, an aryl group, or a cycloalkyl group. B is preferably an alkyl group or a cycloalkyl group and is more preferably a cycloalkyl group. The alkyl group, the alkenyl group, the alkynyl group, the aryl group, or the cycloalkyl group as B may have a substituent.

An alkyl group as B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethylpentyl group, and a 2-ethylhexyl group.

Examples of the alkenyl group as B include a vinyl group, a propenyl group, and a hexenyl group.

Examples of the alkynyl group as B include a propynyl group, and a hexynyl group.

Examples of the aryl group as B include a phenyl group and a p-tolyl group.

The cycloalkyl group as B may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

In a case where the alkyl group, the alkenyl group, the alkynyl group, the aryl group, or the cycloalkyl group as B has a substituent, examples of the substituent include the following. That is, examples of the substituent include a halogen atom such as a fluorine atom, a chlorine atom, a bromine atom, or an iodine atom; an alkoxy group such as a methoxy group, an ethoxy group, or a tert-butoxy group; an aryloxy group such as a phenoxy group or a p-tolyloxy group; an alkylthioxy group such as a methylthioxy group, an ethylthioxy group, or a tert-butylthioxy group; an arylthioxy group such as a phenylthioxy group or a p-tolylthioxy group; an alkoxycarbonyl group such as a methoxycarbonyl group, a butoxycarbonyl group, or a phenoxycarbonyl group; an acetoxy group; a linear alkyl group such as a methyl group, an ethyl group, a propyl group, a butyl group, a heptyl group, a hexyl group, a dodecyl group, or a 2-ethylhexyl group; a branched alkyl group; a cycloalkyl group such as a cyclohexyl group; an alkenyl group such as a vinyl group, a propenyl group, or a hexenyl group; an acetylene group; an alkynyl groups such as a propynyl group or a hexynyl group; an aryl group such as a phenyl group or a tolyl group; a hydroxy group; a carboxy group; a sulfonic group; and a carbonyl group. Among these, from the point of view of obtaining both improvement in roughness and higher sensitivity, a linear alkyl group and a branched alkyl group are preferable.

Next, a sulfonate anion represented by the General Formula (SA2) will be described in detail.

In the General Formula (SA2), Xf is a fluorine atom or an alkyl group which is substituted by at least one fluorine atom. The alkyl group preferably has 1 to 10 carbon atoms and more preferably has 1 to 4 carbon atoms. In addition, the alkyl group substituted with a fluorine atom is preferably a perfluoroalkyl group.

Xf is preferably a fluorine atom or a perfluoroalkyl group having 1 to 4 carbon atoms. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Among these, a fluorine atom and $CF_3$ are preferred, and a fluorine atom is particularly preferred.

In the General Formula (SA2), each of $R_1$ and $R_2$ independently represents a hydrogen atom, a fluorine atom, or an alkyl group. The alkyl group may have a substituent (preferably a fluorine atom) and preferably has 1 to 4 carbon atoms. The alkyl group of $R_1$ and $R_2$ which may have a substituent is particularly preferably a perfluoroalkyl group of 1 to 4 carbon atoms. Specifically, examples of the alkyl group of $R_1$ and $R_2$ which has a substituent include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among these, $CF_3$ is preferred.

In the General Formula (SA2), x is preferably 1 to 8 and more preferably 1 to 4. y is preferably 0 to 4 and more preferably 0. z is preferably 0 to 8 and more preferably 0 to 4.

In the General Formula (SA2), L represents a single bond or a divalent linking group. Examples of the divalent linking group include —COO—, —COO—, —CO—, —O—, —S—, —SO—, —$SO_2$—, an alkylene group, a cycloalkylene group, an alkenylene group, and a combination of two or more thereof and it is preferable if the sum of the carbon atoms is 20 or less. Among these, —COO—, —COO—, —CO—, —O—, —S—, —SO—, or —$SO_2$— are preferable and —COO—, —COO—, and —$SO_2$— is more preferable.

In the General Formula (SA2), E represents an organic group with a ring structure. Examples of E include a cyclic aliphatic group, an aryl group, and a heterocyclic group.

The cyclic aliphatic group as E may either be a monocyclic structure or a polycyclic structure. As the cyclic aliphatic group with a monocyclic structure, a monocyclic cycloalkyl group such as a cyclopentyl group, a cyclohexyl group, or a cyclooctyl group is preferred. As the cyclic aliphatic group with a ploycyclic structure, a polycyclic cycloalkyl group such as a norbornyl group, a tricyclodecanyl group, a tetracyclodecanyl group, a tetracyclododecanyl group or an adamantyl group is preferred. In particular, in a case where a bulky cyclic aliphatic group which has a ring having 6 or more members is adopted as E, it is possible to suppress in-film diffusion in the PEB (post-exposure bake) process and further improve resolving power and EL (Exposure Latitude).

Examples of the aryl group as E includes a benzene ring, a naphthalene ring, a phenanthrene ring, or an anthracene ring.

The group with a heterocyclic structure as E may be aromatic or non-aromatic. As a hetero atom contained in the group, a nitrogen atom or an oxyegn atom is preferred. Specific examples of the heterocyclic structure include a furan ring, a thiophene ring, a benzofuran ring, a benzothiophene ring, a dibenzofuran ring, a dibenzothiophene ring, a pyridine ring, pyperidine ring, and a morpholine ring. Among these, a furan ring, a thiophene ring, a pyridine ring, pyperidine ring, and a morpholine ring are preferable.

E may have a substituent. Examples of the substituent include an alkyl group (may be linear, branched or cyclic and preferably has 1 to 12 carbon atoms), an aryl group (preferably having 6 to 14 carbon atoms), a hydroxy group, an alkoxy group, an ester group, an amido group, a urethane group, a ureido group, a thioether group, a sulfonamido group, and a sulfonic ester group.

As the photoacid generator, a compound with a plurality of structures represented by the General Formula (ZI) may be used. For example, a compound, which has a structure where at least one of $R_{201}'$ to $R_{203}'$ of a compound represented by the General Formula (ZI) is bonded to at least one of $R_{201}$' to $R_{203}$' of another compound represented by the General Formula (ZI), may be used.

Examples of the preferred (ZI) component can include the following compounds (ZI-1) to (ZI-4) which are described below.

The compound (ZI-1) is where at least one of $R_{201}$' to $R_{203}$' of the general formula (ZI) is an aryl group. That is, the compound (ZI-1) is an arylsulfonium compound, that is, a compound containing an arylsulfonium as a cation.

In the compound (ZI-1), all of $R_{201}$' to $R_{203}$' of the compound (ZI) may be aryl groups or a portion of $R_{201}$' to $R_{203}$' may be aryl groups and the remainder may be alkyl groups. Here, in a case where the compound (ZI-1) contains a plurality of aryl groups, the aryl groups may be the same as or different from each other.

Examples of the compound (ZI-1) include a triarylsulfonium compound, a diarylalkylsulfonium compound, and an aryldialkylsulfonium compound.

As the aryl group in the compound (ZI-1), a phenyl group, a naphthyl group, or a heteroaryl group such as an indole residue and a pyrrole residue are preferable, and among these, a phenyl group, a naphthyl group, or an indole residue is particularly preferred.

The alkyl group which is contained in the compound (ZI-1) according to necessity is preferably a linear, branched, or cycloalkyl group having 1 to 15 carbon atoms, and examples thereof include a methyl group, an ethyl group, a propyl group, an n-butyl group, a sec-butyl group, a t-butyl group, a cyclopropyl group, a cyclobutyl group, or a cyclohexyl group.

The aryl group and alkyl group may have a substituent. Examples of the substituent include an alkyl group (preferably, 1 to 15 carbon atoms), an aryl group (preferably, 6 to 14 carbon atoms), an alkoxy group (preferably, 1 to 15 carbon atoms), a halogen atom, a hydroxyl group, and a phenylthio group.

Examples of preferable substituents are a linear, branched or cyclic alkyl group having 1 to 12 carbon atoms and a linear, branched or cyclic alkoxy group having 1 to 12 carbon atoms. Examples of particularly preferable substituents are an alkyl group having 1 to 6 carbon atoms and an alkoxy group having 1 to 6 carbon atoms. The substituents may be substituted into any one of the three $R_{201}$' to $R_{203}$', or may be substituted into all of the three $R_{201}$' to $R_{203}$'. In a case where $R_{201}$ to $R_{203}$ are phenyl groups, the substituent is preferably substituted at the p-position of the aryl group.

In addition, an embodiment where one or two of $R_{201}$', $R_{202}$', and $R_{203}$' is an aryl group which may have a substituent and the remainder are linear, branched, or cyclic alkyl groups is also preferred. Specific examples of the structure include the structures represented in 0141 to 0153 of JP2004-210670A.

In this case, specifically, the aryl group is the same as the aryl groups as $R_{201}$', $R_{202}$', and $R_{203}$', and preferably is a phenyl group or a naphthyl group. In addition, the aryl group preferably contains any one of a hydroxyl group, an alkoxy group, and an alkyl group as a substituent. The substituent is more preferably an alkoxy group having 1 to 12 carbon atoms and is even more preferably an alkoxy group having 1 to 6 carbon atoms.

The linear, branched, or cyclic alkyl group as the remaining groups are preferably an alkyl group having 1 to 6 carbon atoms. These groups may further contain a substituent. Further, when two groups are present as the remaining groups, the groups may be bonded to each other and form a ring structure.

The compound (ZI-1) is, for example, the one represented by the following formula (ZI-1A).

(ZI-1A)

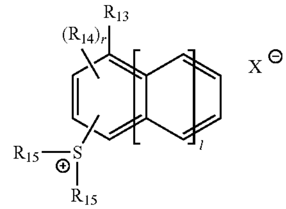

In the general formula (ZI-1A), $R_{13}$ represents a hydrogen atom, a fluorine atom, a hydroxyl group, an alkyl group, a cycloalkyl group, an alkoxy group, a cycloalkyloxy group, or an alkoxycarbonyl group;

each $R_{14}$ independently represents an alkyl group, a cycloalkyl group, an alkoxy group, an alkylsulfonyl group, or a cycloalkylsulfonyl group in a case of there being a plurality thereof;

each $R_{15}$ independently represents an alkyl group or a cycloalkyl group, and two $R_{15}$s may be bonded to each other and form a ring structure;

1 is an integer of 0 to 2;

$X^-$ represents a non-nucleophilic anion and examples thereof include the same $X^-$ as in the General Formula (ZI).

The alkyl group represented by $R_{13}$, $R_{14}$, or $R_{15}$ may be a linear or branched alkyl group. The alkyl group preferably has 1 to 10 carbon atoms, and examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group. Among these, a methyl group, an ethyl group, an n-butyl group, and a t-butyl group are particularly preferable.

Examples of the cycloalkyl group represented by $R_{13}$, $R_{14}$, or $R_{15}$ include a cyclic or polycyclic cycloalkyl group (preferably a cycloalkyl group having 3 to 20 carbon atoms). Examples thereof include cyclopropyl, cyclobutyl, cyclopentyl, cyclohexyl, cycloheptyl, cyclooctyl, cyclododecanyl, cyclopentenyl, cyclohexenyl, and cyclooctadienyl groups. Among these, cyclopropyl, cyclopentyl, cyclohexyl, cycloheptyl, and cyclooctyl groups are particularly preferable.

Examples of an alkyl group portion of the alkoxy group represented by $R_{13}$ or $R_{14}$ include those exemplified above as the alkyl group represented by $R_{13}$, $R_{14}$, or $R_{15}$. As the alkoxy group, a methoxy group, an ethoxy group, an n-propoxy group, and an n-butoxy group are particularly preferable.

Examples of a cycloalkyl group portion of the cycloalkyloxy group represented by $R_{13}$ include those exemplified above as the cycloalkyl group represented by $R_{13}$, $R_{14}$, or $R_{15}$. As the cycloalkyloxy group, a cyclopentyloxy group and a cyclohexyloxy group are particularly preferable.

Examples of an alkoxy group portion of the alkoxycarbonyl group represented by $R_{13}$ include those described above as the alkoxy group represented by $R_{13}$ or $R_{14}$. As the alkoxycarbonyl group, a methoxycarbonyl group, an ethoxycarbonyl group, and an n-butoxycarbonyl group are particularly preferable.

Examples of an alkyl group portion of the alkylsulfonyl group represented by $R_{14}$ include those described above as the alkyl group represented by $R_{13}$, $R_{14}$, or $R_{15}$. Examples of a cycloalkyl group portion of the cycloalkylsulfonyl group represented by $R_{14}$ include those described above as the cycloalkyl group represented by $R_{13}$, $R_{14}$, or $R_{15}$. As the alkylsulfonyl group or the cycloalkyl sulfonyl group, a methane sulfonyl group, an ethane sulfonyl group, an n-propane sulfonyl group, an n-butane sulfonyl group, a cyclopentane sulfonyl group, and a cyclohexane sulfonyl group are particularly preferable.

l is preferably 0 or 1 and is more preferably 1. r is preferably 0 to 2.

The respective groups represented by $R_{13}$, $R_{14}$, or $R_{15}$ may further have a substituent. Examples of the substituent include a halogen atom such as a fluorine atom, a hydroxy group, a carboxy group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group, and a cycloalkyloxycarbonyloxy group.

The alkoxy group may be linear or branched. Examples of the alkoxy group include a methoxy group, an ethoxy group, an n-propoxy group, an i-propoxy group, an n-butoxy group, a 2-methylpropoxy group, a 1-methylpropoxy group, a t-butoxy group, and the like having 1 to 20 carbon atoms.

Examples of the cycloalkyloxy group include a cyclopentyloxy group, a cyclohexyloxy group, and the like having 3 to 20 carbon atoms.

The alkoxyalkyl group may be linear or branched. Examples of the alkoxyalkyl group include a methoxymethyl group, an ethoxymethyl group, a 1-methoxyethyl group, a 2-methoxyethyl group, a 1-ethoxyethyl group, a 2-ethoxyethyl group, and the like having 2 to 21 carbon atoms.

Examples of the cycloalkyloxyalkyl group include a cyclopentyloxyethyl group, a cyclopentyloxypentyl group, a cyclohexyloxyethyl group, a cyclohexyloxypentyl group, and the like having 4 to 21 carbon atoms.

The alkoxycarbonyl group may be linear or branched. Examples of the alkoxycarbonyl group include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, and the like having 2 to 21 carbon atoms.

Examples of the cycloalkyloxycarbonyl group include a cyclopentyloxycarbonyl group, a cyclohexyloxycarbonyl group, and the like having 4 to 21 carbon atoms.

The alkoxycarbonyloxy group may be linear or branched. Examples of the alkoxycarbonyloxy group include a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, and the like having 2 to 21 carbon atoms.

Examples of the cycloalkyloxycarbonyloxy group include a cyclopentyloxy carbonyloxy group, a cyclohexyloxycarbonyloxy group, and the like having 4 to 21 carbon atoms.

As the ring structure that the two $R_{15}$s may form by binding to each other, a structure that forms a 5- or 6-membered ring, particularly preferably a 5-membered ring (that is, a tetrahydrothiophene ring) together with an S atom in General Formula (ZI-1A) is preferable.

The ring structure may have a further substituent. Examples of the substituent include a hydroxy group, a carboxy group, a cyano group, a nitro group, an alkyl group, a cycloalkyl group, an alkoxy group, an alkoxyalkyl group, an alkoxycarbonyl group, and an alkoxycarbonyloxy group. With regard to the ring structure described above, a plurality of the substituent may exist, and these substituents may from a ring (an aromatic or non-aromatic hydrocarbon ring, an aromatic or non-aromatic heterocycle, or a polycyclic condensed ring including a combination of two or more of these rings) by binding to each other.

As $R_{15}$, a methyl group, an ethyl group, and a divalent group in which two $R_{15}$s bind to each other and form a tetrahydrothiophene ring structure together with a sulfur atom are particularly preferable.

The alkyl group, the cycloalkyl group, the alkoxy group, and the alkoxycarbonyl group represented by $R_{13}$, and the alkyl group, the cycloalkyl group, the alkoxy group, the alkyl sulfonyl group, and the cycloalkylsulfonyl group represented by $R_{14}$ may further have a substituent. As the substituent, a hydroxy group, an alkoxy group, an alkoxycarbonyl group, and a halogen atom (particularly, a fluorine atom) are preferable.

Specific preferable examples of the cation in the compound represented by General Formula (ZI-1A) are shown below.

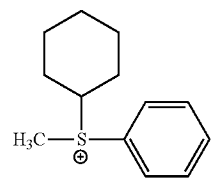

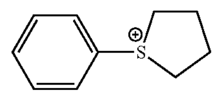

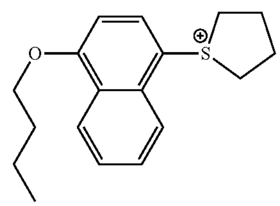

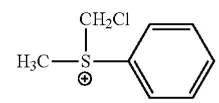

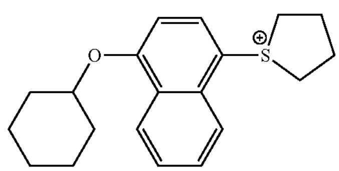

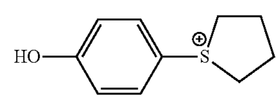

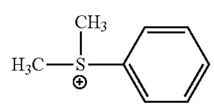

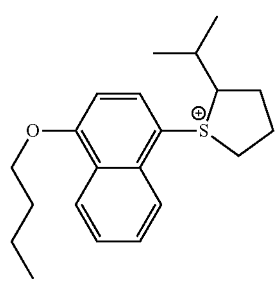

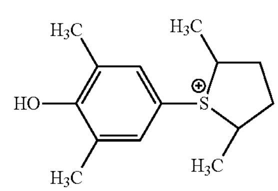

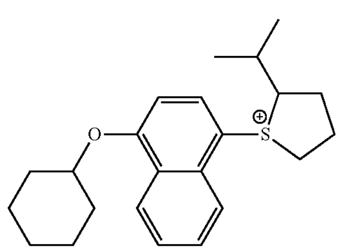

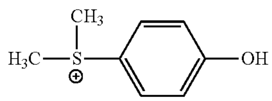
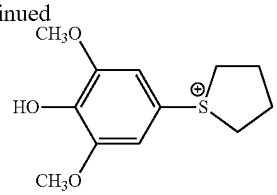
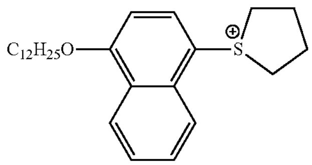
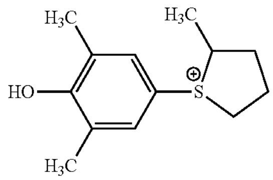
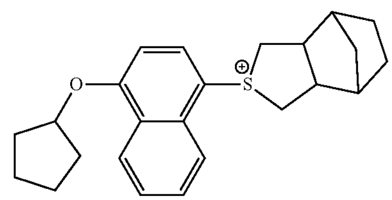
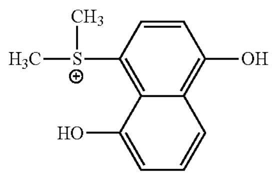
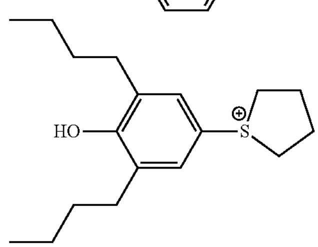
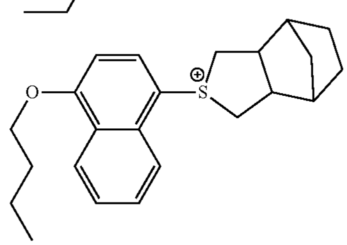
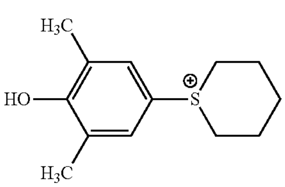
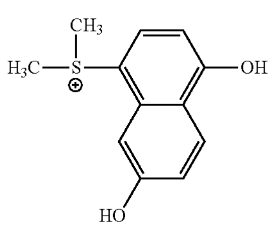
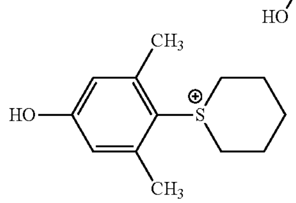
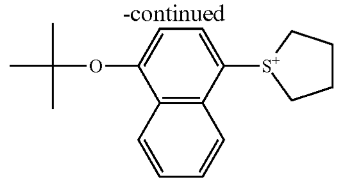
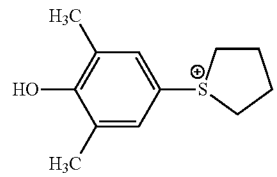
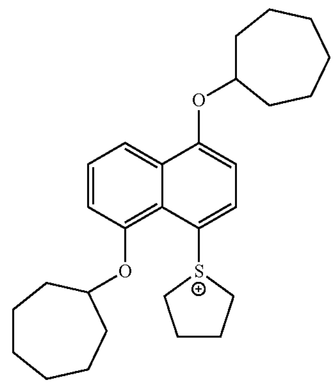
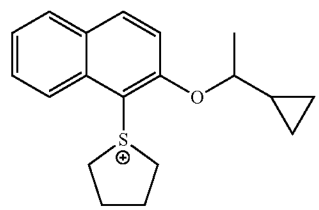
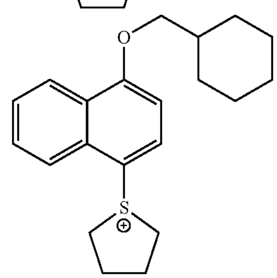
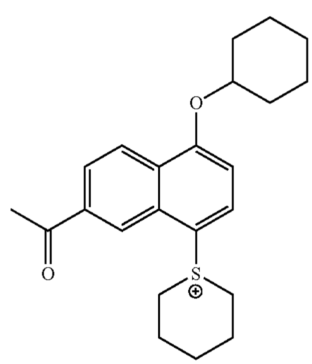

-continued
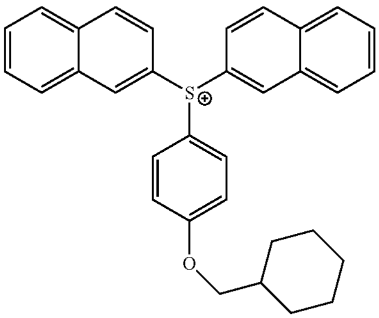
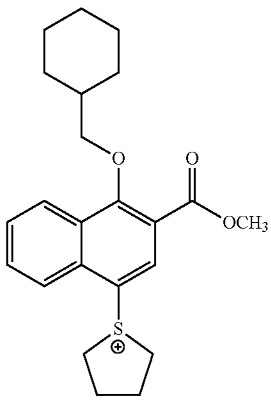
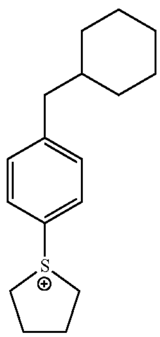
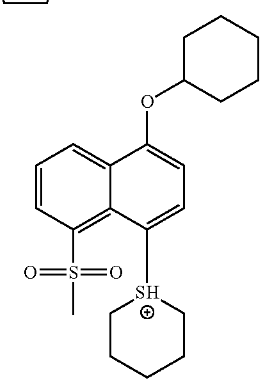
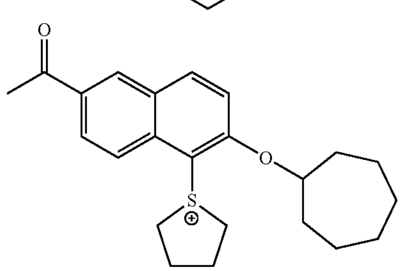
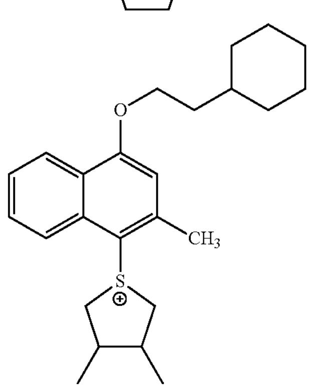
-continued
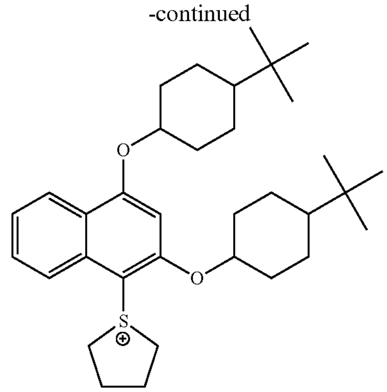
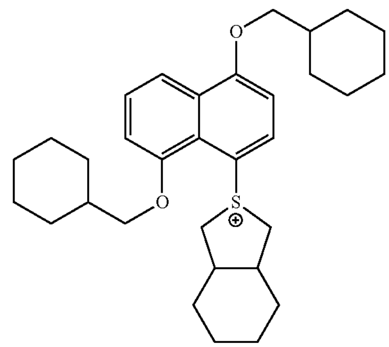
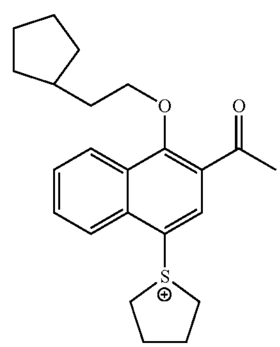
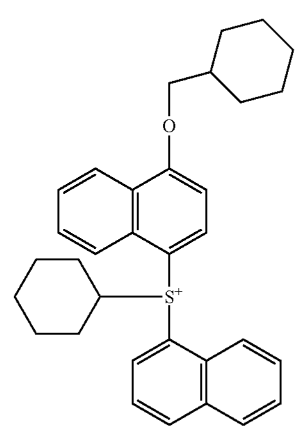

-continued

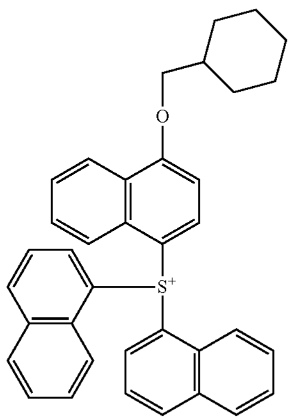

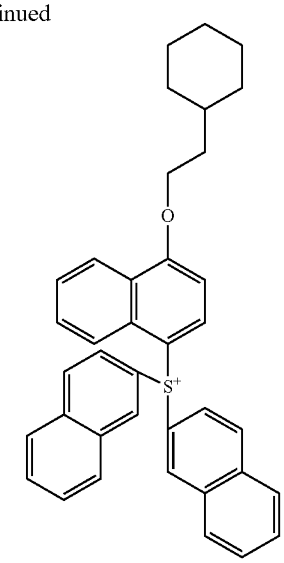

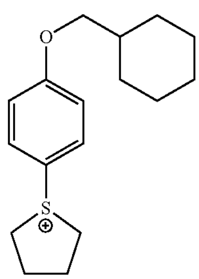

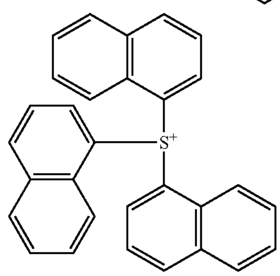

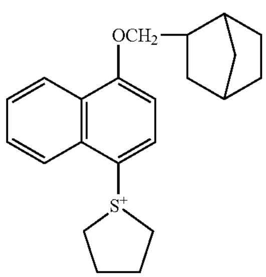

Next, the compound (ZI-2) will be described.

The compound (ZI-2) is a compound in which each of $R_{201}$' to $R_{203}$' in Formula (ZI) independently represents an organic group not containing an aromatic ring. The aromatic ring herein also includes an aromatic ring containing a hetero atom.

The organic group that is represented by $R_{201}$' to $R_{203}$' and does not contain an aromatic ring has, for example, 1 to 30 carbon atoms, and preferably has 1 to 20 carbon atoms.

Each of $R_{201}$' to $R_{203}$' preferably independently represents an alkyl group, a cycloalkyl group, a 2-oxoalkyl group, an alkoxycarbonyl methyl group, an allyl group, or a vinyl group. More preferably, each of $R_{201}$' to $R_{203}$' independently represents a linear, branched, or cyclic 2-oxoalkyl group or alkoxycarbonyl methyl group, and among these, a linear or branched 2-oxoalkyl group is particularly preferable.

Preferable examples of the alkyl group and the cycloalkyl group represented by $R_{201}$' to $R_{203}$' include a linear or branched alkyl group (for example, a methyl group, an ethyl group, a propyl group, a butyl group, or a pentyl group) having 1 to 10 carbon atoms and a cycloalkyl group (a cyclopentyl group, a cyclohexyl group, or a norbornyl group) having 3 to 10 carbon atoms.

The 2-oxoalkyl group represented by $R_{201}$' to $R_{203}$' may be linear, branched, or cyclic, and preferable examples thereof include a group having >C═O in the second position of the above-described alkyl group.

Preferable examples of the alkoxy group in the alkoxycarbonyl methyl group represented by $R_{201}$' to $R_{203}$' include an alkoxy group (a methoxy group, an ethoxy group, a propoxy group, a butoxy group, or a pentoxy group) having 1 to 5 carbon atoms.

$R_{201}$' to $R_{203}$' may be further substituted with, for example, a halogen atom, an alkoxy group (having 1 to 5 carbon atoms for example), a hydroxyl group, a cyano group and/or a nitro group Two of $R_{201}$' to $R_{203}$' may form a ring structure by binding to each other. The ring structure may contain an oxygen atom, a sulfur atom, an ester bond, an amide bond and/or a carbonyl group in the ring. Examples of the group that two of R201' to R203' form by binding to each other include an alkylene group (for example, a butylene group or a pentylene group).

Examples of the ring structure include an aromatic or non-aromatic hydrocarbon ring, an aromatic or non-aromatic heterocycle, or a polycyclic condensed ring including a combination of two or more of these rings. Examples of the ring structure include 3- to 10-membered rings, and among these, 4- to 8-membered rings are preferable, and 5- to 6-membered rings are more preferable.

The compound (ZI-3) is a compound which is represented by the following General Formula (ZI-3) and has a phenacyl sulfonium salt structure.

(ZI-3)

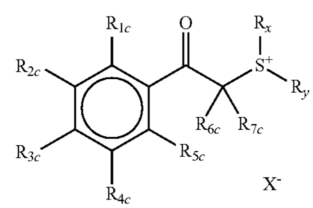

In the formula, each of $R_{1c}$ to $R_{5c}$ independently represents a hydrogen atom, an alkyl group, an alkoxy group, or a halogen atom. The alkyl group and the alkoxy group preferably have 1 to 6 carbon atoms.

Each of $R_{6c}$ and $R_{7c}$ independently represents a hydrogen atom or an alkyl group. The alkyl group preferably has 1 to 6 carbon atoms.

Each of $R_x$ and $R_y$ independently represents an alkyl group, a 2-oxoalkyl group, an alkoxycarbonylmethyl group, an allyl group, or a vinyl group. These atomic groups preferably have 1 to 6 carbon atoms.

Any two or more of $R_{1c}$ to $R_{7c}$, may be bonded with each other, and may form a ring structure. Additionally, $R_x$ and $R_y$ may be bonded with each other and form a ring structure. These ring structures may contain an oxygen atom, a sulfur atom, an ester bond, and/or an amide bond.

$X^-$ in General Formula (ZI-3) has the same definition as $X^-$ in General Formula (ZI).

Specific examples of the compound (ZI-3) include compounds disclosed as example compounds in Paragraphs 0046 and 0047 in JP2004-233661A or Paragraphs 0040 to 0046 in JP2003-35948A.

Next, the compound (ZI-4) will be described.

The compound (ZI-4) is a compound having a cation represented by the following General Formula (ZI-4). This compound (ZI-4) is effective for inhibiting outgassing.

(ZI-4)

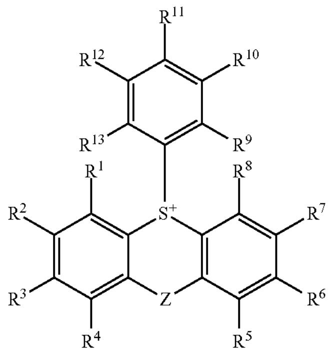

In the General Formula (ZI-4), $R^1$ to $R^{13}$ each independently represents a hydrogen atom or a substituent. Preferably, at least one of $R^1$ to $R^{13}$ is a substituent containing an alcoholic hydroxyl group. Here, "alcoholic hydroxyl group" means a hydroxyl group bonded to a carbon atom in an alkyl group.

Z represents a single bond or a divalent linking group.

In a case where $R^1$ to $R^{13}$ is a substituent containing an alcoholic hydroxyl group, $R^1$ to $R^{13}$ is preferably a group represented by —(W—Y). Here, Y represents an alkyl group substituted with one or more hydroxyl group, and W represents a single bond or a divalent linking group.

Preferable examples of the alkyl group represented by Y include an ethyl group, a propyl group, and an isopropyl group. Y particularly preferably has a structure represented by $—CH_2CH_2OH$.

Though not particularly limited, the divalent linking group represented by W is preferably a divalent group obtained by substituting an arbitrary hydrogen atom in a single bond, an alkoxy group, an acyloxy group, an acylamino group, alkyl and arylsulfonylamino groups, an alkylthio group, an alkylsulfonyl group, an acyl group, an alkoxycarbonyl group, or a carbamoyl group with a single bond. The divalent linking group is more preferably a divalent group obtained by substituting an arbitrary hydrogen atom in a single bond, an acyloxy group, an alkylsulfonyl group, an acyl group, or an alkoxycarbonyl group with a single bond.

When $R^1$ to $R^{13}$ are substituents containing an alcoholic hydroxyl group, these substituents preferably have 2 to 10 carbon atoms, more preferably have 2 to 6 carbon atoms, and particularly preferably have 2 to 4 carbon atoms.

The substituents that are represented by $R^1$ to $R^{13}$ and contain an alcoholic hydroxyl group may have two or more alcoholic hydroxyl groups. The number of alcoholic hydroxyl groups included in the substituents that are represented by $R^1$ to $R^{13}$ and contain an alcoholic hydroxyl group is from 1 to 6, preferably from 1 to 3, and even more preferably 1.

In the compound represented by General Formula (ZI-4), the total number of alcoholic hydroxyl groups of all of $R^1$ to $R^{13}$ is from 1 to 10, preferably from 1 to 6, and even more preferably from 1 to 3.

When $R^1$ to $R^{13}$ do not contain an alcoholic hydroxyl group, examples of the substituents represented by $R^1$ to $R^{13}$ include a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, alkyl and arylsulfonylamino groups, a mercapto group, an alkylthio group, an arylthio group, a heterocyclic thio group, a sulfamoyl group, a sulfo group, alkyl and arylsulfinyl groups, alkyl and arylsulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group, a phosphono group, a silyl group, a hydrazino group, a ureide group, a boronic acid group [$—B(OH)_2$], a phosphate group [$—OPO(OH)_2$], a sulfate group ($—OSO_3H$), and other known substituents.

When $R^1$ to $R^{13}$ do not contain an alcoholic hydroxyl group, $R^1$ to $R^{13}$ are preferably hydrogen atoms, halogen atoms, alkyl groups, cycloalkyl groups, alkenyl groups, cycloalkenyl groups, alkynyl groups, aryl groups, cyano groups, carboxyl groups, alkoxy groups, aryloxy groups, acyloxy groups, carbamoyloxy groups, acylamino groups, aminocarbonylamino groups, alkoxycarbonylamino groups, aryloxycarbonylamino groups, sulfamoylamino groups, alkyl and arylsulfonylamino groups, alkylthio groups, arylthio groups, sulfamoyl groups, alkyl and arylsulfonyl groups, aryloxycarbonyl groups, alkoxycarbonyl groups, carbamoyl groups, imide groups, silyl groups, or ureide groups.

When $R^1$ to $R^{13}$ do not contain an alcoholic hydroxyl group, $R^1$ to $R^{13}$ are more preferably hydrogen atoms, halogen atoms, alkyl groups, cycloalkyl groups, cyano groups, alkoxy groups, acyloxy groups, acylamino groups, aminocarbonylamino groups, alkoxycarbonylamino groups, alkyl and arylsulfonylamino groups, alkylthio groups, sulfamoyl groups, alkyl and arylsulfonyl groups, alkoxycarbonyl groups, or carbamoyl groups.

When $R^1$ to $R^{13}$ do not contain an alcoholic hydroxyl group, $R^1$ to $R^{13}$ are particularly preferably hydrogen atoms, alkyl groups, cycloalkyl groups, halogen atoms, or alkoxy groups.

Among $R^1$ to $R^{13}$, two adjacent groups may form a ring by binding to each other. This ring includes aromatic and non-aromatic hydrocarbon rings and heterocycles. These rings may form a condensed ring by being further combined.

The compound (ZI-4) preferably has a structure in which at least one of $R^1$ to $R^{13}$ contains an alcoholic hydroxyl group, and more preferably has a structure in which at least one of $R^9$ to $R^{13}$ has an alcoholic hydroxyl group.

As described above, Z represents a single bond or a divalent linking group. Examples of the divalent linking group include an alkylene group, an arylene group, a carbonyl group, a sulfonyl group, a carbonyloxy group, a carbonylamino group, a sulfonylamide group, an ether group, a thioether group, an amino group, a disulfide group, an acyl group, an alkylsulfonyl group, —CH═CH—, an aminocarbonylamino group, and an aminosulfonylamino group.

The divalent linking group may have substituents. Examples of the substituents include the same as those exemplified above for $R^1$ to $R^{13}$.

Z is preferably a bond or a group that does not withdraw electrons, such as a single bond, an alkylene group, an arylene group, an ether group, a thioether group, an amino group, —CH═CH—, an aminocarbonylamino group, and an aminosulfonylamino group. Z is more preferably a single bond, an ether group, or a thioether group, and particularly preferably a single bond.

Hereinbelow, General Formulae (ZII) and (ZIII) will be described.

In the General Formulae (ZII) and (ZIII), each of $R_{204}$' $R_{205}$', $R_{206}$, and $R_{207}$ independently represents an aryl group, an alkyl group or a cycloalkyl group. The aryl group, the alkyl group, and the cycloalkyl group may contain may have a substituent.

Preferable examples of the aryl group represented by $R_{204}$', $R_{205}$', $R_{206}$, and $R_{207}$ include the same groups as exemplified above for $R_{201}$' to $R_{203}$' in General Formula (ZI-1).

Preferable examples of the alkyl group and the cycloalkyl group represented by $R_{204}$', $R_{205}$', $R_{206}$, and $R_{207}$ include the linear, branched, or cyclic alkyl groups exemplified above for $R_{201}$' to $R_{203}$' in General Formula (ZI-2).

The aryl group, the alkyl group, and the cycloalkyl group of $R_{204}$', $R_{205}$', $R_{206}$, and $R_{207}$ may have a substituent. Examples of the substituent that the aryl group, the alkyl group, and the cycloalkyl group represented by $R_{204}$', $R_{205}$', $R_{206}$, and $R_{207}$ may have include an alkyl group (having 1 to 15 carbon atoms for example), a cycloalkyl group (having 3 to 15 carbon atoms for example), an aryl group (having 6 to 15 carbon atoms for example), an alkoxy group (having 1 to 15 carbon atoms for example), a halogen atom, a hydroxyl group, a phenylthio group, and the like.

$X^-$ in General Formula (ZII) has the same definition as $X^-$ in General Formula (ZI).

Other preferable examples of the photoacid generator include compounds represented by the following General Formula (ZIV), (ZV), or (ZVI).

$$Ar_3—SO_2—SO_2—Ar_4$$ ZIV

ZV

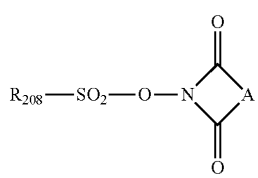

ZVI

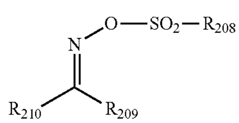

In General Formulae (ZIV) to (ZVI), each of $Ar_3$ and $Ar_4$ independently represents a substituted or unsubstituted aryl group; and each of $R_{208}$ in the General Formulae (ZV) to (ZVI) independently represents an alkyl group, a cycloalkyl group or an aryl group. The alkyl group, the cycloalkyl group, and the aryl group may either be substituted or unsubstituted. It is preferable for these groups to be substituted with a fluorine atom. By doing this, it is possible to increase the strength of the acid generated by the photoacid generator.

Each of $R_{209}$ and $R_{210}$ independently represents an alkyl group, a cycloalkyl group, an aryl group, or an electron-withdrawing group, this alkyl group, this cycloalkyl group, this aryl group, and this electron-withdrawing group may be substituted or unsubstituted, and examples of substituents that the alkyl group, the cycloalkyl group, the aryl group, and the electron-withdrawing group may have include a halogen atom, an alkoxy group (having 1 to 5 carbon atoms for example), a hydroxyl group, a cyano group, and a nitro group.

Preferable examples of $R_{209}$ include a substituted or unsubstituted aryl group. Preferable examples of $R_{210}$ include an electron-withdrawing group. Preferable examples of the electron-withdrawing group include a cyano group and a fluoroalkyl group.

A represents an alkylene group, an alkenylene group, or an arylene group. The alkylene group, the alkenylene group, and the arylene group may have a substituent.

Specific examples of the aryl group represented by $Ar_3$, $Ar_4$, $R_{208}$, $R_{209}$, and $R_{210}$ respectively include the same specific examples of the aryl group represented by $R_{201}$', $R_{202}$', and $R_{203}$' in the General Formula (ZI-1).

Specific examples of the alkyl group and the cycloalkyl group represented by $R_{208}$, $R_{209}$, and $R_{210}$ respectively include the same ones as the specific examples of the alkyl group and the cycloalkyl group represented by $R_{201}$', $R_{202}$', and $R_{203}$' in the General Formula (ZI-2).

Examples of the alkylene group as A can include an alkylene group with 1 to 12 carbon atoms (for example, a methylene group, an ethylene group, a propylene group, an isopropylene group, a butylene group, an isobutylene group and the like), examples of the alkenylene group as A can include an alkenylene group with 2 to 12 carbon atoms (for example, an ethenylene group, a propenylene group, a butenylene group and the like), and examples of the arylene group as A can include an arylene group with 6 to 10 carbon atoms (for example, a phenylene group, a tolylene group, a naphthylene group, and the like).

As the photoacid generator, a compound having a plurality of structures represented by General Formula (ZVI) is also preferable. Examples of such a compound include a compound having a structure in which $R_{209}$ or $R_{210}$ of the compound represented by General Formula (ZVI) binds to $R_{209}$ or $R_{210}$ of another compound represented by General Formula (ZVI).

As the photoacid generator, compounds represented by General Formulae (ZI) to (ZIII) are more preferable, the compound represented by General Formula (ZI) is even more preferable, and compounds (ZI-1) to (ZI-3) are particularly preferable.

Then, in the present invention, from the point of view of suppressing the dispersity of the acid which is generated in exposure to the non-exposed portion and improving the resolution and pattern shape, the photoacid generator (B) is preferably a compound which generates an acid with a large volume of 200 $Å^3$ or more (more preferably a sulfonic acid), is more preferably a compound which generates an acid with a large volume of 250 $Å^3$ or more (more preferably a sulfonic acid), and is even more preferably a compound which generates an acid with a large volume of 300 $Å^3$ or more (more preferably a sulfonic acid). Here, from the point of view of sensitivity and coating solvent solubility, the volume is preferable 2000 $Å^3$ or less and is more preferably 1500 $Å^3$ or less. The volume value is obtained using "WinMOPAC" manufactured by Fujitsu Ltd. That is, first, a chemical structure of the acid according to each example is input, the most stable conformation of each acid is obtained by a molecular force field calculation using an MM3 method with the structure as an initial structure, and after that, it is possible to calculate the "accessible volume" of each acid by performing a molecular orbital calculation using a PM3 method with regard to the most stable conformation.

Specific examples of the photoacid generator are shown below but the scope of the present invention is not limited thereto. Here, the calculated value of the volume is attached (units $Å^3$) in a portion of the examples. Here, the calculated values which are obtained are the volume values of the acid where a proton bonds with an anion moiety.

-continued
(z1)
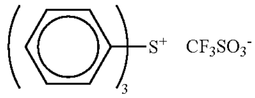
(z2)
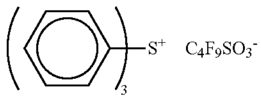
113A$^3$
(z3)
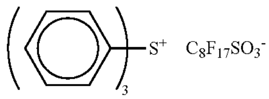
220A$^3$
(z4)
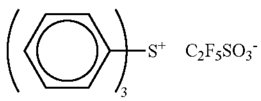
(z5)
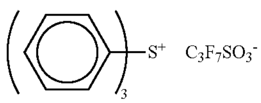
(z6)
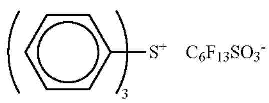
(z7)
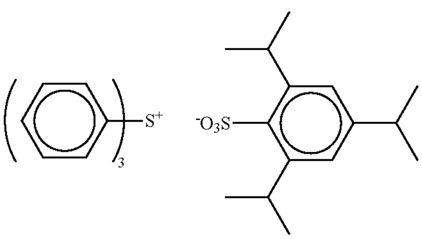
303A$^3$
(z8)
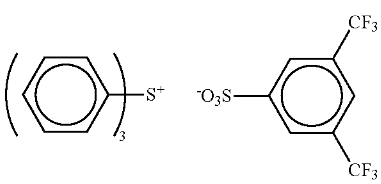
(z9)
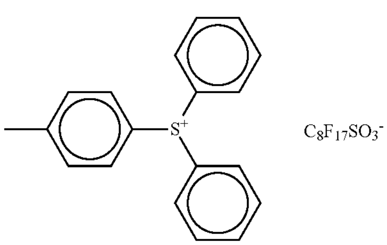
(z10)
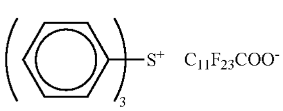
(z11)
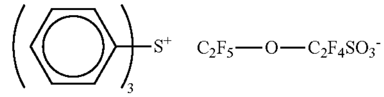
(z12)
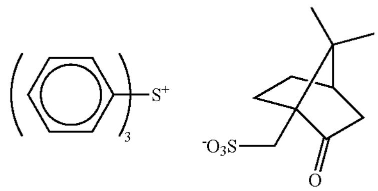
216A$^3$
(z13)
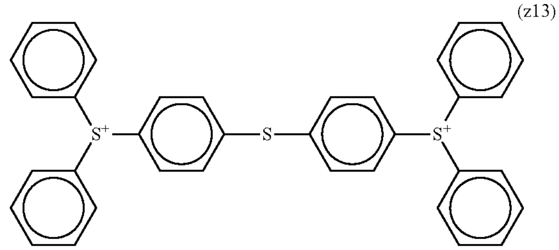
127A$^3$
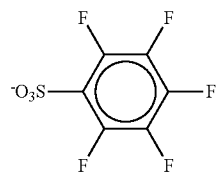
(z14)
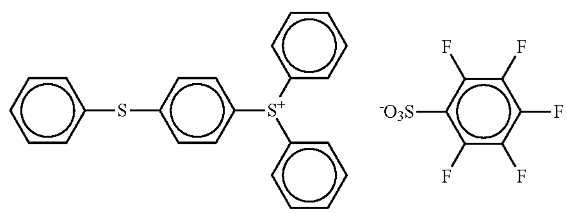
(z15)
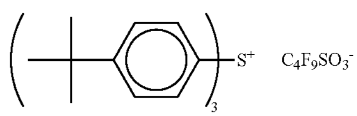
(z16)
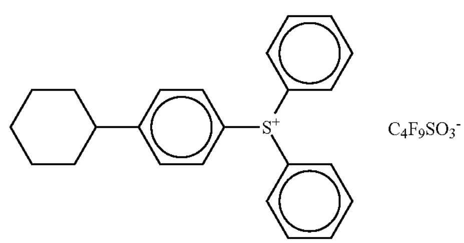
(z17)
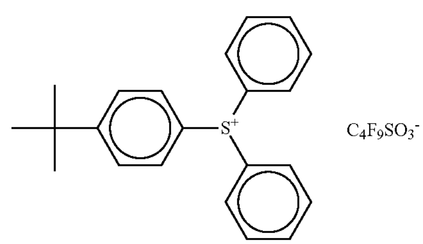

-continued
(z18)
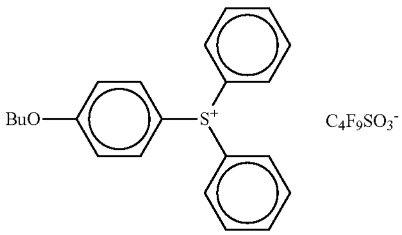
(z19)
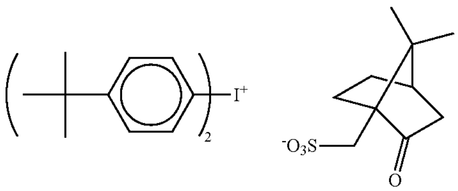
(z20)
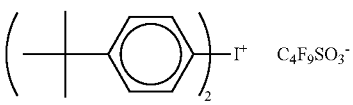
(z21)
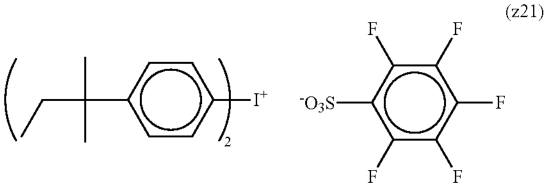
(z22)
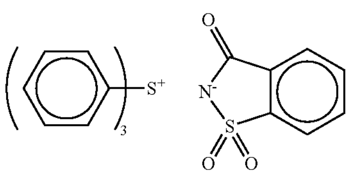
(z23)
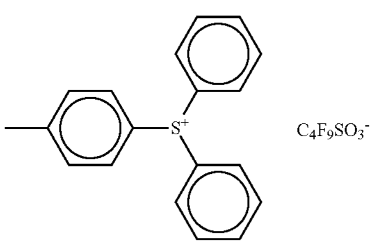
(z24)
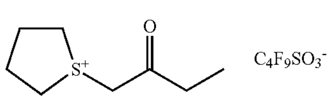
(z25)
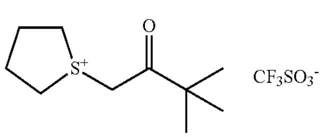
(z26)
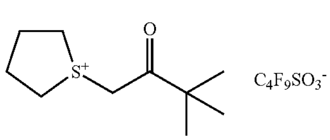
-continued
(z27)
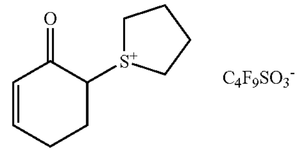
(z28)
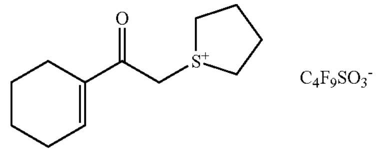
(z29)
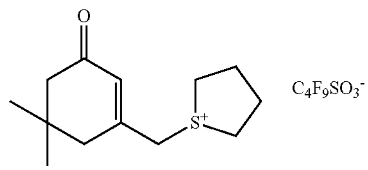
(z30)
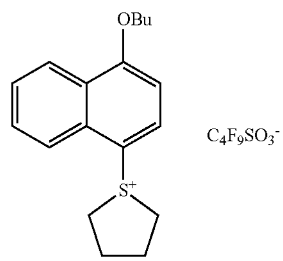
(z31)
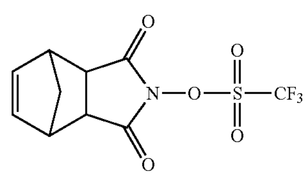
(z32)
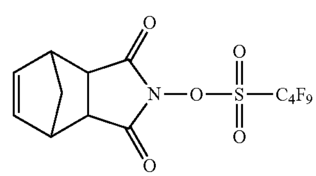
(z33)
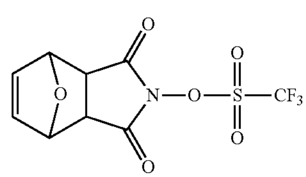
(z34)
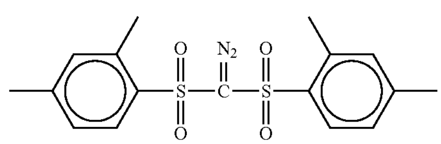
(z35)
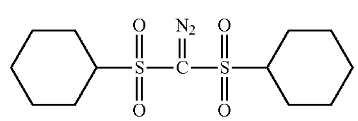

-continued
(z36)
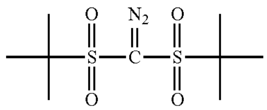
(z37)
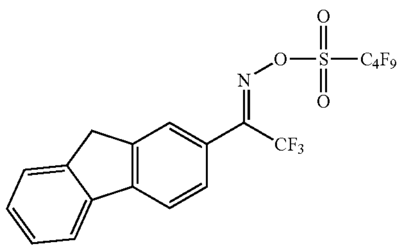
(z38)
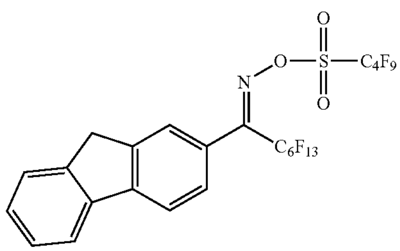
(z39)
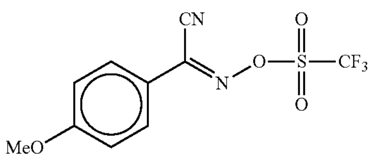
(z40)
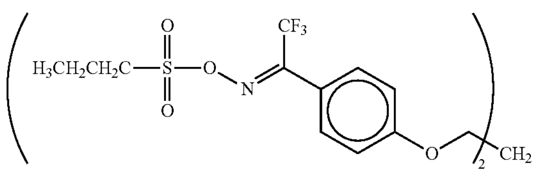
(z41)
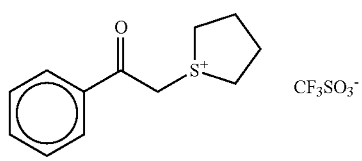
(z42)
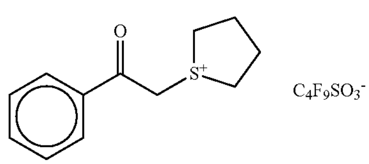
(z43)
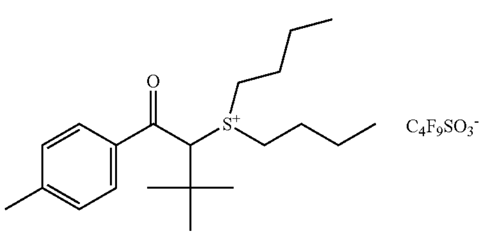
-continued
(z44)
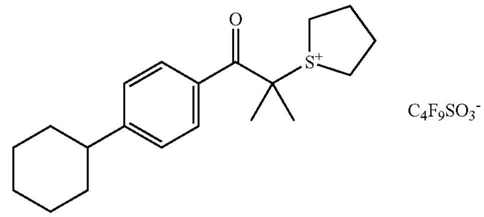
(z45)
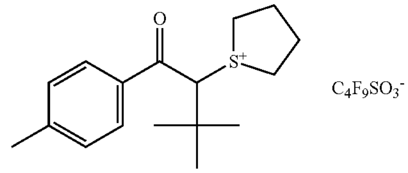
(z46)
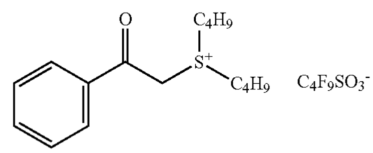
(z47)
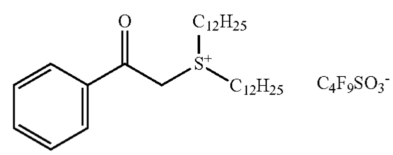
(z48)
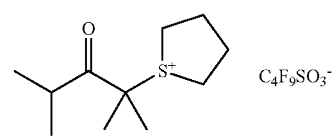
(z49)
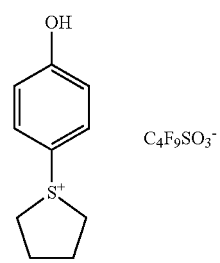
(z50)
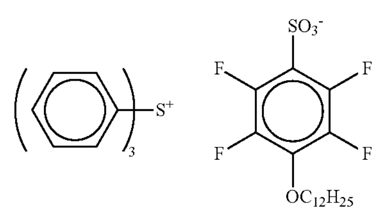
(z51)
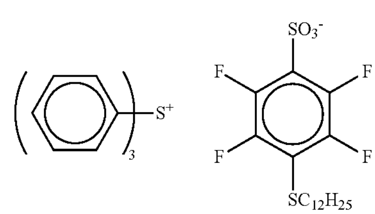
$393A^3$ -continued
(z52)
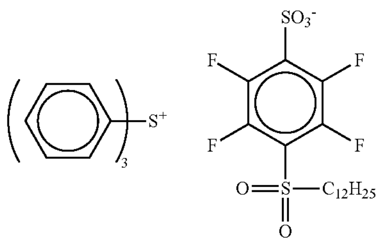
(z53)
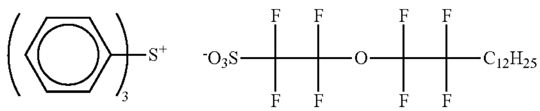
(z54)
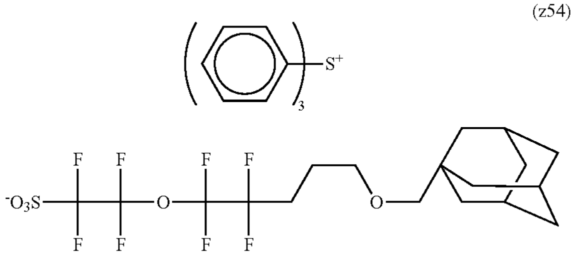
(z55)
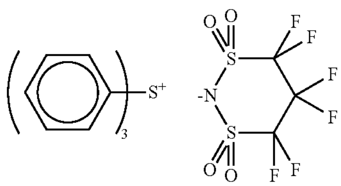
136A$^3$
(z56)
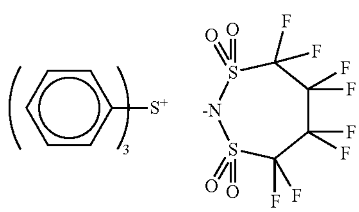
(z57)
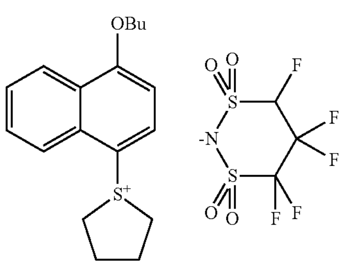
(z58)
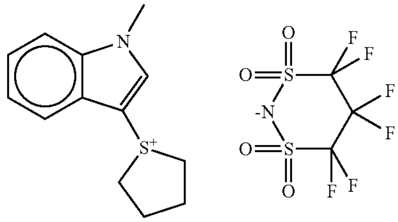
-continued
(z59)
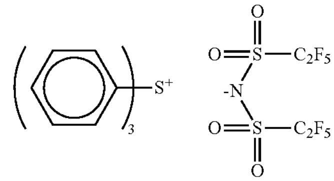
173A$^3$
(z60)
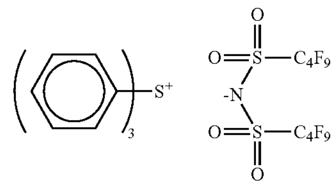
(z61)
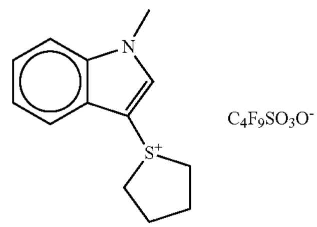
(z62)
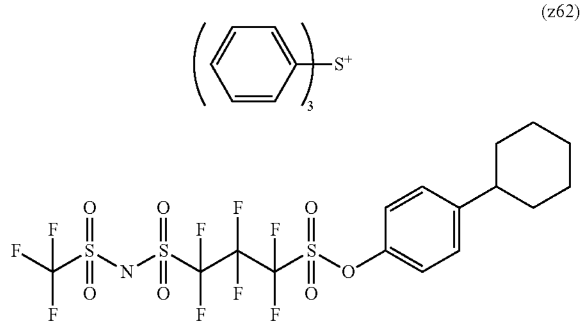
(z63)
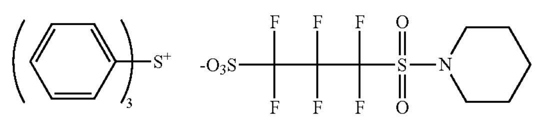
244A$^3$
(z64)
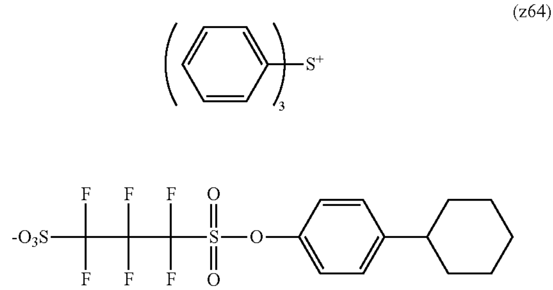
(z65)
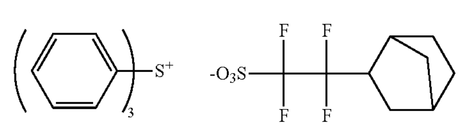

(z66)
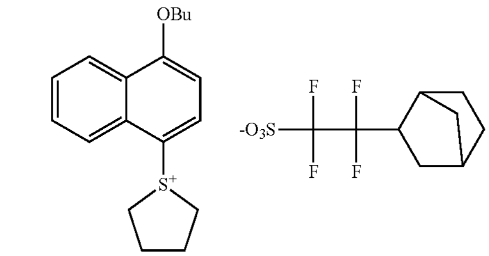
(z67)
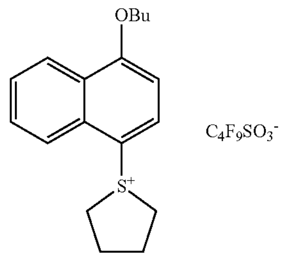
(z68)
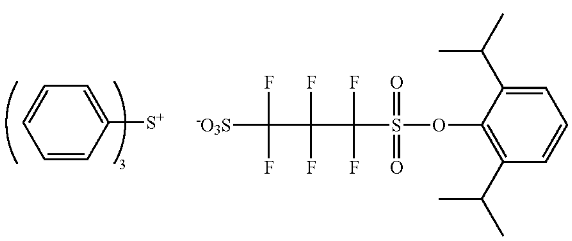
347A$^3$
(z69)
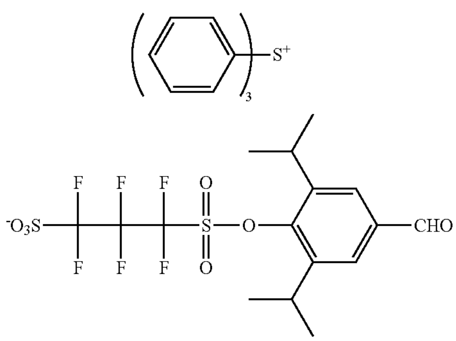
(z70)
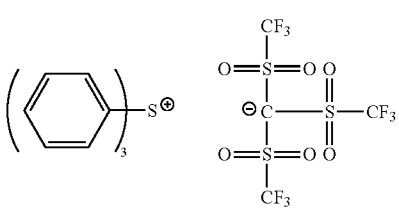
(z71)
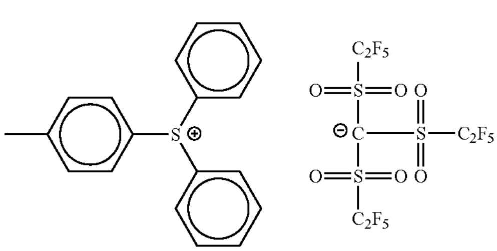
(z72)
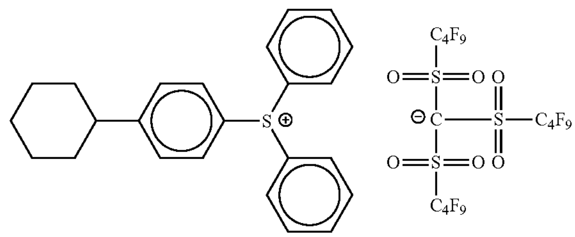
(z73)
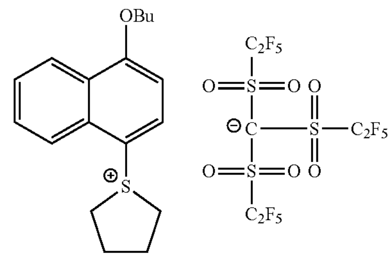
(z74)
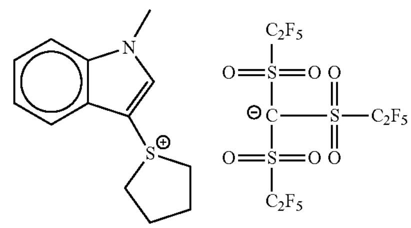
(z75)
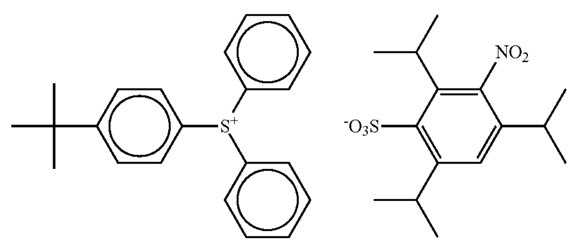
(z76)
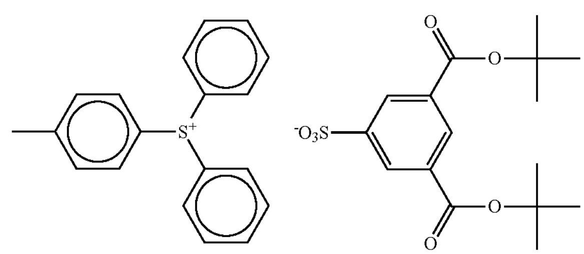
(z77)
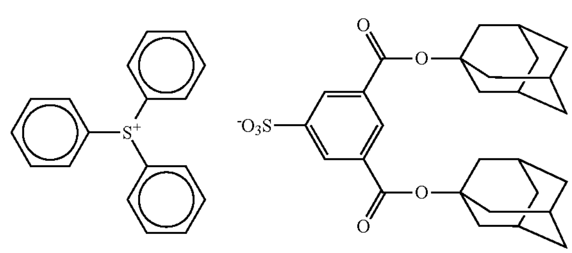

-continued
(z78)
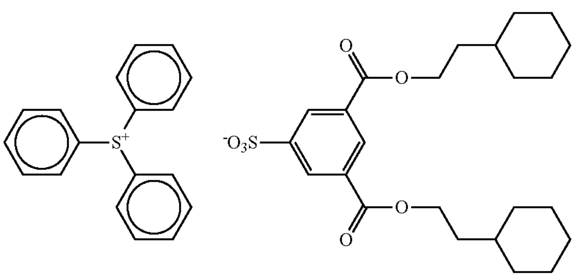
(z79)
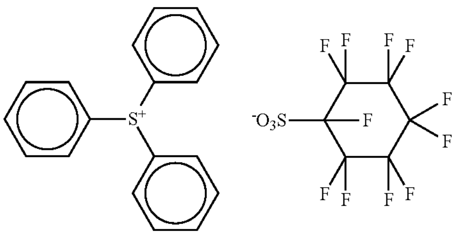
(z80)
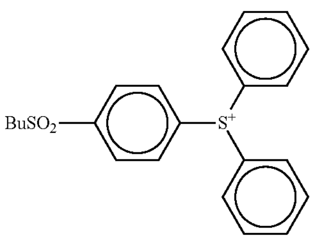
$C_4F_9SO_3^-$
(z81)
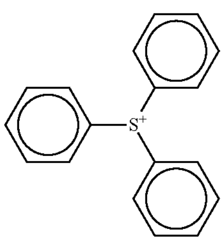
$C_2H_5SO_3^-$
(z82)
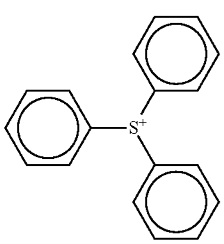
$C_4H_9SO_3^-$
(z83)
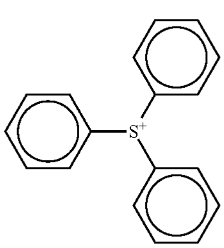
$C_6H_{13}SO_3^-$
-continued
(z84)
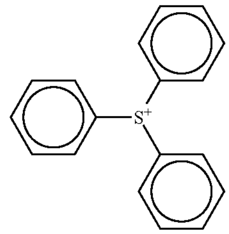
$C_8H_{17}SO_3^-$
(z85)
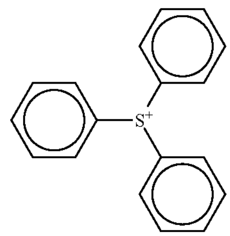
$C_{12}H_{25}SO_3^-$
(z86)
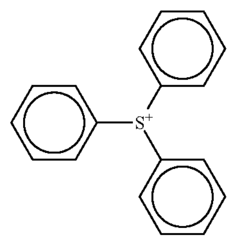
$C_{16}H_{33}SO_3^-$
(z87)
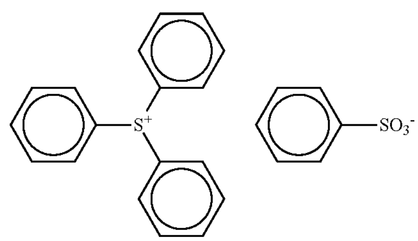
(z88)
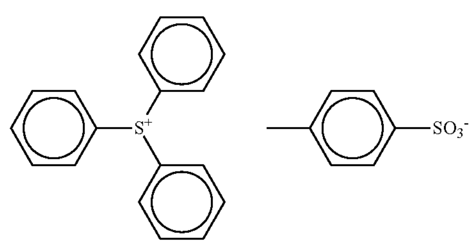
186A[3]
(z89)
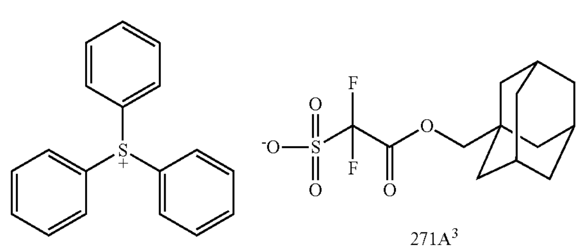
271A[3]

-continued
(z90)
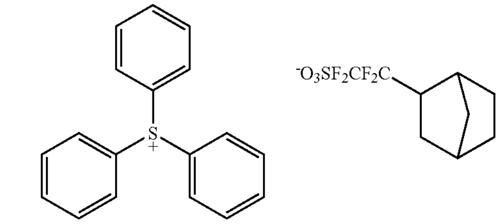
(z91)
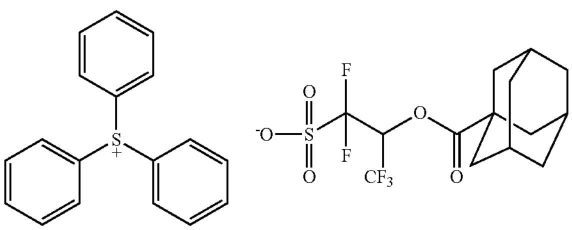
(z92)
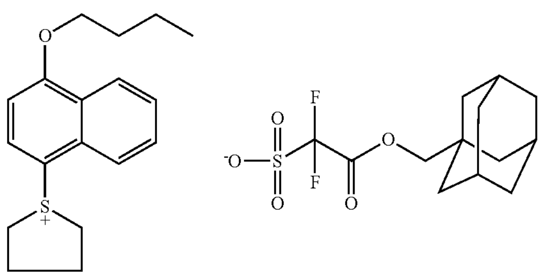
(z93)
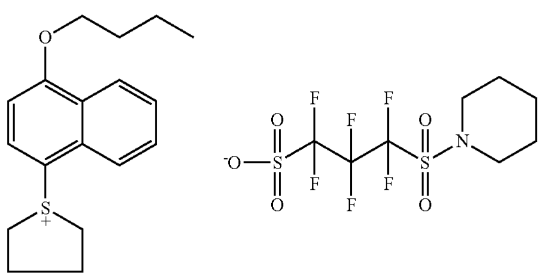
244A3
(z94)
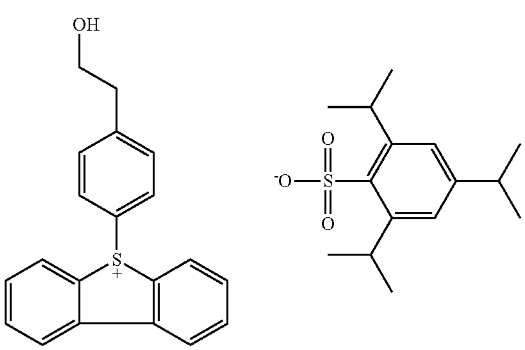
303A3
-continued
(z95)
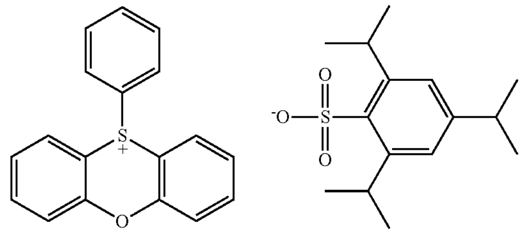
(z96)
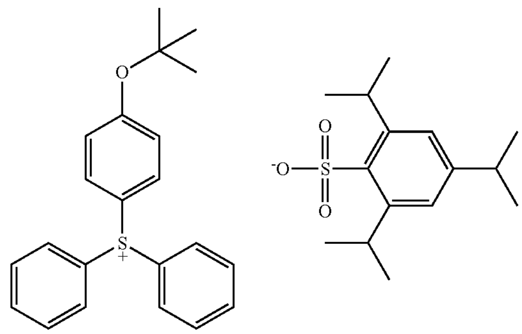
(z97)
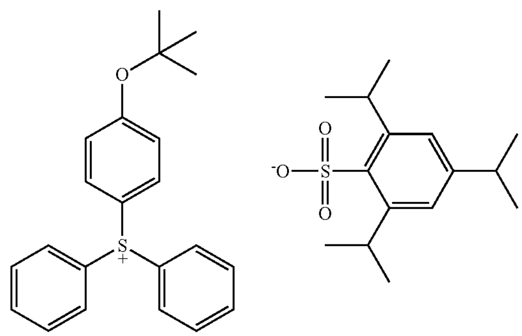
(z98)
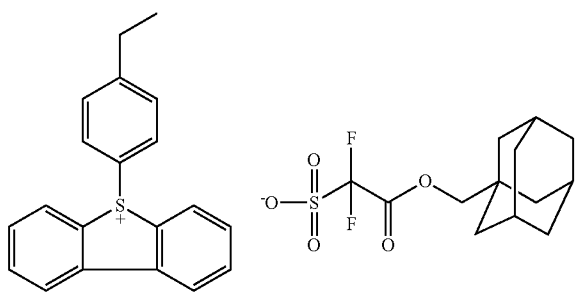
(z99)
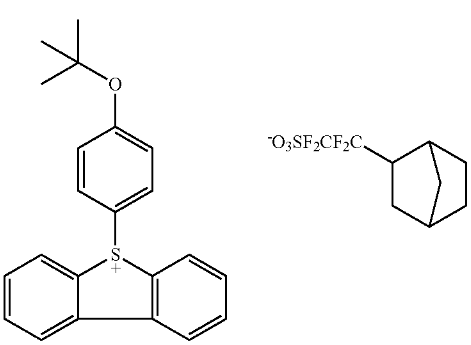

-continued
(z100)
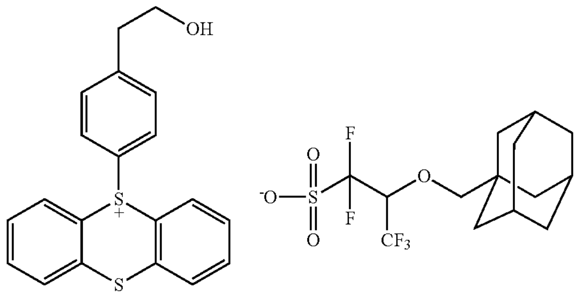
(z101)
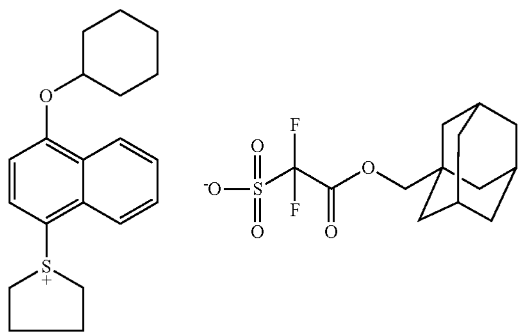
(z102)
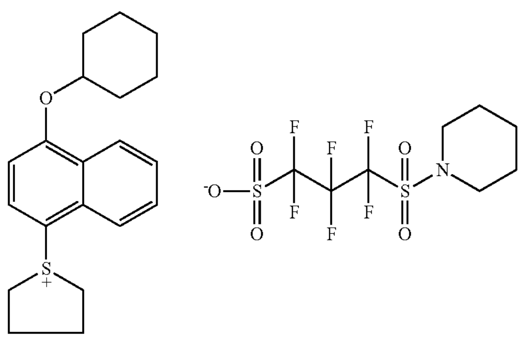
(z103)
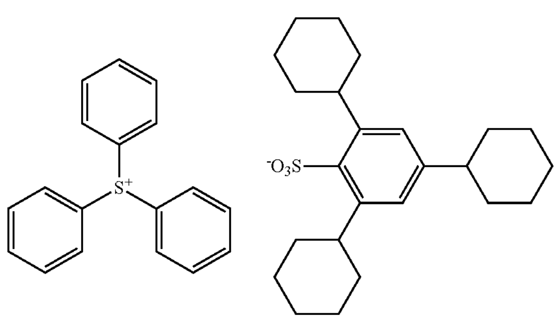
437A3
-continued
(z104)
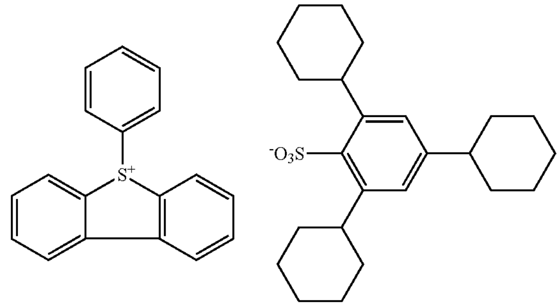
(z105)
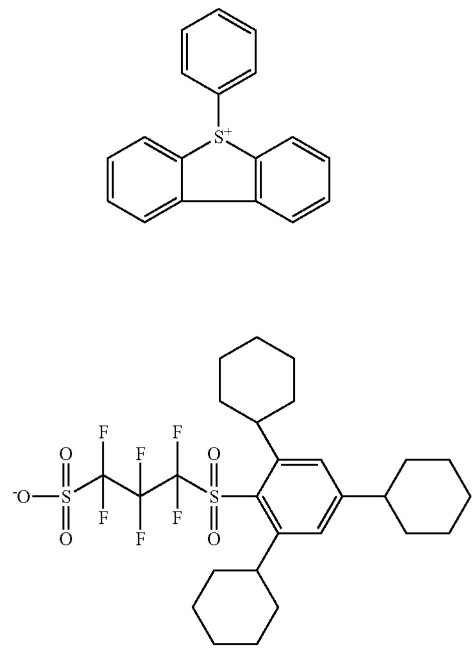
535A3
(z106)
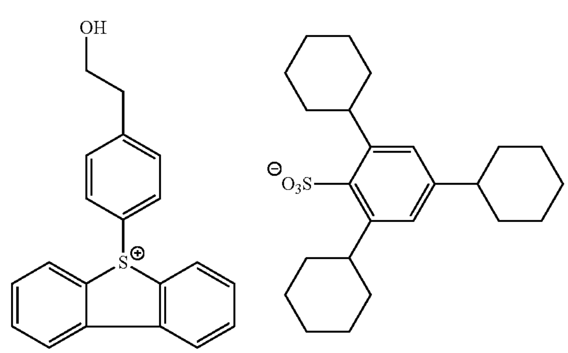

-continued (z107)

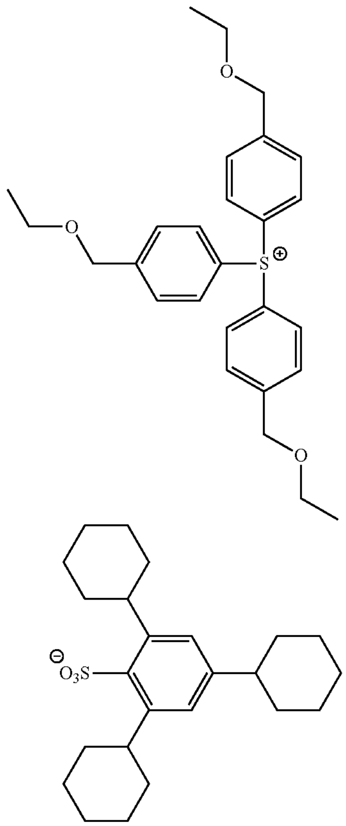

(z108)

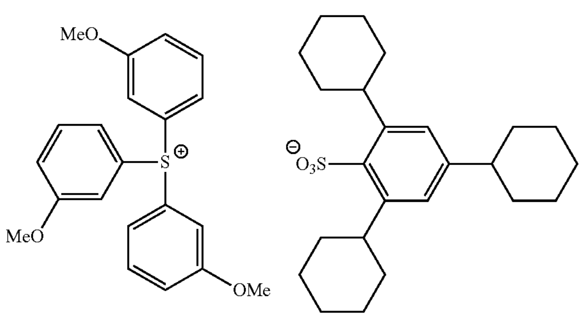

(z109)

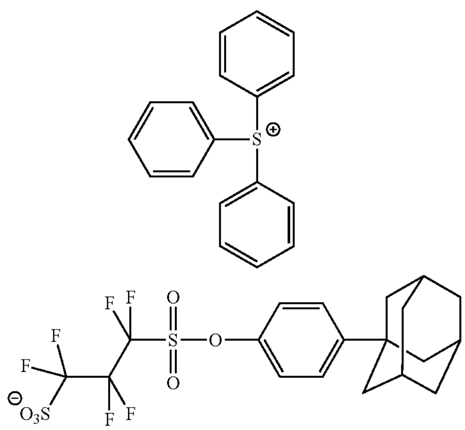

Here, the photoacid generator may use one type singly, or two or more types may be used in combination. When two or more types are used in combination, it is preferable that a compound, which generates two types of different organic acids where the sum of the carbon atoms excluding the hydrogen atoms is two or more, is combined.

It is possible and preferable to appropriately intensify the generated acid when the compound (A) of the present invention uses a compound (ZI-1) and a compound (ZI-4) which have a sulfonate anion represented by the General Formula (SA1).

In a case where the composition according to the present invention further contains the photoacid generator, the content thereof preferably ranges from 0.1 mass % to 40 mass %, more preferably ranges from 0.5 mass % to 30 mass %, and particularly preferably ranges from 1 mass % to 20 mass %, based on the total solid content of the composition.

Other Components

The composition of the present invention may further contain a basic compound, an acid decomposable resin, an organic solvent, a surfactant, an acid dissolution inhibiting compound, a dye, a plasticizer, a photosensitizer, a compound for accelerating dissolution in a developer, a compound having a proton acceptor functional group, or the like.

Basic Compound

The composition of the present invention may further contain a basic compound. When a basic compound is further contained, it is possible to further reduce changes in performance over time from exposure to heating. In addition, it is possible to suppress in-film diffusion of the acid which is generated due to exposure.

The basic compound is preferably a nitrogen-containing organic compound. The compounds which are able to be used are not particularly limited, but for example, it is possible to use the compounds which are classified in (1) to (4) below.

(1) A compound represented by the following General Formula (BS-1)

(BS-1)

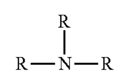

In the General Formula (BS-1), each R independently represents a hydrogen atom or an organic group. Here, at least one out of the three of Rs is an organic group. The organic group is a linear or branched alkyl group, a monocyclic or polycyclic cycloalkyl group, an aryl group, or an aralkyl group.

The number of carbon atoms in the alkyl group as R is not particularly limited, but is normally 1 to 20 and is preferably 1 to 12.

The number of carbon atoms in the cycloalkyl group as R is not particularly limited, but is normally 3 to 20 and is preferably 5 to 15.

The number of carbon atoms in the aryl group as R is not particularly limited, but is normally 6 to 20 and is preferably 6 to 10. Specifically, examples include a phenyl group and a naphthyl group.

The number of carbon atoms in the aralkyl group as R is not particularly limited, but is normally 7 to 20 and is preferably 7 to 11. Specifically, examples include a benzyl group.

The alkyl group, the cycloalkyl group, the aryl group, and the aralkyl group as R may substitute a hydrogen atom with a substituent. Examples of the substituent include an alkyl group, a cycloalkyl group, an aryl group, an aralkyl group, a hydroxy group, a carboxyl group, an alkoxy group, an aryloxy group, an alkylcarbonyloxy group, and an alkyloxycarbonyl group.

Here, it is preferable that at least two of the Rs in the compound represented by the General Formula (BS-1) are organic groups.

Specific examples of the compound represented by the General Formula (BS-1) include tri-n-butylamine, tri-n-pentylamine, tri-n-octylamine, tri-n-decylamine, tri-iso-decyl amine, dicyclohexyl methyl amine, tetradecyl amine, pentadecyl amine, hexadecyl amine, octadecyl amine, didecyl amine, octadecyl methyl amine, dimethyl amine undecyl, N,N-dimethyl dodecyl amine, methyl dioctadecyl amine, N,N-di-butyl aniline, N,N-dihexyl aniline, 2,6-diisopropyl aniline, and 2,4,6-tri(t-butyl)aniline.

In addition, an example of the preferable basic compound represented by the General Formula (BS-1) is an alkyl group where at least of one of Rs is substituted with a hydroxy group. Specifically, examples include triethanolamine and N,N-dihydroxy ethyl aniline.

Here, the alkyl group as R may have an oxygen atom in the alkyl chain. That is, an oxyalkylene chain may be formed. As the oxyalkylene chain, —$CH_2CH_2O$— is preferable. Specifically, examples include tris(methoxy ethoxy ethyl)amine and a compound which is disclosed on line 60 of column 3 in the specifications of U.S. Pat. No. 6,040,112A.

(2) Compound having Nitrogen-containing Heterocyclic Structure

As the nitrogen-containing heterocyclic structure, the compound may or may not have an aromatic property. In addition, a plurality of nitrogen atoms may be contained. Furthermore, hetero atoms other than nitrogen atom may be contained. Specifically, examples include a compound having an imidazole structure (2-phenylbenzimidazole, 2,4,5-triphenylimidazole and the like), a compound having a piperidine structure (N-hydroxyethylpiperidine, bis(1,2,2,6,6-pentamethyl-4-piperidyl)sebacate and the like), a compound having a pyridine structure (4-dimethylaminopyridine and the like), and a compound having an antipyrine structure (antipyrine, hydroxyantipyrine, and the like).

A compound having two or more ring structures can also be preferably used. Specifically, examples include 1,5-diazabicyclo[4.3.0]non-5-ene, 1,8-diazabicyclo[5.4.0]undeca-7-ene.

(3) Amine Compound Having Phenoxy Group

An amine compound having a phenoxy group is a compound where a phenoxy group is provided at the terminal on the opposite side to the N atom of the alkyl group which is contained in an amine compound. The phenoxy group may have a substituent such as an alkyl group, an alkoxy group, a halogen atom, a cyano group, a nitro group, a carboxyl group, a carboxylic acid ester group, a sulfonic acid ester group, an aryl group, an aralkyl group, an acyloxy group, or an aryloxy group.

The compound more preferably has at least one oxyalkylene chain between the phenoxy group and the nitrogen atom. The number of oxyalkylene chains in one molecule is preferably 3 to 9 and is more preferably 4 to 6. Among the oxyalkylene chains, —$CH_2CH_2O$— is particularly preferable.

Specific examples include 2-[2-{2-(2,2-dimethoxy-phenoxyethoxy)ethyl}-bis-(2-methoxyethyl)]-amine, and compounds (C1-1) to (C3-3) disclosed in paragraph 0066 of US2007/0224539A1.

(4) Ammonium Salt

It is possible to appropriately use an ammonium salt. The ammonium salt is preferably a hydroxide or a carboxylate. More specifically, a tetraalkylammonium hydroxide such as tetrabutylammonium hydroxide is preferred.

Other than this, examples of compounds according to the present invention which are able to be used include the compounds synthesized in JP2002-363146A and the compounds disclosed in paragraph 0108 of JP2007-298569A.

In addition, a photosensitive basic compound may be used as the basic compound. It is possible to use a compound disclosed in JP2003-524799A, J. Photopolym. Sci & Tech. Vol. 8, P. 543-553 (1995), and the like as the photosensitive basic compound.

The molecular weight of the basic compound is preferably 250 to 2000 and is more preferably 400 to 1000.

The basic compound may use one type singly or two or more types may be used in combination.

In a case where the basic compound is contained in the composition according to the present invention, the amount thereof contained is normally 0.001 to 10 by mass % and preferably 0.01 to 5 by mass % based on the total solid content of the composition.

The molar ratio of the photoacid generator with regard to the basic compound is preferably 1.5 to 300. That is, the molar ratio of 1.5 or more is preferable from the point of view of improvement of sensitivity and resolution and 300 or less is preferable from the point of suppressing the reduction of resolution due to the thickening of the pattern over time after exposure until heat treatment. The molar ratio is more preferably 2.0 to 200 and is even more preferably 2.5 to 150.

Here, the acid generator in the molar ratio is based on the amount of sum total of the repeating unit and the photoacid generator in a case where the compound (A) includes the repeating unit represented by the General Formula (4).

[4] Acid Decomposable Resin

The composition of the present invention may further contain a resin which is able to be decomposed by the action of an acid and increase a dissolution rate with regard to an alkaline developer, that is, an acid decomposable resin, other than the compound (A).

The acid decomposable resin is typically provided with a group (referred to below as an acid-decomposable group) which is decomposed by the action of an acid and generates an alkali soluble group. The resin may be provided with the acid decomposable group on one of the main chain or a side chain, or both the main chain and the side chain. The resin is preferably provided with an acid decomposable group on the side chain.

As disclosed in EP254853B, JP1990-25850A (JP-H02-25850A), JP1991-223860A (JP-H03-223860A), and JP1992-251259A (JP-H04-251259A), for example, the acid decomposable resin can be obtained by reacting an alkali soluble resin with a precursor of a group which is desorbed by the action of an acid or by copolymerizing an alkali soluble resin monomer which is bonded to a group which is desorbed due to the action of an acid with various monomers.

As the acid decomposable group, a group where the hydrogen atom of an alkali soluble group such as a —COOH group or an —OH group is substituted with a group which is desorbed by the action of an acid is preferable.

The alkali soluble acid decomposable resin described above is not particularly limited and examples thereof include a resin containing a phenolic hydroxyl group and a resin containing a repeating unit having a carboxyl group such as (meth)acrylic acid or norbornene carboxylic acid.

As the resin containing a phenolic hydroxyl group, examples thereof preferably include poly(o-hydroxystyrene), poly(m-hydroxystyrene), poly(p-hydroxystyrene), copolymers thereof, hydrogenated poly(hydroxystyrene), poly(hydroxystyrenes) having the substituent represented by any of the structures below, a styrene-hydroxystyrene copolymer, an α-methylstyrene-hydroxystyrene copolymer, and an alkali soluble resin having a hydroxystyrene structural moiety such as hydrogenated novolak resin.

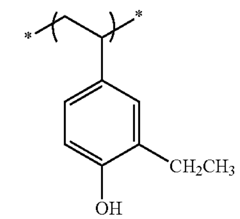
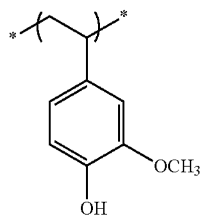
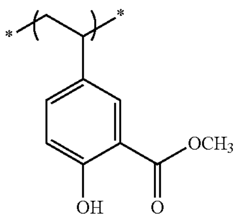
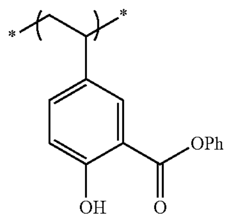
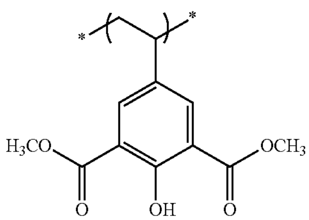
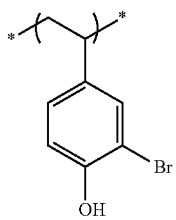
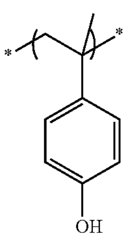
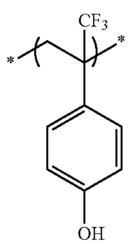
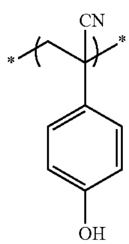
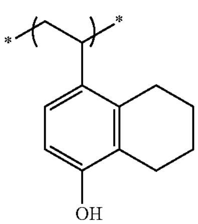
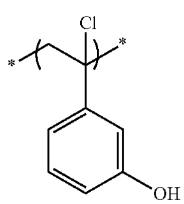
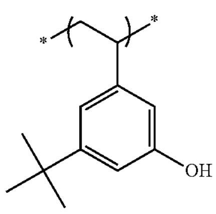
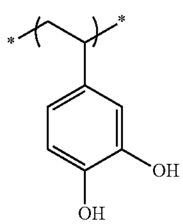
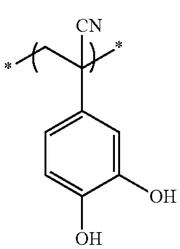
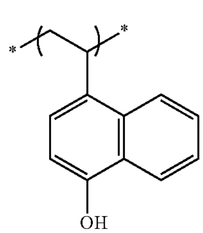

-continued

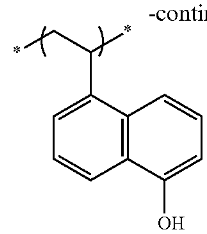
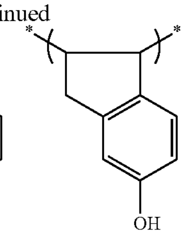
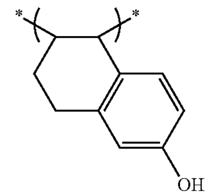

The alkali dissolution rate of the alkali soluble resin is preferably 170 Å/sec or more and particularly preferably 330 Å/sec or more, when measured with a 2.38% by mass of tetramethylammonium hydroxide (TMAH) at 23° C. More specifically, the alkali dissolution rate can be obtained by dissolving only an alkali soluble resin in a solvent such as propylene glycol monomethyl ether acetate (PGMEA), coating a composition having a solid content concentration of 4% by mass on a silicon wafer to form a film (thickness of 100 nm), and measuring the time (seconds) until the film is completely dissolved in a TMAH aqueous solution.

Examples of the monomer which are able to be adopted as the material of the resin include an alkylcarbonyloxy styrene (for example, t-butoxycarbonyloxy styrene), alkoxy styrene (for example, 1-alkoxyethoxystyrene or t-butoxystyrene), and a tertiary alkyl ester(meth)acrylate (for example, t-butyl (meth)acrylate, 2-alkyl-2-adamantyl(meth)acrylate, or dialkyl (1-adamantyl)methyl (meth)acrylate).

In a case where the composition according to the present invention is irradiated with KrF excimer laser light, an electron beam, X-rays, or a high energy light beam with a wavelength of 50 nm or lower (for example, EUV), the acid decomposable resin preferably contains a repeating group provided with an aromatic group. In particular, the acid decomposable resin preferably contains hydroxystyrene as a repeating group. Examples of such a resin include a copolymer with hydroxystyrene protected by a group which is desorbed by the action of an acid and hydroxystyrene or a copolymer of hydroxystyrene and a tertiary alkyl ester(meth)acrylate.

The acid decomposable resin may have a repeating unit which is derived from another polymerizable monomer. Examples of another polymerizable monomer include the monomers previously described as the other polymerizable monomers which can be contained in the compound (A). Here, the amount of the repeating unit which is derived from another polymerizable monomer contained is typical 50 mol % or less and is preferably 30 mol % or less based on the total of the repeating units.

In addition, the acid decomposable group may contain a repeating unit having an alkali soluble group such as a hydroxyl group, a carboxy group, and a sulfonate group, and the amount of the repeating unit having an alkali soluble group contained in this case is preferably 1 to 99 mol %, is more preferably 3 to 95 mol %, and is even more preferably 5 to 90 mol % in the total of the repeating units which configure the acid decomposable resin.

The amount of the repeating unit having the acid decomposable group contained is preferably 3 to 95 mol %, is more preferably 5 to 90 mol %, and is even more preferably 10 to 85 mol % in the total of the repeating units which configure the acid decomposable resin.

The weight average molecular weight of acid decomposable resins is preferably 50,000 or less as the polystyrene equivalent using the GPC method (solvent: THF), is more preferably 1,000 to 20,000, and is particularly preferably 1,000 to 10,000.

The dispersity (Mw/Mn) of acid decomposable resin is preferably 1.0 to 3.0, is more preferably 1.05 to 2.0, and is even more preferably 1.1 to 1.7.

In addition, the acid decomposable resin may use two or more types in combination.

Specific examples of the acid decomposable resin are shown below but are not limited thereto.

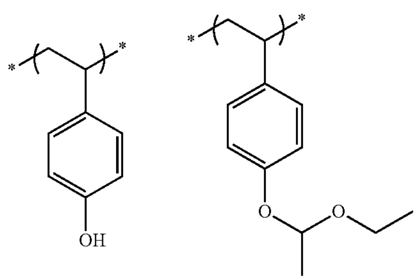

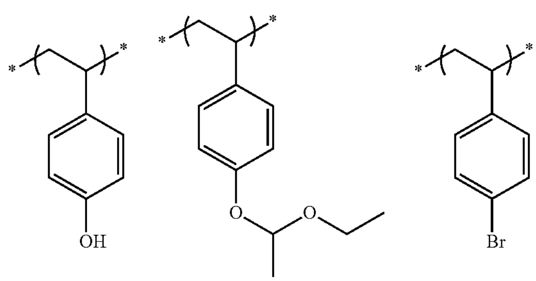

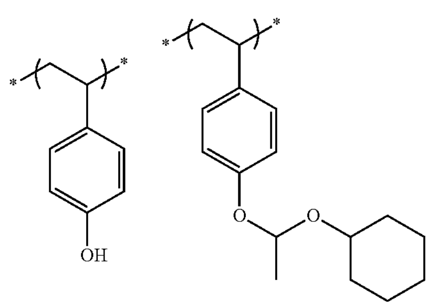

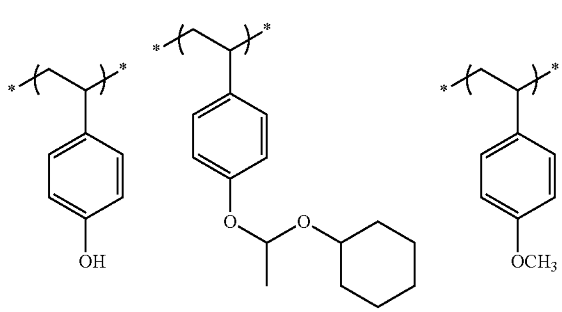

-continued

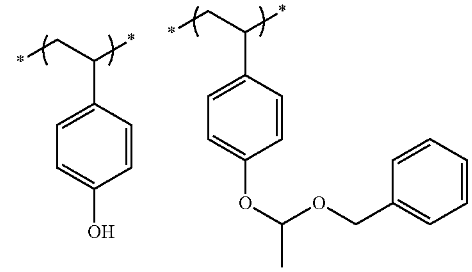

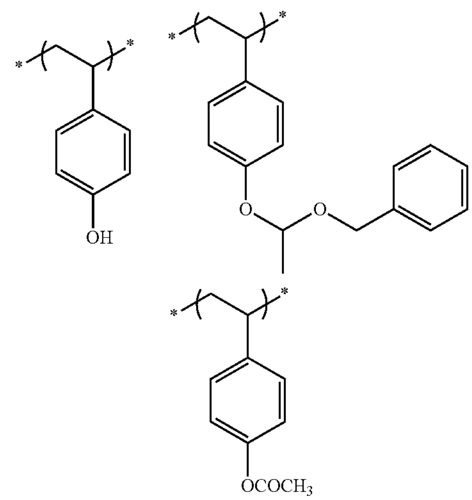

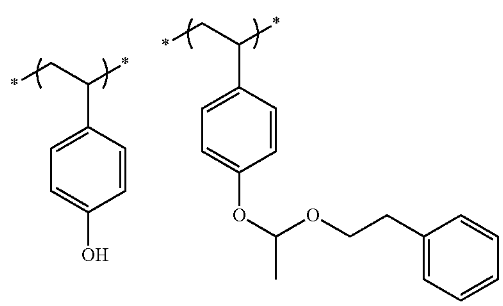

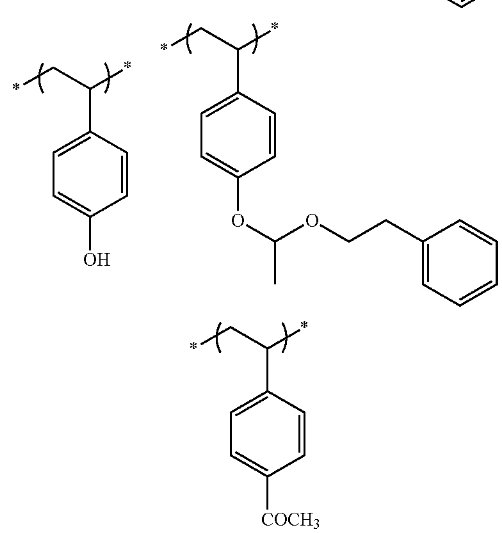

-continued
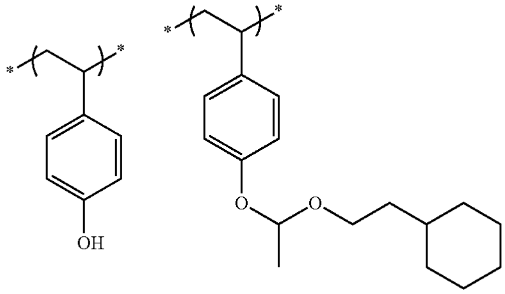
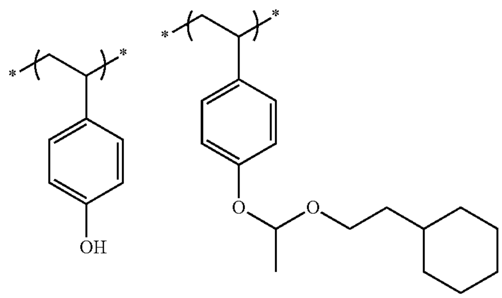
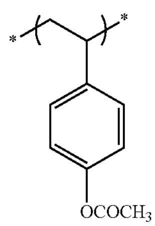
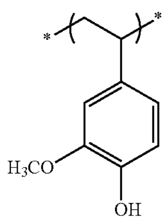
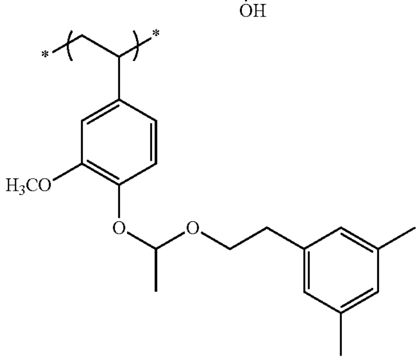
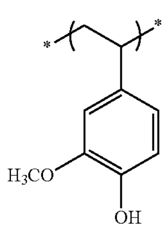
-continued
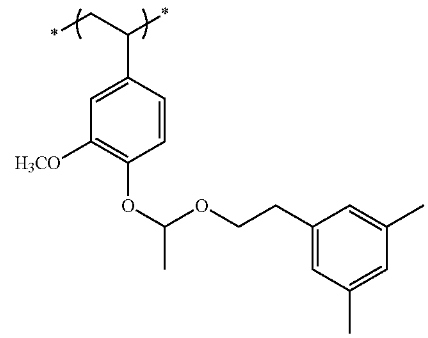
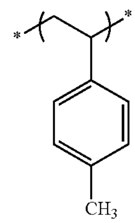
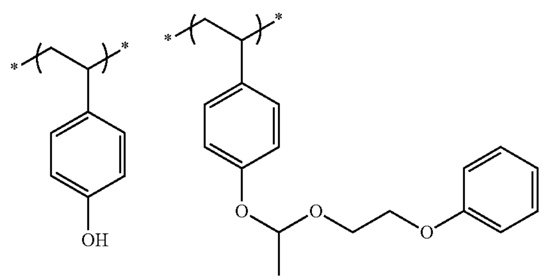
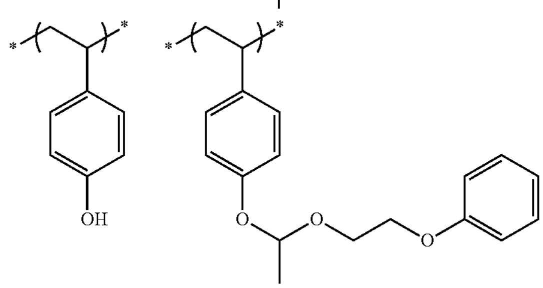
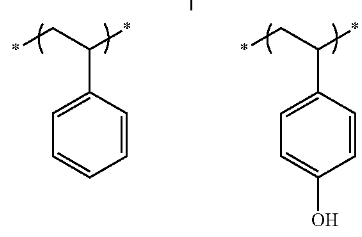
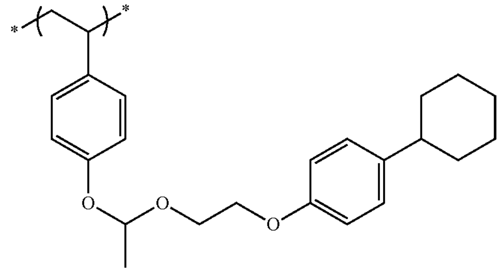

-continued
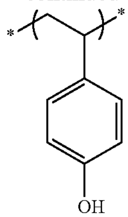
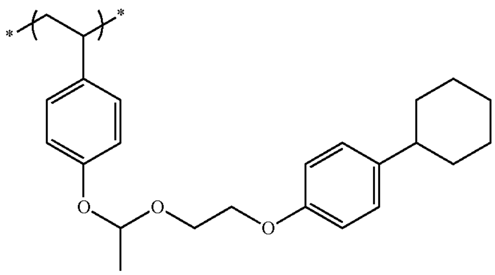
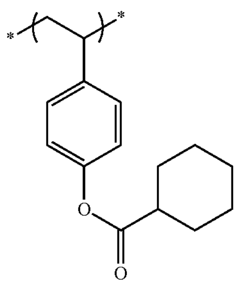
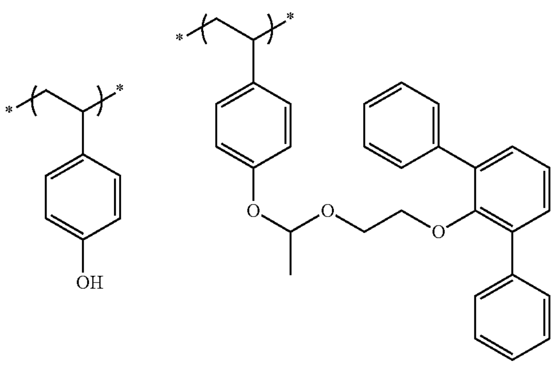
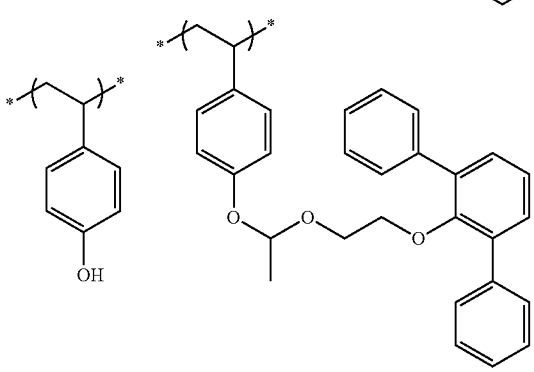
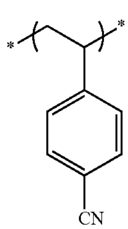
-continued
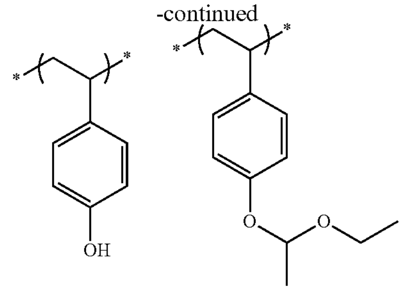
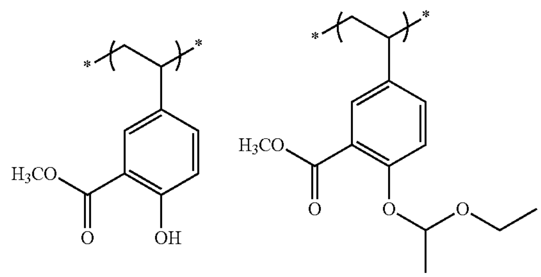
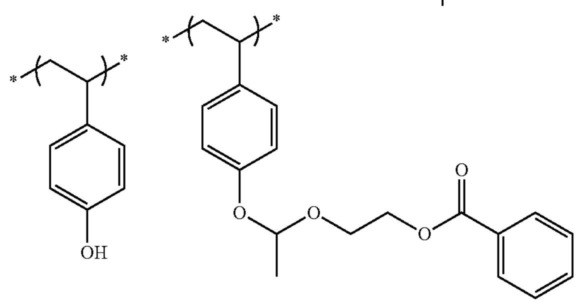
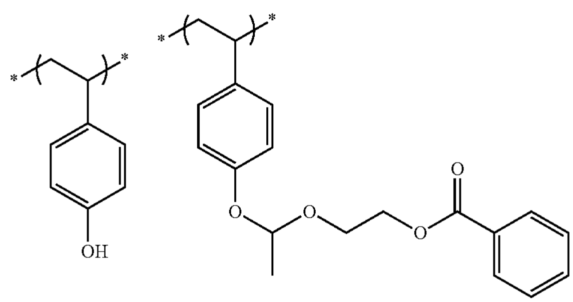
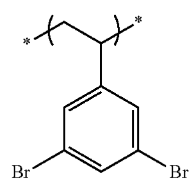
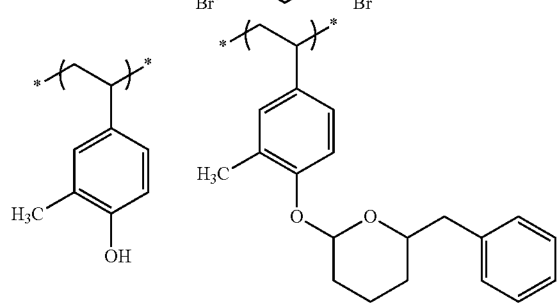

-continued
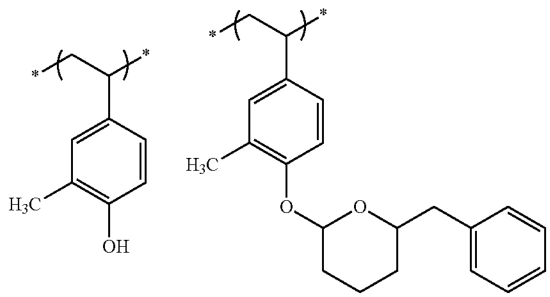
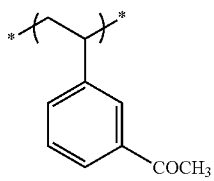
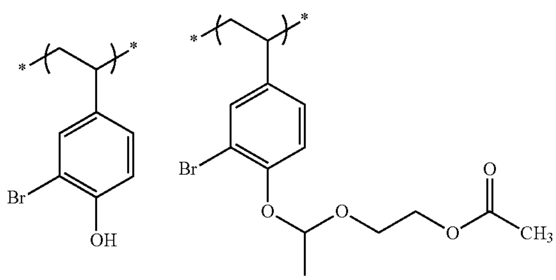
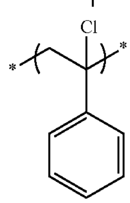
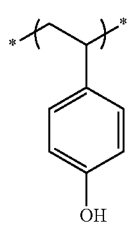
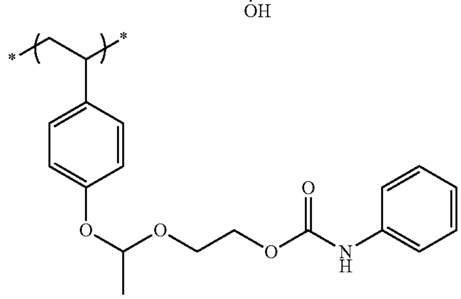
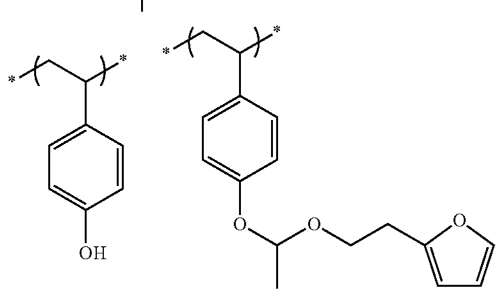
-continued
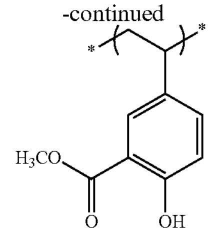
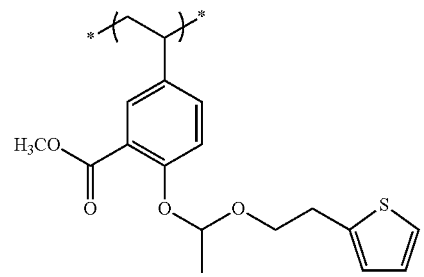
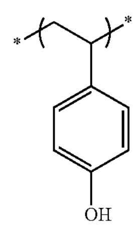
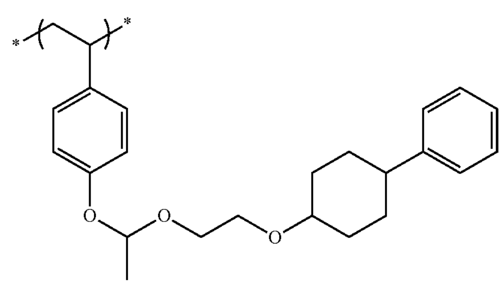
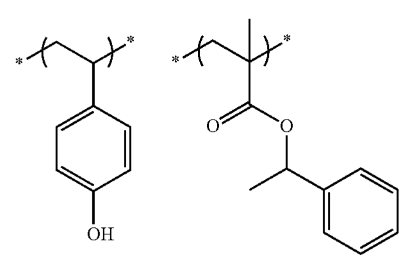
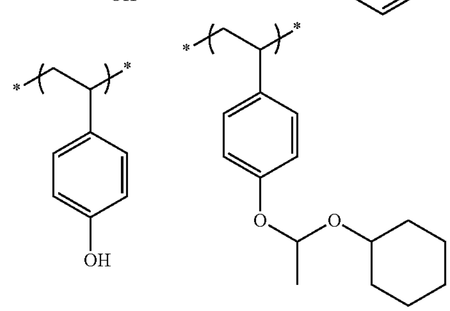

-continued

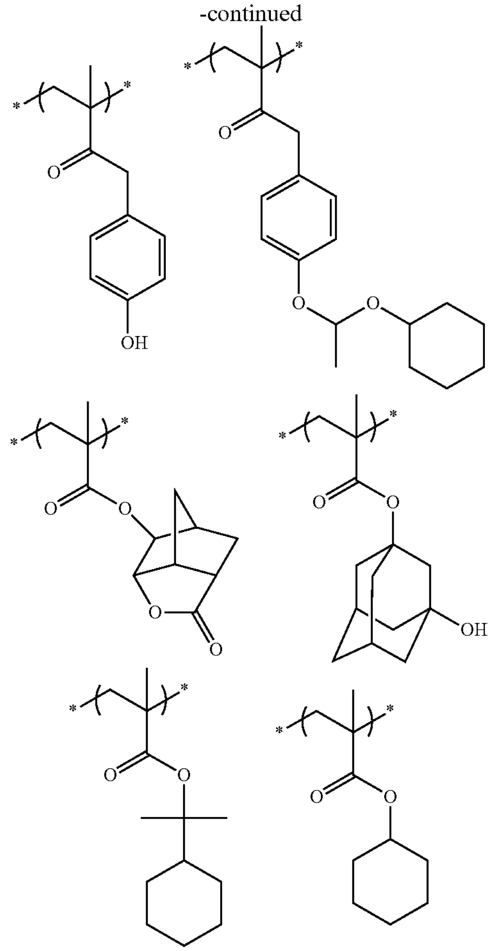

In a case where the acid decomposable resin other than the compound (A) is contained in the present invention, the amount thereof contained is preferably 0.5 to 80 mass %, is more preferably 5 to 50 mass %, and is even more preferably 10 to 30 mass % based on the total solid content of the composition.

Other than the compound (A), the composition of the present invention may further use a resin which has both a repeating unit which generates an acid due to the irradiation with actinic rays or radiation and a repeating which contains a group which is decomposed by the action of an acid and where the rate of solubility in the alkaline developer is increased. As an example which is preferably used as such a resin, there are the examples of resins which are exemplified in JP1997-325497A (JP-H09-325497A), JP2009-93137A, JP2010-85971A, JP2011-256856A, and the like.

[5] Solvent

The composition according to the present invention preferably contains a solvent.

The solvent which is able to be used when preparing the composition is not particularly limited as long as each component is soluble and examples thereof include an alkylene glycol mono alkyl ether carboxylate (propylene glycol monomethyl ether acetate (PGMEA; other name of 1-methoxy-2-acetoxypropane) and the like), an alkylene glycol monoalkyl ether (propylene glycol monomethyl ether (PGME; other name 1-methoxy-2-propanol) and the like), an alkyl lactate ester (ethyl lactate, methyl lactate, and the like), a cyclic lactone (γ-butyrolactone and the like which preferably has 4 to 10 carbon atoms), a linear or a cyclic ketone (2-heptanone, cyclohexanone, and the like which preferably has 4 to 10 carbon atoms), an alkylene carbonate (ethylene carbonate, propylene carbonate, and the like), an alkyl carboxylate (an alkyl acetate such as butyl acetate is preferable), an alkyl alkoxy acetate (ethyl ethoxypropionate), and the like. Other examples of the solvent which is able to be used are the solvents which are disclosed in paragraph 0244 and beyond in US2008/0248425A1 and the like.

Among the solvent described above, an alkylene glycol mono alkyl ether carboxylate, an alkylene glycol monoalkyl ether, or an ethyl lactate are preferable.

These solvents may be used singly or two or more types may be mixed and used. In a case where two or more types may be mixed and used, it is preferable to mix a solvent containing a hydroxyl group and a solvent not containing a hydroxyl group. The mass ratio of the solvent containing a hydroxyl group and the solvent not containing a hydroxyl group is normally 1/99 to 99/1, is preferably 10/90 to 90/10, and even more preferably 20/80 to 60/40.

The solvent containing a hydroxyl group is preferably an alkylene glycol monoalkyl ether or an alkyl lactate ester and the solvent not containing a hydroxyl group is preferably an alkylene glycol mono alkyl ether carboxylate. It is particularly preferable to use a solvent where propylene glycol monomethyl ether is 50 mass % or more of the solvent.

Here, the use of the solvent used is determined so that the total solid concentration of the composition is preferably 0.1 to 10 mass %, is more preferably 2.0 to 6.0 mass %, and is even more preferably 3.0 to 5.0 mass %.

[6] Surfactant

The composition according to the present invention preferably may further contain a surfactant. As the surfactant, a fluorine based and/or a silicon based surfactant is particularly preferable.

Examples of the surfactant include Megaface F176 and Megaface R08 manufactured by DIC Corporation, PF656 and PF6320 manufactured by OMNOVA Solutions Inc., Troysol S-366 manufactured by Troy Chemical Corp., Fluorad FC430 manufactured by Sumitomo 3M Ltd., Polysiloxane polymer KP-341 manufactured by Shin-Etsu Chemical Co., Ltd., and the like.

In addition, it is possible to use other surfactants other than fluorine based and/or silicon based surfactants. More specifically, examples thereof can include polyoxyethylene alkyl ethers, polyoxyethylene alkyl aryl ethers, and the like.

Other than this, it is possible to appropriately use a known surfactant. Examples of surfactants which are able to be used include are surfactants which are disclosed from paragraph 0273 and beyond in US 2008/0248425A1.

The surfactant may be used singly or two or more types may be used.

In a case where the composition according to the present invention further contains a surfactant, the content of the surfactant is preferably 0.0001 to 2 mass % and is more preferably 0.001 to 1 mass % based on the total solid content of the composition.

[7] Dissolution Inhibiting Compound

The composition of the present invention may further contain a dissolution inhibiting compound (referred to below as "dissolution inhibiting compound") with a molecular weight of 3000 or less which increases the solubility in an alkaline developer by being decomposed due to the action of an acid.

In the case of exposing the composition according to the present invention using a KrF excimer laser or irradiating using an electron beam, it is preferable that the dissolution inhibiting compound is a compound containing a structure where the phenolic hydroxyl group of a phenol compound is substituted by an acid decomposable group. As the phenol compound, a compound containing from 1 to 9 phenol skeletons is preferable and more preferably from 2 to 6 phenol skeletons.

The molecular weight of the dissolution inhibiting compound is 3000 or less and is preferably 300 to 3000, and is more preferably 500 to 2500.

In a case where the composition according to the present invention further contains a dissolution inhibiting compound, the amount of the dissolution inhibiting compound added is preferably 0.0001 to 20 mass % and is more preferably 0.5 to 10 mass % based on the total solid content of the composition.

Specific examples of the dissolution inhibiting compound are shown below, but the present invention is not limited thereto.

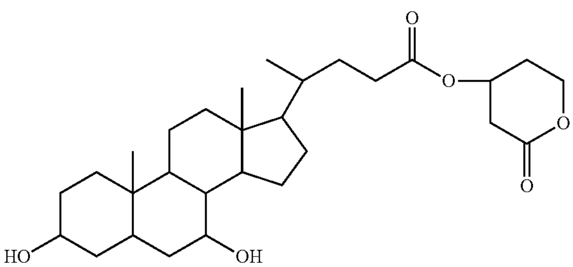

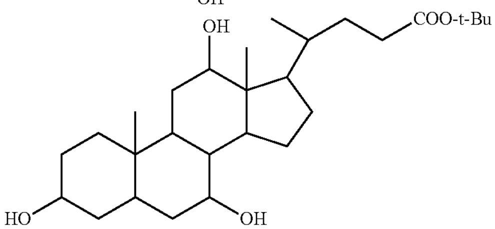

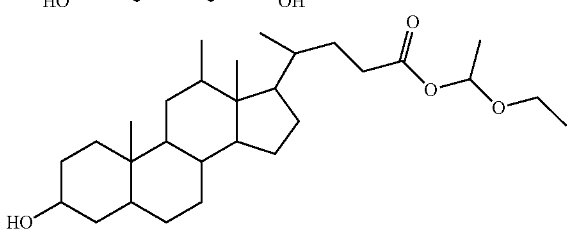

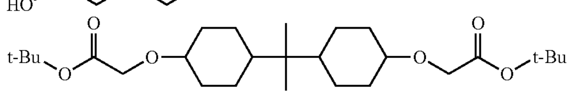

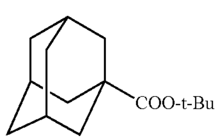

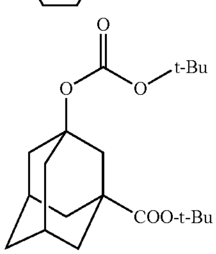

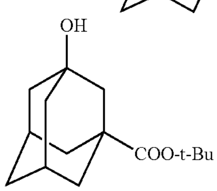

[8] Other Additives

The composition according to the present invention can further contain a dye, a plasticizer, a photosensitizer, a light absorber, a compound for promoting dissolution in a developer (referred to below as a dissolution promoting compound), and the like. In addition, a compound provided with a proton acceptor functional group disclosed in JP2006-208781A and JP2007-286574A can be appropriately used.

The dissolution promoting compound is a low-molecular weight compound with a molecular weight of 1000 or less having 2 or more phenolic hydroxyl groups or 1 or more carboxy groups. When the compound has a carboxy group, the dissolution promoting compound is preferably an alicyclic or aliphatic compound.

The amount of the dissolution promoting compound added is preferably 0 to 50 mass % and is more preferably 5 to 30 mass % based on the mass of the compound (A). The added amount is preferably 50 mass % or less from the point of view of suppressing development residue and preventing pattern deformation during development.

Here, the dissolution promoting compound can be easily synthesized by referencing, for example, JP1992-122938A (JP-H04-122938A), JP1990-28531A (JP-H02-28531A), U.S. Pat. No. 4,916,210A, and EP219,294B.

[9] Pattern Forming Method

The composition according to the present invention may typically be used as below. That is, the composition according to the present invention is typically coated on a support body such as a substrate and a film is formed. The thickness of the film is preferably 100 nm or less and is more preferably 2 nm to 100 nm. As a method of coating on the substrate, spin coating is preferable and the rotational frequency thereof is preferably 1,000 to 3,000 rpm.

For example, the composition according to the present invention is coated using an appropriate coating method such as a spinner or a coater on a substrate (example: silicon/silicon dioxide coating, quartz substrate with a silicon nitride and a chromium layer which are deposited, and the like) which is used in the manufacturing of precision integrated circuit elements and the like. After this, the actinic ray-sensitive or radiation-sensitive film (referred to below as a resist film) is obtained by the drying thereof. Here it is also possible to coat a known antireflection film in advance.

Next, the resist film is irradiated by an actinic ray or radiation (preferably, an electron beam, X-rays, or EUV light) and is developed preferably after baking is performed (normally at 80 to 150° C. and more preferably at 90 to 130° C.). Due to this, it is possible to obtain an excellent pattern. Then, using the pattern as a mask, an appropriate etching process, ion implantation, and the like are performed and a fine semiconductor circuit, an imprint mold structure, and the like is formed.

For details of a process in a case where an imprint mold structure is formed using the composition of the present invention, refer to, for example, JP4109085B, JP2008-162101A, and "Science and New Technology in Nanoimprint", edited by Yoshihiko Hirai (Frontier Publishing). In addition, in particular, for an appropriate manufacturing method of a mold structure in the manufacturing of an information recording medium, refer to, for example, JP4109085B and JP2008-162101A.

In the development process, a normal alkaline developer is used. The developing method appropriately uses a known method such as paddle forming, dipping, dynamic dispensing, and the like. As the alkaline developer, various aqueous alkaline solutions can be used, but normally, a tetramethyl ammonium hydroxide alkaline aqueous solution is used. Alcohols or a surfactant may be added in an appropriate amount to the alkaline developer.

The concentration of the alkaline developer is generally 0.1 to 20% by mass. The pH of the alkaline developer is normally 10.0 to 15.0.

The pattern forming method of the present invention can also be used to a processing to obtain a negative type pattern by developing using a developer which has an organic solvent as a main component, after the coating, depositing and exposing of the composition of the present invention. In such a process, for example, a process disclosed in JP2010-217884A can be used.

As the organic developer, a polar solvent or a hydrocarbon solvent such as an ester-based solvent (butyl acetate, ethyl acetate, or the like), a ketone-based solvent (2-heptanone and cyclohexanone), an alcohol-based solvent, an amide-based solvent, and an ether-based solvent can be used. The water content ration of the total organic developer is preferably less than 10 mass % and more preferably does not actually contain any water.

In addition, the resist film may be formed on mask blank in the pattern forming method of the present invention.

Here, the mask blanks is a material for forming a photomask which is used in a semiconductor manufacturing process, and normally, a light shielding film is provided on a transparent substrate (preferably a glass substrate). The forming method of the light shielding film with regard to the transparent substrate is not particularly limited, but for example, a material which configures the light shielding material is able to be formed on the transparent substrate using chemical deposition.

As the material which configures the light shielding film, a metal such as tantalum, chromium, molybdenum, titanium, zirconium, tin, gallium, and aluminum is a main component and an oxide, nitride, and oxide nitride of a metal element can be appropriately used. Specifically, examples thereof can include chromium oxide, chromium nitride, chromium, tantalum oxide, tantalum nitride, tantalum, molybdenum silicide oxide, molybdenum silicide nitride, molybdenum silicide oxide nitride, molybdenum, and the like.

The light shielding film may be a single layer but is preferably a multi-layer structure where a plurality of material are coated and overlapped. In a case of a multi-layer structure, the thickness of the film for each single layer is not particularly limited, but is preferably 5 nm to 100 nm and is more preferably 10 nm to 80 nm. The thickness of the entire light shielding film is not particularly limited but is preferably 5 nm to 200 nm and is more preferably 10 nm to 150 nm.

By forming, exposing, and developing the resist film is formed on such mask blanks, it is possible to obtain a photomask.

EXAMPLES

Below, the present invention will be described in further detail using examples, but the content of the invention is not limited by this.

Reference Synthesis Example 1

Synthesis of Modified Polyhydroxystyrene Compound (PHS-M1)

In 120 g of acetone, 30.0 g of poly(p-hydroxystyrene) (VP-2500 manufactured by Nippon Soda Co., Ltd.) as the polyhydroxystyrene compound was dissolved, 1.32 g of 1-chloromethyl naphthalene, 2.07 g of potassium carbonate (2 equivalents with regard to 1-chloromethyl naphthalene), and 0.56 g of sodium iodide (0.5 equivalents with regard to 1-chloromethyl naphthalene) were added and circulated for four hours. After approximately half of the acetone was distilled off in an evaporator, 200 ml of ethyl acetate followed by 200 ml of 1N hydrochloric acid was added while stirring. After having been moved to a separating funnel and the aqueous phase has been removed, an organic phase was washed with 200 ml of 1N hydrochloric acid followed by 200 ml of distilled water and the organic phase was condensed using an evaporator. Due to the operations above, 3% naphthylmethylated poly(p-hydroxystyrene) was obtained.

Reference Synthesis Example 2

Synthesis of Modified Polyhydroxystyrene Compound (PHS-M2)

5% naphthylmethylated poly(p-hydroxystyrene) was obtained in the same manner as the reference synthesis example 1 except that the amount of added 1-chloromethyl naphthalene was changed from 1.32 g to 2.21 g.

Reference Synthesis Example 3

Synthesis of Modified Polyhydroxystyrene Compound (PHS-M3)

In 170 g of acetone, 30.0 g of poly(p-hydroxystyrene) (VP-2500 manufactured by Nippon Soda Co., Ltd.) as the polyhydroxystyrene compound was dissolved, 3.42 g of benzyl bromide and 3.59 g of potassium carbonate (1.3 equivalents with regard to benzyl bromide) were added and circulated for four hours to obtain a reactant solution. Then, 8% benzylated poly(p-hydroxystyrene) was obtained in the same manner as the reference synthesis example 1 except that the reactant solution was used.

Reference Synthesis Example 4

Synthesis of Modified Polyhydroxystyrene Compound (PHS-M4)

5% benzylated poly(p-hydroxystyrene) was obtained in the same manner as the reference synthesis example 3 except that VP-2500 was changed to VP-8000 (manufactured by Nippon Soda Co., Ltd.) and the amount of added the benzyl bromide was changed from 3.42 g to 2.14 g.

Reference Synthesis Example 5

Synthesis of Modified Polyhydroxystyrene Compound (PHS-M5)

In 170 g of tetrahydrofuran (THF), 30.0 g of poly(p-hydroxystyrene) (VP-2500 manufactured by Nippon Soda Co., Ltd.) as the polyhydroxystyrene compound was dissolved, 26.53 g of triethylamine was added and stirred in an ice-water bath. A THF solution with 2.34 g of 1-naphthoyl chloride was added dropwise to the reactant solution, and after stirring for 4 hours, the reaction was quenched by adding distilled water. After the THF was distilled off in reduced pressure, an obtained reactant was dissolved in ethyl acetate. After obtained the organic phase was washed 5 times with distilled water, the organic phase was condensed using an evaporator. Due to the operations above, 5% naphthylmethylated poly(p-hydroxystyrene) was obtained.

Reference Synthesis Example 6

Synthesis of Modified Polyhydroxystyrene Compound (PHS-M6)

5% phenylcarbamoylated polyp-hydroxystyrene) was obtained in the same manner as the reference synthesis example 5 except that the 2.34 g of 1-naphthoyl chloride was changed to 1.50 g of phenyl isocyanate.

Synthesis Example 1

Synthesis of Compound (A-1)

With regard to 41.4 g of phenyl acetaldehyde dimethyl acetal, 23.5 g of acetyl chloride was added and was stirred for 6 hours in a water bath of 45° C. After being returned to room temperature, the compound C1-1 shown below was obtained as a chloro-ether compound by removing the unreacted acetyl chloride under reduced pressure.

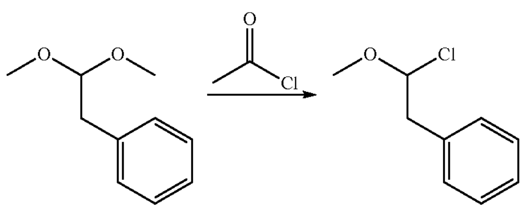

Cl-1

In 50 g of tetrahydrofuran (THF), 10.0 g of poly(p-hydroxystyrene) (VP-2500 manufactured by Nippon Soda Co., Ltd.) as the polyhydroxystyrene compound was dissolved, 8.85 g of triethylamine was added and stirred in an ice-water bath. A mixed solution (4.69 g) containing the compound C1-1 obtained as described was added dropwise to the reactant solution and stirred for 4 hours. The protection rate was 25.2% as determined by $^{1}$H-NMR using a small amount of the reactant solution. After this, the mixed solution containing a small amount of the compound C1-1 was added and stirred for 1 hour, the operation of determining by $^{1}$H-NMR was repeated, and the reaction was quenched by adding distilled water at the point in time where the protection rate exceeded 30.0% which is the target amount. After the THF was distilled off under reduced pressure, an obtained reactant was dissolved in ethyl acetate. After the obtained organic phase has been washed 5 times using distilled water, the organic phase was added dropwise to 1.5 L of hexane. After the obtained precipitate was filtered off and washed using a small amount of hexane, the precipitate was dissolved in 35 g of propylene glycol monomethyl ether acetate (PGMEA). By removing a low boiling point solvent from the obtained solution using an evaporator, 44.3 g of PGMEA solution of the compound (A-1) (26.4 mass %) was obtained.

The composition ratio of the compound (A-1) (molar ratio) was calculated with regard to the obtained compound (A-1) using $^{1}$H-NMR measurement. In addition, the weight average molecular weight (Mw: polystyrene conversion), numerical average molecular weight (Mn: polystyrene conversion), and dispersity (Mw/Mn, referred to as "PDI") of the compound (A-1) was calculated using GPC measurement (solvent: THF). The results of this are shown in the following chemical formula.

(A-1)

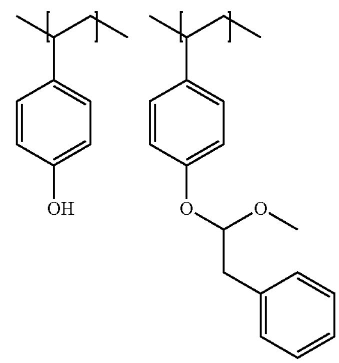

x/y = 70/30
Mw = 4700, PDI = 1.13

Synthesis Examples 2 to 22

Synthesis of Compounds (A-2) to (A22)

The compounds (A-2) to (A22) were synthesized using the same method as the synthesis example 1 except that the polyhydroxystyrene compounds and the chloro-ether compounds which have been used were appropriately changed. The polyhydroxystyrene compounds and the chloro-ether compounds which have been used are shown below. Here, the chloro-ether compounds which have been used were synthesized using the corresponding acetal compound in the same manner as the synthesis example 1.

TABLE 1

| | Synthesis compound | Polyhydroxystyrene compound | Chloro-ether compound |
|---|---|---|---|
| Synthesis Example 2 | A-2 | VP-2500 | Cl-2 |
| Synthesis Example 3 | A-3 | VP-8000 | Cl-2 |
| Synthesis Example 4 | A-4 | VP-2500 | Cl-3 |
| Synthesis Example 5 | A-5 | VP-2500 | Cl-4 |
| Synthesis Example 6 | A-6 | VP-8000 | Cl-4 |
| Synthesis Example 7 | A-7 | VP-2500 | Cl-5 |
| Synthesis Example 8 | A-8 | VP-2500 | Cl-6 |
| Synthesis Example 9 | A-9 | VP-2500 | Cl-6 |
| Synthesis Example 10 | A-10 | VP-2500 | Cl-7 |
| Synthesis Example 11 | A-11 | PHS-M1 | Cl-4 |
| Synthesis Example 12 | A-12 | PHS-M6 | Cl-8 |
| Synthesis Example 13 | A-13 | PHS-M3 | Cl-9 |
| Synthesis Example 14 | A-14 | VP-2500 | Cl-4, Cl-10 |
| Synthesis Example 15 | A-15 | MHS | Cl-8 |
| Synthesis Example 16 | A-16 | MHS | Cl-8, Cl-11 |

TABLE 1-continued
| | Synthesis compound | Polyhydroxystyrene compound | Chloro-ether compound |
|---|---|---|---|
| Synthesis Example 17 | A-17 | PHS-M4 | Cl-12 |
| Synthesis Example 18 | A-18 | VP-8000 | Cl-13 |
| Synthesis Example 19 | A-19 | VP-2500 | Cl-14 |
| Synthesis Example 20 | A-20 | VP-2500 | Cl-15 |
| Synthesis Example 21 | A-21 | VP-8000 | Cl-16 |
| Synthesis Example 22 | A-22 | VP-2500 | Cl-17 |
MHS: poly(m-hydroxystyrene) (Mw = 3700 and PDI = 1.15)
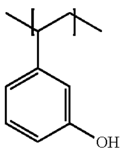
MHS [Mw = 3700, PDI = 1.15]
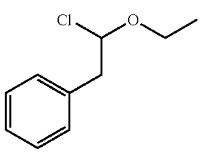
Cl-2
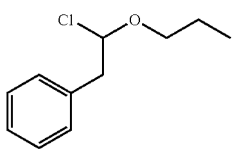
Cl-3
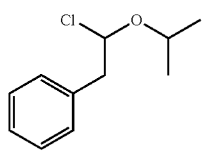
Cl-4
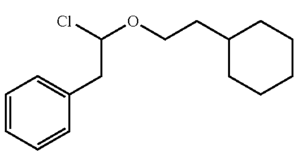
Cl-5
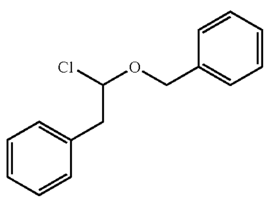
Cl-6
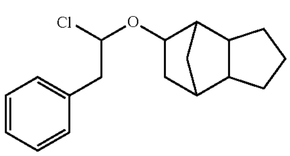
Cl-7
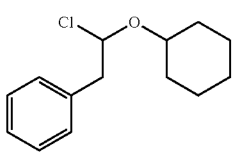
Cl-8
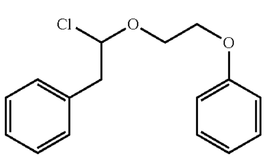
Cl-9
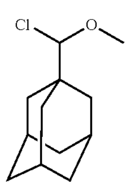
Cl-10
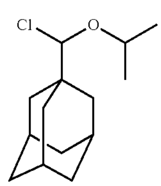
Cl-11
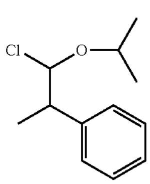
Cl-12
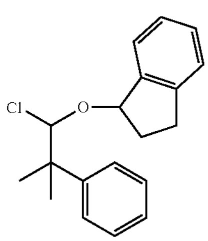
Cl-13
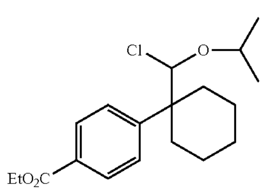
Cl-14

TABLE 1-continued
| Synthesis compound | Polyhydroxystyrene compound | Chloro-ether compound |
|---|---|---|
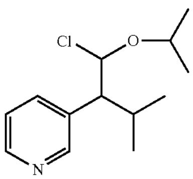
Cl-15
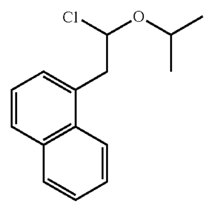
Cl-16
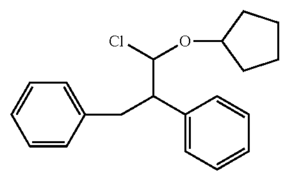
Cl-17
(A-2) (A-3)
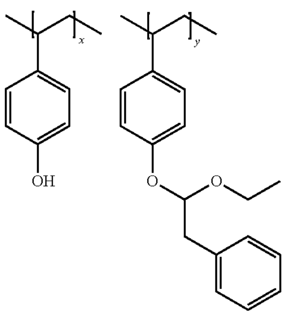
(P-2) x/y = 73/27
Mw = 4700, PDI = 1.13
(P-3) x/y = 78/22
Mw = 12300, PDI = 1.08
(A-4)
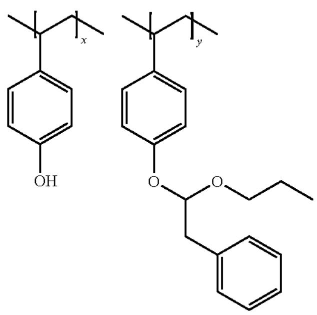
x/y = 76/24
Mw = 4700, PDI = 1.14
(A-5) (A-6)
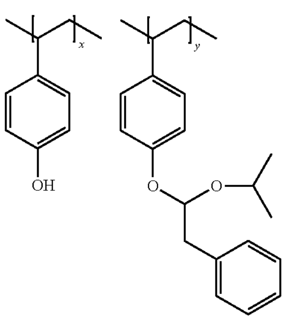
(P-5) x/y = 76/24
Mw = 4600, PDI = 1.12
(P-6) x/y = 80/20
Mw = 12100, PDI = 1.08
(A-7)
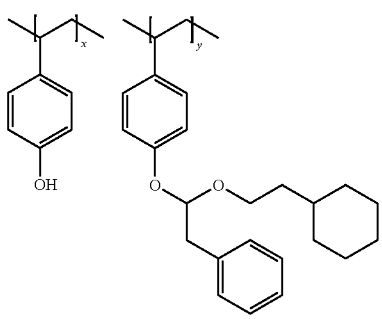
x/y = 81/19
Mw = 4600, PDI = 1.12
(A-8) (A-9)
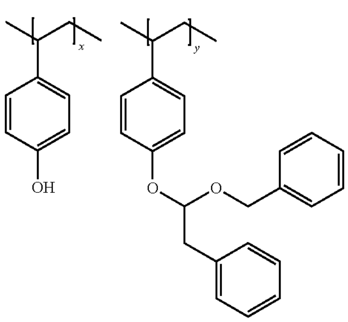
(P-8) x/y = 78/20
Mw = 4700, PDI = 1.13
(P-9) x/y = 76/24
Mw = 4800, PDI = 1.13
(A-10)
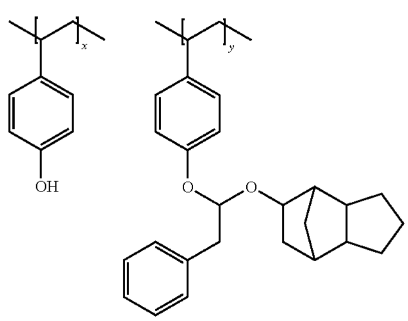
x/y = 78/22
Mw = 4800, PDI = 1.12

TABLE 1-continued
| Synthesis compound | Polyhydroxystyrene compound | Chloro-ether compound |
| --- | --- | --- |
(A-11)
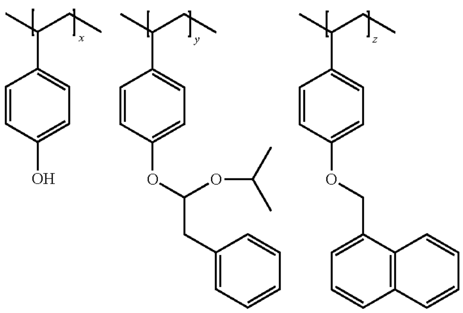
x/y/z = 77/20/3
Mw = 4700, PDI = 1.13
(A-12)
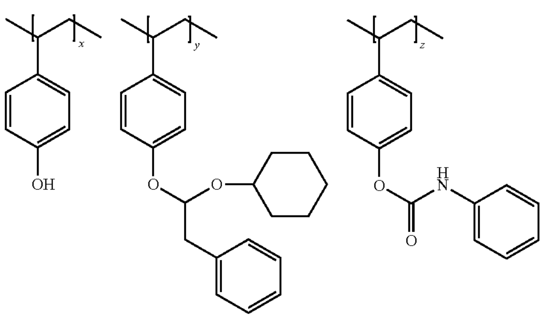
x/y/z = 76/20/4
Mw = 4700, PDI = 1.13
(A-13)
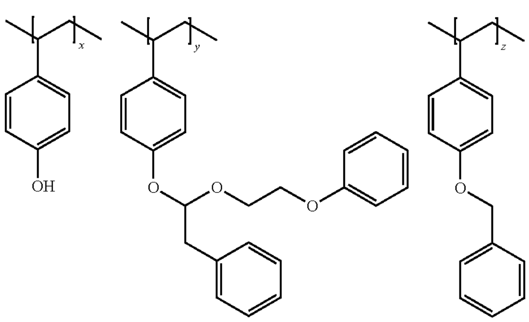
x/y/z = 76/16/8
Mw = 4700, PDI = 1.13
(A-14)
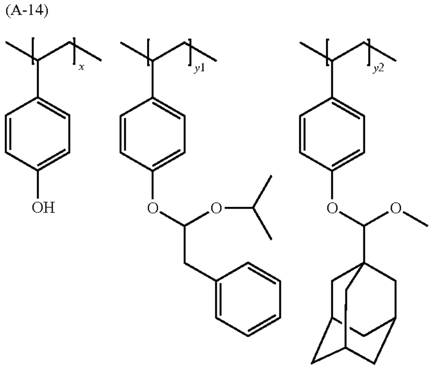
x/y1/y2 = 78/14/8
Mw = 4800, PDI = 1.14

TABLE 1-continued
| Synthesis compound | Polyhydroxystyrene compound | Chloro-ether compound |
| --- | --- | --- |
(A-15)
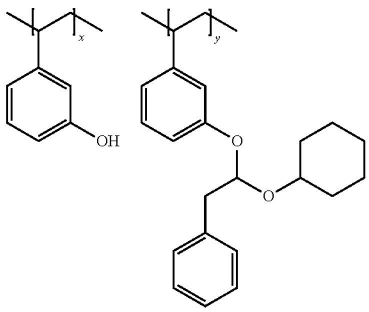
x/y = 78/22
Mw = 4800, PDI = 1.17
(A-16)
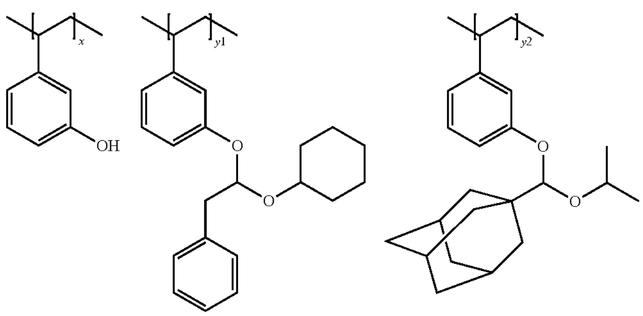
x/y1/y2 = 80/12/8
Mw = 5000, PDI = 1.16
(A-17)
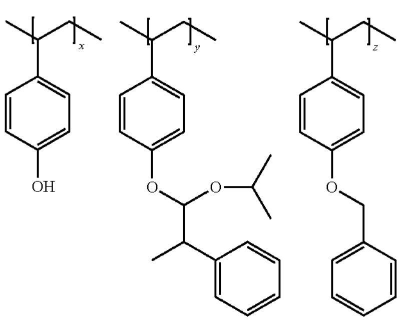
x/y/z = 77/18/5
Mw = 12400, PDI = 1.07
(A-18)
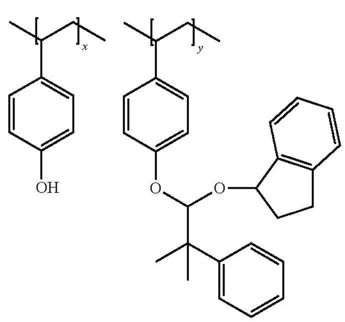
x/y = 85/15
Mw = 12100, PDI = 1.07
(A-19)
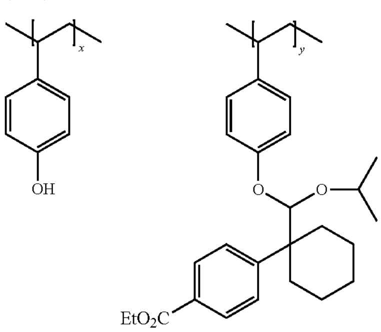
x/y = 83/17
Mw = 4400, PDI = 1.14
(A-20)
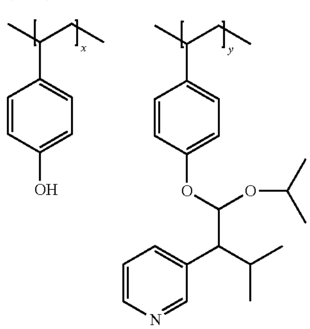
x/y = 73/27
Mw = 4800, PDI = 1.12

TABLE 1-continued

| Synthesis compound | Polyhydroxystyrene compound | Chloro-ether compound |
|---|---|---|

(A-21)

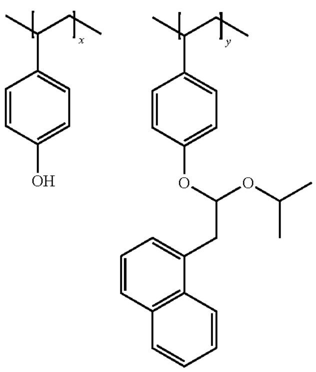

x/y = 83/17
Mw = 12200, PDI = 1.08

(A-22)

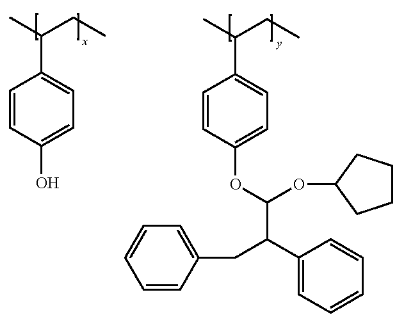

x/y = 82/18
Mw = 4800, PDI = 1.13

Synthesis Example 23

Synthesis of Compound (A-23)

Using (PHS-M2) as the polyhydroxystyrene compound (hydroxystyrene units 83.3 mmol equivalent) and C1-4 as the chloro-ether compound, the reaction was proceeded until the protection rate became 25 mol % using the same method as the synthesis example 1 and the reaction was quenched by adding distilled water. After the THF was distilled off under reduced pressure, an obtained reactant was dissolved in ethyl acetate. After the obtained organic phase had been washed 5 times using distilled water, the organic phase was concentrated and dried.

The obtained polymer was dissolved in 40 g of N,N-dimethyl formamide (DMF), 6.58 g of pyridine, 0.92 g of 2-sulfo benzoic anhydride (abbreviated below as SN-1) as a sulfonating agent, 122 mg of N,N-dimethyl amino pyridine were added and stirred for 5 hours at room temperature. The reactant solution was moves to a separating funnel containing 100 ml of ethyl acetate, the organic phase was washed 5 times using 100 ml of saturated saline, and the ethyl acetate was removed from the organic phase using an evaporator to concentrate.

The obtained polymer was dissolved in 30 ml of tetrahydrofuran (THF) and 10 ml of methanol, 1.72 g of triphenylsulfonium bromide (abbreviated below as PG-1) as a PAG precursor was added, and stirred for 3 hours at room temperature. After the reactant solution was concentrated using an evaporator and dissolved in 100 ml of ethyl acetate, the organic layer was washed 5 times with 100 ml of distilled water. After the organic phase was concentrated and dissolved in 50 ml of acetone, the organic phase was added dropwise to 700 ml of a mixed solution of distilled water:methanol (15:1 volume ratio). The solid obtained by removing the supernatant solution was dissolved in 50 ml of ethyl acetate and was added dropwise to 700 ml of hexane. The precipitate obtained by removing the supernatant solution was dissolved in 32 g of PGMEA. By removing a low boiling point solvent from the obtained solution using an evaporator, 45.3 g of PGMEA solution of the compound (A-23) (27.3 mass %) was obtained.

(A-23)

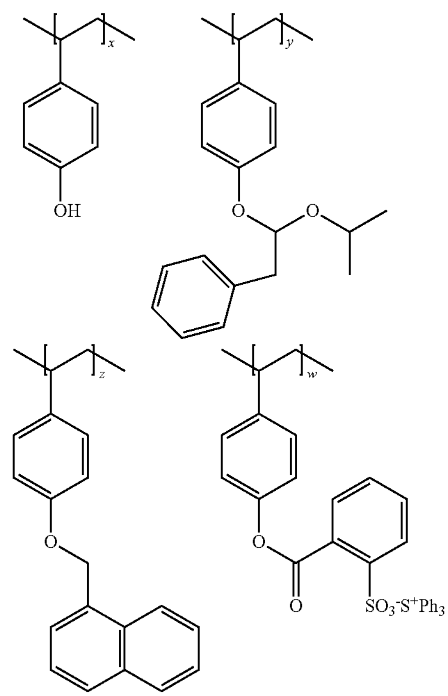

x/y/z/w = 67/25/5/3
Mw = 4900, PDI = 1.13

Synthesis Examples 24 to 29

Synthesis of Compounds (A-24) to (A29)

The compounds (A-24) to (A29) were synthesized using the same method as the synthesis example 23 except that the polyhydroxystyrene compounds, the chloro-ether compounds, the sulfonating agent, and the PAG precursor which have been used were appropriately changed. The reagents which have been used for the synthesis are shown below.

TABLE 2
| | Synthesis compound | Polyhydroxystyrene compound | Chloro-ether compound | Sulfonating agent | PAG Precursor |
|---|---|---|---|---|---|
| Synthesis Example 24 | A-24 | VP-2500 | Cl-8, Cl-10 | SN-1 | PG-1 |
| Synthesis Example 25 | A-25 | PHS-M5 | Cl-6 | SN-1 | PG-1 |
| Synthesis Example 26 | A-26 | VP-2500 | Cl-18 | SN-2 | PG-1 |
| Synthesis Example 27 | A-27 | VP-2500 | Cl-8 | SN-3 | PG-2 |
| Synthesis Example 28 | A-28 | PHS-M3 | Cl-4 | SN-1 | PG-3 |
| Synthesis Example 29 | A-29 | VP-2500 | Cl-8, Cl-10 | SN-1 | PG-4 |
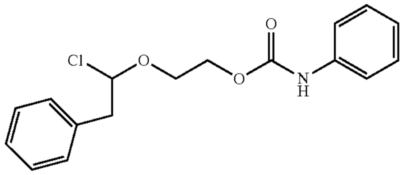
Cl-18
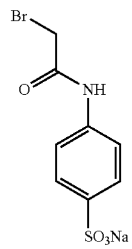
SN-2
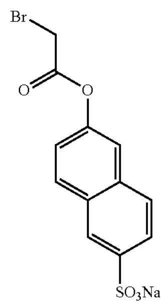
SN-3
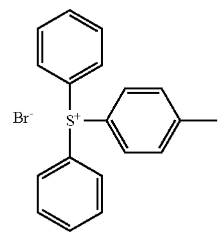
PG-2
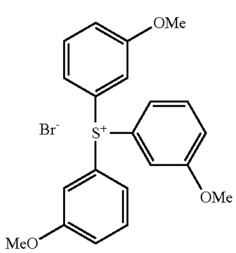
PG-3
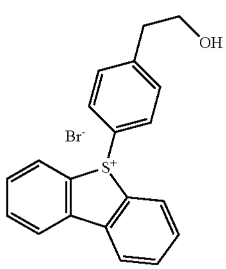
PG-4
(A-24)
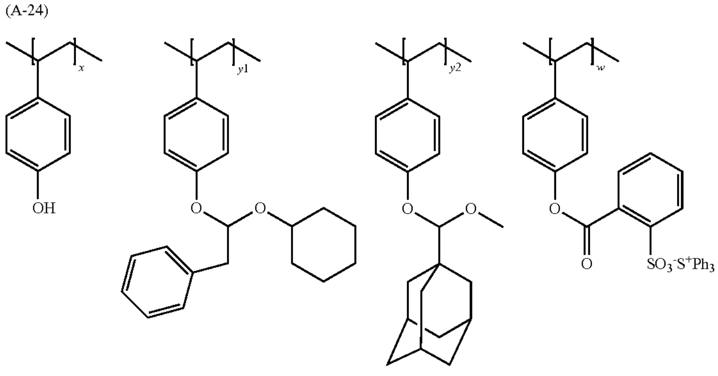
x/y1/y2/w = 79/10/8/3
Mw = 4800, PDI = 1.13

TABLE 2-continued
| Synthesis compound | Polyhydroxystyrene compound | Chloro-ether compound | Sulfonating agent | PAG Precursor |
|---|---|---|---|---|
(A-25)
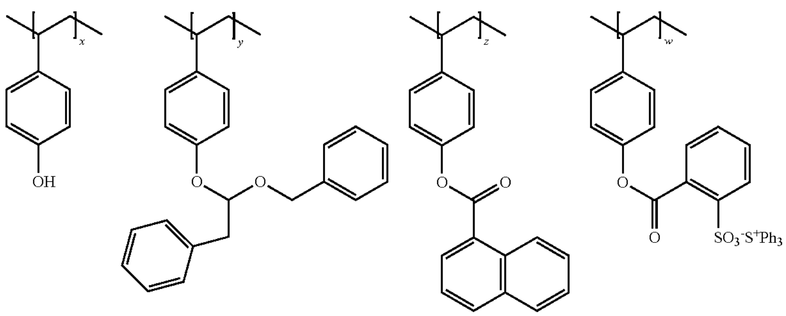
x/y/z/w = 70/21/5/4
Mw = 4700, PDI = 1.12
(A-26)
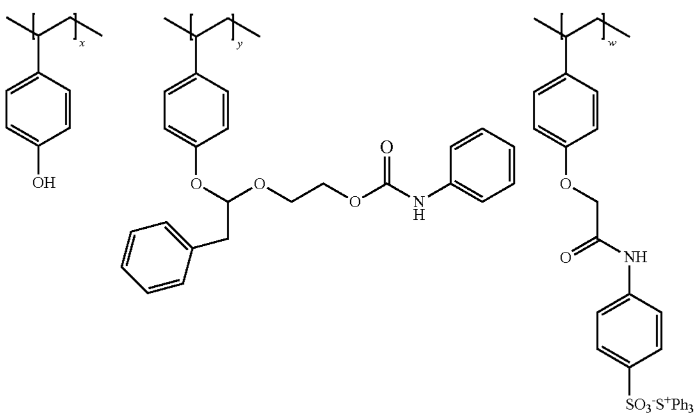
x/y/w = 77/20/3
Mw = 4700, PDI = 1.14
(A-27)
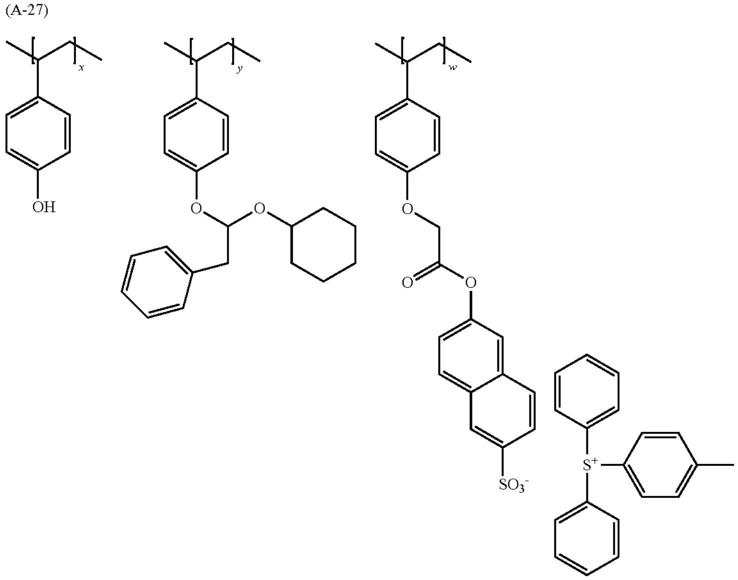
x/y/w = 70/27/3
Mw = 5000, PDI = 1.15

TABLE 2-continued

| Synthesis compound | Polyhydroxystyrene compound | Chloro-ether compound | Sulfonating agent | PAG Precursor |
|---|---|---|---|---|
| (A-28) 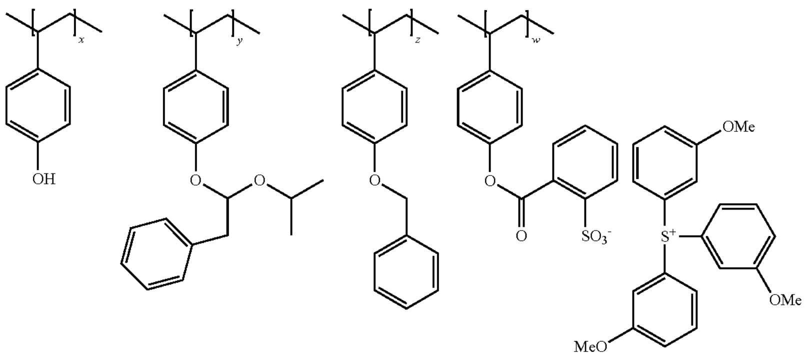 x/y/z/w = 62/27/8/3 Mw = 5300, PDI = 1.13 | | | | |
| (A-29) 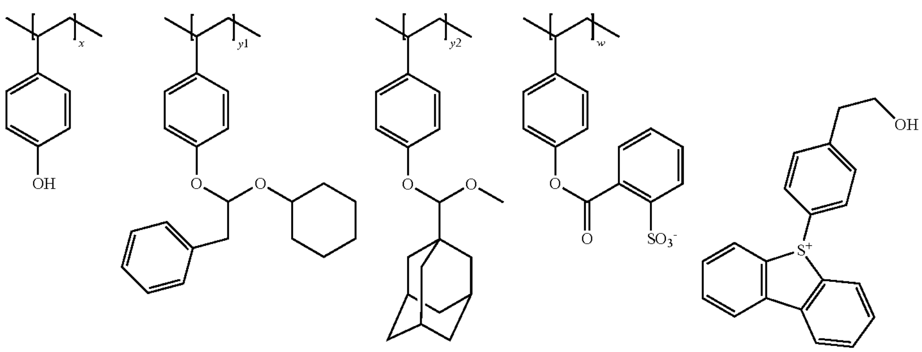 x/y1/y2/w = 62/20/15/3 Mw = 5600, PDI = 1.13 | | | | |

Synthesis Example 30

Synthesis of Compound (A-30)

In a flow of nitrogen gas, 21.6 g of 1-methoxy-2-propanol was heated at 70° C. a mixed solution of 9.97 g of monomer (M-1), 5.65 g of monomer (M-2), 86.45 g of 1-methoxy-2-propanol, and 3.45 g of dimethyl 2,2'-azobisiso butyrate (VP-601 manufactured by Wako Pure Chemical Industries, Ltd.) was added dropwise over 2 hours while stirring the liquid. After the completion of the dropwise addition, the liquid was further stirred for 4 hours at 70° C. After the reactant solution was cooled, re-precipitation was performed using a large amount of hexane and ethyl acetate and 7.44 g of a polymer compound (A-30) of the present invention was obtained by performing vacuum drying.

M-1

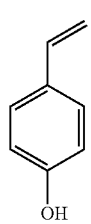

-continued

M-2

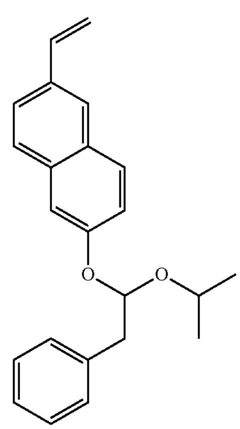

-continued (A-30)

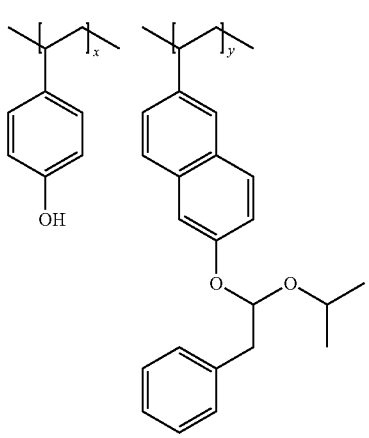

x/y = 80/20
Mw = 4500, PDI = 1.42

Synthesis Examples 31 to 33

Synthesis of Compounds (A-31) to (A33)

By appropriately changing the monomer type which has been used in the basis of the synthesis example 30, polymer compounds (A-31) to (A-33) of the present invention were obtained.

(A-31)

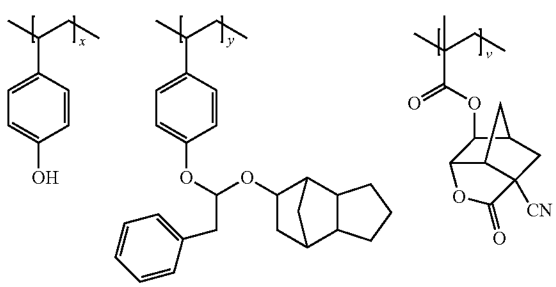

x/y/v = 63/27/10
Mw = 6200, PDI = 1.38

(A-32)

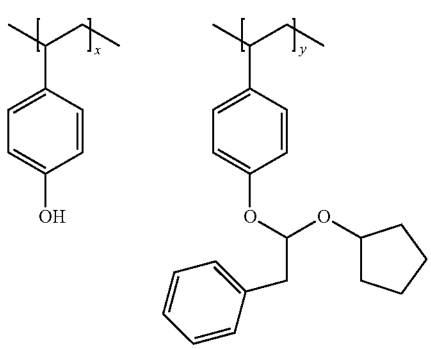

-continued

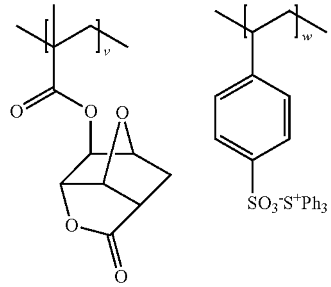

x/y/v/w = 55/27/15/3
Mw = 5400, PDI = 1.34

(A-33)

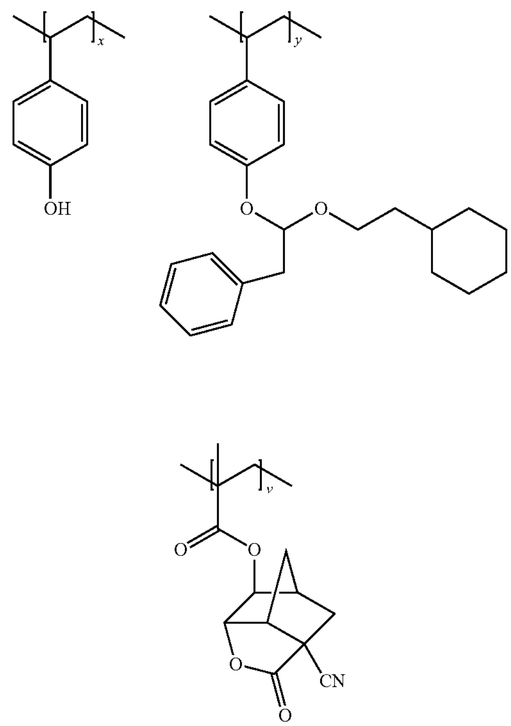

x/y/v = 66/23/11
Mw = 4600, PDI = 1.27

Synthesis Examples 34 and 35

Synthesis of Compounds (A-34) and (A-35)

The compounds (A-34) and (A-35) were synthesized using the same method as the synthesis example 5 except that the polyhydroxystyrene compounds were changed to 4-tert-butyl calix [8] arene (synthesis example 34) and 1,3,5-tri(1',1'-di (4-hydroxyphenyl)ethyl)benzene (synthesis example 35).

(A-34)
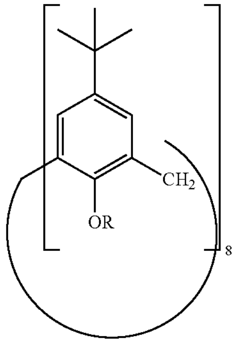
R = H (62%)
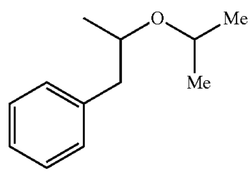
(38%)
(A-35)
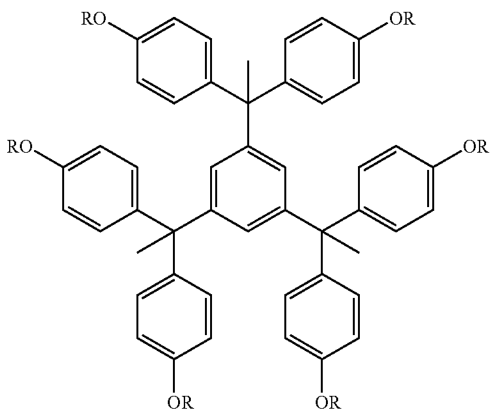
R = H (55%)
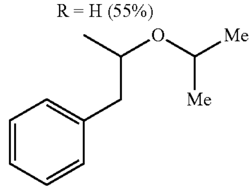
(45%)
For comparison, the compounds below were used. The compounds are shown below with the composition ratio, the weight average molecular weight, and the dispersity.
(R-1)
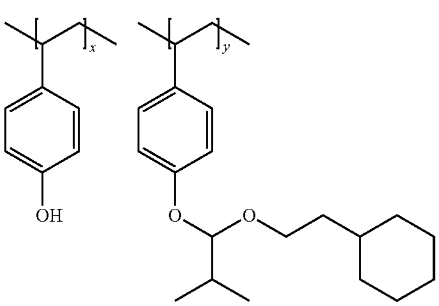
x/y = 74/26
Mw = 4600, PDI = 1.17
-continued
(R-2)
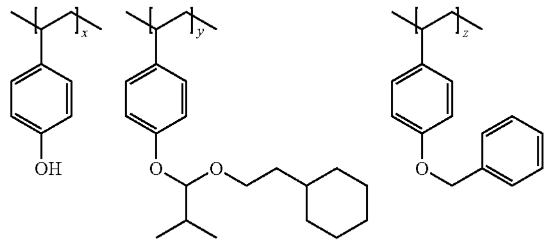
x/y/z = 76/19/5
Mw = 4700, PDI = 1.17
(R-3)
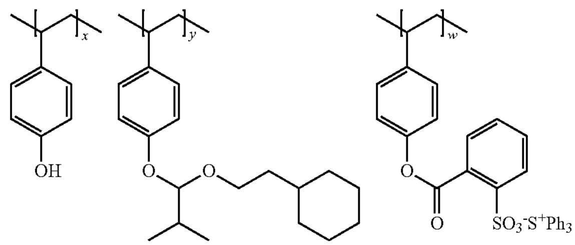
x/y = 71/26/3
Mw = 4900, PDI - 1.17
(R-4)
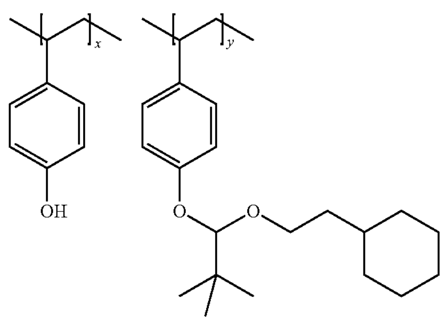
x/y = 74/24
Mw = 4500, PDI = 1.16
(R-5)
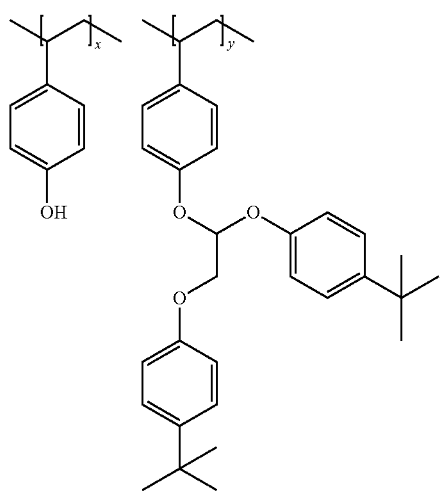
x/y = 75/15
Mw = 4900, PDI = 1.14

-continued
(R-6)
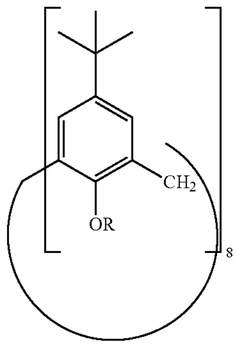
R = H (57%)
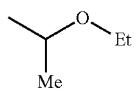
(43%)
Photoacid Generator
The compounds represented by the following formulae were used as the photoacid generator.
PAG-1
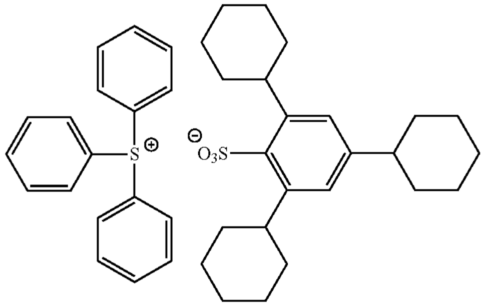
437A$^3$
PAG-2
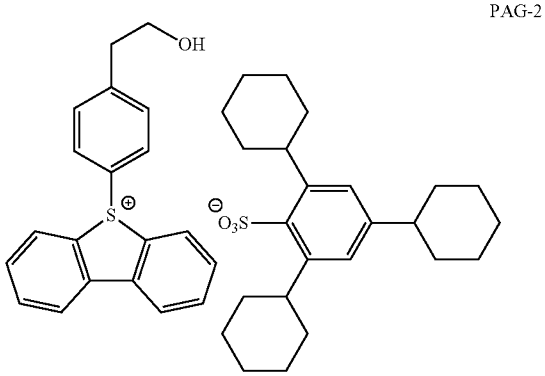
437A$^3$
-continued
PAG-3
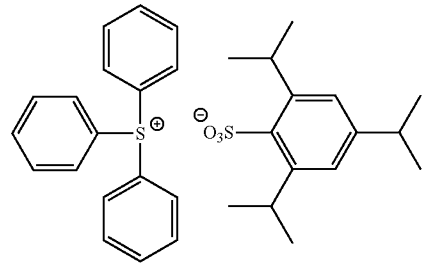
303A$^3$
PAG-4
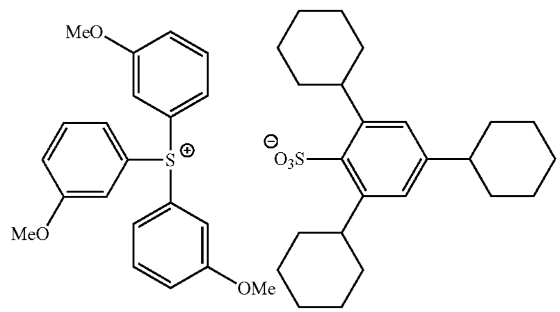
437A$^3$
PAG-5
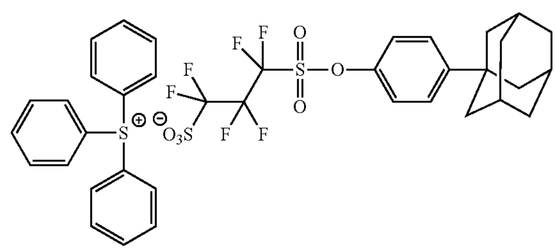
510A$^3$
PAG-6
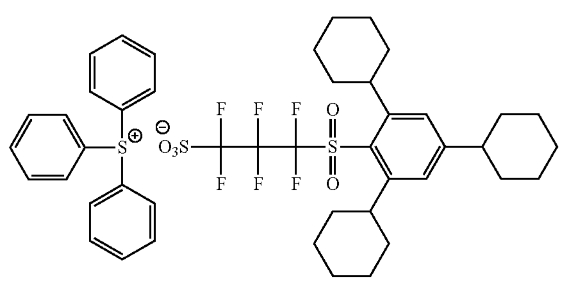
535A$^3$
PAG-7
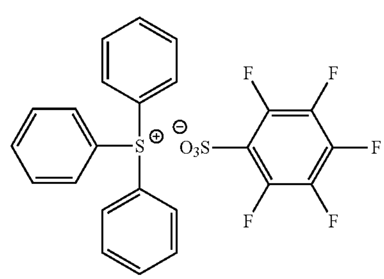
127A$^3$ -continued

PAG-8

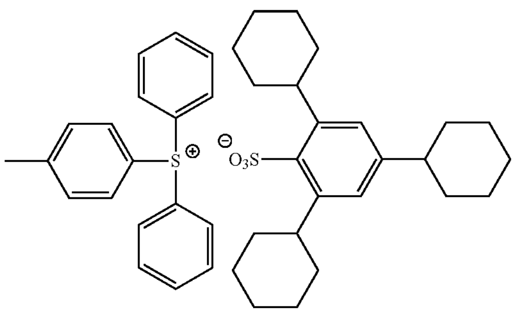

437A$^3$

Synthesis Example

PAG-1

Synthesis of Tricyclohexylbenzene

To 20.0 g of benzene, 6.83 g of aluminum chloride was added, cooled by 3° C. and stirred, and 40.4 g of cyclohexyl chloride was slowly added dropwise. After the dropwise addition, the mixture was stirred for 5 hours at room temperature and was poured into ice water. An organic phase was extracted using ethyl acetate and the obtained organic phase was distilled off at reduced pressure at 40° C. After further distilling off at reduced pressure at 170° C., the organic phase was cooled to room temperature, 50 ml of acetone was introduced and recrystallized. The precipitated crystals were filtered off and 14 g of tricyclohexylbenzene was obtained.

Synthesis of Sodium Tricyclohexylbenzenesulfonate

In 50 ml of methylene chloride, 30 g of tricyclohexylbenzene was dissolved, cooled by 3° C. and stirred, and 15.2 g of chlorosulfonic acid was slowly added dropwise. After the dropwise addition, the mixture was stirred for 5 hours at room temperature, and after the introduction of 10 g of ice, 40 g of 50% aqueous sodium hydroxide was introduced. After a further 20 g of ethanol was added and stirring for 1 hour at 50° C., the undissolved portion was filtered off and removed and the mixture was distilled off at reduced pressure at 40° C. The precipitated crystals were filtered off and washed with hexane, and 30 g of sodium 1,3,5-tricyclohexylbenzensulfonate was obtained.

Synthesis of PAG-1

To 20 ml of methanol, 4.0 g of triphenylsulfonium bromide was added and 5.0 g of sodium 1,3,5-tricyclohexylbenzensulfonate which was dissolved in 20 ml of methanol was added. After stirring for 2 hours at room temperature, 50 ml of ion-exchange water was added and was extracted using chloroform. After the obtained organic phase was washed using water, the organic phase was distilled off at reduced pressure at 40° C. and the obtained crystals were recrystallized using a methanol and ethyl acetate solution. Due to this, 5.0 g of the compound PAG-1 was obtained.

$^1$H-NMR (400 MHz, $CDCl_3$) δ=7.85 (d, 6H), 7.68 (t, 3H), 7.59 (t, 6H), 6.97 (s, 2H), 4.36-4.27 (m, 2H), 2.48-2.38 (m, 1H), 1.97-1.16 (m, 30H)

In the same manner, PAG-2 to PAG-8 were synthesized.

Basic Compound

The compounds represented by the following formulae were used as the basic compound.

BASE-1

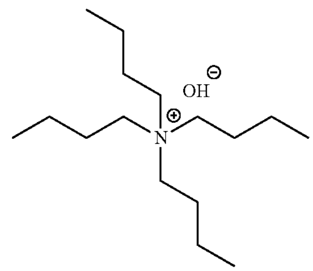

BASE-2

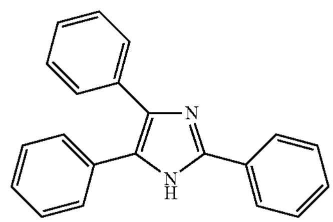

BASE-3

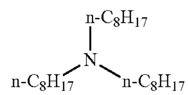

Surfactant and Solvent

The following were used as the surfactant.

W-1: Megaface F176 (manufactured by DIC Corporation) (fluorine-based)

W-2: Megaface R08 (manufactured by DIC Corporation) (fluorine and silicon based)

W-3: PF6320 (manufactured by OMNOVA Solutions Inc.) (fluorine-based)

The following were used as the solvent.

S1: Propylene glycol monomethyl ether acetate (PGMEA)

S2: Propylene glycol monomethyl ether (PGME)

S3: 2-Heptanone

S4: Ethyl lactate

Examples 1 to 8 and Comparative Examples 1 to 10

Each of the components shown in Table 3 was dissolved in the solvents shown in the same table. Each of solutions obtained was filtered using a polytetrafluoroethylene filter with a pore size of 0.1 μm. Due to this, a positive type resist solution with the total solid content concentration shown in Table 3 was prepared. Here, the concentration of each of the components shown in Table 3 is the mass concentration based on the mass of the total solid content.

Resist Evaluation

The prepared positive type resist solution was uniformly coated on a silicon substrate, where a hexamethyldisilazane treatment had been carried out, using a spin coater. Next, heating and drying were performed over 90 seconds at 130° C. using a hot plate. Due to this, a resist film with a film thickness of 100 nm was formed.

With regard to the resist film, electron beam irradiation was performed using an electron beam irradiation device (HL750 manufactured by Hitachi Ltd.; acceleration voltage 50 keV). Immediately after irradiation, the resist film was heated on a hot plate for 90 seconds at 120° C. After this, the resist film was developed for 60 seconds at 23° C. using an aqueous solution of tetramethylammonium hydroxide with a concentration of 2.38 mass % and was dried after being rinsed using pure water for 30 seconds. Due to this, a line and space pattern (line:space=1:1) and an independent line pattern (line: space=1:>100) were formed. Here, below, the line and space pattern is abbreviated as L&S and the independent line pattern is abbreviated as IL.

Shape

The cross-sectional shape of each pattern which was obtained was observed using a scanning electron microscope (S-4800 manufactured by Hitachi Ltd.). The shape of the IL pattern of 100 nm was observed, the shapes closest to a rectangle are shown as A, shapes with a slight thinning of the film thickness are shown as B, and tapered shapes are shown as C.

Resolution

The limit resolution (smallest line width where the lines and spaces are separated and resolved) was set as the resolution (nm).

Post Exposure Bake Sensitivity (PEBS)

With an exposure amount where the L&S pattern of 100 nm is 100 nm at a PEB temperature of 120° C., the line width with a change of −30° C., −20° C., −10° C., and +10° C. with regard to the PEB temperature of 120° C. were measured and the line widths with regard to the temperature were plotted. The slope at this time, that is, the amount of change in the line width for every 1° C. was calculated. As the value gets smaller, excellent performance is exhibited.

A value (nm) which is less than 1.0 nm/° C. is set as 5 points, a value (nm) which is 1.0 nm/° C. or more and less than 1.5 nm/° C. is set as 4 points, a value (nm) which is 1.5 nm/° C. or more and less than 2.0 nm/° C. is set as 3 points, a value (nm) which is 2.0 nm/° C. or more and less than 2.5 nm/° C. is set as 2 points, a value (nm) which is 2.5 nm/° C. or more and less than 3.0 nm/° C. is set as 1 point, and the value (nm) when an image is not formed due to conversion to negative at the high temperature side of the PEB temperature is set as 0 points.

TABLE 3

| Example | Compound (A) (mass %) | Photoacid Generator (mass %) | Basic Compound (mass %) | Solvent (mass ratio) | Surfactant (mass %) | Total Solid Content Concentration (mass %) | L&S Resolution (nm) | IL Resolution (nm) | IL Shape | LER (nm) | PEBS (points) |
|---|---|---|---|---|---|---|---|---|---|---|---|
| Example 1 | A-4 (93.85) | PAG-1 (5.5) | BASE-1 (0.6) | S1/S2 (80/20) | W-3 (0.05) | 4 | 37.5 | 37.5 | A | 4.7 | 5 |
| Example 2 | A-5 (93.85) | PAG-1 (5.5) | BASE-1 (0.6) | S1/S2 (80/20) | W-3 (0.05) | 4 | 37.5 | 37.5 | A | 4.5 | 5 |
| Example 3 | A-6 (93.85) | PAG-1 (5.5) | BASE-1 (0.6) | S1/S2 (80/20) | W-3 (0.05) | 4 | 37.5 | 37.5 | A | 4.6 | 5 |
| Example 4 | A-7 (93.85) | PAG-1 (5.5) | BASE-1 (0.6) | S1/S2 (80/20) | W-3 (0.05) | 4 | 37.5 | 37.5 | A | 4.9 | 5 |
| Example 5 | A-8 (46.90) A-9 (46.95) | PAG-1 (5.5) | BASE-1 (0.6) | S1/S2 (60/40) | W-3 (0.05) | 4 | 37.5 | 37.5 | A | 4.8 | 5 |
| Example 6 | A-11 (93.85) | PAG-1 (5.5) | BASE-1 (0.6) | S1/S2 (80/20) | W-3 (0.05) | 4 | 37.5 | 37.5 | A | 4.9 | 5 |
| Example 7 | A-23 (93.35) | — | BASE-1 (0.6) | S1/S2 (60/40) | W-3 (0.05) | 4 | 37.5 | 37.5 | A | 4.6 | 5 |
| Example 8 | A-34 (93.85) | PAG-1 (5.5) | BASE-1 (0.6) | S1/S2 (80/20) | W-3 (0.05) | 4 | 37.5 | 37.5 | A | 4.7 | 5 |
| Comparative Example 1 | A-1 (93.85) | PAG-1 (5.5) | BASE-1 (0.6) | S1/S2 (80/20) | W-3 (0.05) | 4 | 37.5 | 37.5 | A | 4.6 | 3 |
| Comparative Example 2 | A-1 (91.95) | PAG-6 (7.4) | BASE-1 (0.6) | S1/S2 (80/20) | W-3 (0.05) | 4 | 37.5 | 37.5 | B | 5.1 | 5 |
| Comparative Example 3 | A-2 (93.85) | PAG-1 (5.5) | BASE-1 (0.6) | S1/S2 (80/20) | W-3 (0.05) | 4 | 37.5 | 37.5 | A | 4.8 | 4 |
| Comparative Example 4 | A-3 (93.85) | PAG-1 (5.5) | BASE-1 (0.6) | S1/S2 (80/20) | W-3 (0.05) | 4 | 37.5 | 37.5 | A | 4.5 | 3 |
| Comparative Example 5 | R-1 (93.85) | PAG-1 (5.5) | BASE-1 (0.6) | S1/S2 (80/20) | W-3 (0.05) | 4 | 37.5 | 50.0 | C | 6.6 | 5 |
| Comparative Example 6 | R-2 (93.85) | PAG-1 (5.5) | BASE-1 (0.6) | S1/S2 (80/20) | W-3 (0.05) | 4 | 37.5 | 50.0 | C | 6.2 | 5 |
| Comparative Example 7 | R-3 (99.35) | — | BASE-1 (0.6) | S1/S2 (70/30) | W-3 (0.05) | 4 | 37.5 | 37.5 | C | 5.5 | 5 |
| Comparative Example 8 | R-4 (93.85) | PAG-1 (5.5) | BASE-1 (0.6) | S1/S2 (80/20) | W-3 (0.05) | 4 | 37.5 | 50.0 | C | 5.6 | 4 |
| Comparative Example 9 | R-5 (93.85) | PAG-1 (5.5) | BASE-1 (0.6) | S1/S2 (80/20) | W-3 (0.05) | 4 | 62.5 | 75.0 | C | 5.5 | 0 |
| Comparative Example 10 | R-6 (93.85) | PAG-1 (5.5) | BASE-1 (0.6) | S1/S2 (80/20) | W-3 (0.05) | 4 | 50.0 | 50.0 | B | 5.4 | 5 |

Line Edge Roughness (LER)

With regard to 30 arbitrary points in a 50 μm length direction of the line pattern with a line width of 100 nm, the distance from the reference line which is to be an edge was measured using a scanning electron microscope (S-4800 manufactured by Hitachi Ltd.), the standard deviation was obtained and calculated as 3σ. As the value gets smaller, the line edge roughness improves.

Examples 9 to 38 and Comparative Examples 11 to 16

In order to confirm the performance of the resist film in the mask blanks, positive type resist solutions were prepared in the same manner as the examples 1 to 8, except (1) changing the silicon substrate where hexamethyldisilazane treatment has been carried out to a glass substrate where a chromium oxide film (light shielding film) was provided with a thickness of 100 nm by chemical deposition, (2) changing of the heating conditions after the coating of the resist solution from 90 seconds at 130° C. to 600 seconds at 130° C., and (3) changing of the heating conditions after the electron beam irradiation from 90 seconds at 120° C. to 600 seconds at 120° C., and resist films were formed, and resist evaluations were performed. The results are shown in Table 4.

TABLE 4

| Example | Compound (A) (mass %) | Photoacid Generator (mass %) | Basic Compound (mass %) | Solvent (mass ratio) | Surfactant (mass %) | Total Solid Content Concentration (mass %) | L&S Resolution (nm) | IL Resolution (nm) | IL Shape | LER (nm) | PEBS |
|---|---|---|---|---|---|---|---|---|---|---|---|
| Example 9 | A-5 (93.35) | PAG-1 (5.5) | BASE-2 (1.1) | S1/S2 (80/20) | W-3 (0.05) | 4 | 37.5 | 37.5 | A | 4.9 | 5 |
| Example 10 | A-5 (93.55) | PAG-1 (5.5) | BASE-3 (0.9) | S1/S2 (80/20) | W-3 (0.05) | 4 | 37.5 | 37.5 | A | 4.7 | 5 |
| Example 11 | A-4 (93.85) | PAG-1 (5.5) | BASE-1 (0.6) | S1/S2 (80/20) | W-3 (0.05) | 4 | 37.5 | 37.5 | A | 4.7 | 5 |
| Example 12 | A-5 (93.85) | PAG-1 (5.5) | BASE-1 (0.6) | S1/S2/S4 (45/45/10) | W-3 (0.05) | 4 | 37.5 | 37.5 | A | 4.8 | 5 |
| Example 13 | A-5 (87.55) | PAG-8 (11.2) | BASE-1 (1.2) | S1/S2 (80/20) | W-3 (0.05) | 4 | 37.5 | 37.5 | A | 3.9 | 5 |
| Example 14 | A-6 (93.85) | PAG-1 (5.5) | BASE-1 (0.6) | S1/S2 (80/20) | W-3 (0.05) | 4 | 37.5 | 37.5 | A | 4.6 | 5 |
| Example 15 | A-7 (94.35) | PAG-1 (2.75) | BASE-1 (0.6) | S1/S2 (80/20) | W-3 (0.05) | 4 | 37.5 | 37.5 | A | 4.1 | 5 |
| Example 16 | A-8 (46.90) A-9 (46.95) | PAG-1 (5.5) | BASE-1 (0.6) | S1/S2 (80/20) | W-3 (0.05) | 4 | 37.5 | 37.5 | A | 4.9 | 5 |
| Example 17 | A-10 (93.85) | PAG-1 (5.5) | BASE-1 (0.6) | S1/S2 (80/20) | W-3 (0.05) | 4 | 37.5 | 37.5 | A | 4.6 | 5 |
| Example 18 | A-11 (93.85) | PAG-1 (5.5) | BASE-1 (0.6) | S1/S2 (80/20) | W-3 (0.05) | 4 | 37.5 | 37.5 | A | 4.5 | 5 |
| Example 19 | A-12 (93.15) | PAG-1 (6.2) | BASE-1 (0.6) | S1/S2 (80/20) | W-3 (0.05) | 4 | 37.5 | 37.5 | A | 4.4 | 5 |
| Example 20 | A-13 (93.90) | PAG-1 (5.5) | BASE-1 (0.6) | S1/S2 (80/20) | — | 4 | 37.5 | 37.5 | A | 4.5 | 5 |
| Example 21 | A-14 (93.85) | PAG-1 (5.5) | BASE-1 (0.6) | S1/S2 (80/20) | W-3 (0.05) | 4 | 25.0 | 37.5 | A | 4.5 | 5 |
| Example 22 | A-15 (92.95) | PAG-4 (6.4) | BASE-1 (0.6) | S1/S2 (80/20) | W-3 (0.05) | 4 | 37.5 | 37.5 | A | 4.6 | 5 |
| Example 23 | A-16 (93.75) | PAG-8 (5.6) | BASE-1 (0.6) | S1/S2 (80/20) | W-3 (0.05) | 4 | 37.5 | 37.5 | A | 4.4 | 5 |
| Example 24 | A-17 (93.90) | PAG-1 (5.5) | BASE-1 (0.6) | S1/S2 (80/20) | — | 4 | 37.5 | 37.5 | A | 4.9 | 5 |
| Example 25 | A-18 (93.85) | PAG-1 (5.5) | BASE-1 (0.6) | S1/S2 (80/20) | W-3 (0.05) | 4 | 37.5 | 37.5 | A | 5.0 | 5 |
| Example 26 | A-19 (93.85) | PAG-1 (5.5) | BASE-1 (0.6) | S1/S2 (80/20) | W-3 (0.05) | 4 | 37.5 | 50 | A | 4.6 | 5 |
| Example 27 | A-20 (93.05) | PAG-1 (6.3) | BASE-1 (0.6) | S1/S2 (80/20) | W-3 (0.05) | 4 | 37.5 | 37.5 | A | 4.6 | 5 |
| Example 28 | A-21 (93.85) | PAG-1 (5.5) | BASE-1 (0.6) | S1/S2 (80/20) | W-3 (0.05) | 4 | 37.5 | 37.5 | A | 4.8 | 5 |
| Example 29 | A-22 (93.85) | PAG-1 (5.5) | BASE-1 (0.6) | S1/S2 (80/20) | W-3 (0.05) | 4 | 37.5 | 37.5 | A | 5.0 | 4 |
| Example 30 | A-23 (99.35) | — | BASE-1 (0.6) | S1/S2 (70/30) | W-3 (0.05) | 4 | 37.5 | 37.5 | A | 4.2 | 5 |
| Example 31 | A-24 (99.35) | — | BASE-1 (0.6) | S1/S2 (70/30) | W-3 (0.05) | 4 | 25.0 | 37.5 | A | 4.3 | 5 |
| Example 32 | A-25 (99.35) | — | BASE-1 (0.6) | S1/S2 (60/40) | W-3 (0.05) | 4 | 37.5 | 37.5 | A | 4.4 | 5 |
| Example 33 | A-26 (99.35) | — | BASE-1 (0.6) | S1/S2 (60/40) | W-3 (0.05) | 4 | 37.5 | 37.5 | A | 4.2 | 5 |
| Example 34 | A-27 (99.35) | — | BASE-1 (0.6) | S1/S2 (70/30) | W-3 (0.05) | 4 | 37.5 | 37.5 | A | 4.5 | 5 |
| Example 35 | A-30 (93.85) | PAG-1 (5.5) | BASE-1 (0.6) | S1/S2 (80/20) | W-3 (0.05) | 4 | 37.5 | 37.5 | A | 5.0 | 5 |
| Example 36 | A-33 (93.75) | PAG-8 (5.6) | BASE-1 (0.6) | S1/S2 (80/20) | W-3 (0.05) | 4 | 37.5 | 37.5 | A | 4.2 | 5 |
| Example 37 | A-34 (93.85) | PAG-1 (5.5) | BASE-1 (0.6) | S1/S2 (80/20) | W-3 (0.05) | 4 | 25.0 | 37.5 | A | 4.9 | 5 |
| Example 38 | A-35 (93.85) | PAG-1 (5.5) | BASE-1 (0.6) | S1/S2 (80/20) | W-3 (0.05) | 4 | 37.5 | 37.5 | A | 4.8 | 5 |
| Comparative Example 11 | R-1 (93.85) | PAG-1 (5.5) | BASE-1 (0.6) | S1/S2 (80/20) | W-3 (0.05) | 4 | 37.5 | 50 | B | 5.6 | 5 |
| Comparative Example 12 | R-2 (93.85) | PAG-1 (5.5) | BASE-1 (0.6) | S1/S2 (80/20) | W-3 (0.05) | 4 | 37.5 | 50 | C | 5.2 | 5 |
| Comparative Example 13 | R-3 (99.35) | — | BASE-1 (0.6) | S1/S2 (70/30) | W-3 (0.05) | 4 | 37.5 | 50 | B | 5.0 | 5 |

TABLE 4-continued

| Example | Compound (A) (mass %) | Photoacid Generator (mass %) | Basic Compound (mass %) | Solvent (mass ratio) | Surfactant (mass %) | Total Solid Content Concentration (mass %) | L&S Resolution (nm) | IL Resolution (nm) | IL Shape | LER (nm) | PEBS |
|---|---|---|---|---|---|---|---|---|---|---|---|
| Comparative Example 14 | R-4 (93.85) | PAG-1 (5.5) | BASE-1 (0.6) | S1/S2 (80/20) | W-3 (0.05) | 4 | 37.5 | 37.5 | C | 5.2 | 5 |
| Comparative Example 15 | R-5 (93.85) | PAG-1 (5.5) | BASE-1 (0.6) | S1/S2 (80/20) | W-3 (0.05) | 4 | 62.5 | 62.5 | C | 6.0 | 0 |
| Comparative Example 16 | R-6 (93.85) | PAG-1 (5.5) | BASE-1 (0.6) | S1/S2 (80/20) | W-3 (0.05) | 4 | 37.5 | 50 | C | 5.3 | 5 |

Due to the exposure and development of the mask blanks where the resist film formed from the composition of the present invention is formed, excellent photomask blanks can be obtained for semiconductor manufacture.

Examples 39 to 51 and Comparative Examples 17 to 20

In order to confirm the performance of the resist film in EUV exposure, positive type resist films were formed in the same manner as the examples 1 to 12 except changing of the film thickness of the resist film from 100 nm to 50 nm.

With regard to the resist film, EUV light was irradiated using an EUV exposure device (wavelength=13.5 nm, Na=0.3). Immediately after irradiation, the resist film was heated on a hot plate for 90 seconds at 110° C. After this, the resist film was developed for 30 seconds at 23° C. using an aqueous solution of tetramethylammonium hydroxide with a concentration of 2.38 mass % and was dried after being rinsed using pure water for 30 seconds. Due to this, a line and space pattern (line:space=1:1) was formed.

Sensitivity

First, the cross-sectional shape of each line and space pattern which was obtained was observed using a scanning electron microscope (S-9380 manufactured by Hitachi Ltd.). Then, the amount of exposure when a line with a line width of 35 nm (line:space=1:1) was resolved is set as ($E_{opt}$).

Pattern Shape

The cross-sectional shape of the 35 nm line pattern (line:space=1:1) with the exposure amount where the sensitivity above was exhibited was observed using a scanning electron microscope (S-4800 manufactured by Hitachi Ltd.). Then, the shape thereof was evaluated in three stages of rectangular, reverse tapered shape, and tapered shape.

Roughness Characteristics: Line Width Roughness (LWR)

The 35 nm line pattern (line:space=1:1) described above was observed using a scanning electron microscope (S-9380 manufactured by Hitachi Ltd.). Then, with regard to 50 arbitrary points at equal intervals included in a 2 μm length direction, the distance between the reference line which is to be an edge and the actual edge was measured. Then, the standard deviation of the distance was obtained and calculated as 3σ. Then, 3σ is set as "LWR (nm)". As the value gets smaller, the roughness characteristics improve.

The results of the evaluation are shown in Table 5 below.

TABLE 5

| Example | Compound (A) (mass %) | Photoacid Generator (mass %) | Basic Compound (mass %) | Solvent (mass ratio) | Surfactant (mass %) | Total Solid Content Concentration (mass %) | Sensitivity (mJ/cm2) | Pattern Shape | LWR (nm) |
|---|---|---|---|---|---|---|---|---|---|
| Example 39 | A-8 (85.95) | PAG-4 (12.8) | BASE-1 (1.2) | S1/S2 (80/20) | W-3 (0.05) | 4 | 22.4 | Rectangle | 4.7 |
| Example 40 | A-8 (85.55) | PAG-2 (13.2) | BASE-1 (1.2) | S1/S2 (80/20) | W-3 (0.05) | 4 | 21.6 | Rectangle | 5.1 |
| Example 41 | A-8 (85.25) | PAG-4 (12.8) | BASE-2 (1.9) | S1/S2 (80/20) | W-3 (0.05) | 4 | 22.6 | Rectangle | 4.8 |
| Example 42 | A-8 (84.85) | PAG-4 (12.8) | BASE-3 (2.3) | S1/S2 (80/20) | W-3 (0.05) | 4 | 22.8 | Rectangle | 4.7 |
| Example 43 | A-8 (89.05) | PAG-7 (8.6) | BASE-3 (2.3) | S1/S2 (80/20) | W-3 (0.05) | 4 | 23.3 | Rectangle | 5.5 |
| Example 44 | A-14 (77.25) | PAG-4 (19.2) | BASE-3 (3.5) | S1/S2 (80/20) | W-3 (0.05) | 4 | 22.2 | Rectangle | 4.1 |
| Example 45 | A-27 (97.65) | — | BASE-3 (2.3) | S1/S2 (50/50) | W-3 (0.05) | 4 | 23.0 | Rectangle | 4.3 |
| Example 46 | A-28 (97.65) | — | BASE-3 (2.3) | S1/S2 (50/50) | W-3 (0.05) | 4 | 21.9 | Rectangle | 4.4 |
| Example 47 | A-29 (97.65) | — | BASE-3 (2.3) | S1/S2 (50/50) | W-3 (0.05) | 4 | 22.4 | Rectangle | 4.2 |
| Example 48 | A-31 (84.85) | PAG-2 (13.2) | BASE-1 (1.2) | S1/S2 (80/20) | W-3 (0.05) | 4 | 22.0 | Rectangle | 4.9 |
| Example 49 | A-32 (97.65) | — | BASE-3 (2.3) | S1/S2 (50/50) | W-3 (0.05) | 4 | 22.6 | Rectangle | 4.3 |
| Example 50 | A-34 (84.85) | PAG-4 (12.8) | BASE-3 (2.3) | S1/S2 (80/20) | W-3 (0.05) | 4 | 23.1 | Rectangle | 4.2 |
| Example 51 | A-35 (84.85) | PAG-4 (12.8) | BASE-3 (2.3) | S1/S2 (80/20) | W-3 (0.05) | 4 | 23.3 | Rectangle | 4.4 |
| Comparative Example 17 | R-1 (84.85) | PAG-4 (12.8) | BASE-3 (2.3) | S1/S2 (80/20) | W-3 (0.05) | 4 | 26.4 | Tapered | 6.7 |

TABLE 5-continued

| Example | Compound (A) (mass %) | Photoacid Generator (mass %) | Basic Compound (mass %) | Solvent (mass ratio) | Surfactant (mass %) | Total Solid Content Concentration (mass %) | Sensitivity (mJ/cm2) | Pattern Shape | LWR (nm) |
|---|---|---|---|---|---|---|---|---|---|
| Comparative Example 18 | R-3 (97.65) | — | BASE-3 (2.3) | S1/S2 (50/50) | W-3 (0.05) | 4 | 23.9 | Tapered | 5.2 |
| Comparative Example 19 | R-4 (84.85) | PAG-4 (12.8) | BASE-3 (2.3) | S1/S2 (80/20) | W-3 (0.05) | 4 | 25.9 | Tapered | 5.5 |
| Comparative Example 20 | R-6 (84.85) | PAG-4 (12.8) | BASE-3 (2.3) | S1/S2 (80/20) | W-3 (0.05) | 4 | 23.8 | Tapered | 5.3 |

As shown in Table 5, the compositions of the examples were superior in terms of sensitivity, pattern shape, and LWR compared to the compositions of the comparative examples.

This application claims priority under 35 U.S.C. §119 of Japanese Patent application JP 2011-166034, filed on Jul. 28, 2011 and Japanese Patent application JP 2012-144555, filed on Jun. 27, 2012, the entire contents of which are hereby incorporated by reference.

What is claimed is:

1. An actinic ray-sensitive or radiation-sensitive resin composition comprising:

a compound (A) which contains at least one phenolic hydroxyl group and at least one group where a hydrogen atom in a phenolic hydroxyl group is substituted by a group represented by the following General Formula (1);

(1)

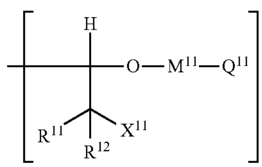

Wherein, in the formula, each of $R^{11}$ and $R^{12}$ independently represents a hydrogen atom, an alkyl group, a cycloalkyl group, an aryl group, or an aralkyl group;

$X^{11}$ represents an aryl group;

$M^{11}$ represents a single bond or a divalent linking group; and $Q^{11}$ represents an alkyl group, a cycloalkyl group or an aryl group wherein the number of carbon atoms which are included in the group represented by $-M^{11}-Q^{11}$ is 3 or more, and at least two of $R^{11}$, $R^{12}$, $Q^{11}$, and $X^{11}$ may form a ring by bonding to each other.

2. The composition according to claim 1, wherein the compound (A) is a polymer compound containing a repeating unit represented by the following General Formula (2);

(2)

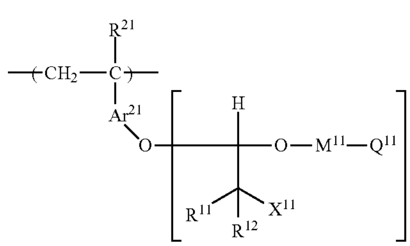

wherein, in the formula, $R^{21}$ represents a hydrogen atom or a methyl group;

$Ar^{21}$ represents an arylene group;

each of $R^{11}$ and $R^{12}$ independently represents a hydrogen atom, an alkyl group, a cycloalkyl group, an aryl group, or an aralkyl group;

$X^{11}$ represents an aryl group;

$M^{11}$ represents a single bond or a divalent linking group; and $Q^{11}$ represents an alkyl group, a cycloalkyl group or an aryl group, wherein the number of carbon atoms which are included in the group represented by $-M^{11}-Q^{11}$ is 3 or more, and at least two of $R^{11}$, $R^{12}$, $Q^{11}$, and $X^{11}$ may form a ring by bonding to each other.

3. The composition according to claim 1, wherein the group represented by $-M^{11}-Q^{11}$ has at least one ring structure.

4. The composition according to claim 1, wherein the group represented by $-M^{11}-Q^{11}$ is a cycloalkyl group, an alkyl group substituted by a cycloalkyl group, an aralkyl group, or an aryloxyalkyl group.

5. The composition according to claim 1, wherein $M^{11}$ is a single bond, $Q^{11}$ is an alkyl group or a cycloalkyl group, and, the carbon atom of $Q^{11}$ which is directly connected to the oxygen atom in $—(O-M^{11}-Q^{11})$ is a secondary carbon or tertiary carbon.

6. The composition according to claim 2, wherein $M^{11}$ is a single bond, $Q^{11}$ is an alkyl group or a cycloalkyl group, and, the carbon atom of $Q^{11}$ which is directly connected to the oxygen atom in $—(O-M^{11}-Q^{11})$ is a secondary carbon or tertiary carbon.

7. The composition according to claim 2, wherein $Ar^{21}$ is a phenylene group.

8. The composition according to claim 2, wherein the compound (A) contains a repeating unit represented by the following General Formula (5);

(5)

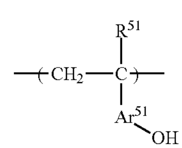

wherein, in the formula, $R^{51}$ represents a hydrogen atom or a methyl group; and $Ar^{51}$ represents an arylene group.

9. The composition according to claim 2, wherein the compound (A) further contains a non-degradable repeating unit represented by the following General Formula (3);

(3)

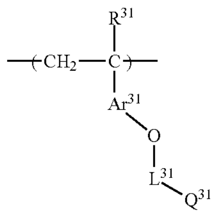

wherein, in the formula, $R^{31}$ represents a hydrogen atom or a methyl group;

$Ar^{31}$ represents an arylene group;

$L^{31}$ represents a single bond or a divalent linking group; and $Q^{31}$ represents a cycloalkyl group or an aryl group.

10. The composition according to claim 2, wherein a compound (A) further contains a repeating unit represented by the following General Formula (4);

(4)

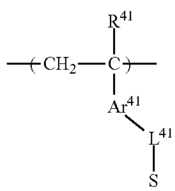

wherein, in the formula, $R^{41}$ represents a hydrogen atom or a methyl group, $Ar^{41}$ represents an arylene group;

$L^{41}$ represents a single bond or a divalent linking group; and

S represents a structural moiety that generates an acid on a side chain by being degraded by actinic ray irradiation or radiation irradiation.

11. The composition according to claim 1, further comprising:

a compound (B) which generates an acid due to irradiation of actinic rays or radiation.

12. The composition according to claim 11, wherein the volume of the acid which is generated from the compound (B) is 200 Å$^3$ or more.

13. An actinic ray-sensitive or radiation-sensitive film which is formed using the composition according to claim 1.

14. The actinic ray-sensitive or radiation-sensitive film according to claim 13, wherein the film thickness of the actinic ray-sensitive or radiation-sensitive film is 100 nm or less.

15. Mask blanks, wherein the actinic ray-sensitive or radiation-sensitive film according to claim 13 is formed.

16. A semiconductor manufacturing mask which is obtained by exposing and developing the mask blanks according to claim 15.

17. A pattern forming method comprising:

the film according to claim 13; and developing the exposed film.

18. The method according to claim 17, wherein the exposing is performed using an electron beam, X-rays, or EUV light.

* * * * *